(12) United States Patent
Hirasawa et al.

(10) Patent No.: US 10,359,155 B2
(45) Date of Patent: Jul. 23, 2019

(54) LIGHT-EMITTING APPARATUS

(71) Applicant: Panasonic Intellectual Property Management Co., Ltd., Osaka (JP)

(72) Inventors: Taku Hirasawa, Kyoto (JP); Yasuhisa Inada, Osaka (JP); Akira Hashiya, Osaka (JP); Nobuaki Nagao, Gifu (JP); Akira Tsujimoto, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 192 days.

(21) Appl. No.: 15/206,273

(22) Filed: Jul. 10, 2016

(65) Prior Publication Data

US 2017/0051885 A1 Feb. 23, 2017

(30) Foreign Application Priority Data

Aug. 20, 2015 (JP) .................... 2015-162403
Aug. 20, 2015 (JP) .................... 2015-162404
(Continued)

(51) Int. Cl.
*F21V 9/30* (2018.01)
*F21K 9/64* (2016.01)
(Continued)

(52) U.S. Cl.
CPC .................. *F21K 9/64* (2016.08); *F21V 9/30* (2018.02); *H01S 5/00* (2013.01); *F21V 5/04* (2013.01);
(Continued)

(58) Field of Classification Search
CPC ................................ F21V 9/00; G02B 6/0026
(Continued)

(56) References Cited

U.S. PATENT DOCUMENTS 5,517,039 A 5/1996 Holonyak, Jr. et al.
5,732,102 A 3/1998 Bouadma
(Continued)

FOREIGN PATENT DOCUMENTS

JP 9-073807 3/1997
JP 11-283751 10/1999
(Continued)

OTHER PUBLICATIONS

The Extended European Search Report dated Dec. 16, 2016 for the related European Patent Application No. 14883764.4.
(Continued)

*Primary Examiner* — William J Carter
(74) *Attorney, Agent, or Firm* — McDermott Will & Emery LLP

(57) ABSTRACT

A light-emitting apparatus includes an excitation light source that emits first light; a light-emitting device on an optical path of the first light, the light-emitting device emitting second light having a wavelength in air; and a first converging lens on an optical path of the second light. The light-emitting device comprises: a photoluminescent layer that emits the second light by being excited by the first light; and a light-transmissive layer on the photoluminescent layer. At least one of the photoluminescent layer and the light-transmissive layer has a surface structure comprising projections or recesses arranged perpendicular to a thickness direction of the photoluminescent layer. At least one of the photoluminescent layer and the light-transmissive layer has a light emitting surface perpendicular to the thickness direction, the second light emitted from the light emitting surface. The surface structure limits the directional angle of the second light emittied from the light emitting surface.

12 Claims, 75 Drawing Sheets

(30) Foreign Application Priority Data

| Aug. 20, 2015 | (JP) | 2015-162405 |
| Aug. 20, 2015 | (JP) | 2015-163042 |
| Aug. 21, 2015 | (JP) | 2015-163680 |
| Aug. 21, 2015 | (JP) | 2015-163681 |
| Mar. 31, 2016 | (JP) | 2016-070837 |

(51) Int. Cl.
*H01S 5/00* (2006.01)
*F21V 5/04* (2006.01)
*F21Y 115/10* (2016.01)
*F21Y 115/30* (2016.01)

(52) U.S. Cl.
CPC ........ *F21Y 2115/10* (2016.08); *F21Y 2115/30* (2016.08)

(58) Field of Classification Search
USPC .................................................. 362/583, 558
See application file for complete search history.

(56) References Cited

U.S. PATENT DOCUMENTS

| 6,483,096 | B1 | 11/2002 | Kunz et al. |
| 6,728,034 | B1 | 4/2004 | Nakanishi et al. |
| 7,619,357 | B2 | 11/2009 | Onishi et al. |
| 7,699,482 | B2 | 4/2010 | Noguchi |
| 8,227,966 | B2 | 7/2012 | Wakabayashi et al. |
| 8,619,363 | B1 | 12/2013 | Coleman |
| 9,158,215 | B2 | 10/2015 | Yu |
| 9,515,239 | B2 | 12/2016 | Inada et al. |
| 9,518,215 | B2 | 12/2016 | Hirasawa et al. |
| 9,618,697 | B2 | 4/2017 | Inada et al. |
| 9,880,336 | B2 | 1/2018 | Inada et al. |
| 9,890,912 | B2 | 2/2018 | Hashiya et al. |
| 10,012,780 | B2 | 7/2018 | Inada et al. |
| 2002/0180348 | A1 | 12/2002 | Oda et al. |
| 2003/0021314 | A1 | 1/2003 | Yoshida et al. |
| 2003/0169792 | A1 | 9/2003 | Kim |
| 2004/0141108 | A1 | 7/2004 | Tanaka et al. |
| 2004/0233534 | A1 | 11/2004 | Nakanishi et al. |
| 2006/0039433 | A1 | 2/2006 | Simpson |
| 2006/0088066 | A1 | 4/2006 | He |
| 2007/0031097 | A1 | 2/2007 | Heikenfeld et al. |
| 2007/0103931 | A1 | 5/2007 | Lee et al. |
| 2007/0138479 | A1 | 6/2007 | Yamazaki et al. |
| 2007/0153860 | A1 | 7/2007 | Chang-Hasnain et al. |
| 2008/0069497 | A1 | 3/2008 | Tissot et al. |
| 2008/0089089 | A1 | 4/2008 | Hama et al. |
| 2008/0149916 | A1 | 6/2008 | Baba et al. |
| 2008/0258160 | A1 | 10/2008 | Do |
| 2008/0303419 | A1 | 12/2008 | Fukuda |
| 2009/0021153 | A1 | 1/2009 | Lee et al. |
| 2009/0040598 | A1 | 2/2009 | Ito |
| 2009/0040745 | A1 | 2/2009 | Nemchuk |
| 2009/0066241 | A1 | 3/2009 | Yokoyama |
| 2009/0129115 | A1 | 5/2009 | Fine et al. |
| 2009/0190068 | A1 | 7/2009 | Kawamura |
| 2009/0206325 | A1 | 8/2009 | Biwa |
| 2009/0267092 | A1 | 10/2009 | Fukshima et al. |
| 2009/0286337 | A1 | 11/2009 | Lee et al. |
| 2010/0074284 | A1 | 3/2010 | Aizawa et al. |
| 2010/0142189 | A1 | 6/2010 | Hong et al. |
| 2010/0164365 | A1 | 7/2010 | Yoshino et al. |
| 2010/0246210 | A1 | 9/2010 | Yashiro |
| 2010/0277887 | A1* | 11/2010 | Su ............................ H01L 33/44 362/19 |
| 2011/0101359 | A1 | 5/2011 | Kim et al. |
| 2011/0198563 | A1 | 8/2011 | Kim et al. |
| 2011/0198645 | A1 | 8/2011 | Jo et al. |
| 2012/0018705 | A1 | 1/2012 | Takazoe et al. |
| 2012/0106127 | A1 | 5/2012 | Hattori et al. |
| 2012/0119638 | A1 | 5/2012 | Sato et al. |
| 2012/0176766 | A1 | 7/2012 | Natsumeda |
| 2012/0224378 | A1 | 9/2012 | Koike et al. |
| 2012/0286258 | A1 | 11/2012 | Naraoka et al. |
| 2012/0292652 | A1 | 11/2012 | Yamae et al. |
| 2013/0069046 | A1 | 3/2013 | Ishizuya |
| 2013/0181195 | A1 | 7/2013 | Cho et al. |
| 2013/0208327 | A1 | 8/2013 | Bolle et al. |
| 2013/0277703 | A1 | 10/2013 | Matsuzaki |
| 2013/0308102 | A1 | 11/2013 | Natsumeda et al. |
| 2014/0022818 | A1 | 1/2014 | Natsumeda et al. |
| 2014/0071683 | A1* | 3/2014 | Hamada ................. C09K 11/08 362/259 |
| 2014/0092620 | A1 | 4/2014 | Tissot |
| 2014/0185316 | A1 | 7/2014 | Kim et al. |
| 2014/0306176 | A1 | 10/2014 | Chiu et al. |
| 2014/0362604 | A1 | 12/2014 | Masuda |
| 2015/0085469 | A1 | 3/2015 | Kamee |
| 2015/0249183 | A1 | 9/2015 | Hirasawa et al. |
| 2015/0249186 | A1 | 9/2015 | Inada et al. |
| 2015/0249187 | A1 | 9/2015 | Inada et al. |
| 2015/0252964 | A1* | 9/2015 | Takahashi ................. F21K 9/60 362/84 |
| 2016/0265746 | A1 | 9/2016 | Hirasawa et al. |
| 2016/0265747 | A1 | 9/2016 | Nagao et al. |
| 2016/0265749 | A1 | 9/2016 | Inada |
| 2017/0012232 | A1 | 1/2017 | Kataishi et al. |
| 2017/0075169 | A1 | 3/2017 | Hayama |

FOREIGN PATENT DOCUMENTS

| JP | 2001-059905 | 3/2001 |
| JP | 2001-155520 | 6/2001 |
| JP | 2006-269294 A | 10/2006 |
| JP | 2007-103901 | 4/2007 |
| JP | 2007-240641 | 9/2007 |
| JP | 2008-130279 | 6/2008 |
| JP | 2008-521211 | 6/2008 |
| JP | 2008-521211 A | 6/2008 |
| JP | 2008-227458 | 9/2008 |
| JP | 2009-140894 | 6/2009 |
| JP | 2010-015874 | 1/2010 |
| JP | 2010-033772 | 2/2010 |
| JP | 2010-035922 A | 2/2010 |
| JP | 2010-097179 | 4/2010 |
| JP | 2010-199357 | 9/2010 |
| JP | 2010-210824 | 9/2010 |
| JP | 2010-210824 A | 9/2010 |
| JP | 2010-231941 | 10/2010 |
| JP | 2010-237311 | 10/2010 |
| JP | 2011-166148 | 8/2011 |
| JP | 2011-166148 A | 8/2011 |
| JP | 2012-093454 | 5/2012 |
| JP | 2012-109334 | 6/2012 |
| JP | 2012-109400 | 6/2012 |
| JP | 2012-182376 | 9/2012 |
| JP | 2013-183020 | 9/2013 |
| JP | 2014-075584 | 4/2014 |
| JP | 2014-082401 | 5/2014 |
| JP | 2014-082401 A | 5/2014 |
| JP | 2014-092645 | 5/2014 |
| JP | 2014-523603 | 9/2014 |
| WO | 2007/034827 | 3/2007 |
| WO | 2007/034827 A1 | 3/2007 |
| WO | 2007/091687 | 8/2007 |
| WO | 2009/005311 | 1/2009 |
| WO | 2009/099211 | 8/2009 |
| WO | 2011/040528 | 4/2011 |
| WO | 2012/049905 | 4/2012 |
| WO | 2012/108384 | 8/2012 |
| WO | 2012/137583 A1 | 10/2012 |
| WO | 2012/137584 | 10/2012 |
| WO | 2013/084442 | 6/2013 |
| WO | 2013/125567 | 8/2013 |
| WO | 2013/172025 | 11/2013 |
| WO | 2013/172025 A1 | 11/2013 |
| WO | 2014/024218 | 2/2014 |
| WO | 2014/119783 | 8/2014 |
| WO | 2015/045886 | 4/2015 |

(56) References Cited

FOREIGN PATENT DOCUMENTS

OTHER PUBLICATIONS

Non-Final Office Action issued in U.S. Appl. No. 15/169,771, dated Aug. 16, 2017.
Non-Final Office Action issued in U.S. Appl. No. 15/214,803, dated Aug. 8, 2017.
Non-Final Office Action issued in U.S. Appl. No. 15/214,837, dated Sep. 12, 2017.
Non-Final Office Action issued in U.S. Appl. No. 15/215,595, dated Jul. 28, 2017.
Notice of Allowance issued in U.S. Appl. No. 15/215,595, dated Sep. 22, 2017.
Non-Final Office Action issued in U.S. Appl. No. 15/215,599, dated Aug. 25, 2017.
Non-Final Office Action issued in U.S. Appl. No. 15/219,462, dated Sep. 26, 2017.
Notice of Allowance issued in U.S. Appl. No. 15/169,771, dated Oct. 24, 2017.
Specification of U.S. Appl. No. 15/446,453, filed Mar. 1, 2017.
Non-Final Office Action issued in U.S. Appl. No. 15/216,669, dated Apr. 14, 2017.
Non-Final Office Action issued in U.S. Appl. No. 15/060,574, dated Jan. 16, 2018.
Final Office Action issued in U.S. Appl. No. 15/214,803, dated Feb. 5, 2018.
Non-final Office Action issued in U.S. Appl. No. 14/618,591, dated Nov. 9, 2015.
Final Office Action issued in U.S. Appl. No. 14/618,591, dated May 19, 2016.
Non-final Office Action issued in U.S. Appl. No. 14/618,254, dated Feb. 3, 2016.
Non-Final Office Action issued in U.S. Appl. No. 14/621,729, dated Mar. 9, 2016.
Final Office Action issued in U.S. Appl. No. 14/621,729, dated Sep. 28, 2016.
International Search Report of PCT application No. PCT/JP2015/000810 dated Apr. 7, 2015.
International Search Report of PCT application No. PCT/JP2015/000811 dated Apr. 7, 2015.
International Search Report of PCT application No. PCT/JP2015/000812 dated Apr. 7, 2015.
International Search Report of PCT application No. PCT/JP2015/000813 dated May 19, 2015.
International Search Report of PCT application No. PCT/JP2015/000814 dated May 26, 2015.
International Search Report of PCT application No. PCT/JP2015/000815 dated Apr. 7, 2015.
International Search Report of PCT application No. PCT/JP2014/004324 dated Nov. 25, 2014; with English translation.
Specification of U.S. Appl. No. 15/166,123, filed May 26, 2016.
Specification of U.S. Appl. No. 15/169,771, filed Jun. 1, 2016.
Specification of U.S. Appl. No. 15/214,523, filed Jul. 20, 2016.
Specification of U.S. Appl. No. 15/214,803, filed Jul. 20, 2016.
Specification of U.S. Appl. No. 15/214,837, filed Jul. 20, 2016.
Specification of U.S. Appl. No. 15/215,592, filed Jul. 21, 2016.
Specification of U.S. Appl. No. 15/215,595, filed Jul. 21, 2016.
Specification of U.S. Appl. No. 15/215,599, filed Jul. 21, 2016.
Specification of U.S. Appl. No. 15/216,669, filed Jul. 21, 2016.
Specification of U.S. Appl. No. 15/216,686, filed Jul. 21, 2016.
Specification of U.S. Appl. No. 15/219,462, filed Jul. 26, 2016.
Notice of Allowance issued in U.S. Appl. No. 15/060,564, dated Mar. 21, 2018.
Notice of Allowance issued in U.S. Appl. No. 15/216,686, dated Mar. 26, 2018.
Final Office Action issued in U.S. Appl. No. 15/215,592, dated Apr. 9, 2018.
Non-Final Office Action issued in U.S. Appl. No. 15/219,462, dated Feb. 28, 2018.
Notice of Allowance issued in U.S. Appl. No. 15/214,523 dated Aug. 10, 2018.
Notice of Allowance issued in U.S. Appl. No. 15/060,574 dated Sep. 12, 2018.
English translation of Search Report for Chinese application No. 201610261401.1, dated Dec. 29, 2018.
English translation of Search Report for Chinese application No. 201610256719.0, dated Dec. 29, 2018.

* cited by examiner $(NA_{lens} > \sin\theta)$

USUS 10,359,155 B2

LIGHT-EMITTING APPARATUS

BACKGROUND

1. Technical Field

The present disclosure relates to a light-emitting apparatus and more particularly to a light-emitting apparatus having a photoluminescent layer.

2. Description of the Related Art

Optical devices, such as lighting fixtures, displays and projectors, which output light in the necessary direction, are required for many applications. Photoluminescent materials, such as those used for fluorescent lamps and white light-emitting diodes (LEDs), emit light in all directions. Thus, those materials are used in combination with optical elements such as reflectors and lenses to emit light only in a particular direction. For example, Japanese Unexamined Patent Application Publication No. 2010-231941 discloses a lighting system including a light distributor and an auxiliary reflector to provide sufficient directionality.

An optical component, such as a reflector or lens, in an optical device increases the size of the optical device. Thus, miniaturization of such an optical component can advantageously decrease the size of the optical device.

SUMMARY

In one general aspect, the techniques disclosed here feature a light-emitting apparatus that includes an excitation light source that emits first light; a light-emitting device on an optical path of the first light, the light-emitting device emitting second light having a wavelength $\lambda_a$ in air; and a first converging lens on an optical path of the second light. The light-emitting device comprises: a photoluminescent layer that emits the second light by being excited by the first light; and a light-transmissive layer on the photoluminescent layer. At least one of the photoluminescent layer and the light-transmissive layer has a surface structure comprising projections or recesses arranged perpendicular to a thickness direction of the photoluminescent layer. At least one of the photoluminescent layer and the light-transmissive layer has a light emitting surface perpendicular to the thickness direction, the second light emitted from the light emitting surface. The surface structure limits the directional angle of the second light emittied from the light emitting surface.

General or specific embodiments may be implemented as a device, an apparatus, a system, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 90 is a schematic view of still another light-emitting apparatus for synthesizing light beams emitted from light sources;

FIG. 91 is a schematic view of still another light-emitting apparatus for synthesizing light beams emitted from light sources;

FIG. 92 is a schematic view of still another light-emitting apparatus for synthesizing light beams emitted from light sources;

FIG. 93 is a schematic view of still another light-emitting apparatus for synthesizing light beams emitted from light sources;

FIG. 94 is a schematic view of still another light-emitting apparatus for synthesizing light beams emitted from light sources;

FIG. 95 is a schematic view of still another light-emitting apparatus for synthesizing light beams emitted from light sources;

FIG. 96 is a schematic view of a household fiber lighting system as an application example;

FIG. 97 is a schematic view of a light-emitting apparatus for synthesizing light beams in different wavelength ranges emitted in different directions from a light-emitting device;

FIG. 98 is a detailed view of a light-emitting apparatus for synthesizing light beams in different wavelength ranges;

FIG. 99 is a schematic view of a light-emitting apparatus for producing white light by synthesizing light beams of three particular wavelengths;

FIG. 100 is a schematic view illustrating first light in a first direction and second light in a second direction emitted from a light-emitting device into different optical fibers;

FIG. 101 is a schematic view of another light-emitting apparatus including coupled optical fibers;

Figure 97:
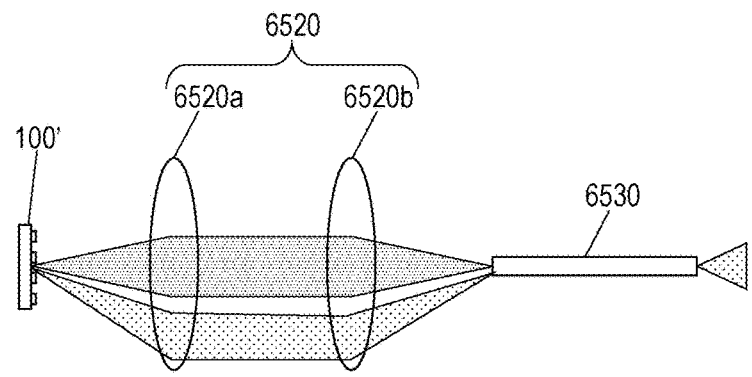
Figure 100:
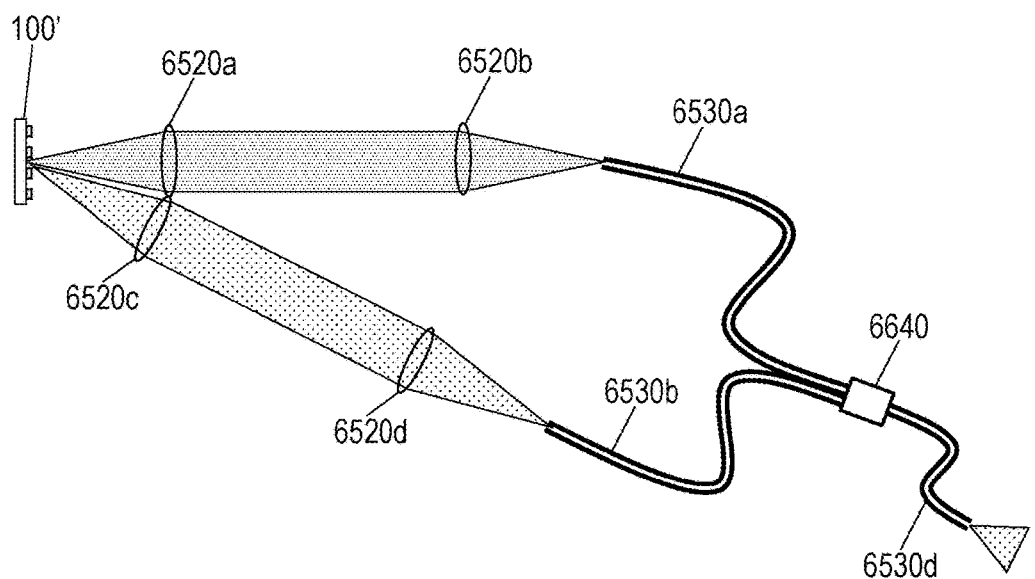
Figure 101:
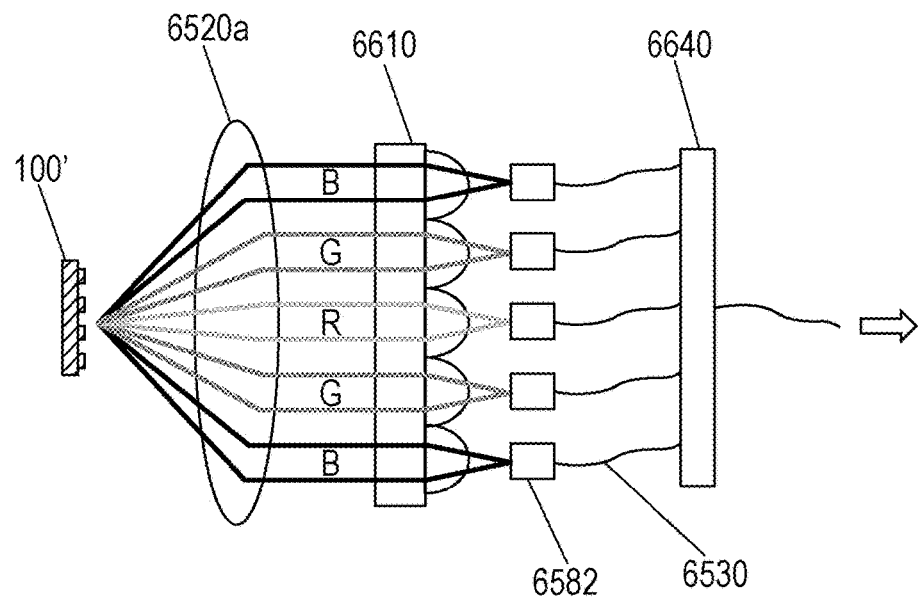
Figure 102:
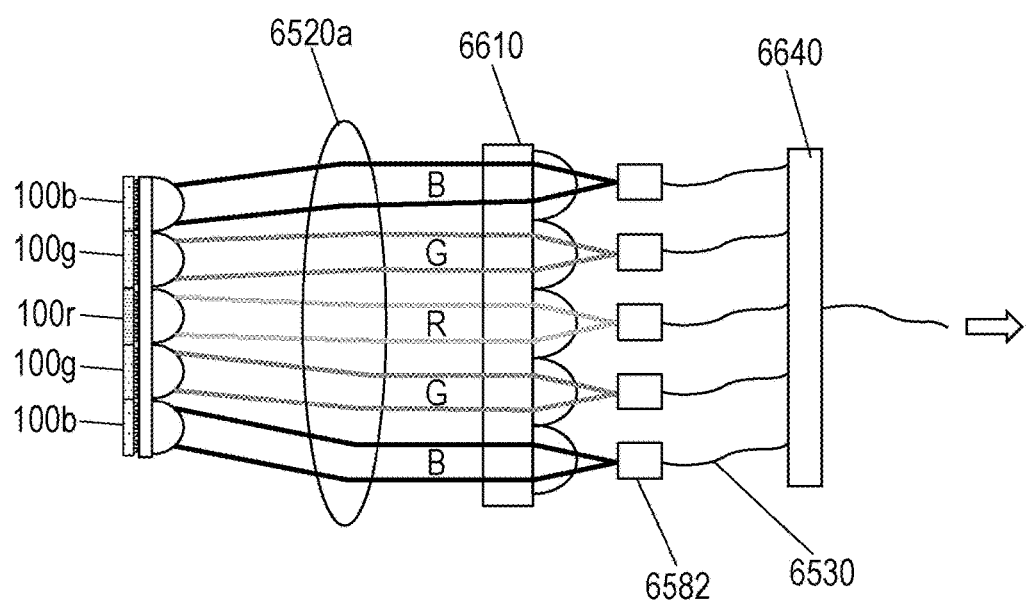
Figure 103:
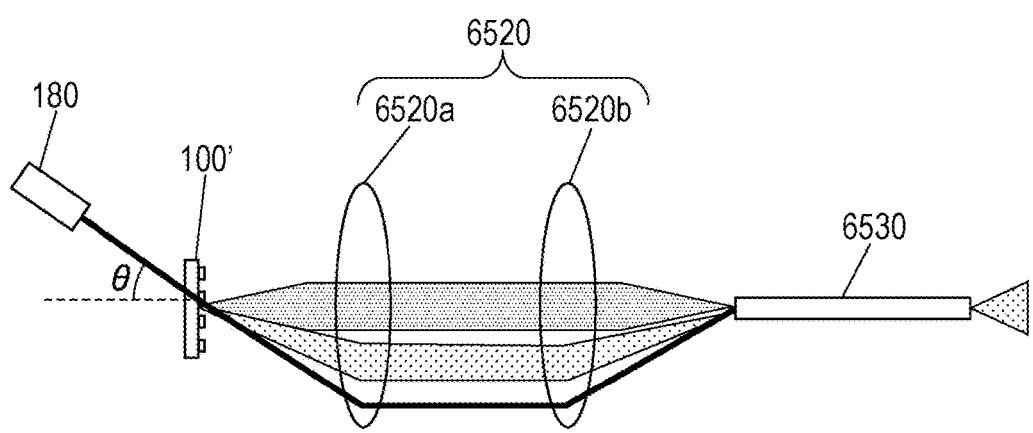
Figure 104:
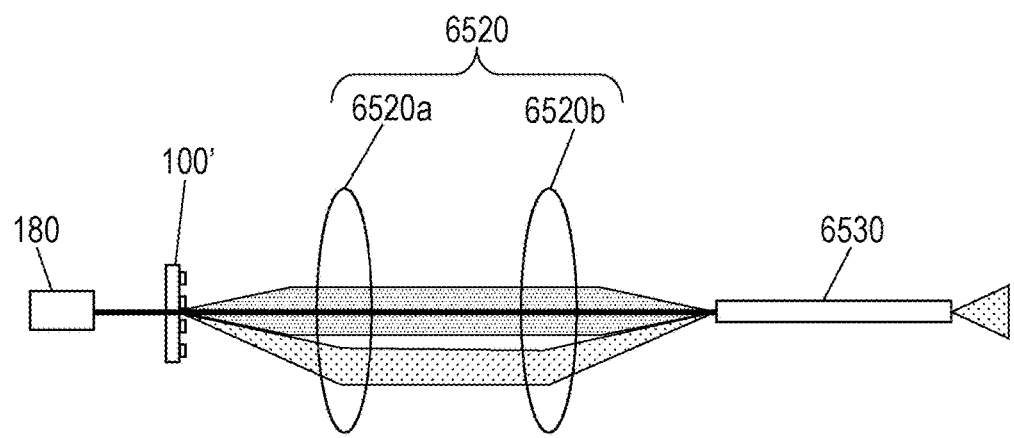
Figure 105:
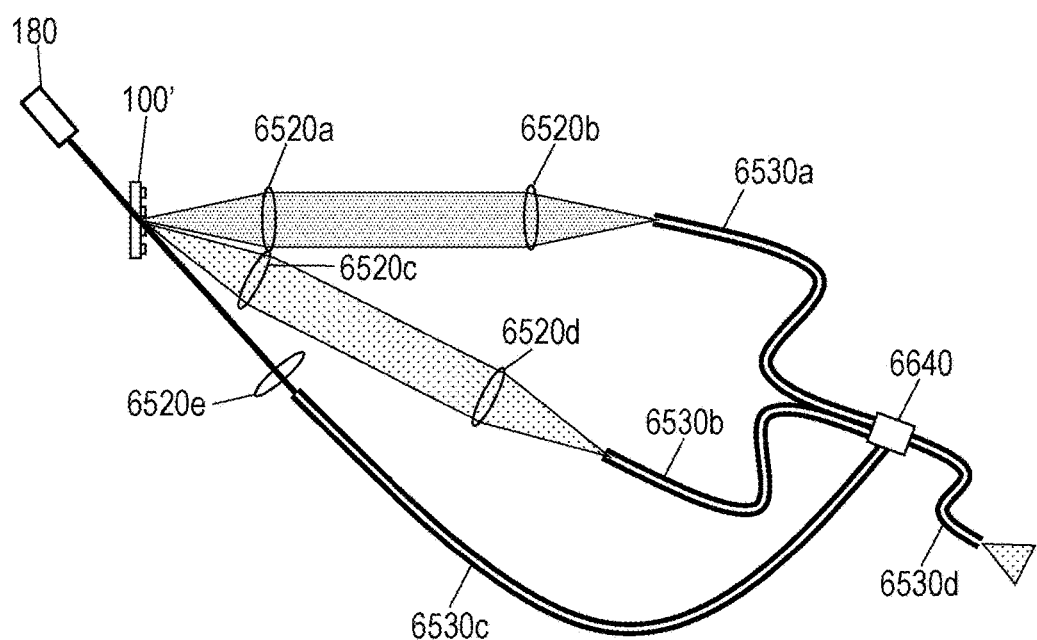
Figure 106:
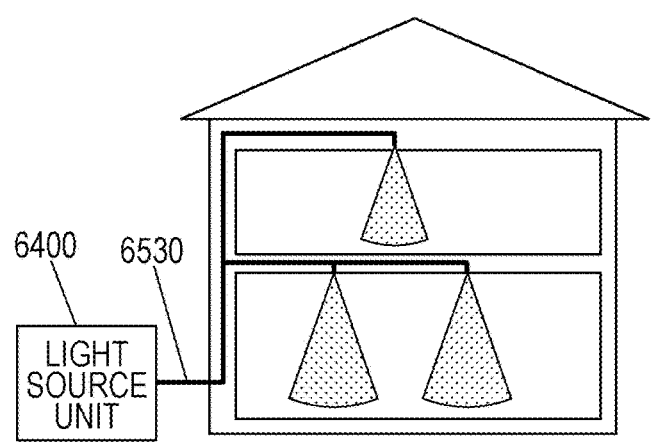
Figure 107:
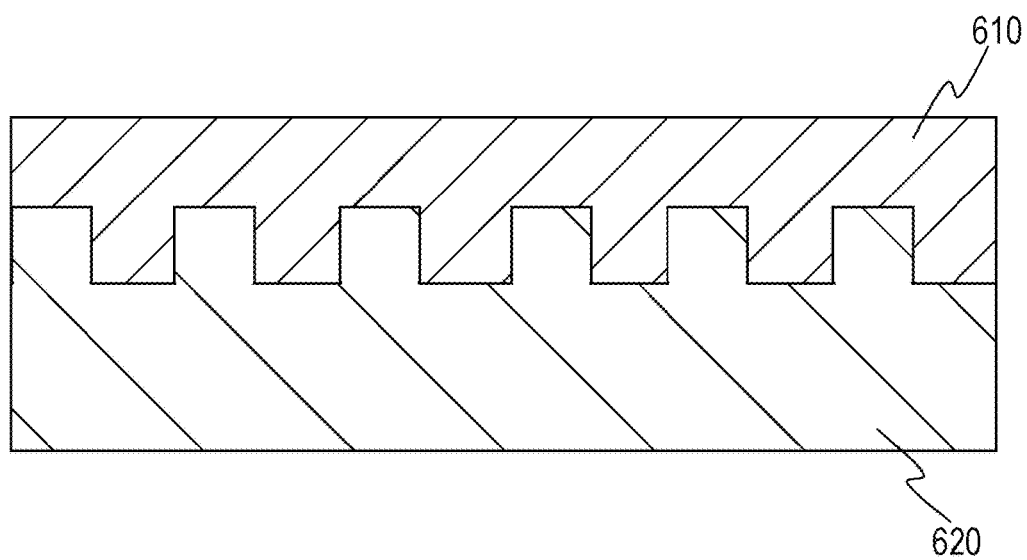

FIG. 102 is a schematic view of a structure including tiled light-emitting devices instead of the light-emitting device illustrated in FIG. 101;

FIG. 103 is a schematic view of a structure in which part of light emitted from an excitation light source is utilized in the structure illustrated in FIG. 97;

FIG. 104 is a schematic view of a structure in which the position of the excitation light source illustrated in FIG. 103 was changed;

FIG. 105 is a schematic view of a structure in which part of light emitted from an excitation light source is utilized in the structure illustrated in FIG. 100;

FIG. 106 is a schematic view of a household fiber lighting system as an application example; and FIG. 107 is a schematic cross-sectional view of a surface structure having projections or recesses or both.

DETAILED DESCRIPTION

A light-emitting apparatus according to an embodiment of the present disclosure includes an excitation light source, a light-emitting device on an optical path of excitation light emitted from the excitation light source, and a converging lens on an optical path of light emitted from the light-emitting device. The light-emitting device includes a photoluminescent layer for emitting light having a wavelength $\lambda_a$ in air upon receiving excitation light. As will be described in detail later, a light-emitting device of a light-emitting apparatus according to the present disclosure has a novel structure in which the luminous efficiency, directionality, or polarization characteristics of a photoluminescent material can be controlled. An embodiment of the present disclosure can provide a light-emitting apparatus having a novel structure that utilizes a photoluminescent material. A light-emitting device for use in a light-emitting apparatus according to the present disclosure will be described below. The entire structure of the light-emitting apparatus will be described in detail later.

A light-emitting device according to an embodiment of the present disclosure includes a photoluminescent layer, a light-transmissive layer located on or near the photoluminescent layer, and a surface structure formed on a surface of at least one of the photoluminescent layer and the light-transmissive layer and having projections or recesses or both. The surface structure limits the directional angle of the light having the wavelength $\lambda_a$ in air emitted from the photoluminescent layer. The surface structure may be a submicron structure on the photoluminescent layer or light-transmissive layer. For example, the submicron structure may be a periodic structure having projections or recesses or both. For example, the submicron structure has projections or recesses. Light from the photoluminescent layer includes first light having a wavelength $\lambda_a$ in air, and the distance $D_{int}$ between adjacent projections or recesses and the refractive index $n_{wav-a}$ of the photoluminescent layer for the first light satisfy $\lambda_a/n_{wav-a}<D_{int}<\lambda_a$. In other words, the periodic structure has a period $p_a$ that satisfies $\lambda_a/n_{wav-a}<p_a<\lambda_a$. The wavelength $\lambda_a$ may be in the visible wavelength range (for example, 380 to 780 nm). When infrared light is used, the wavelength $\lambda_a$ may be more than 780 nm. When ultraviolet light is used, the wavelength $\lambda_a$ may be less than 380 nm. In the present disclosure, all electromagnetic waves, including infrared light and ultraviolet light, are referred to as "light" for convenience.

The photoluminescent layer contains a photoluminescent material. The term "photoluminescent material" refers to a material that emits light in response to excitation light. The term "photoluminescent material" encompasses fluorescent materials and phosphorescent materials in a narrow sense, encompasses inorganic materials and organic materials (for example, dyes), and encompasses quantum dots (that is, tiny semiconductor particles). The photoluminescent layer may contain a matrix material (host material) in addition to the photoluminescent material. Examples of matrix materials include resins and inorganic materials, such as glasses and oxides.

The light-transmissive layer located on or near the photoluminescent layer is formed of a material, for example, an inorganic material or resin, having high transmittance to light emitted from the photoluminescent layer. For example, the light-transmissive layer can be formed of a dielectric material (particularly, an insulator having low light absorptivity). The light-transmissive layer may also be a substrate that supports the photoluminescent layer. If the surface of the photoluminescent layer exposed to air has a submicron structure, an air layer can serve as the light-transmissive layer.

A surface structure having projections or recesses or both is formed on a surface of at least one of the photoluminescent layer and the light-transmissive layer. The term "surface", as used herein, refers to a portion in contact with another substance (that is, an interface). If the light-transmissive layer is a gas layer, such as air, the interface between the gas layer and another substance (for example, the photoluminescent layer) is a surface of the light-transmissive layer. This surface structure can also be referred to as a "texture". The surface structure typically has projections or recesses periodically arranged in one or two dimension. Such a surface structure can be referred to as a "periodic structure". The projections and recesses are formed at the boundary between two adjoining members (or media) having different refractive indices. Thus, the "periodic structure" has a refractive index that varies periodically in a certain direction. The term "periodically" refers not only to periodically in the strict sense but also to approximately periodically. In the present specification, the distance between any two adjacent centers (hereinafter also referred to as the "center distance") of continuous projections or recesses in a periodic structure having a period p varies within ±15% of p.

The term "projection", as used herein, refers to a raised portion higher than the reference height. The term "recess", as used herein, refers to a recessed portion lower than the reference height. When projections and recesses have a particular shape, size, or distribution, it may be difficult to distinguish between projections and recesses. For example, in a cross-sectional view of FIG. 107, a member 610 has recesses, and a member 620 has projections, or alternatively the member 610 has projections, and the member 620 has recesses. In either case, each of the member 610 and the member 620 has projections or recesses or both.

The distance between the centers of two adjacent projections or recesses in the surface structure (the period p in the case of a periodic structure) is typically shorter than the wavelength $\lambda_a$ in air of light emitted from the photoluminescent layer. The distance is submicron if light emitted from the photoluminescent layer is visible light, near-infrared light having a short wavelength, or ultraviolet light. Thus, such a surface structure is sometimes referred to as a "submicron structure". The "submicron structure" may partly have a center distance or period of more than 1 micrometer (μm). In the following description, it is assumed that the photoluminescent layer principally emits visible light, and the surface structure may be a "submicron structure". However, the following description can also be applied to a surface structure having a micrometer structure (for example, a micrometer structure used in combination with infrared light).

In an embodiment of the present disclosure, a unique electric field distribution is formed inside the photoluminescent layer and the light-transmissive layer, as described in detail later with reference to the results of calculations and experiments. Such an electric field distribution is formed by an interaction between guided light and a submicron structure (that is, a surface structure). Such an electric field distribution is formed in an optical mode referred to as a "quasi-guided mode". A quasi-guided mode can be utilized to improve the luminous efficiency, directionality, and polarization selectivity of photoluminescence, as described later. The term "quasi-guided mode" may be used in the following description to describe novel structures and/or mechanisms contemplated by the present inventors. Such a description is for illustrative purposes only and is not intended to limit the present disclosure in any way.

For example, the submicron structure has projections and satisfies the relationship $\lambda_a/n_{wav-a}<D_{int}<\lambda_a$, where $D_{int}$ is the center-to-center distance between adjacent projections. Instead of the projections, the submicron structure may have recesses. For simplicity, the following description will be directed to a submicron structure having projections. The symbol λ denotes the wavelength of light, and the symbol $\lambda_a$ with a subscript "a" denotes the wavelength of light in air. The symbol $n_{wav}$ denotes the refractive index of the photoluminescent layer. If the photoluminescent layer is formed of a medium containing a mixture of materials, the refractive index $n_{wav}$ represents the average of the refractive indices of the materials weighted by their respective volume fractions. Although it is desirable to use the symbol $n_{wav-a}$ to refer to the refractive index for light having a wavelength $\lambda_a$ because the refractive index n generally depends on the wavelength, it may be abbreviated for simplicity. The symbol $n_{wav}$ basically denotes the refractive index of the photoluminescent layer, however, if a layer having a higher refractive index than the photoluminescent layer is adjacent to the photoluminescent layer, the refractive index $n_{wav}$ represents the average of the refractive indices of the layer having the higher refractive index and the photoluminescent layer weighted by their respective volume fractions. This situation is optically equivalent to a photoluminescent layer composed of layers of different materials.

The effective refractive index $n_{eff}$ of the medium for light in a quasi-guided mode satisfies $n_a<n_{eff}<n_{wav}$, wherein $n_a$ denotes the refractive index of air. If light in a quasi-guided mode propagates through the photoluminescent layer while being totally reflected at an incident angle θ, the effective refractive index $n_{eff}$ can be written as $n_{eff}=n_{wav} \sin θ$. The effective refractive index $n_{eff}$ is determined by the refractive index of the medium present in the region where the electric field of a quasi-guided mode is distributed. For example, if the submicron structure is formed in the light-transmissive layer, the effective refractive index $n_{eff}$ depends not only on the refractive index of the photoluminescent layer but also on the refractive index of the light-transmissive layer. Because the electric field distribution also varies with the polarization direction of a quasi-guided mode (TE mode or TM mode), the effective refractive index $n_{eff}$ can differ between the TE mode and the TM mode.

The submicron structure is formed on at least one of the photoluminescent layer and the light-transmissive layer. If the photoluminescent layer and the light-transmissive layer are in contact with each other, the submicron structure may be formed at the interface between the photoluminescent layer and the light-transmissive layer. In such a case, the photoluminescent layer and the light-transmissive layer have the submicron structure. The photoluminescent layer may have no submicron structure. In such a case, a light-transmissive layer having a submicron structure is located on or near the photoluminescent layer. A phrase like "a light-transmissive layer (or its submicron structure) located on or near the photoluminescent layer", as used herein, typically means that the distance between these layers is less than half the wavelength $\lambda_a$. This allows the electric field in a guided mode to reach the submicron structure, thus forming a quasi-guided mode. However, the distance between the submicron structure of the light-transmissive layer and the photoluminescent layer may exceed half the wavelength $\lambda_a$ if the light-transmissive layer has a higher refractive index than the photoluminescent layer, because light reaches the light-transmissive layer even if the above relationship is not satisfied. In the present specification, if the photoluminescent layer and the light-transmissive layer have a positional relationship that allows the electric field in a guided mode to reach the submicron structure and form a quasi-guided mode, they may be associated with each other.

If the submicron structure satisfies $\lambda_a/n_{wav-a}<D_{int}<\lambda_a$ as described above, the surface structure is characterized by a submicron size in applications utilizing visible light. The submicron structure can include at least one periodic structure, as in the light-emitting devices of light-emitting apparatuses according to the embodiments described in detail later. The at least one periodic structure has a period $p_a$ that can satisfy $\lambda_a/n_{wav-a}<p_a<\lambda_a$. Thus, the submicron structure can include a periodic structure in which the distance $D_{int}$ between adjacent projections is constant at $p_a$. If the submicron structure includes such a periodic structure, light in a quasi-guided mode propagates while repeatedly interacting with the periodic structure so that the light is diffracted by the submicron structure. Unlike the phenomenon in which light propagating through free space is diffracted by a periodic structure, this is the phenomenon in which light is guided (that is, repeatedly totally reflected) while interacting with the periodic structure. This can efficiently diffract light even if the periodic structure causes a small phase shift (that is, even if the periodic structure has a small height).

The above mechanism can be utilized to improve the luminous efficiency of photoluminescence by the enhancement of the electric field due to a quasi-guided mode and also to couple emitted light to the quasi-guided mode. The angle of travel of light in a quasi-guided mode is changed by the angle of diffraction determined by the periodic structure. This can be utilized to emit light having a particular wavelength in a particular direction. This can significantly improve directionality as compared with submicron structures including no periodic structure. Furthermore, high polarization selectivity can be simultaneously achieved because the effective refractive index $n_{eff}$ ($=n_{wav} \sin θ$) differs between the TE mode and the TM mode. For example, as demonstrated by the experimental examples below, a light-emitting device can be provided that emits intense linearly polarized light (for example, the TM mode) of a particular wavelength (for example, 610 nm) in the front direction. The directional angle of light emitted in the front direction is less than 15 degrees, for example. The term "directional angle", as used herein, refers to the angle between the direction of maximum intensity and the direction of 50% of the maximum intensity of linearly polarized light having a particular wavelength to be emitted. In other words, the term "directional angle" refers to the angle of one side with respect to the direction of maximum intensity, which is assumed to be 0 degrees. Thus, the periodic structure (that is, surface structure) in an embodiment of the present disclosure limits the directional angle of light having a particular wavelength $\lambda_a$. In other words, the distribution of light having the wavelength $\lambda_a$ is narrowed as compared with submicron structures including no periodic structure. Such a light distribution in which the directional angle is narrowed as compared with submicron structures including no periodic structure is sometimes referred to as a "narrow-angle light distribution". Although the periodic structure in an embodiment of the present disclosure limits the directional angle of light having the wavelength $\lambda_a$, the periodic structure does not necessarily emit the entire light having the wavelength $\lambda_a$ at narrow angles. For example, in an embodiment described later in FIG. 29, light having the wavelength $\lambda_a$ is slightly emitted in a direction (for example, at an angle in the range of 20 to 70 degrees) away from the direction of maximum intensity. However, as a whole, emitted light having the wavelength $\lambda_a$ mostly has an angle in the range of 0 to 20 degrees and has limited directional angles.

Unlike general diffraction gratings, the periodic structure in a typical embodiment of the present disclosure has a shorter period than the light wavelength $\lambda_a$. General diffraction gratings have a sufficiently longer period than the light wavelength $\lambda_a$, and consequently light having a particular wavelength is divided into diffracted light emissions, such as zero-order light (that is, transmitted light) and ±1-order diffracted light. In such diffraction gratings, higher-order diffracted light is generated on both sides of zero-order light. Higher-order diffracted light generated on both sides of zero-order light in diffraction grating makes it difficult to provide a narrow-angle light distribution. In other words, known diffraction gratings do not have the effect of limiting the directional angle of light to a predetermined angle (for example, approximately 15 degrees), which is a characteristic effect of an embodiment of the present disclosure. In this regard, the periodic structure according to an embodiment of the present disclosure is significantly different from known diffraction gratings.

A submicron structure having lower periodicity results in lower directionality, luminous efficiency, polarization, and wavelength selectivity. The periodicity of the submicron structure may be adjusted depending on the need. The periodic structure may be a one-dimensional periodic structure, which has higher polarization selectivity, or a two-dimensional periodic structure, which allows for lower polarization.

The submicron structure may include periodic structures. For example, these periodic structures may have different periods (pitches) or different periodic directions (axes). The periodic structures may be formed on the same plane or may be stacked on top of each other. The light-emitting device may include photoluminescent layers and light-transmissive layers, and each of the layers may have submicron structures.

The submicron structure can be used not only to control light emitted from the photoluminescent layer but also to efficiently guide excitation light into the photoluminescent layer. That is, excitation light can be diffracted by the submicron structure and coupled to a quasi-guided mode that guides light in the photoluminescent layer and the light-transmissive layer and thereby can efficiently excite the photoluminescent layer. The submicron structure satisfies $\lambda_{ex}/n_{wav-ex} < D_{int} < \lambda_{ex}$, wherein $\lambda_{ex}$ denotes the wavelength of excitation light in air, the excitation light exciting the photoluminescent material, and $n_{wav-ex}$ denotes the refractive index of the photoluminescent layer for the excitation light. The symbol $n_{wav-ex}$ denotes the refractive index of the photoluminescent layer at the emission wavelength of the photoluminescent material. Alternatively, the submicron structure may include a periodic structure having a period $p_{ex}$ that satisfies $\lambda_{ex}/n_{wav-ex} < p_{ex} < \lambda_{ex}$. The excitation light has a wavelength $\lambda_{ex}$ of 450 nm, for example, but may have a shorter wavelength than visible light. If the excitation light has a wavelength in the visible range, the excitation light may be emitted together with light emitted from the photoluminescent layer.

1. Underlying Knowledge Forming Basis of the Present Disclosure

The underlying knowledge forming the basis for the present disclosure will be described before describing specific embodiments of the present disclosure, and then an exemplary structure of a light-emitting device including a photoluminescent layer will be described. As described above, photoluminescent materials, such as those used for fluorescent lamps and white light-emitting diodes (LEDs), emit light in all directions. Thus, in general, such photoluminescent materials are used in combination with optical elements, such as reflectors and lenses, to emit light in a particular direction. However, the size of such an optical element, for example, a lens can be decreased if the photoluminescent layer itself emits directional light. This results in a significant reduction in the size of optical devices and equipment. With this idea in mind, the present inventors have conducted a detailed study on the photoluminescent layer to achieve directional light emission.

The present inventors have investigated the possibility of inducing light emission with particular directionality so that light from the photoluminescent layer is localized in a particular direction. Based on Fermi's golden rule, the emission rate Γ, which is a measure characterizing light emission, is represented by the formula (1):

$$\Gamma(r) = \frac{2\pi}{\hbar} \langle (d \cdot E(r)) \rangle^2 \rho(\lambda) \tag{1}$$

In the formula (1), r denotes the vector indicating the position, λ denotes the wavelength of light, d denotes the dipole vector, E denotes the electric field vector, and ρ denotes the density of states. In many substances other than some crystalline substances, the dipole vector d is randomly oriented. The magnitude of the electric field E is substantially constant irrespective of the direction if the size and thickness of the photoluminescent layer are sufficiently larger than the wavelength of light. Hence, in most cases, the value of $<(d \cdot E(r))>^2$ is independent of the direction. Accordingly, the emission rate Γ is constant irrespective of the direction. Thus, in most cases, the photoluminescent layer emits light in all directions.

As can be seen from the formula (1), to achieve anisotropic light emission, it is necessary to align the dipole vector d in a particular direction or to enhance a component of the electric field vector in a particular direction. One of these approaches can be employed to achieve directional light emission. Embodiments of the present disclosure utilize a quasi-guided mode in which an electric field component in a particular direction is enhanced by confinement of light in a photoluminescent layer. Structures for utilizing a quasi-guided mode have been studied and analyzed in detail as described below.

2. Structure for Enhancing Electric Field Only in Particular Direction

The present inventors have investigated the possibility of controlling light emission using a guided mode with an intense electric field. Light can be coupled to a guided mode using a waveguide structure that itself contains a photoluminescent material. However, a waveguide structure simply formed using a photoluminescent material emits little or no light in the front direction because the emitted light is coupled to a guided mode. Accordingly, the present inventors have investigated the possibility of combining a waveguide containing a photoluminescent material with a periodic structure. When the electric field of light is guided in a waveguide while overlapping with a periodic structure located on or near the waveguide, a quasi-guided mode is formed by the effect of the periodic structure. That is, a quasi-guided mode is a guided mode restricted by the periodic structure and is characterized in that the antinodes of the amplitude of the electric field have the same period as the periodic structure. Light in this mode is confined in the waveguide structure to enhance the electric field in a particular direction. This mode also interacts with the periodic structure and undergoes diffraction, so that light in this mode is converted into light propagating in a particular direction and can be emitted from the waveguide. The electric field of light other than quasi-guided modes is not enhanced because little or no such light is confined in the waveguide. Thus, most light is coupled to a quasi-guided mode with a large electric field component.

That is, the present inventors have investigated the possibility of using a photoluminescent layer containing a photoluminescent material as a waveguide (or a waveguide layer including a photoluminescent layer) in combination with a periodic structure located on or near the waveguide to couple light to a quasi-guided mode in which the light is converted into light propagating in a particular direction, thereby providing a directional light source.

Figure 30:
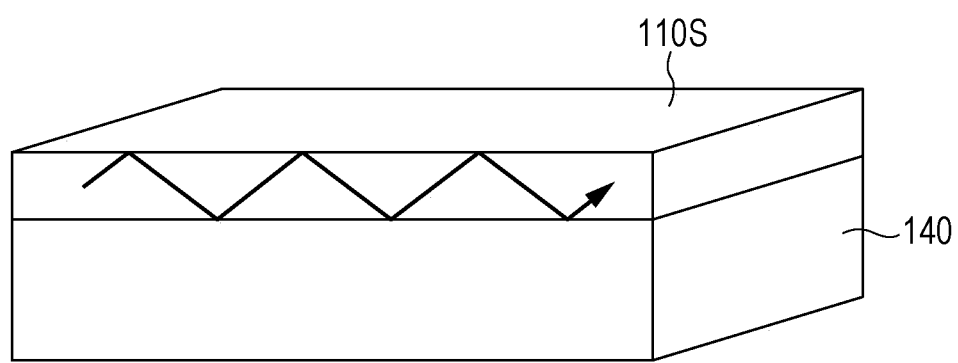
FIG. 30 is a schematic perspective view of a slab waveguide.

As a simple waveguide structure, the present inventors have studied slab waveguides. A slab waveguide has a planar structure in which light is guided. FIG. 30 is a schematic perspective view of a slab waveguide. In FIG. 30, there is a mode of light propagating through a waveguide 110S if the waveguide 110S has a higher refractive index than a substrate 140 that supports the waveguide 110S. If such a slab waveguide includes a photoluminescent layer, the electric field of light emitted from an emission point overlaps largely with the electric field of a guided mode. This allows most of the light emitted from the photoluminescent layer to be coupled to the guided mode. If the photoluminescent layer has a thickness close to the wavelength of light, a situation can be created where there is only a guided mode with a large electric field amplitude.

If a periodic structure is located on or near the photoluminescent layer, the electric field of a guided mode interacts with the periodic structure to form a quasi-guided mode. Even if the photoluminescent layer is composed of multiple layers, a quasi-guided mode can be formed as long as the electric field of a guided mode reaches the periodic structure. Not all of the photoluminescent layer needs to be formed of a photoluminescent material, provided that at least a portion of the photoluminescent layer functions to emit light.

If the periodic structure is made of a metal, a mode due to a guided mode and plasmon resonance is formed. This mode has different properties from the quasi-guided mode described above and is less effective in enhancing emission because a large loss occurs due to high absorption by the metal. Thus, it is advantageous to form the periodic structure using a dielectric material having low absorptivity.

Figure 1A:
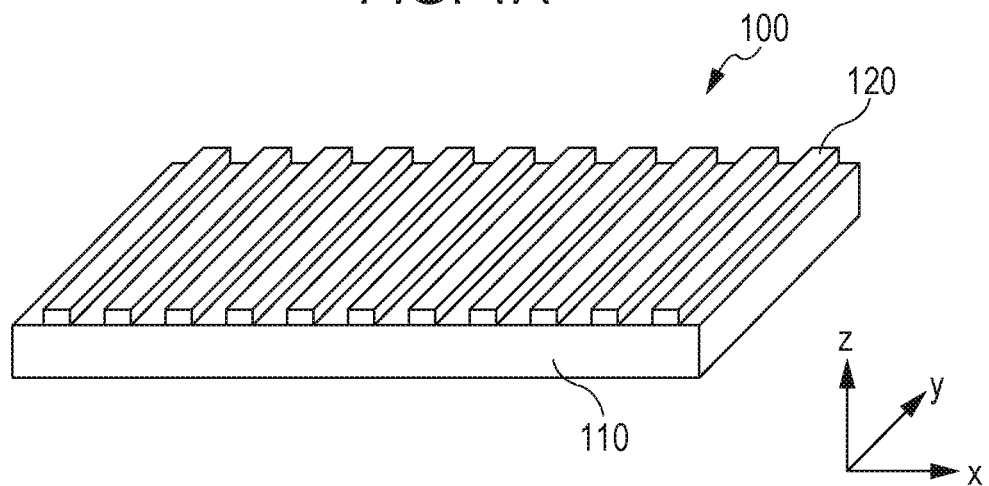
FIG. 1A is a perspective view of the structure of a light-emitting device according to an embodiment.
Figure 1B:
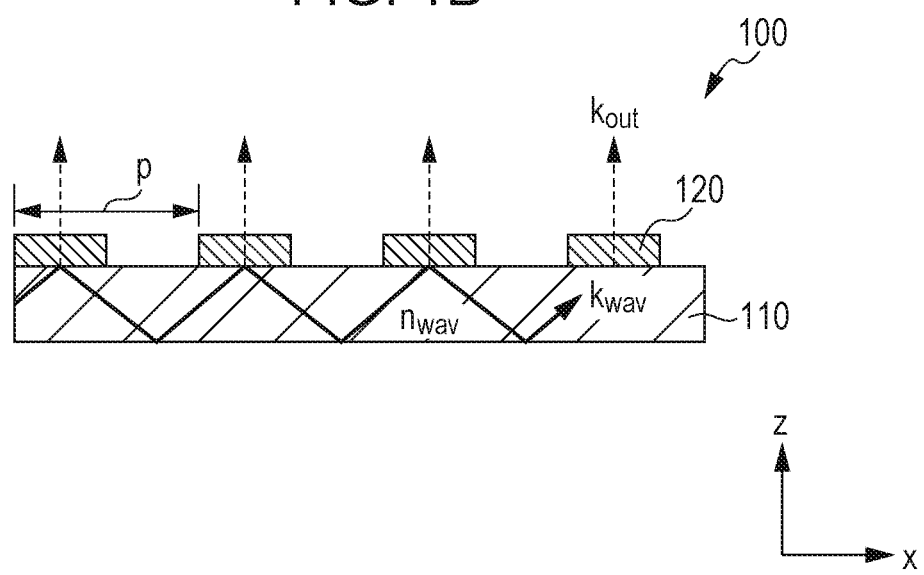
FIG. 1B is a fragmentary cross-sectional view of the light-emitting device illustrated in FIG. 1A.

The present inventors have studied the coupling of light to a quasi-guided mode that can be emitted as light propagating in a particular angular direction using a periodic structure formed on a waveguide. FIG. 1A is a schematic perspective view of a light-emitting device 100 including a waveguide (for example, a photoluminescent layer) 110 and a periodic structure (for example, part of a light-transmissive layer) 120. If the light-transmissive layer has a periodic structure (that is, if a periodic submicron structure is formed on the light-transmissive layer), the surface structure 120 is sometimes referred to as a "light-transmissive layer 120". In this example, the surface structure 120 is a one-dimensional periodic structure in which stripe-shaped projections extending in the y direction are arranged at regular intervals in the x direction. FIG. 1B is a cross-sectional view of the light-emitting device 100 taken along a plane parallel to the xz plane. If a periodic structure having a period p is provided in contact with the waveguide 110, a quasi-guided mode having a wave number $k_{wav}$ in the in-plane direction is converted into light propagating outside the waveguide 110. The wave number $k_{out}$ of the light can be represented by the formula (2):

$$k_{out} = k_{wav} - m\frac{2\pi}{p} \tag{2}$$

In the formula (2), m is an integer indicating the diffraction order.

For simplicity, light guided in the waveguide 110 is assumed to be a ray of light propagating at an angle $\theta_{wav}$. This approximation gives the formulae (3) and (4):

$$\frac{k_{wav}\lambda_0}{2\pi} = n_{wav}\sin\theta_{wav} \tag{3}$$

$$\frac{k_{out}\lambda_0}{2\pi} = n_{out}\sin\theta_{out} \tag{4}$$

In these formulae, $\lambda_0$ denotes the wavelength of the light in air, $n_{wav}$ denotes the refractive index of the waveguide 110, $n_{out}$ denotes the refractive index of the medium on the light emission side, and $\theta_{out}$ denotes the angle at which the light is emitted from the waveguide 110 to a substrate or to the air. From the formulae (2) to (4), the output angle $\theta_{out}$ can be represented by the equation (5):

$$n_{out}\sin\theta_{out} = n_{wav}\sin\theta_{wav} - m\lambda_0/p \tag{5}$$

If $n_{wav}\sin\theta_{wav} = m\lambda_0/p$ in the formula (5), this results in $\theta_{out}=0$, meaning that the light can be emitted in the direction perpendicular to the plane of the waveguide 110 (that is, in the front direction).

Based on this principle, light can be coupled to a particular quasi-guided mode and be converted into light having a particular output angle using the periodic structure to emit intense light in that direction.

There are some constraints to achieving the above situation. To form a quasi-guided mode, light propagating through the waveguide 110 has to be totally reflected. The conditions therefor are represented by the formula (6):

$$n_{out} < n_{wav}\sin\theta_{wav} \tag{6}$$

To diffract a quasi-guided mode using the periodic structure and thereby emit light from the waveguide 110, $-1 < \sin\theta_{out} < 1$ has to be satisfied in the formula (5). Hence, the following formula (7) has to be satisfied:

$$-1 < \frac{n_{wav}}{n_{out}}\sin\theta_{wav} - \frac{m\lambda_0}{n_{out}p} < 1 \tag{7}$$

Taking into account the formula (6), the formula (8) has to be satisfied:

$$\frac{m\lambda_0}{2n_{out}} < p \tag{8}$$

To emit light from the waveguide 110 in the front direction ($\theta_{out}=0$), as can be seen from the formula (5), the formula (9) has to be satisfied:

$$p = m\lambda_0/(n_{wav}\sin\theta_{wav}) \tag{9}$$

As can be seen from the formulae (9) and (6), the required conditions are represented by the formula (10):

$$\frac{m\lambda_0}{n_{wav}} < p < \frac{m\lambda_0}{n_{out}} \quad (10)$$

The periodic structure as illustrated in FIGS. 1A and 1B may be designed based on first-order diffracted light (that is, m=1) because higher-order diffracted light having m of 2 or more has low diffraction efficiency. In a typical embodiment of the present disclosure, the period p of the periodic structure is determined so as to satisfy the formula (11), which is given by substituting m=1 into the formula (10):

$$\frac{\lambda_0}{n_{wav}} < p < \frac{\lambda_0}{n_{out}} \quad (11)$$

If the waveguide (for example, the photoluminescent layer) 110 is not in contact with a transparent substrate, as illustrated in FIGS. 1A and 1B, $n_{out}$ is equal to the refractive index of air (approximately 1.0). Thus, the period p is determined so as to satisfy the formula (12):

$$\frac{\lambda_0}{n_{wav}} < p < \lambda_0 \quad (12)$$

Figure 1C:
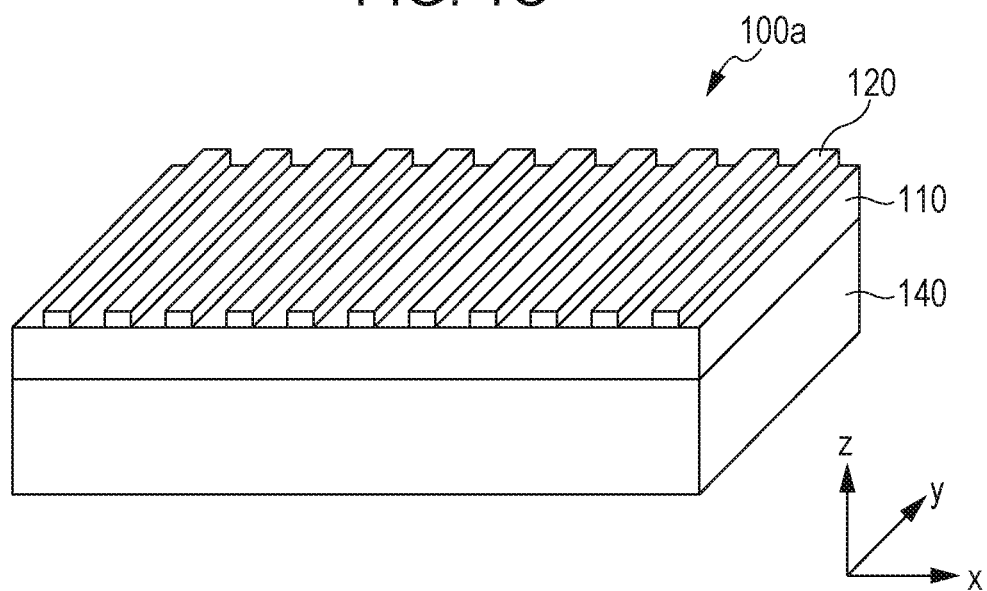
FIG. 1C is a perspective view of the structure of a light-emitting device according to another embodiment.
Figure 1D:
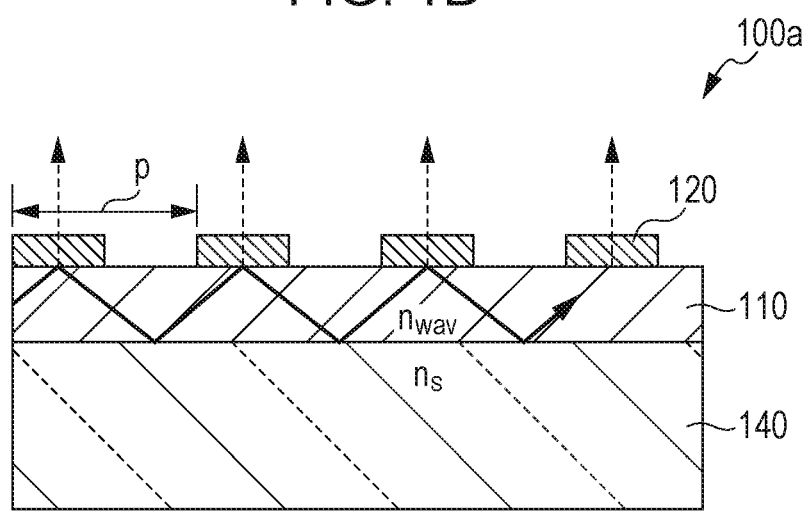
FIG. 1D is a fragmentary cross-sectional view of the light-emitting device illustrated in FIG. 1C.

Alternatively, a structure as illustrated in FIGS. 1C and 1D may be employed in which a photoluminescent layer serving as the waveguide 110 and the surface structure 120 are formed on a substrate 140. The substrate 140 is typically a transparent substrate. The substrate 140 is hereinafter also referred to as a transparent substrate 140.

When the waveguide 110 and the surface structure 120 are formed on the transparent substrate 140, since the refractive index $n_s$ of the transparent substrate 140 is higher than the refractive index of air, the period p is determined so as to satisfy the following formula (13), which is given by substituting $n_{out}=n_s$ into the formula (11):

$$\frac{\lambda_0}{n_{wav}} < p < \frac{\lambda_0}{n_s} \quad (13)$$

Although m=1 is assumed in the formula (10) to give the formulae (12) and (13), m may be 2 or more. That is, if both surfaces of the light-emitting device 100 are in contact with air layers, as shown in FIGS. 1A and 1B, the period p is determined so as to satisfy the formula (14):

$$\frac{m\lambda_0}{n_{wav}} < p < m\lambda_0 \quad (14)$$

wherein m is an integer of 1 or more.

Likewise, as in a light-emitting device 100a illustrated in FIGS. 1C and 1D, if a photoluminescent layer serving as the waveguide 110 is formed on the transparent substrate 140, the period p is determined so as to satisfy the following formula (15):

$$\frac{m\lambda_0}{n_{wav}} < p < \frac{m\lambda_0}{n_s} \quad (15)$$

By determining the period p of the periodic structure so as to satisfy the above formulae, light from the photoluminescent layer can be emitted in the front direction. Thus, a directional light-emitting apparatus can be provided. The waveguide 110 is hereinafter also referred to as a photoluminescent layer 110.

3. Verification by Calculations 3-1. Period and Wavelength Dependence

The present inventors verified, by optical analysis, whether light emission in a particular direction as described above is actually possible. The optical analysis was performed by calculations using DiffractMOD available from Cybernet Systems Co., Ltd. In these calculations, the change in the absorption of external light incident perpendicular to a light-emitting device by a photoluminescent layer was calculated to determine the enhancement of light output perpendicular to the light-emitting device. The calculation of the process by which external incident light is coupled to a quasi-guided mode and is absorbed by the photoluminescent layer corresponds to the calculation of a process opposite to the process by which light emitted from the photoluminescent layer is coupled to a quasi-guided mode and is converted into propagating light output perpendicular to the light-emitting device. Similarly, the electric field distribution of a quasi-guided mode was calculated from the electric field of external incident light.

Figure 2:
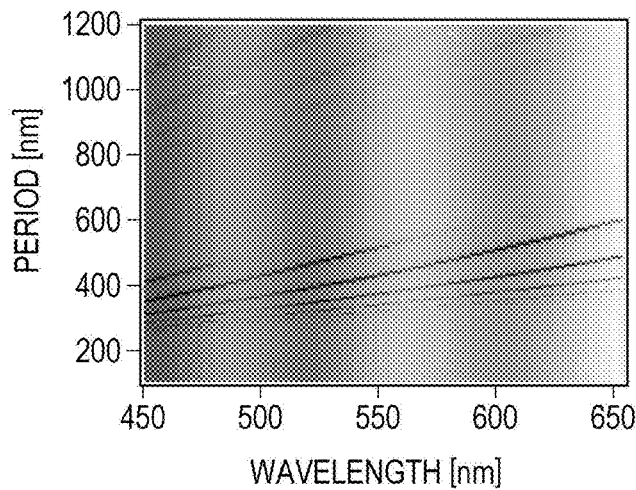
FIG. 2 is a graph showing the calculation results of the enhancement of light emitted in the front direction with varying emission wavelengths and varying heights of a periodic structure.

FIG. 2 shows the calculation results of the enhancement of light emitted in the front direction with varying emission wavelengths and varying periods of the periodic structure. The photoluminescent layer had a thickness of 1 µm and a refractive index $n_{wav}$ of 1.8, and the periodic structure had a height of 50 nm and a refractive index of 1.5. In these calculations, the periodic structure was a one-dimensional periodic structure uniform in the y direction, as illustrated in FIG. 1A, and the polarization of light was in the TM mode, which has an electric field component parallel to the y direction. The results in FIG. 2 show that there are enhancement peaks at certain combinations of wavelength and period. In FIG. 2, the magnitude of the enhancement is expressed by different shades of color; a darker color (black) indicates a higher enhancement, whereas a lighter color (white) indicates a lower enhancement.

Figure 3:
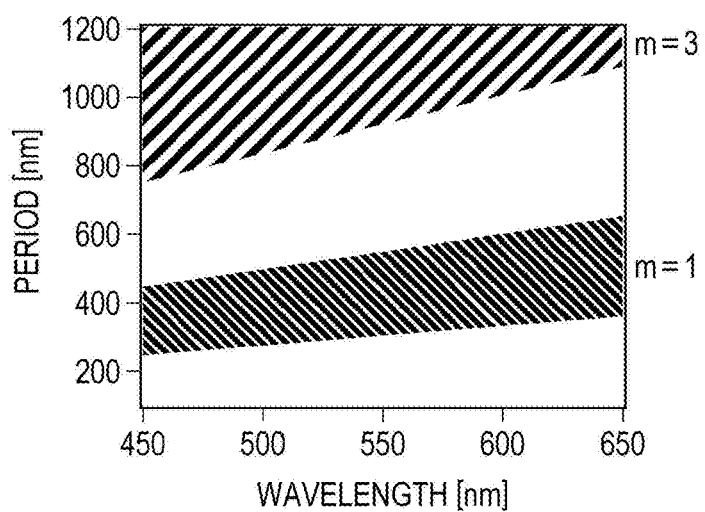
FIG. 3 is a graph illustrating the conditions for m=1 and m=3 in the formula (10)

In the above calculations, the periodic structure had a rectangular cross section as illustrated in FIG. 1B. FIG. 3 is a graph illustrating the conditions for m=1 and m=3 in the formula (10). A comparison between FIGS. 2 and 3 shows that the peaks in FIG. 2 are located within the regions corresponding to m=1 and m=3. The intensity is higher for m=1 because first-order diffracted light has a higher diffraction efficiency than third- or higher-order diffracted light. There is no peak for m=2 because of low diffraction efficiency in the periodic structure.

In FIG. 2, a plurality of lines are observed in each of the regions corresponding to m=1 and m=3 in FIG. 3. This indicates the presence of a plurality of quasi-guided modes.

3-2. Thickness Dependence

Figure 4:
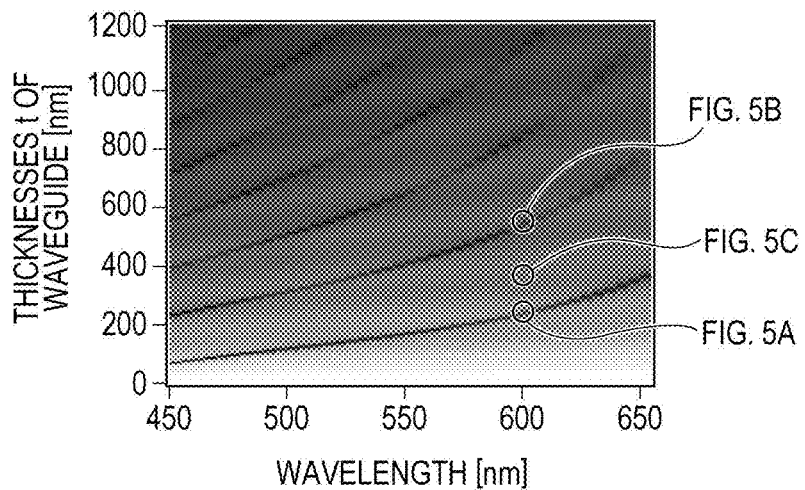
FIG. 4 is a graph showing the calculation results of the enhancement of light emitted in the front direction with varying emission wavelengths and varying thicknesses t of a photoluminescent layer.

FIG. 4 is a graph showing the calculation results of the enhancement of light emitted in the front direction with varying emission wavelengths and varying thicknesses t of the photoluminescent layer. The photoluminescent layer had a refractive index $n_{wav}$ of 1.8, and the periodic structure had a period of 400 nm, a height of 50 nm, and a refractive index of 1.5. FIG. 4 shows that the enhancement of light is highest at a particular thickness t of the photoluminescent layer.

Figure 5A:
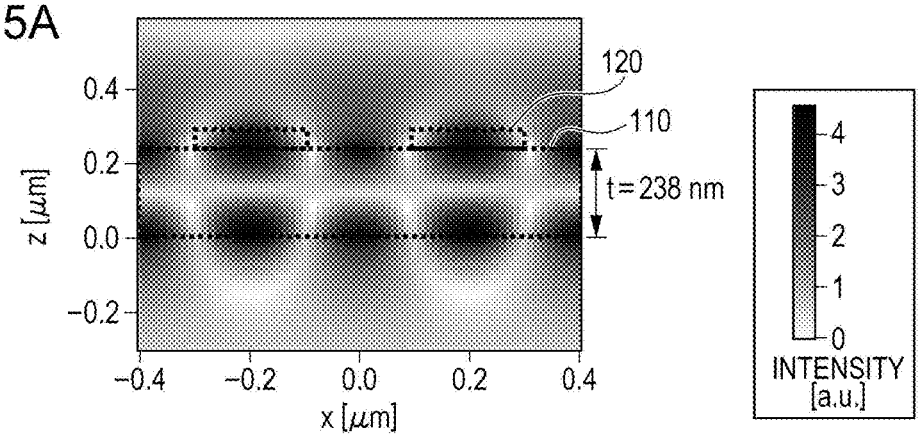
FIG. 5A is a graph showing the calculation results of the electric field distribution of a mode to guide light in the x direction for a thickness t of 238 nm.
Figure 5B:
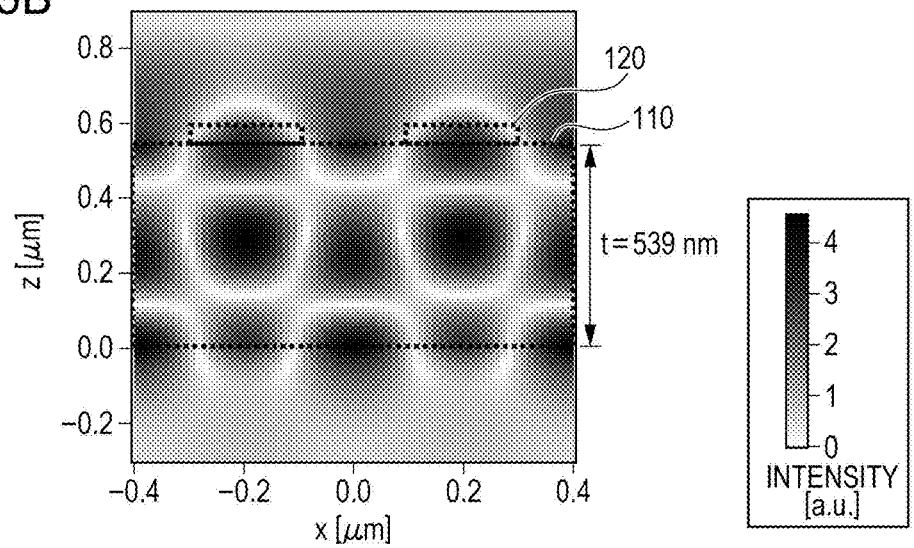
FIG. 5B is a graph showing the calculation results of the electric field distribution of a mode to guide light in the x direction for a thickness t of 539 nm.
Figure 5C:
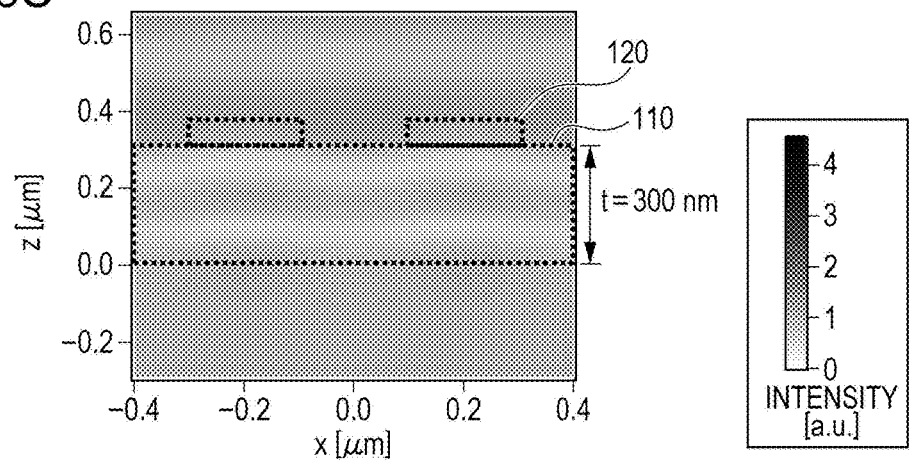
FIG. 5C is a graph showing the calculation results of the electric field distribution of a mode to guide light in the x direction for a thickness t of 300 nm.

FIGS. 5A and 5B show the calculation results of the electric field distributions in a mode to guide light in the x direction for a wavelength of 600 nm and thicknesses t of 238 nm and 539 nm, respectively, at which there are peaks in FIG. 4. For comparison, FIG. 5C shows the results of similar calculations for a thickness t of 300 nm, at which there is no peak. In these calculations, as in the above calculations, the periodic structure was a one-dimensional periodic structure uniform in the y direction. In each figure, a darker region has higher electric field strength, and a lighter region has lower electric field strength. Whereas the results for t=238 nm and t=539 nm show high electric field strength, the results for t=300 nm show low electric field strength as a whole. This is because there is a guided mode in the case of t=238 or 539 nm, so that light is strongly confined. Furthermore, regions with the highest electric field strength (antinodes) are always present in or directly below the projections, indicating the correlation between the electric field and the surface structure 120 (the periodic structure in this example). Thus, the resulting guided mode depends on the arrangement of the surface structure 120. A comparison between the results for t=238 nm and t=539 nm shows that these modes differ by one in the number of nodes (white regions) of the electric field in the z direction.

3-3. Polarization Dependence

Figure 6:
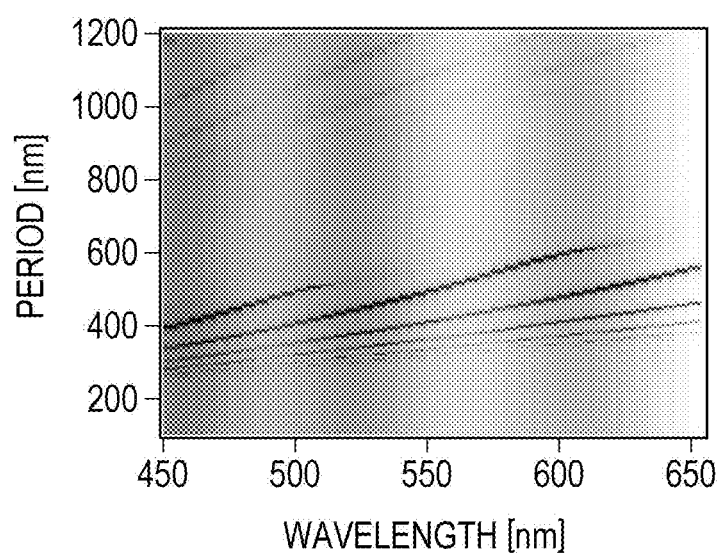
FIG. 6 is a graph showing the calculation results of the enhancement of light under the same conditions as in FIG. 2 except that the polarization of light is in the TE mode, which has an electric field component perpendicular to the y direction.

To examine the polarization dependence, the enhancement of light was calculated under the same conditions as in FIG. 2 except that the polarization of light was in the TE mode, which has an electric field component perpendicular to the y direction. FIG. 6 shows the calculation results. Although the peaks in FIG. 6 differ slightly in position from the peaks for the TM mode (FIG. 2), they are located within the regions shown in FIG. 3. This demonstrates that the structure according to this embodiment is effective for both the TM mode and the TE mode.

3-4. Two-Dimensional Periodic Structure

Figure 7A:
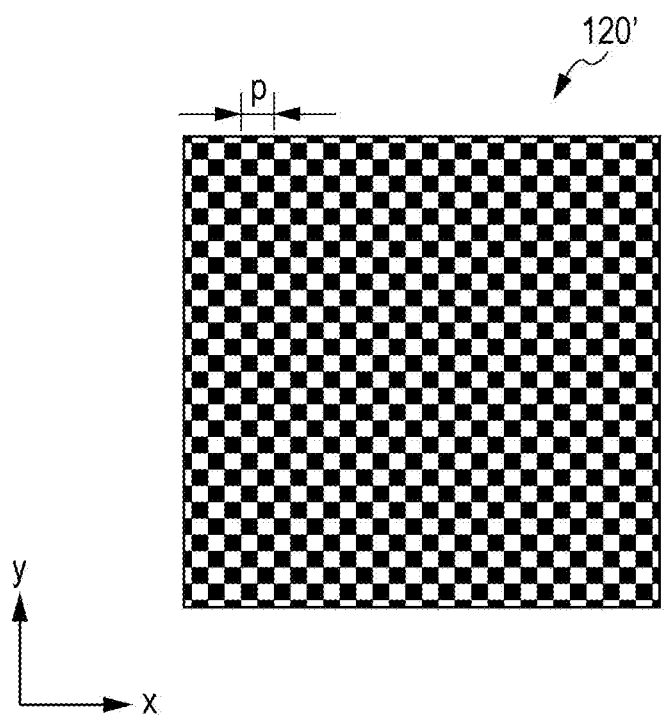
FIG. 7A is a plan view of a two-dimensional periodic structure.
Figure 7B:
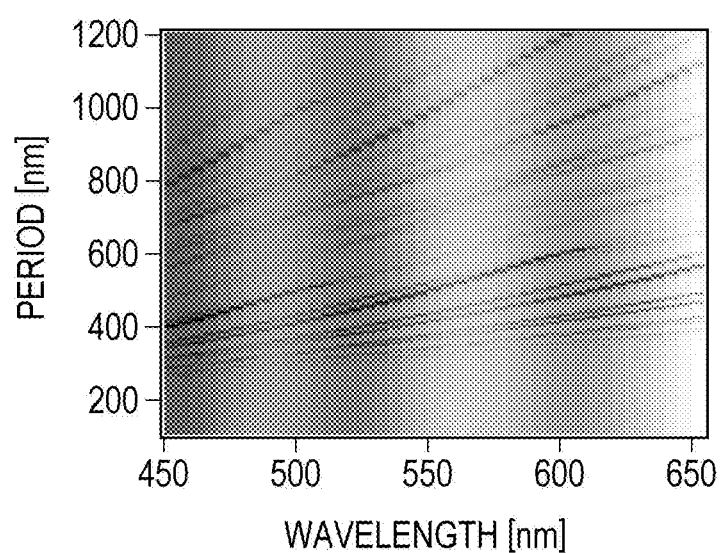
FIG. 7B is a graph showing the results of calculations performed as in FIG. 2 for the two-dimensional periodic structure.

The effect of a two-dimensional periodic structure has also been studied. FIG. 7A is a partial plan view of a two-dimensional surface structure 120' including recesses and projections arranged in both the x direction and the y direction. In FIG. 7A, black regions represent projections, and white regions represent recesses. For a two-dimensional periodic structure, both the diffraction in the x direction and the diffraction in the y direction have to be taken into account. Although the diffraction only in the x or y direction is similar to that in a one-dimensional periodic structure, a two-dimensional periodic structure can be expected to give different results from the one-dimensional periodic structure because diffraction also occurs in a direction containing both an x component and a y component (for example, at an angle of 45 degrees). FIG. 7B shows the calculation results of the enhancement of light for the two-dimensional periodic structure. The calculations were performed under the same conditions as in FIG. 2 except for the type of periodic structure. As shown in FIG. 7B, peaks matching the peaks for the TE mode in FIG. 6 were observed in addition to peaks matching the peaks for the TM mode in FIG. 2. These results demonstrate that the two-dimensional periodic structure also converts and outputs the TE mode by diffraction. For a two-dimensional periodic structure, diffraction that simultaneously satisfies the first-order diffraction conditions in both the x direction and the y direction also has to be taken into account. Such diffracted light is emitted at an angle corresponding to $\sqrt{2}$ times (that is, $2^{1/2}$ times) the period p. Thus, peaks will occur at $\sqrt{2}$ times the period p in addition to peaks that occur in a one-dimensional periodic structure. Such peaks are also observed in FIG. 7B.

Figure 18A:
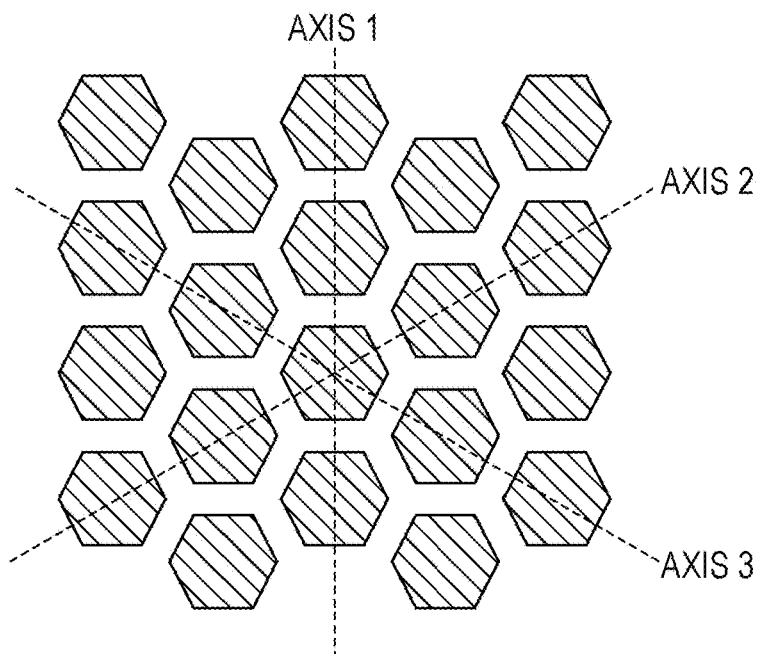
FIG. 18A is a schematic view of a two-dimensional periodic structure.
Figure 18B:
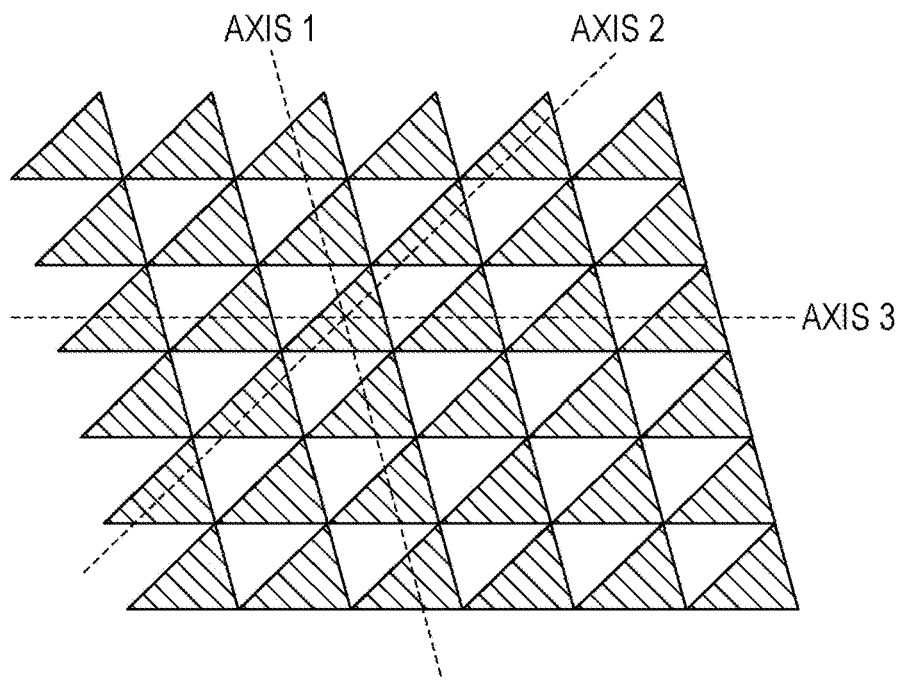
FIG. 18B is a schematic view of another two-dimensional periodic structure.

The two-dimensional periodic structure does not have to be a square grid structure having equal periods in the x direction and the y direction, as illustrated in FIG. 7A, but may be a hexagonal grid structure, as illustrated in FIG. 18A, or a triangular grid structure, as illustrated in FIG. 18B. The two-dimensional periodic structure may have different periods in different directions (for example, in the x direction and the y direction for a square grid structure).

In this embodiment, as demonstrated above, light in a characteristic quasi-guided mode formed by the periodic structure and the photoluminescent layer can be selectively emitted only in the front direction through diffraction by the periodic structure. With this structure, the photoluminescent layer can be excited with excitation light such as ultraviolet light or blue light to emit directional light.

4. Study on Constructions of Periodic Structure and Photoluminescent Layer

The effects of changes in various conditions such as the constructions and refractive indices of the periodic structure and the photoluminescent layer will now be described.

4-1. Refractive Index of Periodic Structure

Figure 8:
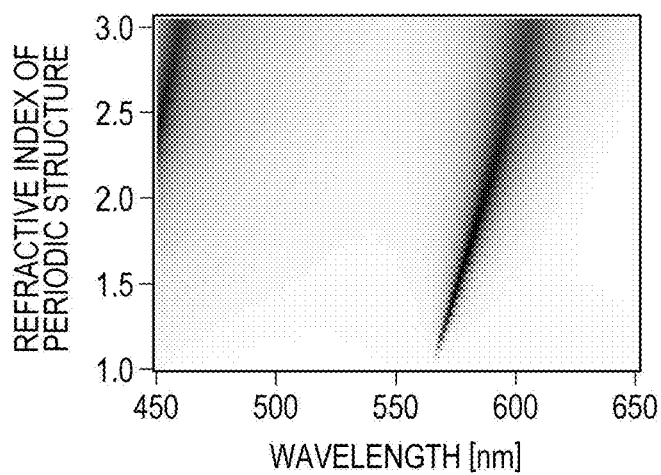
FIG. 8 is a graph showing the calculation results of the enhancement of light emitted in the front direction with varying emission wavelengths and varying refractive indices of the periodic structure.
Figure 9:
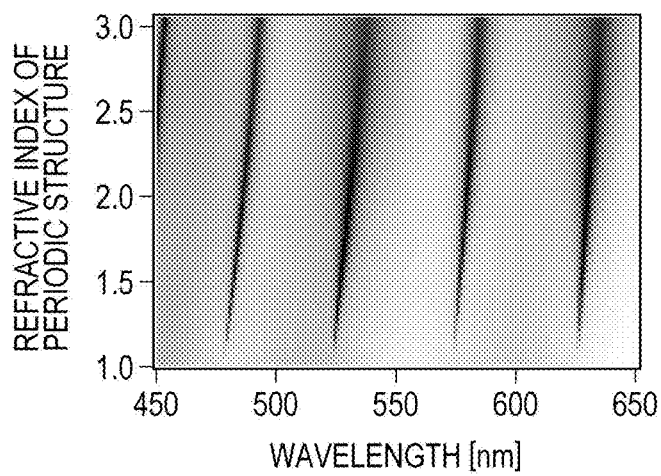
FIG. 9 is a graph showing the results obtained under the same conditions as in FIG. 8 except that the photoluminescent layer has a thickness of 1,000 nm.

The refractive index of the periodic structure has been studied. In the calculations performed herein, the photoluminescent layer had a thickness of 200 nm and a refractive index $n_{wav}$ of 1.8, the surface structure was a one-dimensional periodic structure uniform in the y direction, as illustrated in FIG. 1A, and had a height of 50 nm and a period of 400 nm, and the polarization of light was the TM mode, which has an electric field component parallel to the y direction. FIG. 8 shows the calculation results of the enhancement of light emitted in the front direction with varying emission wavelengths and varying refractive indices of the periodic structure. FIG. 9 shows the results obtained under the same conditions except that the photoluminescent layer had a thickness of 1,000 nm.

The results show that the photoluminescent layer having a thickness of 1,000 nm (FIG. 9) results in a smaller shift in the wavelength at which the light intensity is highest (the wavelength is hereinafter referred to as a peak wavelength) with the change in the refractive index of the periodic structure than the photoluminescent layer having a thickness of 200 nm (FIG. 8). This is because the quasi-guided mode is more affected by the refractive index of the periodic structure as the photoluminescent layer is thinner. Specifically, a periodic structure having a higher refractive index increases the effective refractive index and thus shifts the peak wavelength toward longer wavelengths, and this effect is more noticeable as the photoluminescent layer is thinner. The effective refractive index is determined by the refractive index of a medium present in the region where the electric field of a quasi-guided mode is distributed.

The results also show that a periodic structure having a higher refractive index results in a broader peak and lower intensity. This is because a periodic structure having a higher refractive index emits light in a quasi-guided mode at a higher rate and is therefore less effective in confining light, that is, has a lower Q value. To maintain high peak intensity, a structure may be employed in which light is moderately emitted using a quasi-guided mode that is effective in confining light (that is, has a high Q value). This means that it is advantageous to use a periodic structure formed of a material not having a much higher refractive index than the photoluminescent layer. Thus, in order to increase the peak intensity and Q value, the refractive index of a dielectric material constituting the periodic structure (that is, the light-transmissive layer) can be lower than or similar to the refractive index of the photoluminescent layer. This is also true if the photoluminescent layer contains materials other than photoluminescent materials.

4-2. Height of Periodic Structure

Figure 10:
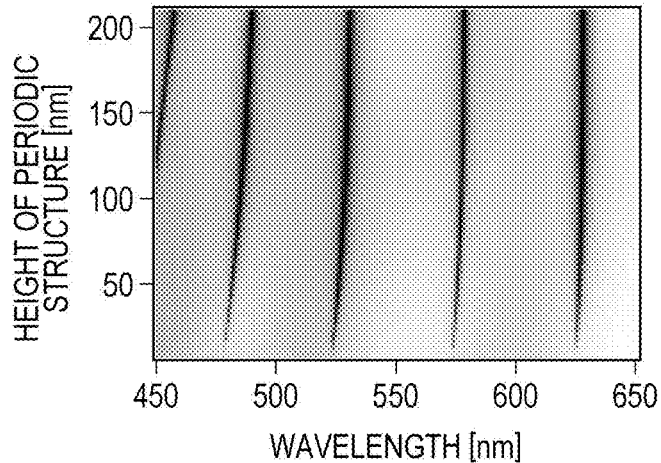
FIG. 10 is a graph showing the calculation results of the enhancement of light emitted in the front direction with varying emission wavelengths and varying heights of the periodic structure.
Figure 11:
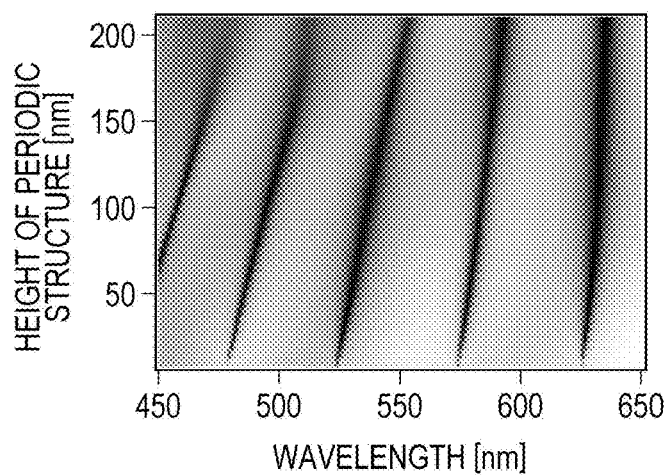
FIG. 11 is a graph showing the results of calculations performed under the same conditions as in FIG. 10 except that the periodic structure has a refractive index $n_p$ of 2.0.

The height of the periodic structure has been studied. In the calculations performed herein, the photoluminescent layer had a thickness of 1,000 nm and a refractive index $n_{wav}$ of 1.8, the surface structure was a one-dimensional periodic structure uniform in the y direction, as illustrated in FIG. 1A, and had a refractive index $n_p$ of 1.5 and a period of 400 nm, and the polarization of the light was the TM mode, which has an electric field component parallel to the y direction. FIG. 10 shows the calculation results of the enhancement of light emitted in the front direction with varying emission wavelengths and varying heights of the periodic structure. FIG. 11 shows the results of calculations performed under the same conditions except that the periodic structure has a refractive index $n_p$ of 2.0. Whereas the results in FIG. 10 show that the peak intensity and the Q value (that is, the peak line width) do not change when the periodic structure has at least a certain height, the results in FIG. 11 show that the peak intensity and the Q value decrease with increasing height of the periodic structure. If the refractive index $n_{wav}$ of the photoluminescent layer is higher than the refractive index $n_p$ of the periodic structure (FIG. 10), light is totally reflected, and only a leaking (evanescent) portion of the electric field of a quasi-guided mode interacts with the periodic structure. If the periodic structure has a sufficiently large height, the influence of the interaction between the evanescent portion of the electric field and the periodic structure remains constant irrespective of the height. In contrast, if the refractive index $n_{wav}$ of the photoluminescent layer is lower than the refractive index $n_p$ of the periodic structure (FIG. 11), light reaches the surface of the periodic structure without being totally reflected and is therefore more influenced by the periodic structure with a larger height. As shown in FIG. 11, a height of approximately 100 nm is sufficient, and the peak intensity and the Q value decrease above a height of 150 nm. Thus, if the refractive index $n_{wav}$ of the photoluminescent layer is lower than the refractive index $n_p$ of the periodic structure, the periodic structure may have a height of 150 nm or less to achieve a high peak intensity and Q value.

4-3. Polarization Direction

Figure 12:
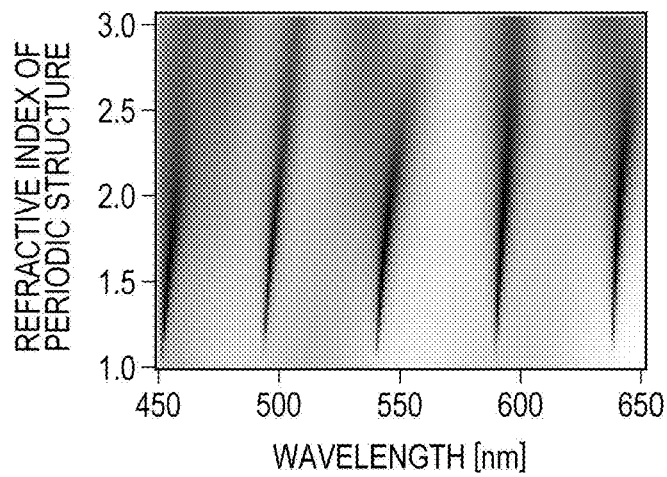
FIG. 12 is a graph showing the results of calculations performed under the same conditions as in FIG. 9 except that the polarization of the light is in the TE mode, which has an electric field component perpendicular to the y direction.

The polarization direction has been studied. FIG. 12 shows the results of calculations performed under the same conditions as in FIG. 9 except that the polarization of light was in the TE mode, which has an electric field component perpendicular to the y direction. The TE mode is more influenced by the periodic structure than the TM mode because the electric field of a quasi-guided mode leaks more largely in the TE mode than in the TM mode. Thus, the peak intensity and the Q value decrease more significantly in the TE mode than in the TM mode if the refractive index $n_p$ of the periodic structure is higher than the refractive index $n_{wav}$ of the photoluminescent layer.

4-4. Refractive Index of Photoluminescent Layer

Figure 13:
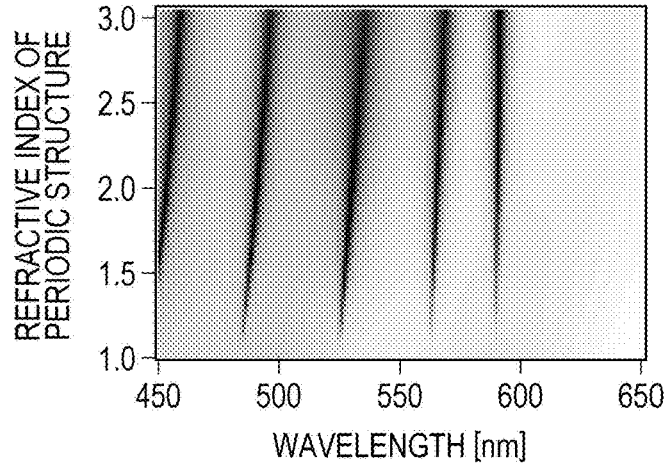
FIG. 13 is a graph showing the results of calculations performed under the same conditions as in FIG. 9 except that the photoluminescent layer has a refractive index $n_{wav}$ of 1.5.

The refractive index of the photoluminescent layer has been studied. FIG. 13 shows the results of calculations performed under the same conditions as in FIG. 9 except that the photoluminescent layer had a refractive index $n_{wav}$ of 1.5. The results for the photoluminescent layer having a refractive index $n_{wav}$ of 1.5 are similar to the results in FIG. 9. However, light having a wavelength of 600 nm or more was not emitted in the front direction. This is because, from the formula (10), $\lambda_0 < n_{wav} \times p/m = 1.5 \times 400$ nm/1=600 nm.

The above analysis demonstrates that a high peak intensity and Q value can be achieved if the periodic structure has a refractive index lower than or similar to the refractive index of the photoluminescent layer or if the periodic structure has a higher refractive index than the photoluminescent layer and a height of 150 nm or less.

5. Modified Examples

Modified examples of the embodiments of the light-emitting device will be described below.

5-1. Structure Including Substrate

The light-emitting device may have a structure in which the photoluminescent layer 110 and the surface structure 120 are formed on the transparent substrate 140, as illustrated in FIGS. 1C and 1D. Such a light-emitting device 100a may be produced by forming a thin film of the photoluminescent material for the photoluminescent layer 110 (optionally containing a matrix material; the same applies hereinafter) on the transparent substrate 140 and then forming the surface structure 120 thereon. In this structure, the refractive index $n_s$ of the transparent substrate 140 has to be lower than or equal to the refractive index $n_{wav}$ of the photoluminescent layer 110 so that the photoluminescent layer 110 and the surface structure 120 function to emit light in a particular direction. If the transparent substrate 140 is provided in contact with the photoluminescent layer 110, the period p is set so as to satisfy the formula (15), which is given by replacing the refractive index $n_{out}$ of the output medium in the formula (10) by $n_s$.

Figure 14:
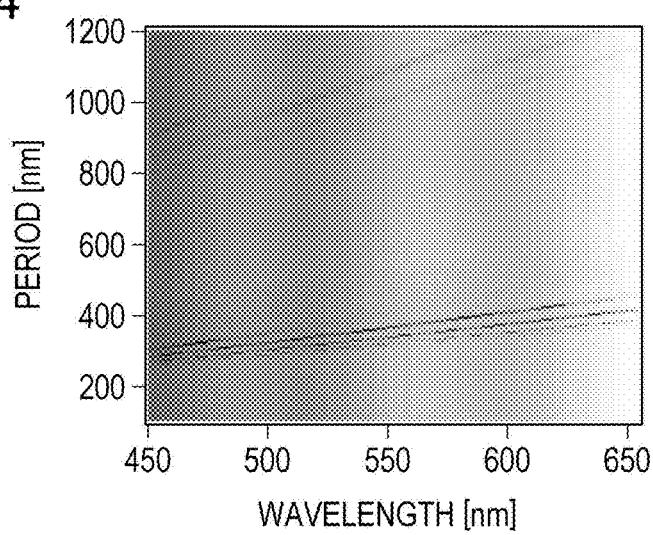
FIG. 14 is a graph showing the results of calculations performed under the same conditions as in FIG. 2 except that the photoluminescent layer and the periodic structure are disposed on a transparent substrate having a refractive index of 1.5.
Figure 15:
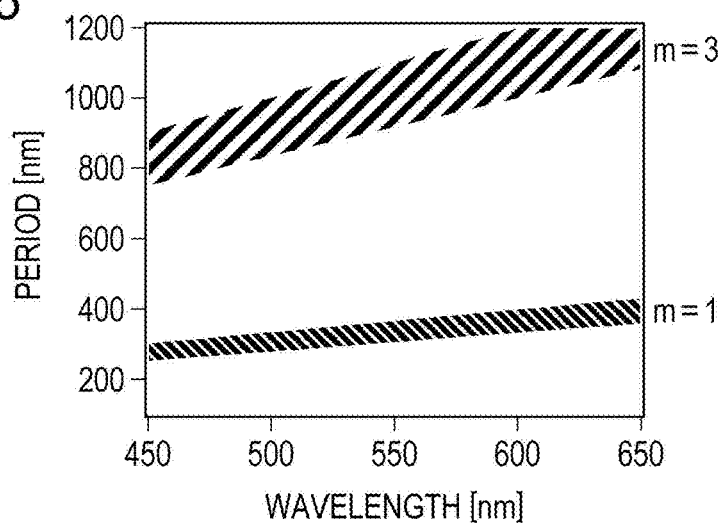
FIG. 15 is a graph illustrating the condition represented by the formula (15)

To demonstrate this, calculations were performed under the same conditions as in FIG. 2 except that the photoluminescent layer 110 and the surface structure 120 were disposed on a transparent substrate 140 having a refractive index of 1.5. FIG. 14 shows the calculation results. As in the results in FIG. 2, light intensity peaks are observed at particular periods for each wavelength, although the ranges of periods where peaks appear differ from those in FIG. 2. FIG. 15 is a graph illustrating the condition represented by the formula (15), which is given by substituting $n_{out}=n_s$ into the formula (10). In FIG. 14, light intensity peaks are observed in the regions corresponding to the ranges shown in FIG. 15.

Thus, for the light-emitting device 100a, in which the photoluminescent layer 110 and the surface structure 120 are disposed on the transparent substrate 140, a period p that satisfies the formula (15) is effective, and a period p that satisfies the formula (13) is significantly effective.

5-2. Light-Emitting Apparatus Including Excitation Light Source

Figure 16:
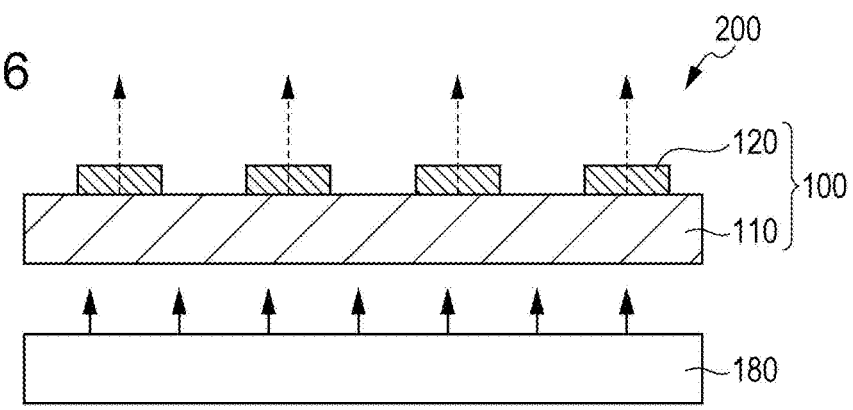
FIG. 16 is a schematic view of a light-emitting apparatus including a light-emitting device illustrated in FIGS. 1A and 1B and a light source that emits excitation light toward a photoluminescent layer.

FIG. 16 is a schematic view of a light-emitting apparatus 200 including the light-emitting device 100 illustrated in FIGS. 1A and 1B and a light source 180 that emits excitation light to the photoluminescent layer 110. In this embodiment, as described above, the photoluminescent layer can be excited with excitation light, such as ultraviolet light or blue light, and emit directional light. The light-emitting apparatus 200 including the light source 180 that can emit such excitation light can emit directional light. Although the wavelength of excitation light emitted from the light source 180 is typically in the ultraviolet or blue range, it is not necessarily within these ranges, but may be determined depending on the photoluminescent material for the photoluminescent layer 110. Although the light source 180 illustrated in FIG. 16 is configured to direct excitation light into the bottom surface of the photoluminescent layer 110, it may be configured otherwise, for example, to direct excitation light into the top surface of the photoluminescent layer 110. Excitation light may be directed at an angle (that is, obliquely) with respect to a direction perpendicular to a main surface (the top surface or the bottom surface) of the photoluminescent layer 110. Excitation light directed obliquely so as to be totally reflected in the photoluminescent layer 110 can more efficiently induce light emission from the photoluminescent layer 110.

Figure 17A:
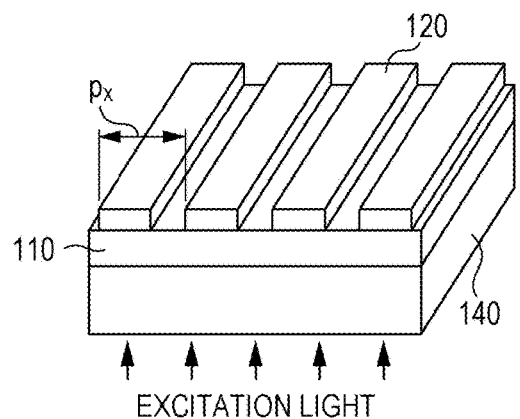
FIG. 17A is a schematic view of a one-dimensional periodic structure having a period $p_x$ in the x direction.
Figure 17B:
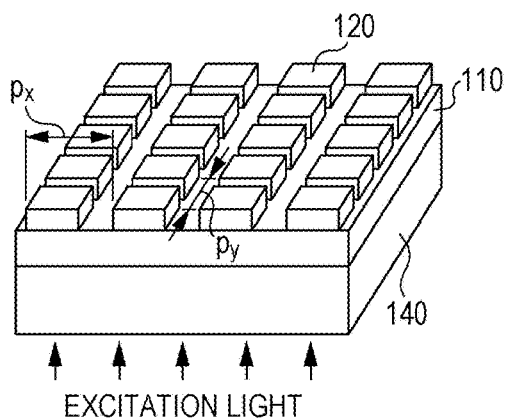
FIG. 17B is a schematic view of a two-dimensional periodic structure having a period $p_x$ in the x direction and a period $p_y$ in the y direction.

Excitation light may be coupled to a quasi-guided mode to efficiently emit light. FIGS. 17A to 17D illustrate such a method. In this example, as in the structure illustrated in FIGS. 1C and 1D, the photoluminescent layer 110 and the surface structure 120 are formed on the transparent substrate 140. As illustrated in FIG. 17A, the period $p_x$ in the x direction is first determined so as to enhance light emission. As illustrated in FIG. 17B, the period $p_y$ in the y direction is then determined so as to couple excitation light to a quasi-guided mode. The period $p_x$ is determined so as to satisfy the condition given by replacing p by $p_x$ in the formula (10). The period $p_y$ is determined so as to satisfy the formula (16): wherein m is an integer of 1 or more, $\lambda_{ex}$ denotes the wavelength of excitation light, and $n_{out}$ denotes the refractive index of a medium having the highest refractive index of the media in contact with the photoluminescent layer 110 except the surface structure 120.

$$\frac{m\lambda_{ex}}{n_{wav}} < p_y < \frac{m\lambda_{ex}}{n_{out}} \quad (16)$$

In the example in FIG. 17B, $n_{out}$ denotes the refractive index $n_s$ of the transparent substrate 140. For a structure including no transparent substrate 140, as illustrated in FIG. 16, $n_{out}$ denotes the refractive index of air (approximately 1.0).

In particular, excitation light can be more effectively converted into a quasi-guided mode if m=1, that is, if the period $p_y$ is determined so as to satisfy the formula (17):

$$\frac{\lambda_{ex}}{n_{wav}} < p_y < \frac{\lambda_{ex}}{n_{out}} \quad (17)$$

Thus, excitation light can be converted into a quasi-guided mode if the period $p_y$ is set so as to satisfy the condition represented by the formula (16) (particularly, the condition represented by the formula (17)). As a result, the photoluminescent layer 110 can efficiently absorb excitation light having the wavelength $\lambda_{ex}$.

Figure 17C:
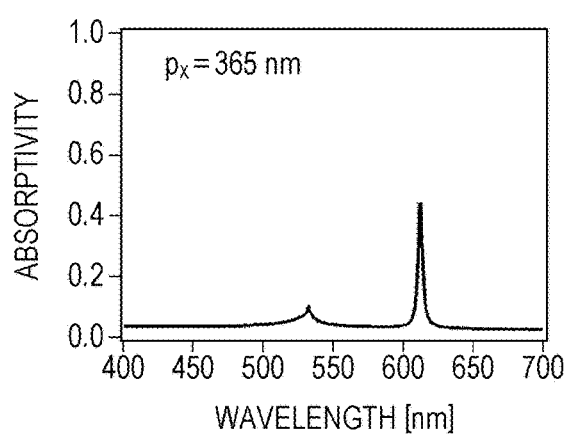
FIG. 17C is a graph showing the wavelength dependence of light absorptivity in the structure illustrated in FIG. 17A.
Figure 17D:
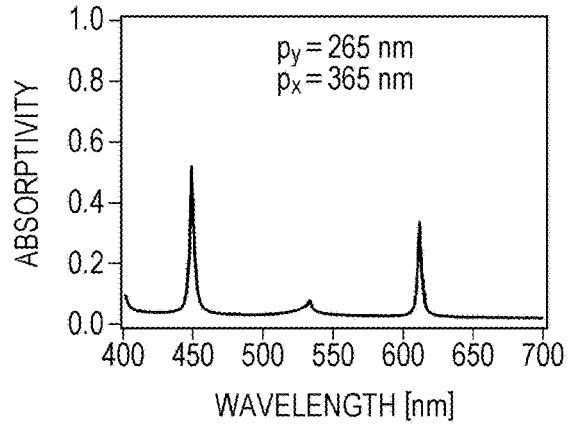
FIG. 17D is a graph showing the wavelength dependence of light absorptivity in the structure illustrated in FIG. 17B.

FIGS. 17C and 17D are the calculation results of the proportion of absorbed light to light incident on the structures shown in FIGS. 17A and 17B, respectively, for each wavelength. In these calculations, $p_x$=365 nm, $p_y$=265 nm, the photoluminescent layer 110 had an emission wavelength $\lambda$ of about 600 nm, excitation light had a wavelength $\lambda_{ex}$ of about 450 nm, and the photoluminescent layer 110 had an extinction coefficient of 0.003. FIG. 17D shows high absorptivity not only for light from the photoluminescent layer 110 but also for excitation light of approximately 450 nm. This indicates that incident light is effectively converted into a quasi-guided mode and thereby increases the proportion of light absorbed into the photoluminescent layer 110. The photoluminescent layer 110 also has high absorptivity for the emission wavelength, that is, approximately 600 nm. This indicates that light having a wavelength of approximately 600 nm incident on this structure is similarly effectively converted into a quasi-guided mode.

The surface structure 120 illustrated in FIG. 17B is a two-dimensional periodic structure including structures having different periods (different periodic components) in the x direction and the y direction. Such a two-dimensional periodic structure including multiple periodic components allows for high excitation efficiency and high output intensity. Although excitation light is incident on the transparent substrate 140 in FIGS. 17A and 17B, the same effect can be achieved if excitation light is incident on the surface structure 120.

Also available are two-dimensional periodic structures including periodic components as illustrated in FIGS. 18A and 18B. The structure illustrated in FIG. 18A includes periodically arranged projections or recesses having a hexagonal planar shape. The structure illustrated in FIG. 18B includes periodically arranged projections or recesses having a triangular planar shape. These structures have major axes (axes 1 to 3 in these examples) that can be assumed to be periodic. Thus, the structures can have different periods in different axial directions. These periods may be set so as to increase the directionality of light beams of different wavelengths or to efficiently absorb excitation light. In any case, each period is set so as to satisfy the condition corresponding to the formula (10).

5-3. Periodic Structure on Transparent Substrate

Figure 19A:
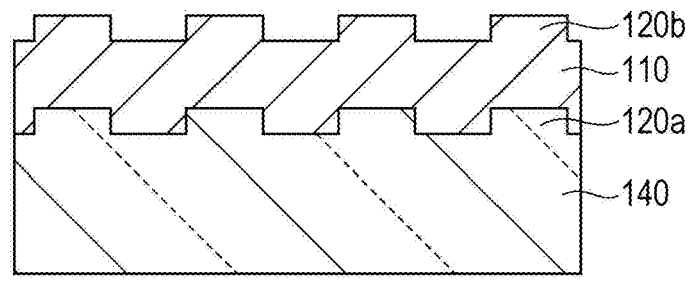
FIG. 19A is a schematic view of a modified example in which a periodic structure is formed on a transparent substrate.
Figure 19B:
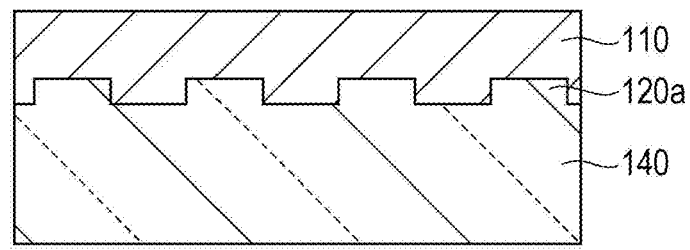
FIG. 19B is a schematic view of another modified example in which a periodic structure is formed on a transparent substrate.

As illustrated in FIGS. 19A and 19B, a surface structure 120a may be formed on the transparent substrate 140, and the photoluminescent layer 110 may be disposed thereon. In the example in FIG. 19A, the photoluminescent layer 110 is formed along the texture of the surface structure 120a on the transparent substrate 140. As a result, a surface structure 120b with the same period is formed in the surface of the photoluminescent layer 110. In the example in FIG. 19B, the surface of the photoluminescent layer 110 is flattened. In these examples, directional light emission can be achieved by setting the period p of the surface structure 120a so as to satisfy the formula (15).

Figure 19C:
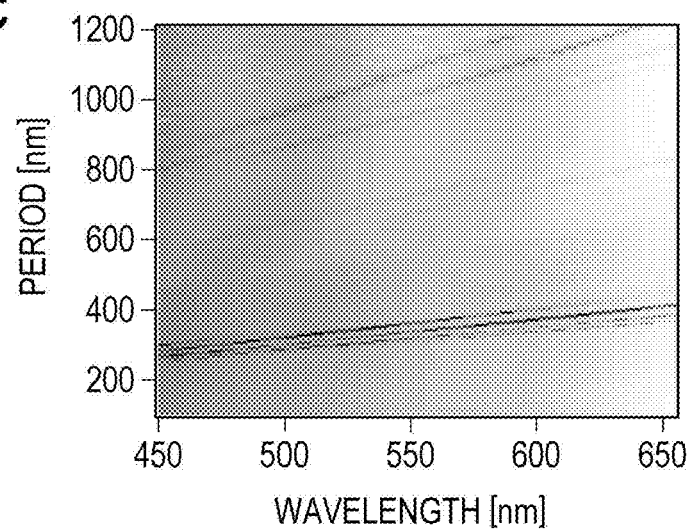
FIG. 19C is a graph showing the calculation results of the enhancement of light emitted from the structure illustrated in FIG. 19A in the front direction with varying emission wavelengths and varying periods of the periodic structure.

To verify the effect of these structures, the enhancement of light emitted from the structure illustrated in FIG. 19A in the front direction was calculated with varying emission wavelengths and varying periods of the periodic structure. In these calculations, the photoluminescent layer 110 had a thickness of 1,000 nm and a refractive index $n_{wav}$ of 1.8, the surface structure 120a was a one-dimensional periodic structure uniform in the y direction and had a height of 50 nm, a refractive index $n_p$ of 1.5, and a period of 400 nm, and the polarization of light was in the TM mode, which has an electric field component parallel to the y direction. FIG. 19C shows the calculation results. Also in these calculations, light intensity peaks were observed at the periods that satisfy the condition represented by the formula (15).

5-4. Powder

These embodiments show that light having any wavelength can be enhanced by adjusting the period of the periodic structure and/or the thickness of the photoluminescent layer. For example, if the structure illustrated in FIGS. 1A and 1B is formed using a photoluminescent material that emits light over a wide wavelength range, only light having a certain wavelength can be enhanced. The structure of the light-emitting device 100 as illustrated in FIGS. 1A and 1B may be provided in powder form for use as a fluorescent material. Alternatively, the light-emitting device 100 as illustrated in FIGS. 1A and 1B may be embedded in resin or glass.

Figure 20:
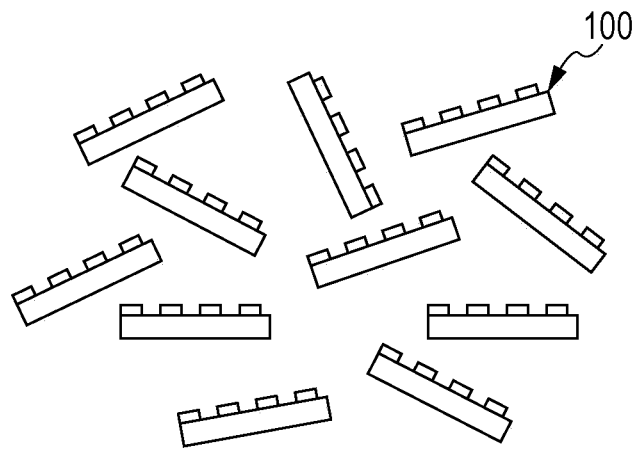
FIG. 20 is a schematic view of a mixture of light-emitting devices in powder form.

The single structure as illustrated in FIGS. 1A and 1B can emit only light having a certain wavelength in a particular direction and is therefore not suitable for light having a wide wavelength spectrum, such as white light. Accordingly, as shown in FIG. 20, light-emitting devices 100 that differ in, for example, the period of the periodic structure or the thickness of the photoluminescent layer, may be mixed in powder form to provide a light-emitting apparatus with a wide wavelength spectrum. In such a case, the individual light-emitting devices 100 have sizes of, for example, several micrometers to several millimeters in one direction and can include, for example, one- or two-dimensional periodic structures with several periods to several hundreds of periods.

5-5. Array of Structures with Different Periods

Figure 21:
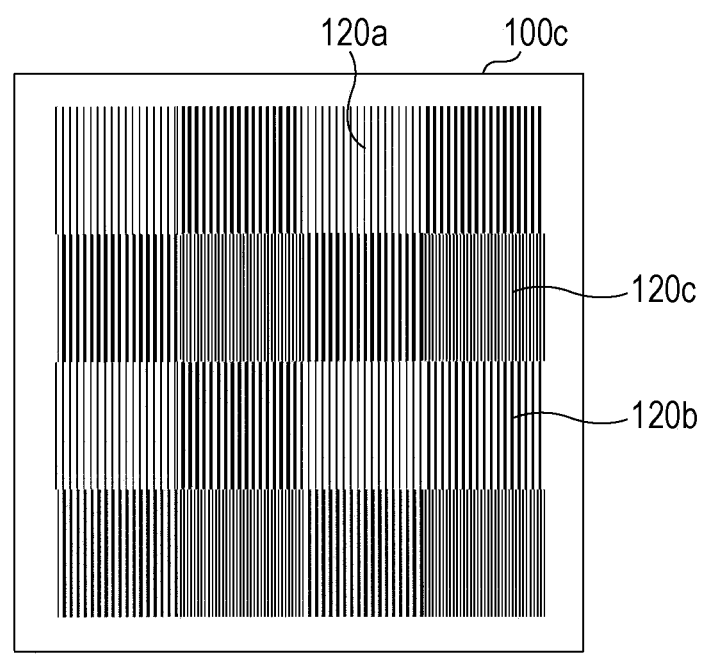
FIG. 21 is a plan view of a two-dimensional array of periodic structures having different periods on a photoluminescent layer.

FIG. 21 is a plan view of a two-dimensional array of periodic structures having different periods on a photoluminescent layer. In a light-emitting device 100c illustrated in FIG. 21, three types of surface structures 120a, 120b, and 120c are arranged without any space therebetween. The periods of the surface structures 120a, 120b, and 120c are set to emit, for example, light in the red, green, and blue wavelength ranges, respectively, in the front direction. Such structures having different periods can be arranged on the photoluminescent layer to emit directional light having a wide wavelength spectrum. The periodic structures are not necessarily formed as described above, but may be formed in any manner.

5-6. Layered Structure

Figure 22:
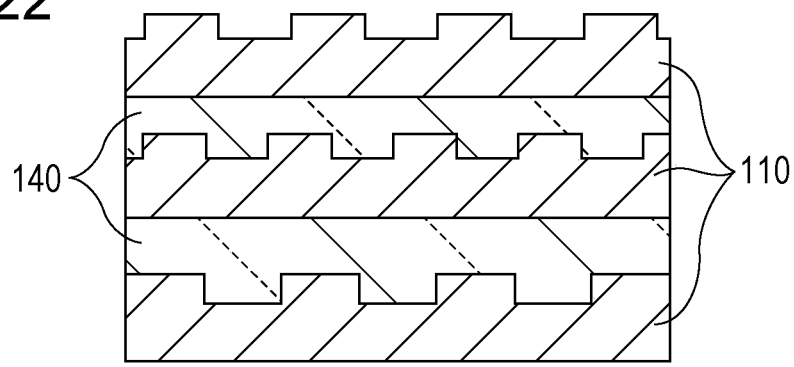
FIG. 22 is a schematic view of a light-emitting device including photoluminescent layers each having a textured surface.

FIG. 22 illustrates a light-emitting device including photoluminescent layers 110 each having a textured surface. A transparent substrate 140 is disposed between the photoluminescent layers 110. The texture on each of the photoluminescent layers 110 corresponds to the periodic structure or the submicron structure. The example in FIG. 22 includes three periodic structures having different periods. The periods of these periodic structures are set to emit light in the red, green, and blue wavelength ranges in the front direction. The photoluminescent layer 110 in each layer is formed of a material that emits light having the color corresponding to the period of the periodic structure in that layer. Thus, periodic structures having different periods can be stacked on top of each other to emit directional light having a wide wavelength spectrum.

The number of layers and the constructions of the photoluminescent layer 110 and the periodic structure in each layer are not limited to those described above, but may be selected as appropriate. For example, for a structure including two layers, first and second photoluminescent layers are formed opposite each other with a light-transmissive substrate therebetween, and first and second periodic structures are formed on the surfaces of the first and second photoluminescent layers, respectively. In such a case, the first photoluminescent layer and the first periodic structure satisfy the condition represented by the formula (15), and the second photoluminescent layer and the second periodic structure satisfy the condition represented by the formula (15). For a structure including three or more layers, the photoluminescent layer and the periodic structure in each layer satisfy the condition represented by the formula (15). The positional relationship between the photoluminescent layers and the periodic structures in FIG. 22 may be reversed. Although the layers have different periods in FIG. 22, all the layers may have the same period. In such a case, although the spectrum cannot be broadened, the emission intensity can be increased.

5-7. Structure Including Protective Layer

Figure 23:
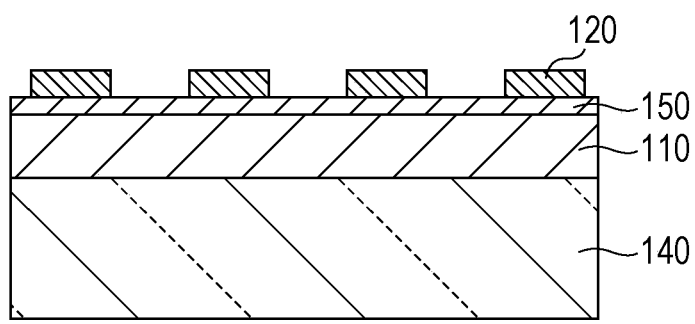
FIG. 23 is a cross-sectional view of a structure including a protective layer between a photoluminescent layer and a surface structure.

FIG. 23 is a cross-sectional view of a structure including a protective layer 150 between the photoluminescent layer 110 and the surface structure 120. The protective layer 150 may be provided to protect the photoluminescent layer 110. However, if the protective layer 150 has a lower refractive index than the photoluminescent layer 110, the electric field of light leaks into the protective layer 150 only by about half the wavelength. Thus, if the protective layer 150 has a thickness greater than the wavelength, no light reaches the surface structure 120. As a result, there is no quasi-guided mode, and the function of emitting light in a particular direction cannot be achieved. If the protective layer 150 has a refractive index higher than or similar to that of the photoluminescent layer 110, light reaches the interior of the protective layer 150; therefore, there is no limitation on the thickness of the protective layer 150. Nevertheless, a thinner protective layer 150 is advantageous because more light is emitted if most of the portion in which light is guided (this portion is hereinafter referred to as a "waveguide layer") is formed of a photoluminescent material. The protective layer 150 may be formed of the same material as the surface structure (or light-transmissive layer) 120. In such a case, the light-transmissive layer 120 having the periodic structure also functions as a protective layer. The light-transmissive layer 120 advantageously has a lower refractive index than the photoluminescent layer 110.

6. Materials

Directional light emission can be achieved if the photoluminescent layer (or waveguide layer) and the surface structure are formed of materials that satisfy the above conditions. The surface structure may be formed of any material. However, a photoluminescent layer (or waveguide layer) or a surface structure formed of a medium with high light absorption is less effective in confining light and therefore results in a lower peak intensity and Q value. Thus, the photoluminescent layer (or waveguide layer) and the surface structure may be formed of a material with relatively low light absorption.

For example, the surface structure may be formed of a dielectric material having low light absorptivity. Examples of candidate materials for the periodic structure include magnesium fluoride ($MgF_2$), lithium fluoride (LiF), calcium fluoride ($CaF_2$), quartz ($SiO_2$), glasses, resins, magnesium oxide (MgO), indium tin oxide (ITO), titanium oxide ($TiO_2$), silicon nitride (SiN), tantalum pentoxide ($Ta_2O_5$), zirconia ($ZrO_2$), zinc selenide (ZnSe), and zinc sulfide (ZnS). To form a surface structure having a lower refractive index than the photoluminescent layer, as described above, $MgF_2$, LiF, $CaF_2$, $SiO_2$, glasses, and resins can be used, which have refractive indices of approximately 1.3 to 1.5.

The term "photoluminescent material" encompasses fluorescent materials and phosphorescent materials in a narrow sense, encompasses inorganic materials and organic materials (for example, dyes), and encompasses quantum dots (for example, tiny semiconductor particles). In general, fluorescent materials containing an inorganic host material tend to have a higher refractive index. Examples of fluorescent materials that emit blue light include $M_{10}(PO_4)_6Cl_2$:$Eu^{2+}$ (wherein M is at least one element selected from Ba, Sr, and Ca), $BaMgAl_{10}O_{17}$:$Eu^{2+}$, $M_3MgSi_2O_8$:$Eu^{2+}$ (wherein M is at least one element selected from Ba, Sr, and Ca), and $M_5SiO_4Cl_6:Eu^{2+}$ (wherein M is at least one element selected from Ba, Sr, and Ca). Examples of fluorescent materials that emit green light include $M_2MgSi_2O_7:Eu^{2+}$ (wherein M is at least one element selected from Ba, Sr, and Ca), $SrSisAlO_2N_7:Eu^{2+}$, $SrSi_2O_2N_2:Eu^{2+}$, $BaAl_2O_4:Eu^{2+}$, $BaZrSi_3O_9:Eu^{2+}$, $M_2SiO_4:Eu^{2+}$ (wherein M is at least one element selected from Ba, Sr, and Ca), $BaSi_3O_4N_2:Eu^{2+}$, $CaMg(SiO_4)_4Cl_2:Eu^{2+}$, $Ca_3SiO_4Cl_2:Eu^{2+}$, $CaSi_{12-(m+n)}Al_{(m+n)}O_nN_{16-n}:Ce^{3+}$, and β-SiAlON:$Eu^{2+}$. Examples of fluorescent materials that emit red light include $CaAlSiN_3:Eu^{2+}$, $SrAlSi_4O_7:Eu^{2+}$, $M_2Si_5N_8:Eu^{2+}$ (wherein M is at least one element selected from Ba, Sr, and Ca), $MSiN_2:Eu^{2+}$ (wherein M is at least one element selected from Ba, Sr, and Ca), $MSi_2O_2N_2:Yb^{2+}$ (wherein M is at least one element selected from Sr and Ca), $Y_2O_2S:Eu^{3+}$, $Sm^{3+}$, $La_2O_2S:Eu^{3+}$, $Sm^{3+}$, $CaWO_4:Li^{1+}$, $Eu^{3+}$, $Sm^{3+}$, $M_2SiS_4:Eu^{2+}$ (wherein M is at least one element selected from Ba, Sr, and Ca), and $M_3SiO_5:Eu^{2+}$ (wherein M is at least one element selected from Ba, Sr, and Ca). Examples of fluorescent materials that emit yellow light include $Y_3Al_5O_{12}:Ce^{3+}$, $CaSi_2O_2N_2:Eu^{2+}$, $Ca_3Sc_2Si_3O_{12}:Ce^{3+}$, $CaSc_2O_4:Ce^{3+}$, α-SiAlON:$Eu^{2+}$, $MSi_2O_2N_2:Eu^{2+}$ (wherein M is at least one element selected from Ba, Sr, and Ca), and $M_7(SiO_3)_6Cl_2:Eu^{2+}$ (wherein M is at least one element selected from Ba, Sr, and Ca).

Examples of quantum dots include materials such as CdS, CdSe, core-shell CdSe/ZnS, and alloy CdSSe/ZnS. Light having various wavelengths can be emitted depending on the material. Examples of matrices for quantum dots include glasses and resins.

The substrate 140, as illustrated in, for example, FIGS. 1C and 1D, is formed of a light-transmissive material having a lower refractive index than the photoluminescent layer 110. Examples of such materials include $MgF_2$, LiF, $CaF_2$, $SiO_2$, glasses, and resins. In structures in which excitation light enters the photoluminescent layer 110 without passing through the substrate 140, the substrate 140 is not necessarily transparent. For example, the substrate 140 may be formed of $BaF_2$, $SrF_2$, MgO, $MgAl_2O_4$, sapphire ($Al_2O_3$), $SrTiO_3$, $LaAlO_3$, $TiO_2$, $Gd_3Ga_5O_{12}$, $LaSrAlO_4$, $LaSrGaO_4$, $LaTaO_3$, SrO, yttria-stabilized zirconia (YSZ) $ZrO_2.Y_2O_3$, yttrium-aluminum-garnet (YAG), or $Tb_3Ga_5O_{12}$.

7. Production Method

A method for producing a light-emitting device will be described below.

Figure 24:
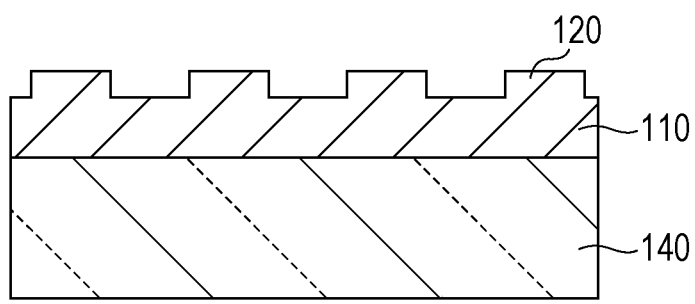
FIG. 24 is a cross-sectional view of a structure including a surface structure formed by processing only a portion of a photoluminescent layer.

A method for forming the structure illustrated in FIGS. 1C and 1D includes forming a thin film of the photoluminescent layer 110 on the transparent substrate 140, for example, by evaporation, sputtering, or coating of a fluorescent material, forming a dielectric film, and then patterning the dielectric film, for example, by photolithography to form the surface structure 120. Alternatively, the surface structure 120 may be formed by nanoimprinting. As illustrated in FIG. 24, the surface structure 120 may also be formed by partially processing the photoluminescent layer 110. In such a case, the surface structure 120 is formed of the same material as the photoluminescent layer 110.

The light-emitting device 100 illustrated in FIGS. 1A and 1B can be produced, for example, by producing the light-emitting device 100a illustrated in FIGS. 1C and 1D and then removing the photoluminescent layer 110 and the surface structure 120 from the substrate 140.

The structure illustrated in FIG. 19A can be produced, for example, by forming the surface structure 120a on the transparent substrate 140 by a process such as a semiconductor process or nanoimprinting and then depositing thereon the material of the photoluminescent layer 110 by a process such as evaporation or sputtering. The structure illustrated in FIG. 19B can also be formed by filling the recesses in the surface structure 120a with the photoluminescent layer 110 by coating.

These production methods are for illustrative purposes only, and the light-emitting devices according to the embodiments of the present disclosure may be produced by other methods.

8. Experimental Examples

Light-emitting devices for use in light-emitting apparatuses according to embodiments of the present disclosure are described in the following examples.

A sample light-emitting device having the structure as illustrated in FIG. 19A was prepared and evaluated for its properties. The light-emitting device was prepared as described below.

Figure 25:
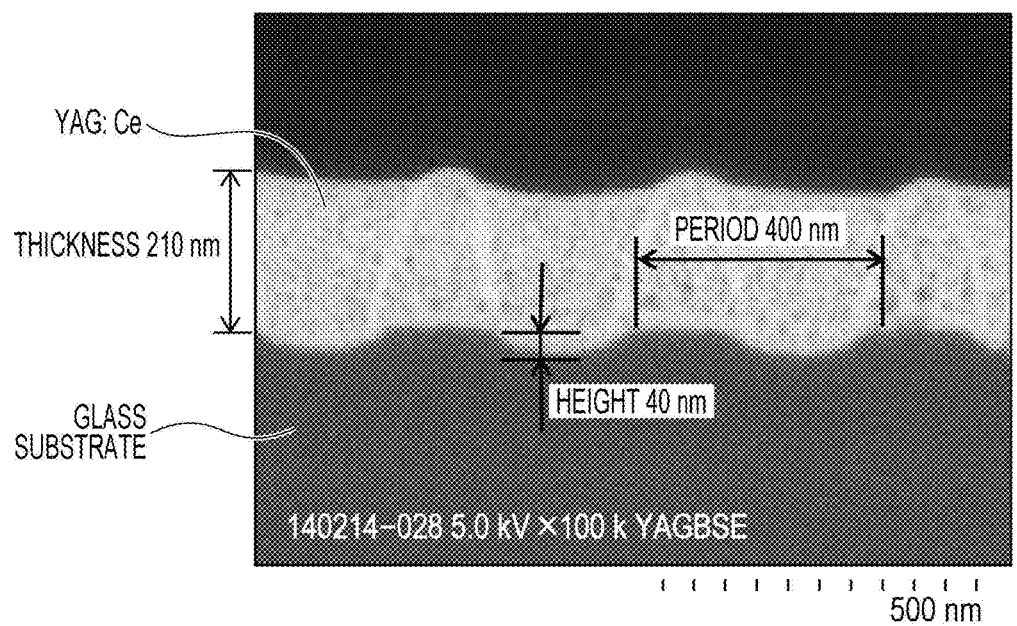
FIG. 25 is a cross-sectional transmission electron microscopy (TEM) image of a photoluminescent layer formed on a glass substrate having a periodic structure.
Figure 26:
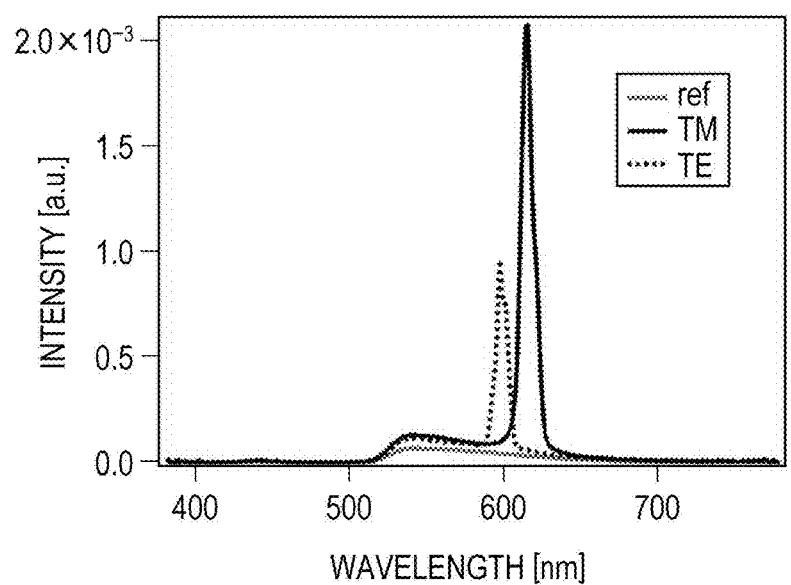
FIG. 26 is a graph showing the measurement results of the spectrum of light emitted from a sample light-emitting device in the front direction.

A one-dimensional periodic structure (stripe-shaped projections) having a period of 400 nm and a height of 40 nm was formed on a glass substrate, and a photoluminescent material YAG:Ce was deposited thereon to form a film having a thickness of 210 nm. FIG. 25 shows a cross-sectional transmission electron microscopy (TEM) image of the resulting light-emitting device. FIG. 26 shows the measurement results of the spectrum of light emitted from the light-emitting device in the front direction when YAG:Ce was excited with an LED having an emission wavelength of 450 nm. FIG. 26 shows the results (ref) for a light-emitting device having no periodic structure, the results for the TM mode, and the results for the TE mode. The TM mode has a polarization component parallel to the one-dimensional periodic structure. The TE mode has a polarization component perpendicular to the one-dimensional periodic structure. The results show that the intensity of light having a particular wavelength is significantly higher in the presence of the periodic structure than in the absence of the periodic structure. The results also show that the light enhancement effect is greater in the TM mode, which has a polarization component parallel to the one-dimensional periodic structure.

Figure 27A:
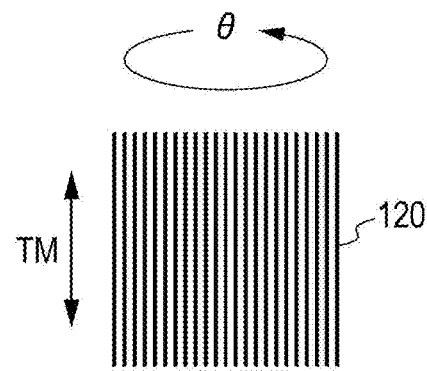
FIG. 27A is a schematic view of a light-emitting device that can emit linearly polarized light in the TM mode, rotated about an axis parallel to the line direction of the one-dimensional periodic structure.
Figure 27B:
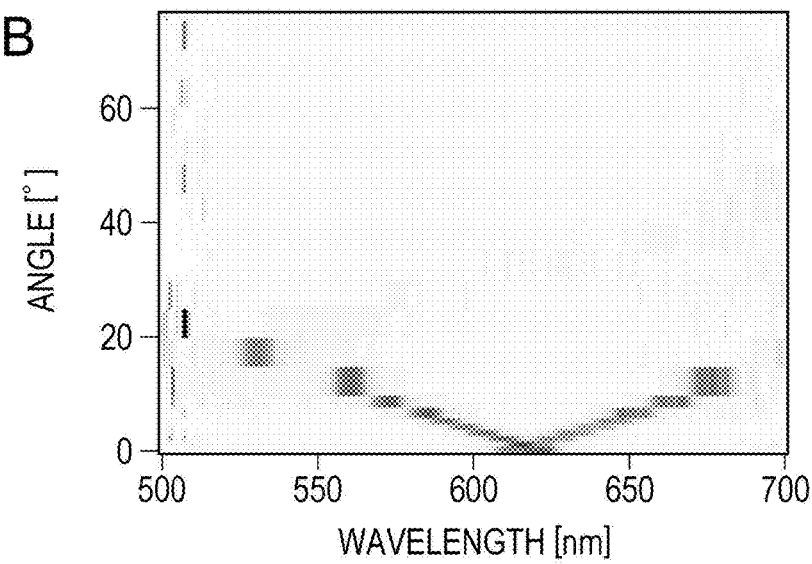
FIG. 27B is a graph showing the measurement results of the angular dependence of light emitted from the sample light-emitting device rotated as illustrated in FIG. 27A.
Figure 27C:
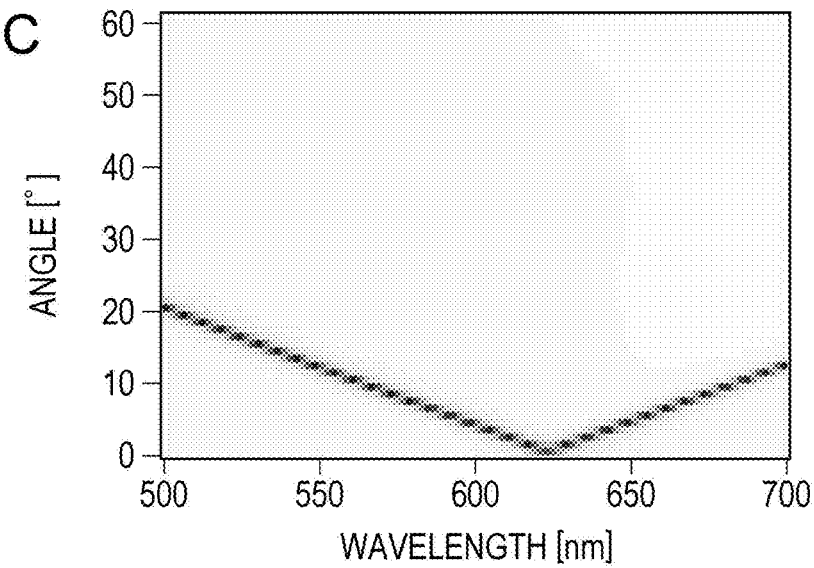
FIG. 27C is a graph showing the calculation results of the angular dependence of light emitted from the sample light-emitting device rotated as illustrated in FIG. 27A.
Figure 27D:
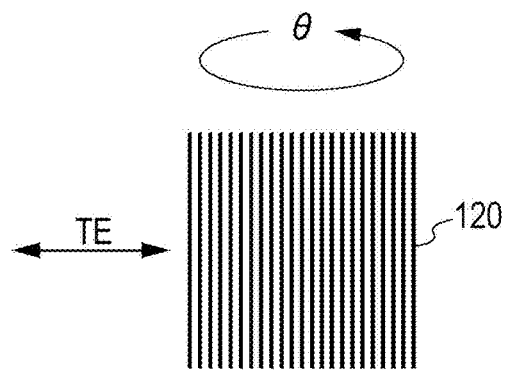
FIG. 27D is a schematic view of a light-emitting device that can emit linearly polarized light in the TE mode, rotated about an axis parallel to the line direction of the one-dimensional periodic structure.
Figure 27E:
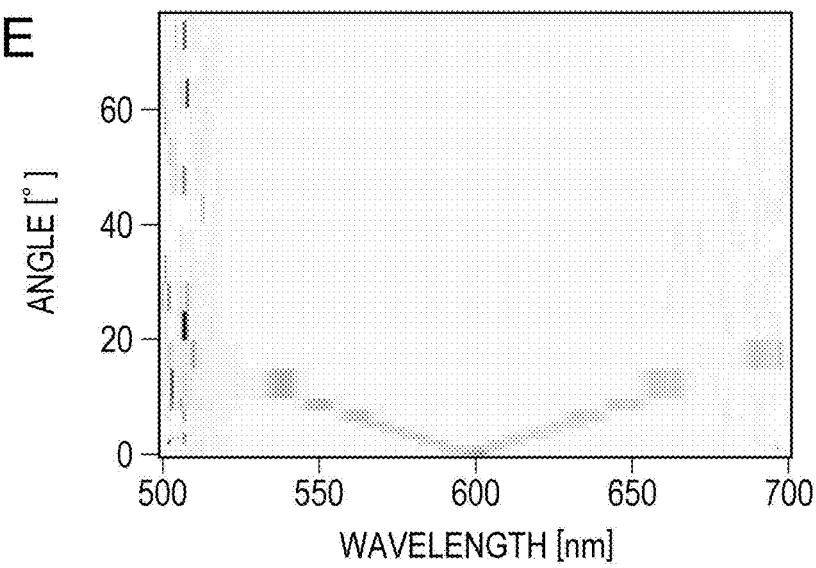
FIG. 27E is a graph showing the measurement results of the angular dependence of light emitted from the sample light-emitting device rotated as illustrated in FIG. 27D.
Figure 27F:
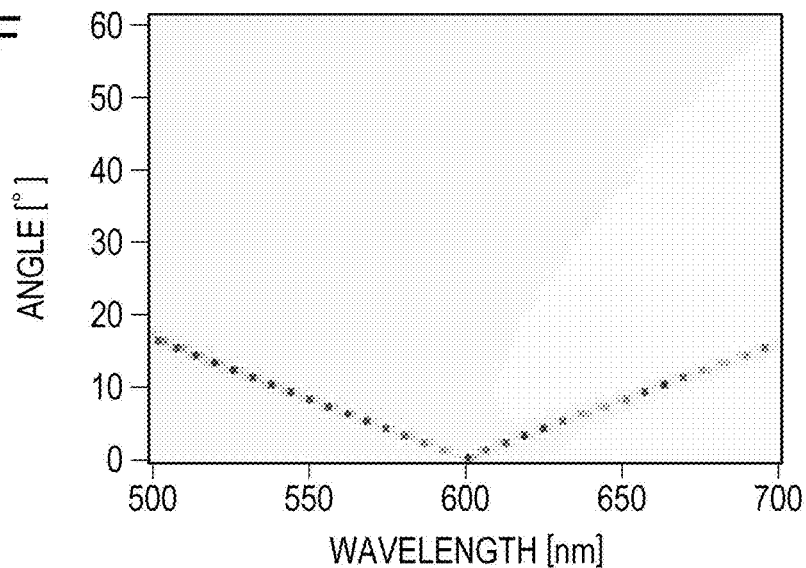
FIG. 27F is a graph showing the calculation results of the angular dependence of light emitted from the sample light-emitting device rotated as illustrated in FIG. 27D.
Figure 28A:
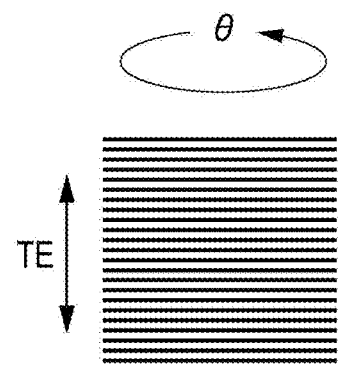
FIG. 28A is a schematic view of a light-emitting device that can emit linearly polarized light in the TE mode, rotated about an axis perpendicular to the line direction of the one-dimensional periodic structure.
Figure 28B:
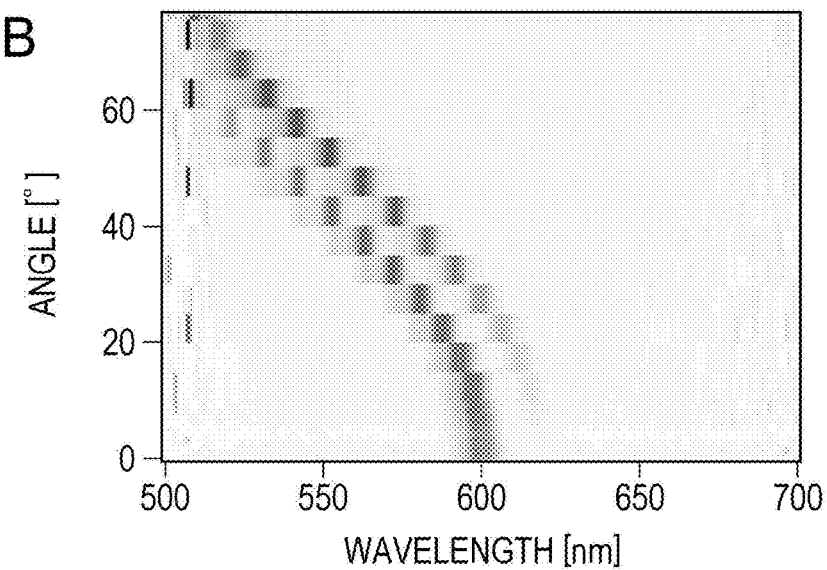
FIG. 28B is a graph showing the measurement results of the angular dependence of light emitted from the sample light-emitting device rotated as illustrated in FIG. 28A.
Figure 28C:
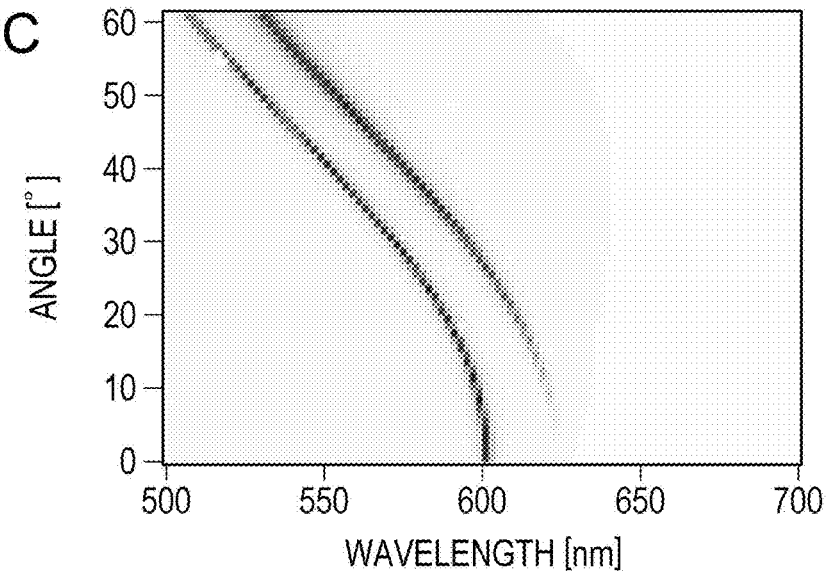
FIG. 28C is a graph showing the calculation results of the angular dependence of light emitted from the sample light-emitting device rotated as illustrated in FIG. 28A.
Figure 28D:
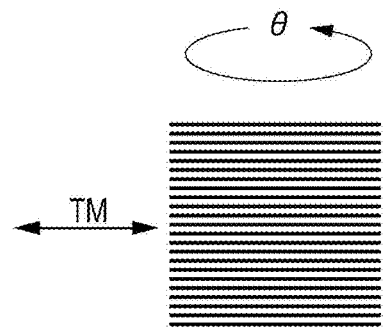
FIG. 28D is a schematic view of a light-emitting device that can emit linearly polarized light in the TM mode, rotated about an axis perpendicular to the line direction of the one-dimensional periodic structure.
Figure 28E:
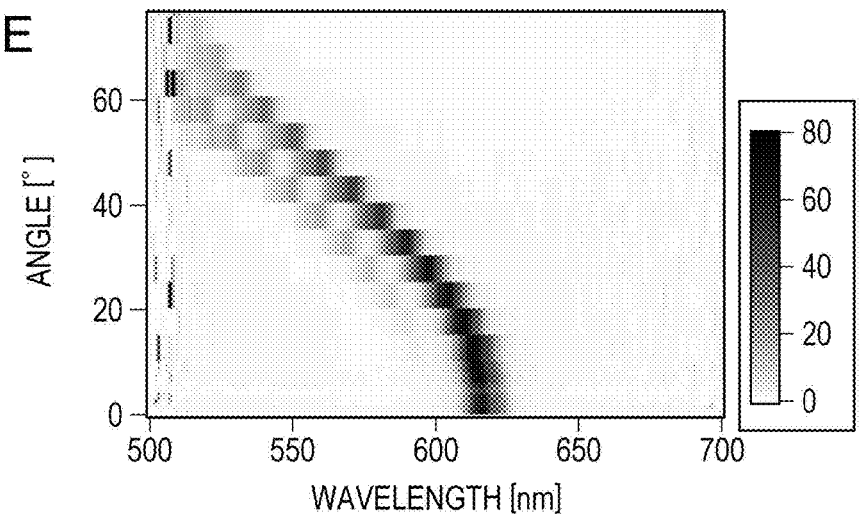
FIG. 28E is a graph showing the measurement results of the angular dependence of light emitted from the sample light-emitting device rotated as illustrated in FIG. 28D.
Figure 28F:
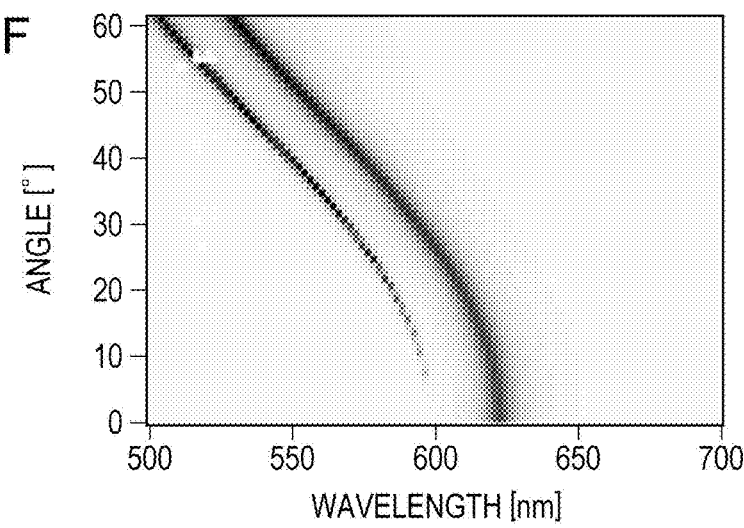
FIG. 28F is a graph showing the calculation results of the angular dependence of light emitted from the sample light-emitting device rotated as illustrated in FIG. 28D.

FIGS. 27A to 27F and FIGS. 28A to 28F show the results of measurements and calculations of the angular dependence of the intensity of light emitted from the same sample. FIG. 27A illustrates a light-emitting device that can emit linearly polarized light in the TM mode, rotated about an axis parallel to the line direction of the one-dimensional periodic structure 120. FIGS. 27B and 27C show the results of measurements and calculations for the rotation. FIG. 27D illustrates a light-emitting device that can emit linearly polarized light in the TE mode, rotated about an axis parallel to the line direction of the one-dimensional periodic structure 120. FIGS. 27E and 27F show the results of measurements and calculations for the rotation. FIG. 28A illustrates a light-emitting device that can emit linearly polarized light in the TE mode, rotated about an axis perpendicular to the line direction of the one-dimensional periodic structure 120. FIGS. 28B and 28C show the results of measurements and calculations for the rotation. FIG. 28D illustrates a light-emitting device that can emit linearly polarized light in the TM mode, rotated about an axis perpendicular to the line direction of the one-dimensional periodic structure 120. FIGS. 28E and 28F show the results of measurements and calculations for the rotation.

As is clear from FIGS. 27A to 27F and FIGS. 28A to 28F, the enhancement effect is greater for the TM mode. The wavelength of enhanced light shifts with angle. For example, light having a wavelength of 610 nm is observed only in the TM mode and in the front direction, indicating that the light is directional and polarized. Furthermore, the measurement results and the calculation results match each other in FIGS. 27B and 27C, FIGS. 27E and 27F, FIGS. 28B and 28C, and FIGS. 28E and 28F. Thus, the validity of the above calculations was experimentally demonstrated.

Figure 29:
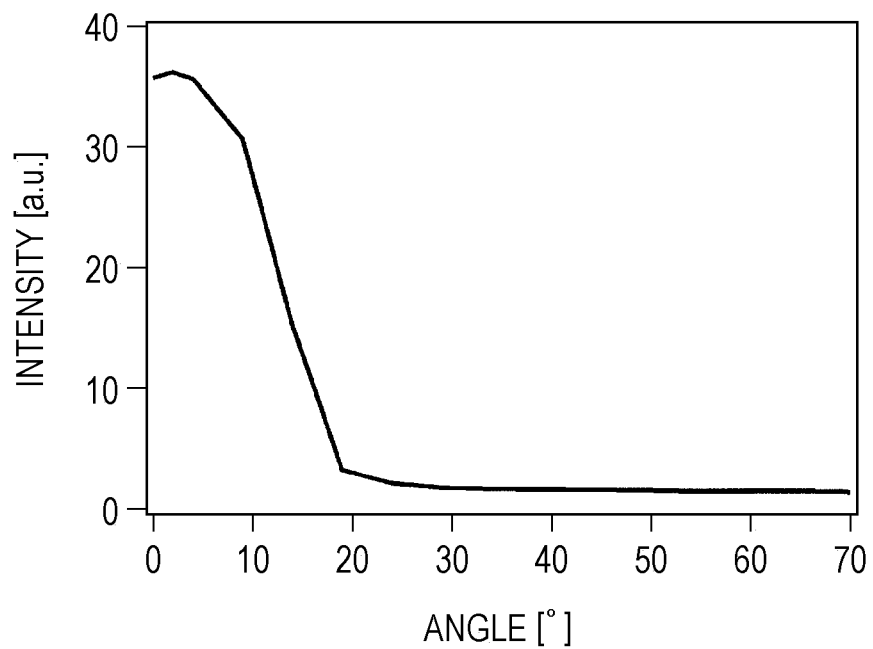
FIG. 29 is a graph showing the measurement results of the angular dependence of light (wavelength: 610 nm) emitted from a sample light-emitting device.

FIG. 29 shows the angular dependence of the intensity of light having a wavelength of 610 nm for rotation about an axis perpendicular to the line direction, as illustrated in FIG. 28D. The results show that the light was significantly enhanced in the front direction and was little enhanced at other angles. The directional angle of light emitted in the front direction is less than 15 degrees. As described above, the directional angle is the angle at which the intensity is 50% of the maximum intensity and is expressed as the angle of one side with respect to the direction with the maximum intensity. The results shown in FIG. 29 demonstrates that directional light emission was achieved. In addition, all the light was in the TM mode, which demonstrates that polarized light emission was simultaneously achieved.

Although YAG:Ce, which emits light in a wide wavelength range, was used in the above experiment, directional and polarized light emission can also be achieved using a similar structure including a photoluminescent material that emits light in a narrow wavelength range. Such a photoluminescent material does not emit light having other wavelengths and can therefore be used to provide a light source that does not emit light in other directions or in other polarized states.

9. Other Modifications

Figure 31:
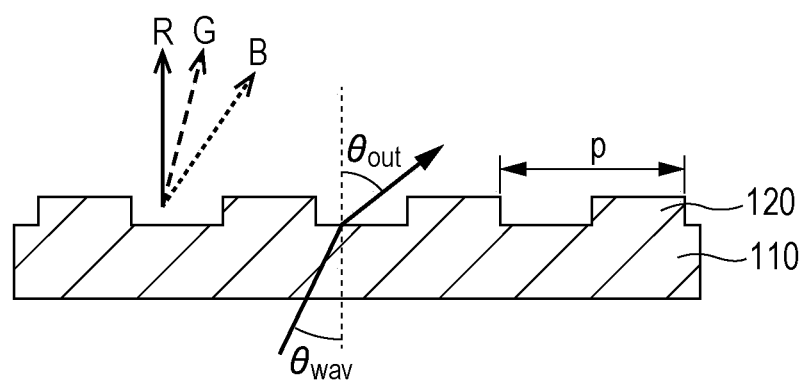
FIG. 31 is a schematic view illustrating the relationship between the wavelength and emission direction of light under the emission enhancement effect in a light-emitting device having a surface structure on a photoluminescent layer.

As described above, the wavelength and emission direction of light under the light enhancement effect depend on the submicron structure of a light-emitting device according to the present disclosure. FIG. 31 illustrates a light-emitting device having a surface structure 120 on a photoluminescent layer 110. The surface structure 120 is formed of the same material as the photoluminescent layer 110 and has the one-dimensional periodic structure illustrated in FIG. 1A. Light to be enhanced by the one-dimensional periodic structure satisfies $p \times n_{wav} \times \sin \theta_{wav} - p \times n_{out} \times \sin \theta_{out} = m\lambda$ (see the formula (5)), wherein p (nm) denotes the period of the one-dimensional periodic structure, $n_{wav}$ denotes the refractive index of the photoluminescent layer 110, $n_{out}$ denotes the refractive index of an outer medium to which the light is emitted, $\theta_{wav}$ denotes the incident angle on the one-dimensional periodic structure, and $\theta_{out}$ denotes the angle at which the light is emitted from one-dimensional periodic structure to the outer medium. λ is the light wavelength in air, and m is an integer.

The formula can be transformed into $\theta_{out} = \arcsin[(n_{wav} \times \sin \theta_{wav} - m\lambda/p)/n_{out}]$. Thus, in general, the output angle $\theta_{out}$ of light under the light enhancement effect varies with the wavelength λ. Consequently, as schematically illustrated in FIG. 31, the color of visible light varies with the observation direction.

This visual angle dependency can be reduced by determining $n_{wav}$ and $n_{out}$ so as to make $(n_{wav} \times \sin \theta_{wav} - m\lambda/p)/n_{out}$ constant for any wavelength λ. The refractive indices of substances have wavelength dispersion (wavelength dependence). Thus, a material to be selected should have the wavelength dispersion characteristics of $n_{wav}$ and $n_{out}$ such that $(n_{wav} \times \sin \theta_{wav} - m\lambda/p)/n_{out}$ is independent of the wavelength λ. For example, if the outer medium is air, $n_{out}$ is approximately 1.0 irrespective of the wavelength. Thus, the material of the photoluminescent layer 110 and the one-dimensional periodic structure has a narrow wavelength dispersion of the refractive index $n_{wav}$. The material may have reciprocal dispersion, in which the refractive index $n_{wav}$ decreases with decreasing wavelength of light.

Figure 32A:
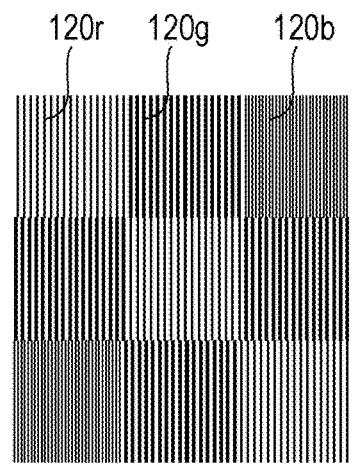
FIG. 32A is a schematic plan view of an example structure of an array of periodic structures having different wavelengths at which the light enhancement effect is produced.

As illustrated in FIG. 32A, an array of periodic structures having different wavelengths at which the light enhancement effect is produced can emit white light. In the example illustrated in FIG. 32A, a surface structure 120r that can enhance red light (R), a surface structure 120g that can enhance green light (G), and a surface structure 120b that can enhance blue light (B) are arranged in a matrix. Each of the surface structures 120r, 120g, and 120b may be a one-dimensional periodic structure. The projections of the surface structures 120r, 120g, and 120b are arranged in parallel. Thus, the red light, green light, and blue light have the same polarization characteristics. Light beams of three primary colors emitted from the surface structures 120r, 120g, and 120b under the light enhancement effect are mixed to produce linearly polarized white light.

Each of the surface structures 120r, 120g, and 120b arranged in a matrix is referred to as a unit periodic structure (or pixel). The size (the length of one side) of the unit periodic structure may be at least three times the period. The unit periodic structures are advantageously not perceived by the human eye in order to produce the color mixing effect. For example, the length of one side is less than 1 mm. Although each of the unit periodic structures is square in FIG. 32A, adjacent surface structures 120r, 120g, and 120b may be in the shape other than square, such as rectangular, triangular, or hexagonal.

A photoluminescent layer under each of the surface structures 120r, 120g, and 120b may be the same or may be formed of different photoluminescent materials corresponding to each color of light.

Figure 32B:
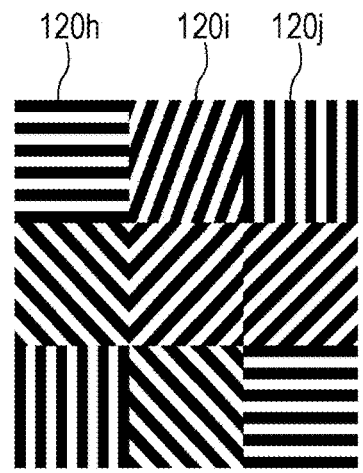
FIG. 32B is a schematic plan view of an example structure that includes an array of one-dimensional periodic structures having projections extending in different directions.

As illustrated in FIG. 32B, the projections of the one-dimensional periodic structures (including surface structures 120h, 120i, and 120j) may extend in different directions. Light emitted from each of the periodic structures under the light enhancement effect may have the same wavelength or different wavelengths. For example, the same periodic structures arranged as illustrated in FIG. 32B can produce unpolarized light. The surface structures 120r, 120g, and 120b in FIG. 32A arranged as illustrated in FIG. 32B can produce unpolarized white light as a whole.

Figure 32C:
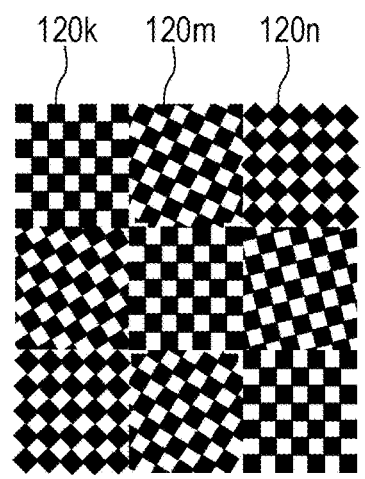
FIG. 32C is a schematic plan view of an example structure that includes an array of two-dimensional periodic structures.

As a matter of course, the periodic structures to be tiled are not limited to one-dimensional periodic structures and may be two-dimensional periodic structures (including surface structures 120k, 120m, and 120n), as illustrated in FIG. 32C. The period and direction of each of the surface structures 120k, 120m, and 120n may be the same or different, as described above, and may be appropriately determined as required.

Figure 33:
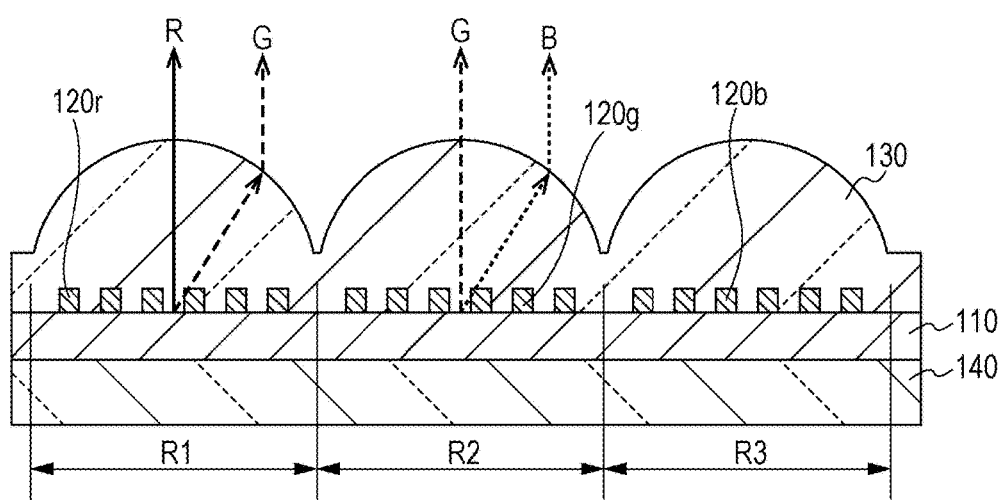
FIG. 33 is a schematic cross-sectional view of a light-emitting device including microlenses.

As illustrated in FIG. 33, for example, an array of microlenses 130 may be disposed on a light emission side of a light-emitting device. The array of microlenses 130 can refract oblique light in the normal direction and thereby produce the color mixing effect.

The light-emitting device illustrated in FIG. 33 includes regions R1, R2, and R3, which include the surface structures 120r, 120g, and 120b, respectively, illustrated in FIG. 32A. In the region R1, the surface structure 120r emits red light R in the normal direction and, for example, emits green light G in an oblique direction. The microlens 130 refracts the oblique green light G in the normal direction. Consequently, a mixture of red light R and green light G is observed in the normal direction. Thus, the microlenses 130 can reduce difference in light wavelength depending on the angle. Although the microlens array including microlenses corresponding to the periodic structures is described here, another microlens array is also possible. As a matter of course, periodic structures to be tiled are not limited to those described above and may be the same periodic structures or the structures illustrated in FIG. 32B or 32C.

A lenticular lens may also be used as an optical element for refracting oblique light instead of the microlens array. In addition to lenses, prisms may also be used. A prism array may also be used. A prism corresponding to each periodic structure may be arranged. Prisms of any shape may be used. For example, triangular prisms or pyramidal prisms may be used.

Figure 34A:
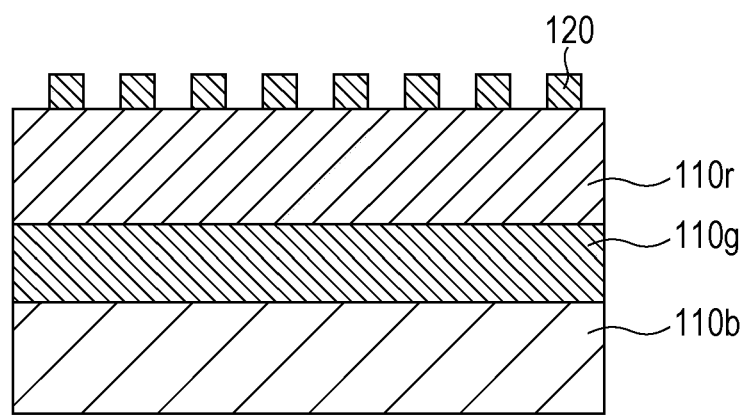
FIG. 34A is a schematic cross-sectional view of a light-emitting device that includes photoluminescent layers having different emission wavelengths.
Figure 34B:
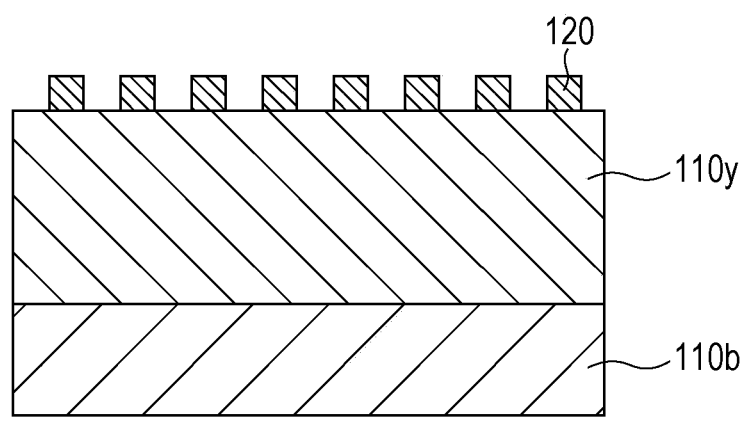
FIG. 34B is a schematic cross-sectional view of another light-emitting device that includes photoluminescent layers having different emission wavelengths.

White light (light having a broad spectral width) may be produced by using the periodic structure described above or using two or more photoluminescent layers as illustrated in FIG. 34A or 34B. As illustrated in FIG. 34A, photoluminescent layers 110b, 110g, and 110r having different emission wavelengths may be stacked to produce white light. The stacking sequence is not limited to that illustrated in FIG. 34A. As illustrated in FIG. 34B, a photoluminescent layer 110y that emits yellow light may be disposed on a photoluminescent layer 110b that emits blue light. The photoluminescent layer 110y may be formed of YAG.

When photoluminescent materials, such as fluorescent dyes, to be mixed with a matrix (host) material are used, photoluminescent materials having different emission wavelengths may be mixed with the matrix material to emit white light from a single photoluminescent layer. Such a photoluminescent layer that can emit white light may be used in tiled unit periodic structures as illustrated in FIGS. 32A to 32C.

10. Light-Emitting Apparatus Including Converging Lens

Figure 35:
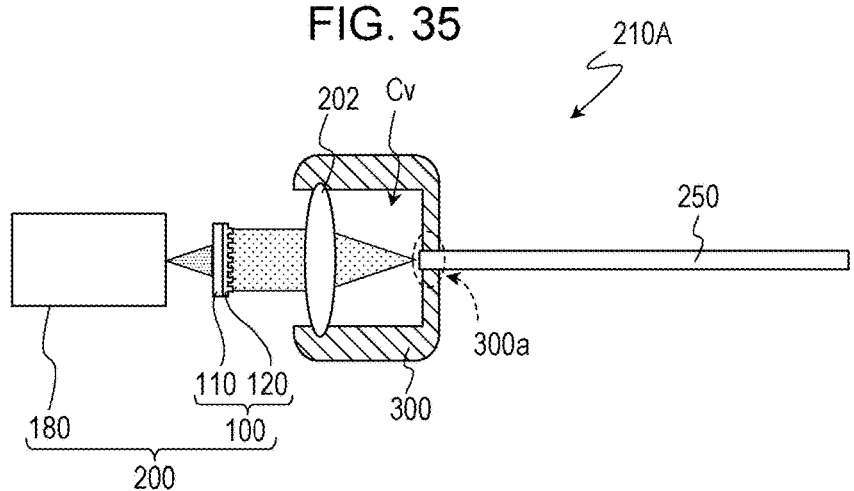
FIG. 35 is a schematic view of an exemplary structure of a light-emitting apparatus according to an embodiment of the present disclosure.

An exemplary structure of a light-emitting apparatus according to an embodiment of the present disclosure will be described below. FIG. 35 is a schematic view of an exemplary structure of a light-emitting apparatus according to an embodiment of the present disclosure. A light-emitting apparatus 210A illustrated in FIG. 35 roughly includes the light-emitting apparatus 200 illustrated in FIG. 16 and a converging lens 202 for receiving light from the light-emitting apparatus 200. More specifically, the light-emitting apparatus 210A includes the excitation light source 180, the light-emitting device 100, and the converging lens 202.

The light-emitting device 100 is disposed on the optical path of excitation light emitted from the excitation light source 180. Excitation light emitted from the excitation light source 180 enters the photoluminescent layer 110 of the light-emitting device 100 disposed on the optical path of the excitation light. The photoluminescent material in the photoluminescent layer 110 emits light upon receiving excitation light. Light from the photoluminescent layer 110 is emitted from the light-emitting device 100 through the surface structure 120 (see FIG. 16, for example). As described above, the light-emitting device 100 can emit light in a particular direction. In this example, light is emitted in the front direction of the light-emitting device 100. As a matter of course, the light-emitting device 100a illustrated in FIGS. 1C and 1D may be used instead of the light-emitting device 100.

Light emitted from the light-emitting device 100 enters the converging lens 202 facing the surface structure 120. In the structure illustrated in FIG. 35, the converging lens 202 is supported by a housing 300 so as to be disposed on the optical path of light emitted from the light-emitting device 100. The housing 300 may fix the positions of the light-emitting device 100 and the converging lens 202.

In the structure illustrated in FIG. 35, the light-emitting apparatus 210A is coupled to an optical fiber 250. In this example, the housing 300 has an opening 300a at an incident position of light passing through the converging lens 202. One end of the optical fiber 250 is inserted into the opening 300a and is fixed to the light-emitting apparatus 210A.

One end of the optical fiber 250 coupled to the light-emitting apparatus 210A is disposed at an incident position of light passing through the converging lens 202. Thus, at least part of light passing through the converging lens 202 enters the optical fiber 250. Thus, the optical fiber 250 coupled to the light-emitting apparatus 210A is optically coupled to the light-emitting apparatus 210A. Thus, in the structure illustrated in FIG. 35, the opening 300a functions as a joint for the optical fiber 250. In this example, the optical axis of the converging lens 202 coincides with the axis of the optical fiber 250.

A structure for coupling of an optical fiber may be any structure that can receive an inlet of the optical fiber and is not limited to the structure illustrated in FIG. 35. The opening 300a may be provided with a transparent member that can transmit light passing through the converging lens 202. A transparent member on the opening 300a may have an antireflection coating. The light-emitting apparatus 210A may have an optical connector, socket, slot, or plug as a joint for an optical fiber at the incident position of light passing through the converging lens 202.

Figure 36:
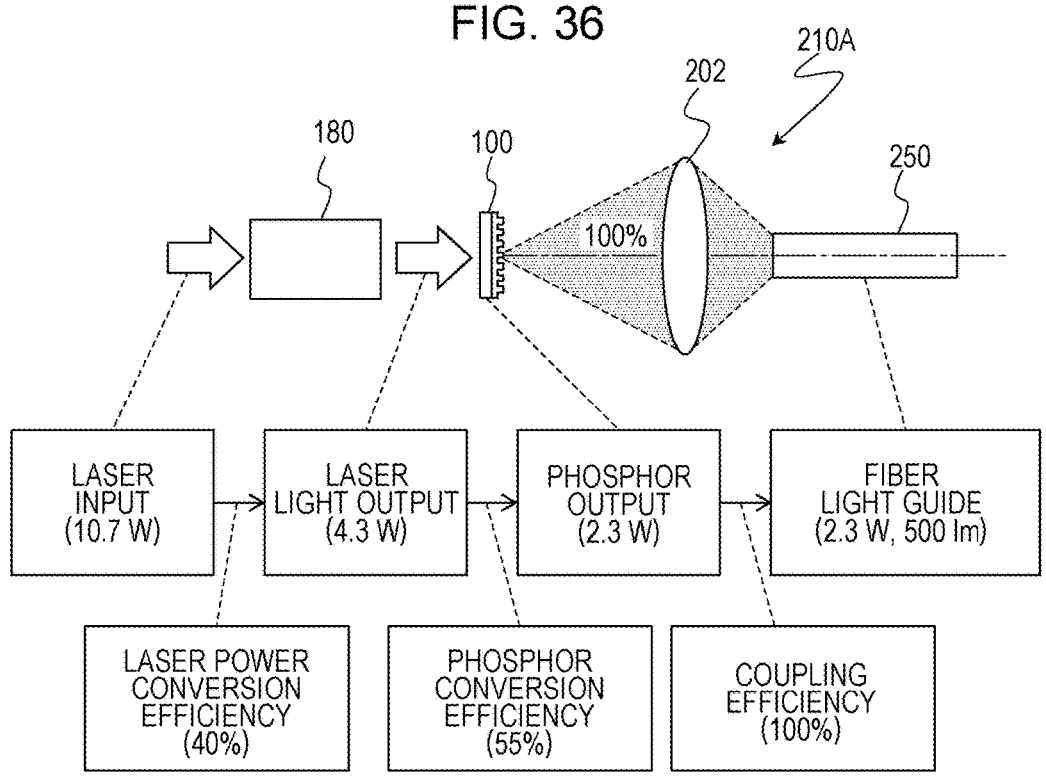
FIG. 36 is a schematic view illustrating coupling efficiency between a light-emitting device and a converging lens in a light-emitting apparatus according to an embodiment of the present disclosure.

As described above, the light-emitting device 100 has a novel structure for controlling the directionality of emitted light. For example, the light-emitting device 100 can selectively emit light from the photoluminescent layer 110 in the front direction. Thus, as schematically illustrated in FIG. 36, the outgoing beams can almost entirely enter the converging lens 202 without a collimating lens. Since the light-emitting device 100 can emit directional light, the present embodiment of the present disclosure can improve light-use efficiency without a large converging lens. Thus, a smaller light-emitting apparatus or optical device can be provided.

Figure 37:
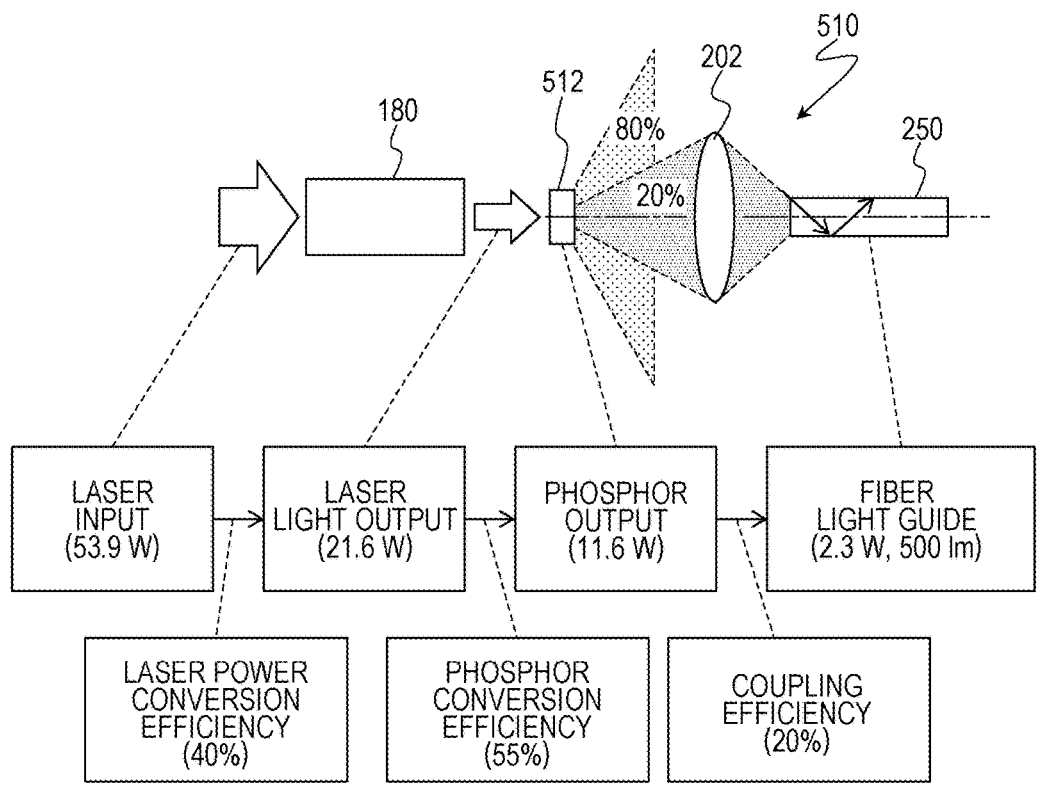
FIG. 37 is a schematic view illustrating coupling efficiency between a phosphor and a converging lens in a light-emitting apparatus according to a comparative example.

FIG. 37 illustrates a light-emitting apparatus 510 according to a comparative example. The light-emitting apparatus 510 includes a known phosphor 512 instead of the light-emitting device 100. In FIGS. 36 and 37, the housing 300 illustrated in FIG. 35 is omitted. The housing 300 may also be omitted in other figures.

In the light-emitting apparatus 510, the phosphor 512 emits light in all directions. Thus, the outgoing beams from the phosphor 512 include light beams that cannot theoretically enter the converging lens 202. Thus, light from the phosphor 512 cannot be effectively utilized. For example, as schematically illustrated in FIG. 37, the percentage of light beams emitted from the phosphor 512 and incident on the converging lens 202 is approximately 20%. The remainder (80%) of the light beams emitted from the phosphor 512 are lost.

In the optical system illustrated in FIG. 36 or 37 in which light emitted from the light source (the light-emitting device 100 or the phosphor 512) enters the optical fiber 250, it is known that the amount called "etendue" is preserved in the absence of diffusion. For example, the etendue of a light source is defined as the product of the luminous area of the light source and the solid angle of divergent light from the light source. Etendue is also defined for a surface for receiving light from the light source. The etendue on a light-receiving side represents the ability of introducing light. When the etendue on a light-receiving side is smaller than the etendue of a light source, light from the light source is not entirely introduced into the light-receiving side and is partly lost. When the etendue of a light source is identical with the etendue of an optical fiber to be irradiated, the light-use efficiency reaches its maximum. The etendue of the optical fiber 250 depends on the numerical aperture of the optical fiber 250. An etendue of the light source greater than the etendue of the optical fiber causes a loss.

In the light-emitting apparatus 210A illustrated in FIG. 36, when the converging lens 202 has a focal length that matches the numerical aperture of the optical fiber 250, and the distance between the converging lens 202 and an end surface of the optical fiber 250 is appropriate, light from the converging lens 202 can almost entirely enters the optical fiber 250. If the light-emitting apparatus 210A has a joint for an optical fiber, the optical fiber 250 can be fixed to the light-emitting apparatus 210A, and the light-emitting apparatus 210A and the optical fiber 250 can advantageously have high coupling efficiency.

In contrast, in the structure that includes the known phosphor 512 instead of the light-emitting device 100 (see FIG. 37), the phosphor 512 emits light in all directions, and the etendue of the phosphor 512 is generally greater than the etendue of the optical fiber. Thus, the phosphor 512 and the optical fiber 250 cannot have high coupling efficiency. In the structure illustrated in FIG. 37, the phosphor 512 and the optical fiber 250 have a coupling efficiency of only 20%. As long as the etendue on a light-receiving side is constant, the amount of light incident on the optical fiber 250 does not increase with increasing luminous area of the light source (the phosphor 512). As described above, the etendue of the optical fiber 250 depends on the numerical aperture of the optical fiber 250. Thus, if the numerical aperture of the optical fiber 250 is constant, an increase in the diameter of the converging lens 202 to increase the number of light beams incident on the converging lens 202 cannot increase the number of light beams incident on the optical fiber 250.

In the light-emitting apparatus 210A, outgoing beams from the light-emitting device 100 can almost entirely enter the converging lens 202 (see FIG. 36). Light from the light-emitting device 100 can almost entirely enter the optical fiber 250. Thus, in the present embodiment of the present disclosure, the emission direction of light from the light-emitting device 100 can be controlled through the converging lens 202 such that the light enters the optical fiber 250. This can improve coupling efficiency between the light-emitting device 100 and the optical fiber 250.

In the present embodiment of the present disclosure, the same output (light beam) from the optical fiber 250 can be produced with smaller input energy due to higher coupling efficiency between the light-emitting device 100 and the optical fiber 250. For example, if the optical fiber 250 produces an output of 2.3 W using a laser diode having a power conversion efficiency of 40% as the excitation light source 180, and the phosphor has a conversion efficiency of 55%, then energy input to the excitation light source 180 per unit time is approximately 53.9 W in the light-emitting apparatus 510 according to the comparative example illustrated in FIG. 37 and approximately 10.7 W in the light-emitting apparatus 210A illustrated in FIG. 36. Thus, the light-emitting apparatus 210A can save energy.

In FIGS. 35 to 37, the converging lens 202 is a biconvex lens. However, the converging lens 202 is not limited to the biconvex lens and may be a plano-convex lens, a Fresnel lens, or a gradient refractive index lens (GRIN) lens, in which the refractive index changes along an axis. The converging lens 202 may be a lens attached to an end surface of the optical fiber.

10-1. Modified Examples of Light-Emitting Apparatus Including Converging Lens

Figure 38:
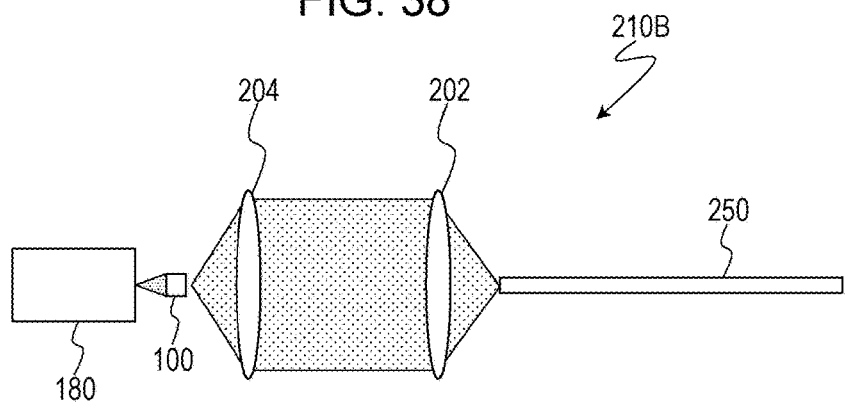
FIG. 38 is a schematic view of another modified example of a light-emitting apparatus according to an embodiment of the present disclosure.

FIG. 38 illustrates another modified example of a light-emitting apparatus according to an embodiment of the present disclosure; A light-emitting apparatus 210B illustrated in FIG. 38 includes a collimating lens 204 between the light-emitting device 100 and the converging lens 202. Light emitted from the light-emitting device 100 has a relatively small directional angle. Thus, high light-use efficiency can be achieved even with the collimating lens 204 having a small diameter. In this structure, the distance between the light-emitting device 100 and a joint of the optical fiber 250 can be increased. This improves the design flexibility of the optical system.

Figure 39:
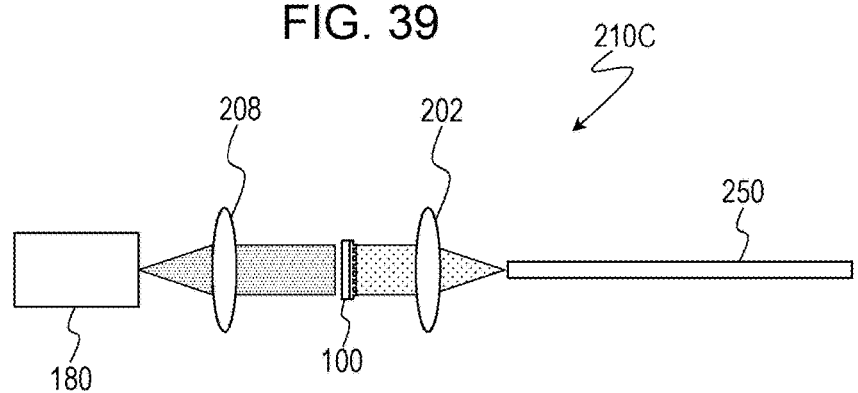
FIG. 39 is a schematic view of still another modified example of a light-emitting apparatus according to an embodiment of the present disclosure.

FIG. 39 illustrates still another modified example of a light-emitting apparatus according to an embodiment of the present disclosure. A light-emitting apparatus 210C illustrated in FIG. 39 includes a collimating lens 208 between the excitation light source 180 and the light-emitting device 100. In this structure, the light-emitting device 100 can be irradiated with collimated excitation light. Thus, the photoluminescent layer 110 can be evenly excited.

Figure 40:
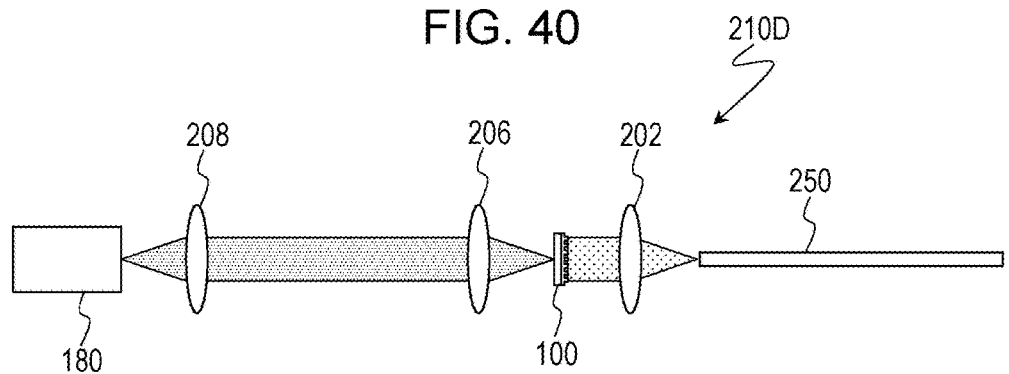
FIG. 40 is a schematic view of still another modified example of a light-emitting apparatus according to an embodiment of the present disclosure.

FIG. 40 illustrates still another modified example of a light-emitting apparatus according to an embodiment of the present disclosure. A light-emitting apparatus 210D illustrated in FIG. 40 includes the collimating lens 208 between the excitation light source 180 and the light-emitting device 100 and a converging lens 206 between the collimating lens 208 and the light-emitting device 100. This structure can converge excitation light and therefore miniaturize the light-emitting device 100. Thus, the optical system can be miniaturized. Furthermore, the distance between the excitation light source 180 and the light-emitting device 100 can be increased. This improves the design flexibility of the optical system.

Figure 41:
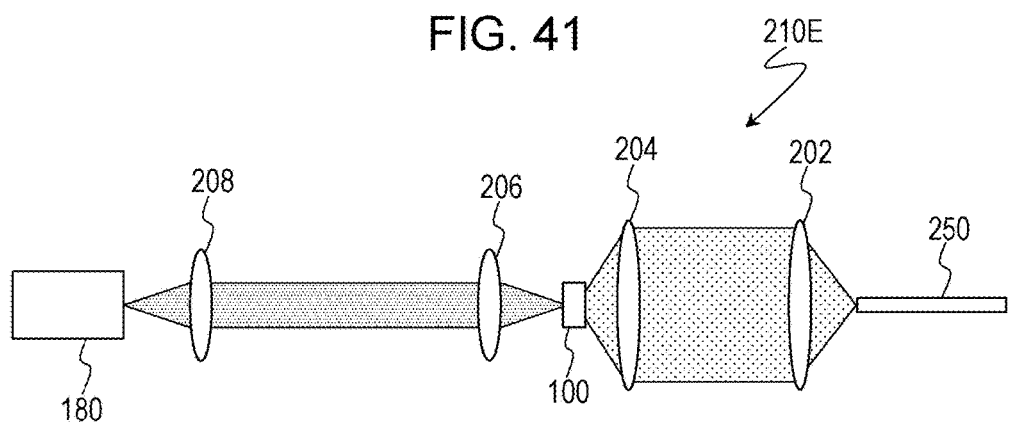
FIG. 41 is a schematic view of still another modified example of a light-emitting apparatus according to an embodiment of the present disclosure.

FIG. 41 illustrates still another modified example of a light-emitting apparatus according to an embodiment of the present disclosure. As in the light-emitting apparatus 210B illustrated in FIG. 38, a light-emitting apparatus 210E illustrated in FIG. 41 includes the collimating lens 204 between the light-emitting device 100 and the converging lens 202. As in the light-emitting apparatus 210D illustrated in FIG. 40, the light-emitting apparatus 210E further includes the collimating lens 208 and the converging lens 206 between the excitation light source 180 and the light-emitting device 100. As illustrated in FIG. 41, the collimating lens 208 and the converging lens 206 are disposed in this order from the excitation light source 180 to the light-emitting device 100. As illustrated in FIG. 41, a collimating lens and a converging lens may be disposed between the excitation light source 180 and the light-emitting device 100 and between the light-emitting device 100 and an optical component (the optical fiber 250) that receives light from the light-emitting apparatus. Thus, the light-emitting apparatus 210E has the same advantages as the light-emitting apparatus 210B illustrated in FIG. 38 and the light-emitting apparatus 210D illustrated in FIG. 40.

As described above, an optical system in a light-emitting apparatus according to the present disclosure can be variously designed. In addition to the structures illustrated in FIGS. 38 to 41, for example, the collimating lens 208 can be removed from the light-emitting apparatus 210D illustrated in FIG. 40 or the light-emitting apparatus 210E illustrated in FIG. 41. In other words, there may be no collimating lens between the excitation light source 180 and the light-emitting device 100. In FIGS. 35 to 41, each of the converging lenses (the converging lenses 202 and 206) is a biconvex lens. However, this is for convenience of explanation. A converging lens in a light-emitting apparatus according to the present disclosure may be a combination of lenses. The same is true for the collimating lenses (the collimating lenses 204 and 208). As a matter of course, the collimating lenses (the collimating lenses 204 and 208) are not limited to biconvex lenses.

As described above, light-emitting devices and light-emitting apparatuses including the light-emitting devices according to the present disclosure have various advantages and can be used with advantageous effects in various optical devices. For example, the following applications are practicable.

A light-emitting device according to the present disclosure can emit directional light in a particular direction. Such high directionality can be suitably utilized in edge-light backlight units that include a light guide plate of a liquid crystal display unit. For example, when a known light source having low directionality is used, light from the light source is directed to a light guide plate through a reflector and/or a diffuser. When a light source having high directionality in a particular direction is used, light can be efficiently directed to a light guide plate without these optical components.

When a plurality of the light-emitting apparatuses 210A illustrated in FIG. 35 are used, and the output end surfaces of the optical fibers 250 optically coupled to the light-emitting apparatuses 210A are two-dimensionally arranged, the light-emitting apparatuses 210A can function as a display apparatus. Any of the light-emitting apparatuses 210B to 210E illustrated in FIGS. 38 to 41 may be used instead of the light-emitting apparatus 210A.

Known lighting fixtures include an optical component, including a reflector, to direct isotropic light in a desired direction. In contrast, in an embodiment of the present disclosure, a light-emitting device and an optical fiber can be optically coupled with high coupling efficiency. Thus, reflectors can be omitted. The use of a light-emitting device according to the present disclosure allows for a simple design for directional light instead of a complex design for isotropic light. Consequently, lighting fixtures can be reduced in size, or the process of designing lighting fixtures can be simplified.

A light-emitting device according to the present disclosure can enhance light having a particular wavelength alone. Thus, a light source that emits light having a required wavelength alone can be easily provided. The wavelength of emitted light can be adjusted by changing the periodic structure without changing the material of the photoluminescent layer. Furthermore, the wavelength of emitted light can be changed with the angle relative to the periodic structure. Such wavelength selectivity can be suitable for a narrow-band imaging (NBI, registered trademark) technique, for example. A light-emitting device according to the present disclosure can also be used for visible light communication.

In the field of illumination, color-enhancing light color illumination and beautifying light color illumination techniques have been developed. Such illumination can finely produce the color of an object to be illuminated. The color-enhancing light color illumination is effective in making foods, such as vegetables, look more delicious. The beautifying light color illumination is effective in ensuring natural-looking skin tones. Such illumination is performed by controlling the spectrum of the light source (the intensity distribution as a function of light wavelength) depending on the object. Hitherto, the spectrum of illumination light has been controlled by selective transmission of light emitted from a light source using an optical filter. The optical filter absorbs unnecessary light and consequently decreases light-use efficiency. In contrast, a light-emitting device according to the present disclosure can enhance light having a particular wavelength and requires no optical filter, thus improving light-use efficiency.

A light-emitting device according to the present disclosure can emit polarized light (linearly polarized light). When unpolarized light including two linearly polarized light components intersecting at right angles is emitted from a light source, linearly polarized light has hitherto been produced by absorbing one of the two linearly polarized light components using a polarizing filter (also referred to as a "polarizer"). Thus, the light-use efficiency is 50% or less. The use of a light-emitting device according to the present disclosure as a polarized light source can obviate the need for a polarizing filter and improve light-use efficiency. Polarized illumination is used to reduce reflected light, for example, from windowpanes of shop windows and view restaurants. Polarized illumination can also be used as washstand illumination, which utilizes the dependence of the reflection characteristics of the skin surface on polarized light, and is used to facilitate the observation of lesion sites with an endoscope.

A polarized light source is suitably used as a backlight for liquid crystal display units and as a light source for liquid crystal projectors. When a light-emitting device according to the present disclosure is used as a light source for liquid crystal projectors, in combination with the use of the wavelength selectivity, the light-emitting device can constitute a three-primary-color polarized light source. For example, a light-emitting device that emits red linearly polarized light, a light-emitting device that emits green linearly polarized light, and a light-emitting device that emits blue linearly polarized light may be joined together to form a disk. While the disk is irradiated with excitation light, the disk may be rotated to form a light source that successively emits red, green, and blue three-primary-color polarized light beams.

Application examples of a light-emitting device according to the present disclosure are not limited to those described above. A light-emitting device according to the present disclosure can be applied to various optical devices. For example, as described below, a light-emitting device according to the present disclosure can be used to provide a small projector.

11. Projector

An exemplary structure of a projector that includes a light-emitting device according to the present disclosure will be described below. A projector according to an embodiment of the present disclosure includes a light source unit, an image-forming unit including a light modulator, and an optical fiber that introduces light from the light source unit at one end thereof and guides the light to the image-forming unit. In other words, the light source unit and the image-forming unit are coupled together via the optical fiber. As described in detail below, the light modulator changes the traveling direction of light emitted from the optical fiber in accordance with the image signal, thereby forming an image on a projection target, such as a screen or wall.

In an embodiment of the present disclosure, the light source unit includes an excitation light source, a photoluminescent layer for emitting light having a wavelength $\lambda_a$ in air upon receiving excitation light from the excitation light source, a light-transmissive layer located on or near the photoluminescent layer, and a surface structure formed on a surface of at least one of the photoluminescent layer and the light-transmissive layer and having projections or recesses or both. The photoluminescent layer, light-transmissive layer, and surface structure can have the structure as described above. Directional light from the photoluminescent layer can be emitted in a particular direction without an optical component (or with a small optical component), such as a reflector or lens. Thus, a projector having a much smaller size than before can be provided.

Light directed from the light source unit to the image-forming unit via the optical fiber may be excitation light emitted from the excitation light source. In another embodiment of the present disclosure, the photoluminescent layer, the light-transmissive layer, and the surface structure are disposed in the image-forming unit. In this case, the light modulator receives light having a wavelength $\lambda_a$ in air from the photoluminescent layer.

11-1. Projector Including Excitation Light Source in Light Source Unit

Figure 42:
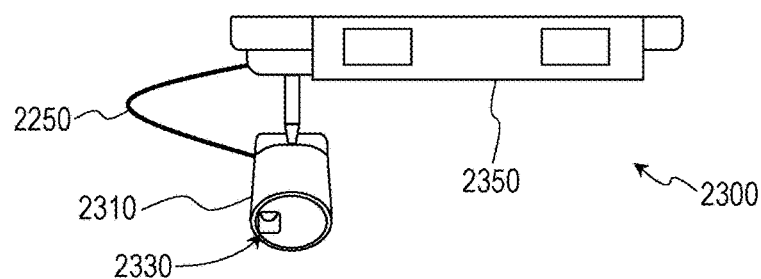
FIG. 42 is an outside drawing of a projector according to an embodiment of the present disclosure.

FIG. 42 is an outside drawing of a projector according to an embodiment of the present disclosure. In the structure illustrated in FIG. 42, a projector 2300 includes a main body unit 2350 and a lighting unit 2310. The main body unit 2350 may be attachable to a ceiling. The projector 2300 includes an optical fiber 2250 between the main body unit 2350 and the lighting unit 2310. In the projector 2300, light generated in the main body unit 2350 is transmitted to the lighting unit 2310 via the optical fiber 2250.

The lighting unit 2310 irradiates a screen or wall with light to form an image (motion picture or still picture). In the structure illustrated in FIG. 42, the lighting unit 2310 has an opening 2330. Light for forming an image is emitted from the lighting unit 2310 through the opening 2330. The lighting unit 2310 is coupled to the main body unit 2350 with a joint, such as a hinge, and can change the emission direction of light.

Figure 43:
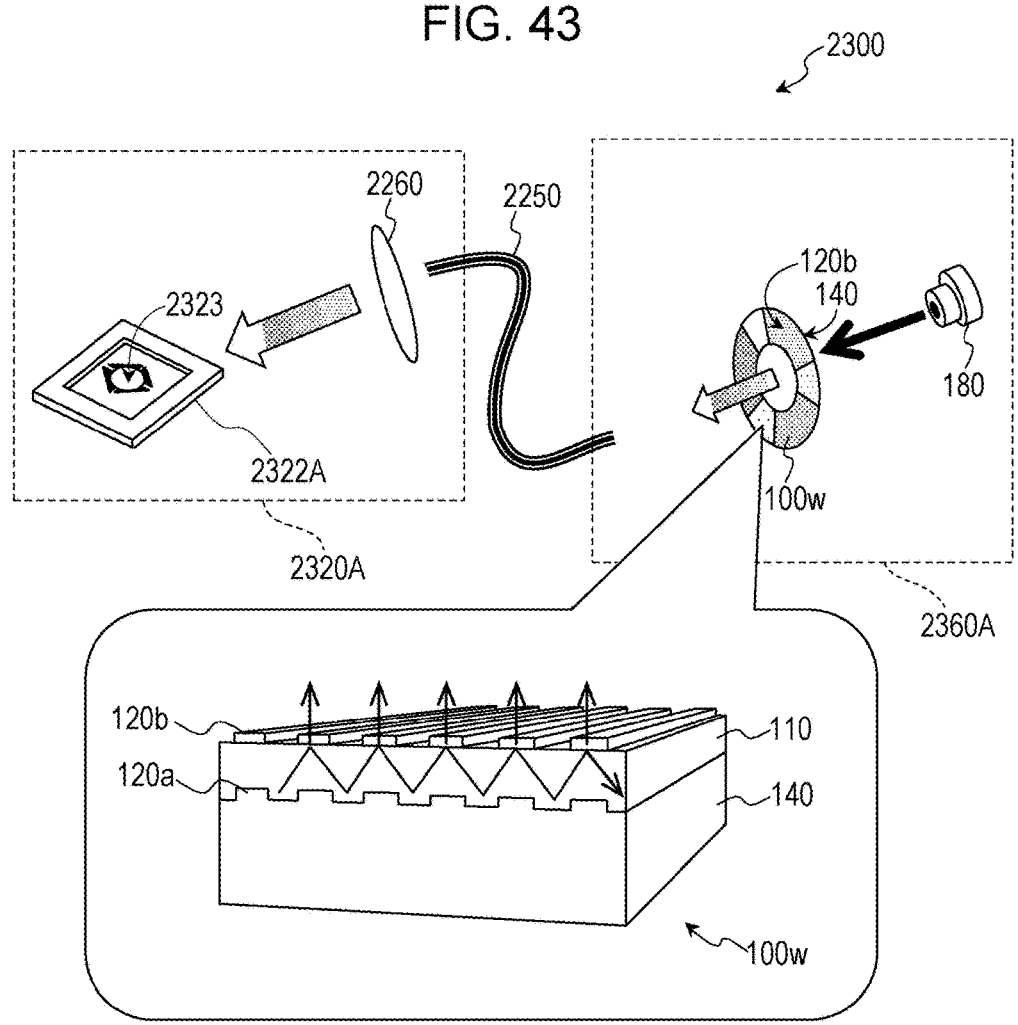
FIG. 43 is a schematic view of an optical system of the projector illustrated in FIG. 42.

FIG. 43 illustrates an optical system of the projector 2300 illustrated in FIG. 42. The optical system of the projector 2300 roughly includes a light source unit 2360A, an image-forming unit 2320A, and the optical fiber 2250, which optically couples the light source unit 2360A with the image-forming unit 2320A. The light source unit 2360A and the image-forming unit 2320A are disposed in the main body unit 2350 and the lighting unit 2310, respectively.

In the structure illustrated in FIG. 43, the light source unit 2360A includes the excitation light source 180 and a disk-shaped light-emitting device 100w. The light-emitting device 100w includes regions along its circumference. Each of the regions has the structure of the light-emitting device 100 or 100a. More specifically, each of the regions in the light-emitting device 100w includes the photoluminescent layer and the surface structure. In this example, as schematically illustrated in FIG. 43, each of the regions in the light-emitting device 100w has the structure of the light-emitting device illustrated in FIG. 19A. Although the light-emitting device 100a including the photoluminescent layer 110 on the substrate 140 (transparent substrate) is described below, the light-emitting device 100 may be used instead of the light-emitting device 100a.

The light-emitting device 100w is disposed on the optical path of excitation light emitted from the excitation light source 180. The excitation light source 180 may be an LED or laser diode. In this example, the light-emitting device 100w is disposed in the main body unit 2350 such that the substrate 140 faces the excitation light source 180. Excitation light emitted from the excitation light source 180 enters the photoluminescent layer 110 of the light-emitting device 100w through the substrate 140. As described above, the surface structure (periodic structure 120a and/or 120b) of the light-emitting device 100w functions to limit the directional angle of particular light emitted from the photoluminescent layer 110. Thus, the light-emitting device 100w emits intense light having a particular wavelength in a particular direction (for example, in the front direction).

The light-emitting device 100w is rotatably supported in the lighting unit 2310 and is rotated by a driving unit (for example, a motor, not shown in FIG. 43) during the operation of the projector 2300. Excitation light emitted from the excitation light source 180 enters at least one of the regions in the light-emitting device 100w depending on the rotation angle of the light-emitting device 100w.

Typically, the regions in the light-emitting device 100w have different periodic structures. In other words, the different regions in the light-emitting device 100w emit intense light beams of different wavelengths in a particular direction. Thus, the light-emitting device 100w emits light having a different wavelength depending on the region(s) that excitation light enters. The light-emitting device 100w may be referred to as a directional-light-emitting color wheel.

One end of the optical fiber 2250 is disposed on the optical path of light emitted from the light-emitting device 100w. One end of the optical fiber 2250 on the optical path of light emitted from the light-emitting device 100w is optically coupled to the light-emitting device 100w. As described above, a light-emitting device according to the present disclosure has a novel structure for controlling the directionality of emitted light. Thus, the light-emitting device 100w and the optical fiber 2250 can have high coupling efficiency. A converging lens may be disposed between the optical fiber 2250 and the light-emitting device 100w.

The optical fiber 2250 transmits light from the light source unit 2360A of the main body unit 2350 to the lighting unit 2310 (see FIG. 42). Thus, light generated in the light source unit 2360A is transmitted to the image-forming unit 2320A in the lighting unit 2310 via the optical fiber 2250.

The image-forming unit 2320A includes a MEMS mirror 2322A that receives light from the optical fiber 2250. Light from the light source unit 2360A entering one end of the optical fiber 2250 is emitted from the other end of the optical fiber 2250 toward the MEMS mirror 2322A. Light emitted from the optical fiber 2250 spreads out according to the numerical aperture of the optical fiber 2250. Typically, therefore, a collimating lens 2260 is disposed between the optical fiber 2250 and the MEMS mirror 2322A in order to produce parallel light. As long as light emitted from the optical fiber 2250 is directly or indirectly incident on the MEMS mirror 2322A, another optical component, such as the collimating lens 2260, may be disposed between the MEMS mirror 2322A and the optical fiber 2250.

Light incident on the MEMS mirror 2322A is reflected by a movable mirror 2323 of the MEMS mirror 2322A at an angle corresponding to the inclination of the movable mirror 2323. Light reflected by the movable mirror 2323 is emitted from the lighting unit 2310 through the opening 2330 and forms an image.

Figure 44:
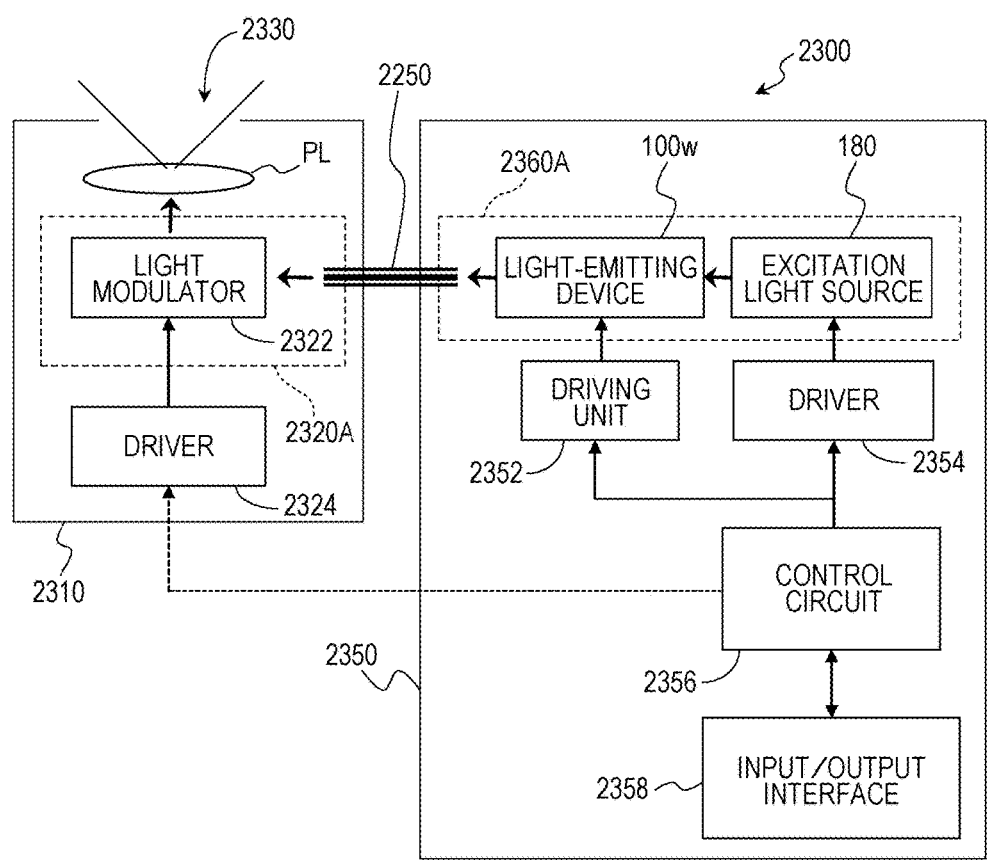
FIG. 44 is a block diagram of the projector illustrated in FIG. 42.

FIG. 44 illustrates the structure of the projector 2300 illustrated in FIG. 42. As described above, the main body unit 2350 includes the light source unit 2360A, which includes the excitation light source 180. In this example, the light source unit 2360A in the main body unit 2350 includes the light-emitting device 100*w*. The main body unit 2350 can further include a driving unit 2352 for the light-emitting device 100*w*, a driver 2354 for the excitation light source 180, a control circuit 2356, and an input/output interface 2358.

The input/output interface 2358 can transfer electric signals to and from an external device (for example, a computer or removable memory) and can receive image data and control signals by wire or radio from an external device (for example, a server or terminal device connected to a network). For example, the control circuit 2356 includes a memory, a central processing unit (CPU), and an image-processing circuit, such as a digital signal processor (DSP), and generates image signals based on image data (or signals) input via the input/output interface 2358. The control circuit 2356 controls the operation of each unit of the projector 2300 on the basis of the input from the input/output interface 2358. For example, the control circuit 2356 sends control signals to the driver 2354 to turn on or off the excitation light source 180. The incidence of excitation light on the optical fiber 2250 may be controlled by the driver 2354 controlling the operation of a shutter disposed between the optical fiber 2250 and the excitation light source 180. The shutter can be disposed at any position between the excitation light source 180 and a light modulator 2322 described later. The control circuit 2356 also controls the driving unit 2352 (typically a motor) for rotating the light-emitting device 100*w* and selects the region in the light-emitting device 100*w* that excitation light from the excitation light source 180 enters.

In this example, the lighting unit 2310 includes a driver 2324 for driving the light modulator 2322 of the image-forming unit 2320A. The MEMS mirror 2322A is an example of the light modulator 2322. In the structure illustrated in FIG. 44, the control circuit 2356 controls the driver 2324.

11-2. Formation of Image

A method for forming images with the MEMS mirror 2322A will be described below.

Figure 45A:
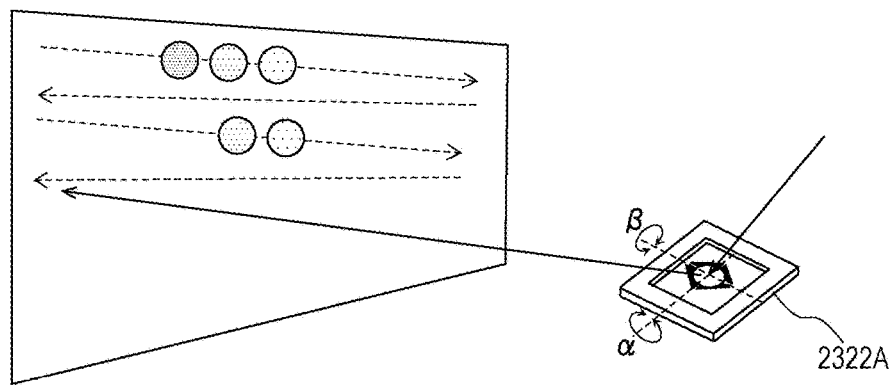
FIG. 45A is a schematic view of an image formed using light reflected from a micro electro mechanical system (MEMS) mirror.

FIG. 45A is a schematic view of an image formed using light reflected from the MEMS mirror 2322A. For example, the MEMS mirror 2322A includes a movable mirror supported by a minute beam and a driving mechanism (electrostatic actuator) for changing the inclination of the movable mirror. In the structure illustrated in FIG. 45A, the MEMS mirror 2322A is a two-dimensional MEMS mirror in which the movable mirror can rotate about two orthogonal axes ($\alpha$ axis and $\beta$ axis). The movable mirror can be tilted in a desired direction by applying an appropriate voltage as a drive signal to the MEMS mirror 2322A for an appropriate time. The inclination of the movable mirror can be controlled to reflect incident light toward a desired position in a projection target, such as a screen. A light beam reflected from the MEMS mirror 2322A can be scanned in the horizontal and vertical directions by defferentiating the driving frequency with respect to the $\alpha$ axis and the $\beta$ axis.

As illustrated in FIG. 43, light emitted from the light-emitting device 100*w* and transmitted through the optical fiber 2250 is directly or indirectly incident on the MEMS mirror 2322A. As described above, the light-emitting device 100*w* includes regions from which intense light beams of different wavelengths are emitted in a particular direction (for example, in the direction normal to the light-emitting device 100*w*). For example, one region in the light-emitting device 100*w* has a periodic structure that enhances light having a wavelength corresponding to red light, and another region has a periodic structure that enhances light having a wavelength corresponding to green light. Still another region has a periodic structure that enhances light having a wavelength corresponding to blue light. Thus, the peak wavelength of light emitted in the direction normal to the light-emitting device 100*w* may vary from one region to another.

Thus, the wavelength of light coupled to the optical fiber 2250 can be altered by rotating the light-emitting device 100*w* to change the region(s) that excitation light enters. In other words, the wavelength of light incident on the MEMS mirror 2322A can be sequentially changed. Thus, for example, red (R), green (G), and blue (B) light spots can be formed on the projection target by controlling the rotation of the light-emitting device 100*w* in synchronism with scanning of light beams on the projection target, as schematically illustrated in FIG. 45A. For example, a desired color image based on the image signal sent to the projector 2300 can be displayed by scanning R, G, and B light beams. In order to display black, for example, light incident on the MEMS mirror 2322A can be reflected toward a light absorber in the lighting unit 2310. Some regions in the light-emitting device 100*w* may have the same periodic structure, and photoluminescent materials of different emission wavelengths may be used in some regions.

Figure 45B:
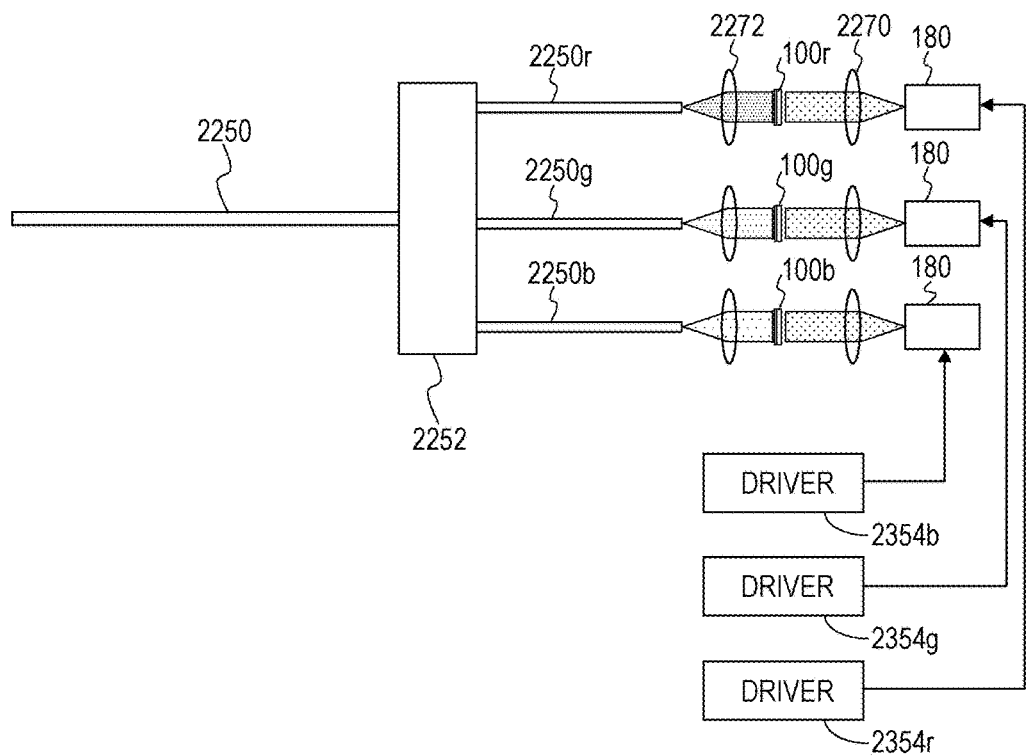
FIG. 45B is a schematic view of another example of an optical system for changing the wavelength of light emitted from an optical fiber.

A structure for emitting light having a desired wavelength from the optical fiber 2250 to the light modulator 2322 is not limited to the structure illustrated in FIG. 43. As illustrated in FIG. 45B, light having a desired wavelength may be generated by coupling optical fibers, which are optically coupled to light-emitting devices that emit intense light beams of different wavelengths, with the optical fiber 2250 via an optical fiber coupler 2252.

In the structure illustrated in FIG. 45B, light-emitting devices 100*r*, 100*g*, and 100*b* are disposed between the excitation light source 180 and an optical fiber 2250*r*, between the excitation light source 180 and an optical fiber 2250*g*, and between the excitation light source 180 and an optical fiber 2250*b*, respectively. A collimating lens 2270 is disposed between the excitation light source 180 and each of the light-emitting devices 100*r*, 100*g*, and 100*b*. For example, the light-emitting devices 100*r*, 100*g*, and 100*b* have a periodic structure, the period of which is set to emit intense light in red, green, and blue wavelength ranges, respectively, in the front direction. Thus, light in the red, green, and blue wavelength ranges enters one end of the optical fibers 2250*r*, 2250*g*, and 2250*r*, respectively. The light-emitting devices 100*r*, 100*g*, and 100*b* may be designed to include photoluminescent layers of different emission wavelengths and thereby emit intense light in different wavelength ranges. As illustrated in the figure, a converging lens 2272 may be disposed between the light-emitting device 100*r* and the optical fiber 2250*r*, between the light-emitting device 100*g* and the optical fiber 2250*g*, and between the light-emitting device 100*b* and the optical fiber 2250*b*.

The other end of each of the optical fibers 2250*r*, 2250*g*, and 2250*b* is coupled to one end of the optical fiber 2250 via the optical fiber coupler 2252. The other end of the optical fiber 2250 faces the light modulator 2322. For example, the optical fiber coupler 2252 has a structure in which optical fibers are coupled together by fusion or a structure that utilizes a waveguide. Red light transmitted through the optical fiber 2250*r*, green light transmitted through the optical fiber 2250*g*, and blue light transmitted through the optical fiber 2250*b* are synthesized in the optical fiber coupler 2252, and the synthesized light is emitted from the other end of the optical fiber 2250. Light having a desired color (spectrum) can be emitted from the other end of the optical fiber 2250 by adjusting the output of the excitation light source 180. Thus, the color of a light beam traveling toward the projection target can be changed. The intensity of excitation light emitted from the excitation light source 180 can be controlled by drivers 2354*r*, 2354*g*, and 2354*b* each coupled to the excitation light source 180. These drivers 2354*r*, 2354*g*, and 2354*b* are controlled by the control circuit 2356, for example.

An aperture for each color may be disposed between the light-emitting device 100*r* and the optical fiber 2250*r*, between the light-emitting device 100*g* and the optical fiber 2250*g*, and between the light-emitting device 100*b* and the optical fiber 2250*b*, and the degree of opening of the aperture may be controlled by the drivers 2354*r*, 2354*g*, and 2354*b*. The intensity ratio of light beams to be synthesized can be adjusted by changing the degree of opening of the aperture. Thus, synthesized light can have any desired color. Although red light, green light, and blue light are synthesized in the present example, the wavelength range of light to be synthesized and the number of light-emitting devices are not particularly limited.

11-3. Modified Examples of Projector

Figure 46:
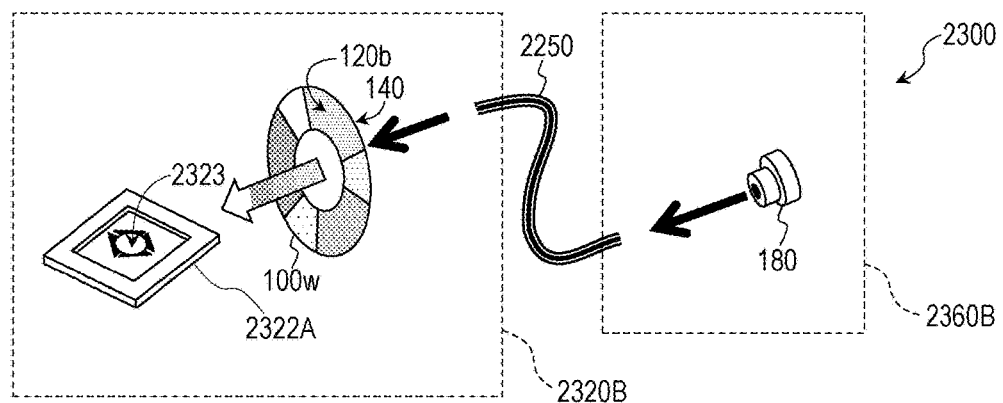
FIG. 46 is a schematic view of another optical system of the projector.
Figure 47:
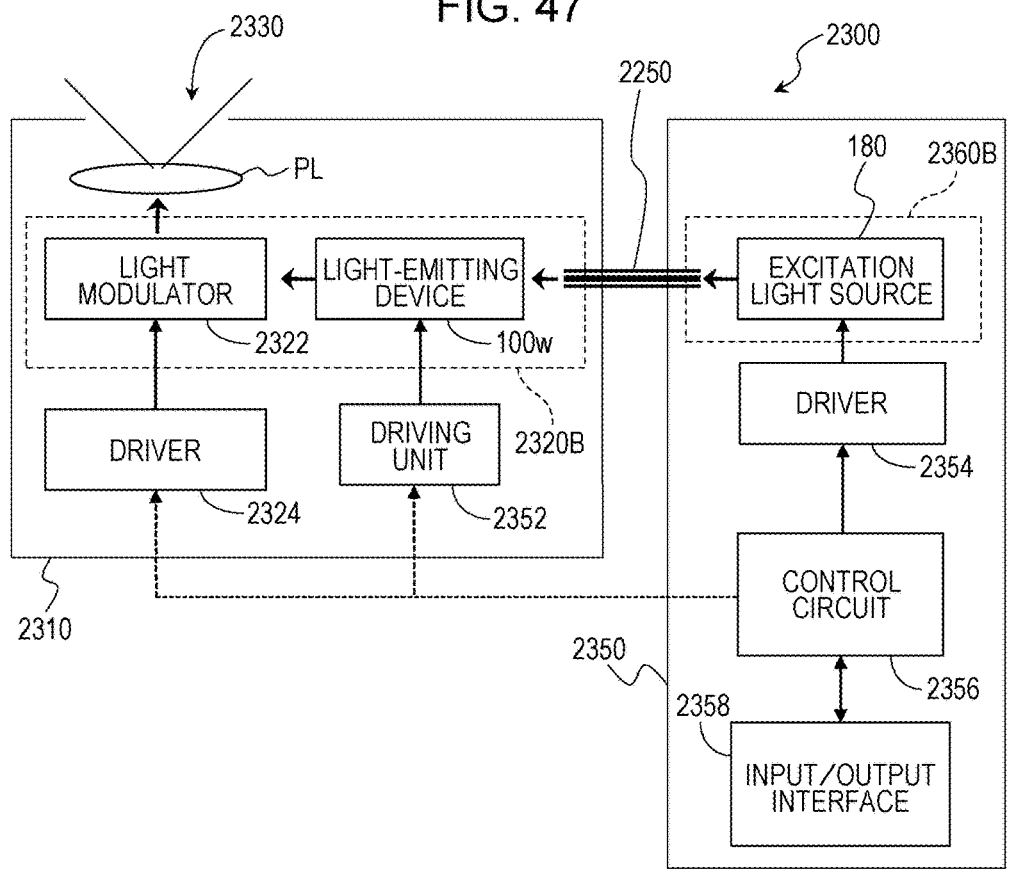
FIG. 47 is a block diagram of the optical system illustrated in FIG. 46.

FIG. 46 is a schematic view of another optical system of the projector 2300. FIG. 47 is a block diagram of the optical system illustrated in FIG. 46.

In the structure illustrated in FIGS. 46 and 47, the projector 2300 includes a light source unit 2360B including the excitation light source 180, an image-forming unit 2320B including the MEMS mirror 2322A, and the optical fiber 2250, which optically couples the light source unit 2360B with the image-forming unit 2320B. In this example, the image-forming unit 2320B includes the light-emitting device 100*w*. In this example, as schematically illustrated in FIG. 47, the light modulator 2322 and the light-emitting device 100*w* are disposed in the lighting unit 2310. The driving unit 2352 for the light-emitting device 100*w* is also disposed in the lighting unit 2310. The excitation light source 180 is disposed in the main body unit 2350 as in the example illustrated in FIGS. 43 and 44.

In the structure illustrated in FIGS. 46 and 47, one end of the optical fiber 2250 is disposed on the optical path of excitation light emitted from the excitation light source 180. The optical fiber 2250 transmits excitation light from the excitation light source 180 to the image-forming unit 2320B. Excitation light emitted from the optical fiber 2250 is incident on the light-emitting device 100*w* in the image-forming unit 2320B. Thus, the optical fiber 2250 emits excitation light from the other end thereof toward the light-emitting device 100*w*. A collimating lens may be disposed between the optical fiber 2250 and the light-emitting device 100*w*.

Upon receiving excitation light, the light-emitting device 100*w* emits intense light having a particular wavelength in a particular direction (for example, in the direction normal to the light-emitting device 100*w*). The MEMS mirror 2322A in the image-forming unit 2320B receives light enhanced by the light-emitting device 100*w*. Thus, the MEMS mirror 2322A is placed such that light emitted from the light-emitting device 100*w* is incident on the MEMS mirror 2322A. As long as light enhanced by the light-emitting device 100*w* is directly or indirectly incident on the MEMS mirror 2322A, a converging lens may be disposed between the light-emitting device 100*w* and the MEMS mirror 2322A. The MEMS mirror 2322A changes the traveling direction of incident light in accordance with the drive signal.

In this manner, excitation light generated in the light source unit 2360B may be transmitted to the image-forming unit 2320B via the optical fiber 2250. A desired image can also be displayed on a screen by using such a structure.

11-4. Optical Coupling Between Light-Emitting Device and Optical Fiber

Figure 48:
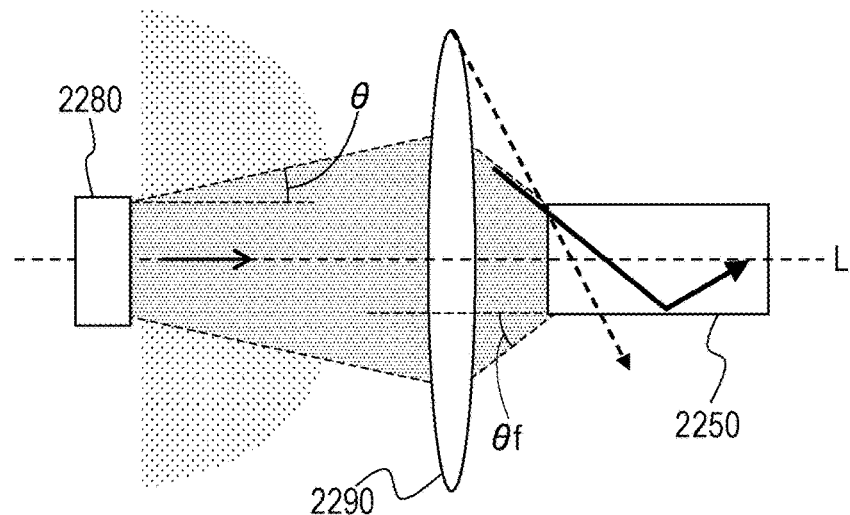
FIG. 48 is a schematic view illustrating optical coupling between a light source and an optical fiber.

FIG. 48 is a schematic view illustrating optical coupling between a light source and an optical fiber. FIG. 48 schematically illustrates that light emitted from a light source 2280 enters the optical fiber 2250 through a converging lens 2290.

As described above, the etendue of an optical system is preserved in the absence of diffusion. In the example illustrated in FIG. 48, the center of the light source 2280, the optical axis of the converging lens 2290, and an axis L of the optical fiber 2250 are coincident. The etendue of the light source 2280 is represented by $S \sin^2 \theta$, wherein $\theta$ denotes the maximum angle between diverging light emitted from the light source 2280 and the axis L, and S denotes the luminous area of the light source 2280. The refractive index of air is assumed to be 1.

As described above, if the etendue on a light-receiving side, which represents the ability of introducing light, is smaller than the etendue of a light source, then light from the light source is not entirely introduced into the light-receiving side and is partly lost. In FIG. 48, deep shading schematically represents light entering the optical fiber 2250, and light shading schematically represents light not entering the optical fiber 2250 when the light source 2280 has a large etendue.

The etendue of the optical fiber 2250 on the light-receiving side can be represented by the numerical aperture NA of the optical fiber 2250. The numerical aperture NA of the optical fiber 2250 is represented by the maximum angle $\theta f$ between the light beam introduced into the optical fiber 2250 and the axis L. The angle $\theta f$ depends on the conditions under which total reflection occurs in the optical fiber 2250. When light enters the optical fiber 2250, the etendue on a light-receiving side depends on the type of the optical fiber 2250.

As long as the etendue on the light-receiving side is constant, the amount of light introduced into the optical fiber 2250 does not increase with increasing luminous area of the light source 2280. The same is true even if the diameter of the converging lens 2290 between the light source 2280 and the optical fiber 2250 is increased.

Figure 49:
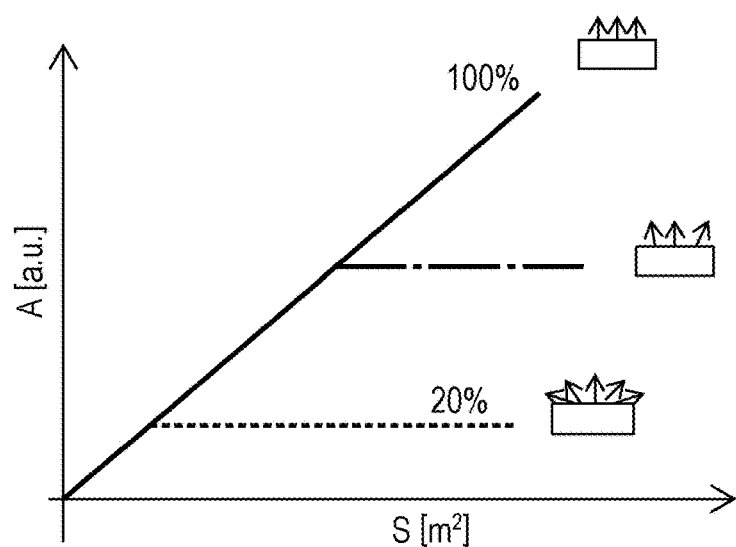
FIG. 49 is a schematic graph of the relationship between the luminous area S of a light source and the amount A of light introduced into an optical fiber.

FIG. 49 schematically illustrates the relationship between the luminous area S of the light source 2280 and the amount A of light introduced into the optical fiber 2250. The broken line in FIG. 49 indicates isotropic emission from the light source 2280 and a relatively large etendue of the light source 2280. The coupling efficiency between the light source 2280 and the optical fiber 2250 is approximately 20%, for example. The dash-dot line in FIG. 49 indicates high directionality and a relatively small etendue of the light source 2280. The solid line in FIG. 49 indicates complete directionality of the light source 2280 and an etendue of approximately 0. The coupling efficiency can reach approximately 100%. Thus, optical coupling between a light source having some luminous area and an optical fiber is improved when the light source has higher directionality.

The surface structure (the periodic structure 120*a* and/or 120*b*) of the light-emitting device 100*w* forms a quasi-guided mode in the photoluminescent layer 110. In the quasi-guided mode, light having a particular wavelength emitted from the photoluminescent layer 110 has the maximum intensity in a particular direction (for example, in the front direction). The directional angle of light having a wavelength $\lambda_a$ emitted from the photoluminescent layer 110 is limited to, for example, less than 15 degrees by the surface structure of the light-emitting device 100w. This provides a narrow-angle light distribution. Since the light-emitting device 100w has a structure for controlling the directionality of emitted light, the light-emitting device 100w and the optical fiber 2250 can have high coupling efficiency. Thus, light from the light-emitting device 100w can be efficiently transmitted via the optical fiber 2250 (see FIG. 43, for example). Thus, bright images can be displayed even when the optical fiber 2250 is disposed between the light-emitting device 100w and the light modulator 2322 (the MEMS mirror 2322A). Because of high coupling efficiency between the light-emitting device 100w and the optical fiber 2250, the projector can reduce power consumption.

As illustrated in FIG. 42, in a light-emitting device according to the present disclosure, the main body unit 2350 can be optically coupled to the lighting unit 2310 via the optical fiber 2250, and all the optical components of the image forming optical system are not necessarily housed in the lighting unit 2310. Thus, the lighting unit can be easily miniaturized and has high design flexibility.

Figure 50:
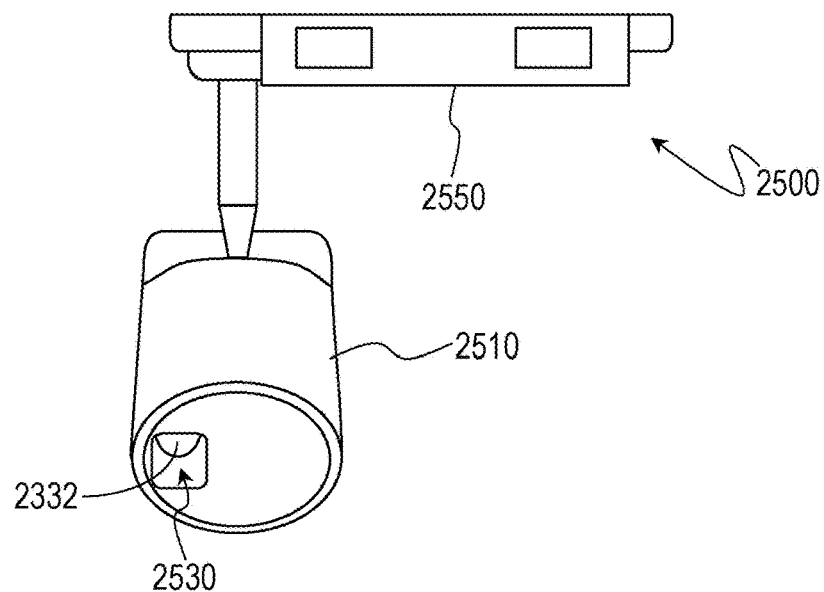
FIG. 50 is an outside drawing of a projector according to a comparative example including a lighting unit that houses all the optical components of an image forming optical system.

FIG. 50 is an outside drawing of a projector according to a comparative example including a lighting unit that houses all the optical components of an image forming optical system. A projector 2500 illustrated in FIG. 50 includes a lighting unit 2510 coupled to a main body unit 2550. The lighting unit 2510 has an opening 2530, in which a focusing lens 2332 is disposed.

Figure 51:
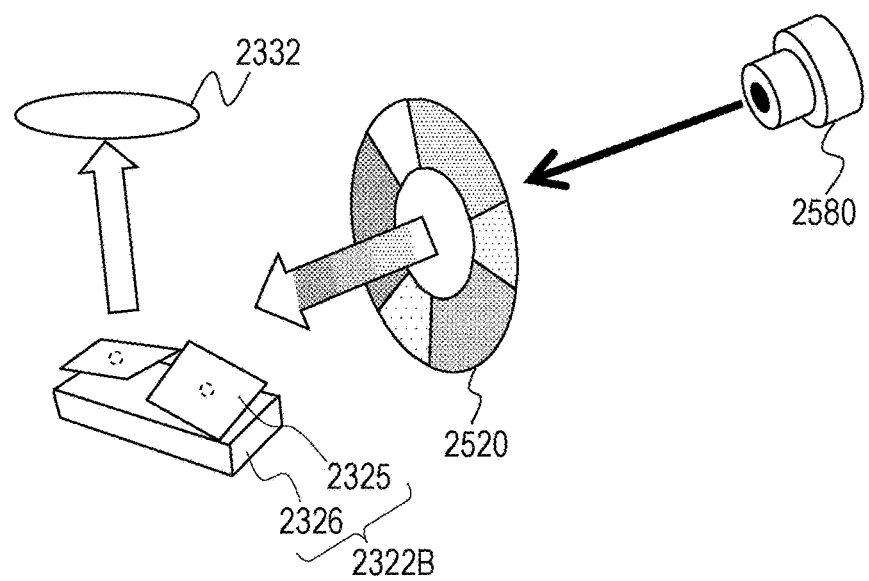
FIG. 51 is a schematic view of image forming components in the lighting unit of the projector illustrated in FIG. 50.

FIG. 51 illustrates image forming components in the lighting unit 2510 of the projector 2500 illustrated in FIG. 50. The projector 2500 is a digital light processing (DLP) projector including a digital micromirror device (DMD). The lighting unit 2510 includes a light source 2580 for emitting white light, a color wheel 2520, a digital micromirror device 2322B (hereinafter referred to as "DMD 2322B") for receiving light passing through the color wheel 2520, and the focusing lens 2332. The color wheel 2520 has a disk shape and includes regions along its circumference. The regions are formed of different color filters and include a region for transmitting red light (R), a region for transmitting green light (G), a region for transmitting blue light (B), and a region for directly transmitting white light (W) emitted from the light source 2580, for example. The color wheel 2520 is rotatably supported in the lighting unit 2510 and is rotated by a driving unit (for example, a motor, not shown). The color of light entering the DMD 2322B changes with the rotation of the color wheel 2520. The DMD 2322B includes a substrate 2326 and many minute mirrors 2325 arranged on the substrate 2326. Light incident on the mirrors 2325 is reflected in a predetermined direction to form an image. In FIG. 51, for simplicity, two out of thousands of mirrors 2325 arranged in a matrix are illustrated. The structure and operation of the DMD 2322B will be described in detail later.

As illustrated in FIGS. 50 and 51, in the case that the light source 2580 is disposed in the lighting unit 2510, a relatively large component for cooling the light source 2580, such as a heat sink or fan (not shown in FIG. 51), is disposed in the lighting unit 2510. Thus, it is difficult to miniaturize the lighting unit 2510. In the generally cylindrical lighting unit 2510 illustrated in FIG. 50, the diameter and longitudinal length are approximately 20 and 30 cm, for example. The lighting unit 2510 including a large heat sink has an increased weight. For example, the lighting unit 2510 weighs approximately 3 kg.

In contrast, in a projector including a light-emitting device according to the present disclosure, since a light source unit can be optically coupled to an image-forming unit via an optical fiber, the excitation light source 180 and the light modulator 2322 can be easily separately disposed in the main body unit 2350 and the lighting unit 2310, respectively. Thus, a component that generates much heat is not necessarily disposed in the lighting unit 2310, and a heat sink is not necessarily disposed in the lighting unit 2310. Thus, the lighting unit 2310 can include no heat sink and can be decreased in size and weight. For example, the lighting unit 2310 weighs approximately 0.3 kg. Since the lighting unit 2310 can be relatively easily decreased in size and weight, the lighting unit 2310 can substitute for spotlights and downlights in houses, stores, and offices.

Laser beams have sometimes been used to display images on a screen. For example, in the optical system illustrated in FIG. 51, the light source 2580 may be a laser diode (LD). A projector according to the present disclosure displays images using light emitted from the light-emitting device 100w. Upon receiving excitation light, the projector emits light from the light-emitting device 100w toward a projection target. Thus, the projector offers a higher level of safety. When a laser beam is used to display images, speckle noise must be prevented. A projector according to the present disclosure does not use a laser beam to display images and requires no particular mechanism for reducing speckle noise.

11-5. Other Modified Examples of Projector

Figure 52:
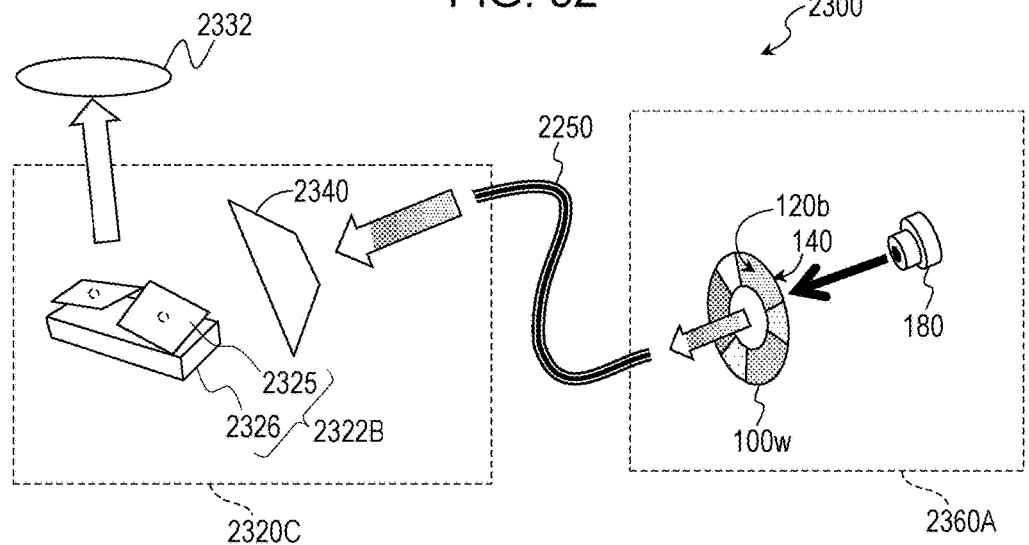
FIG. 52 is a schematic view of still another optical system of the projector.
Figure 53:
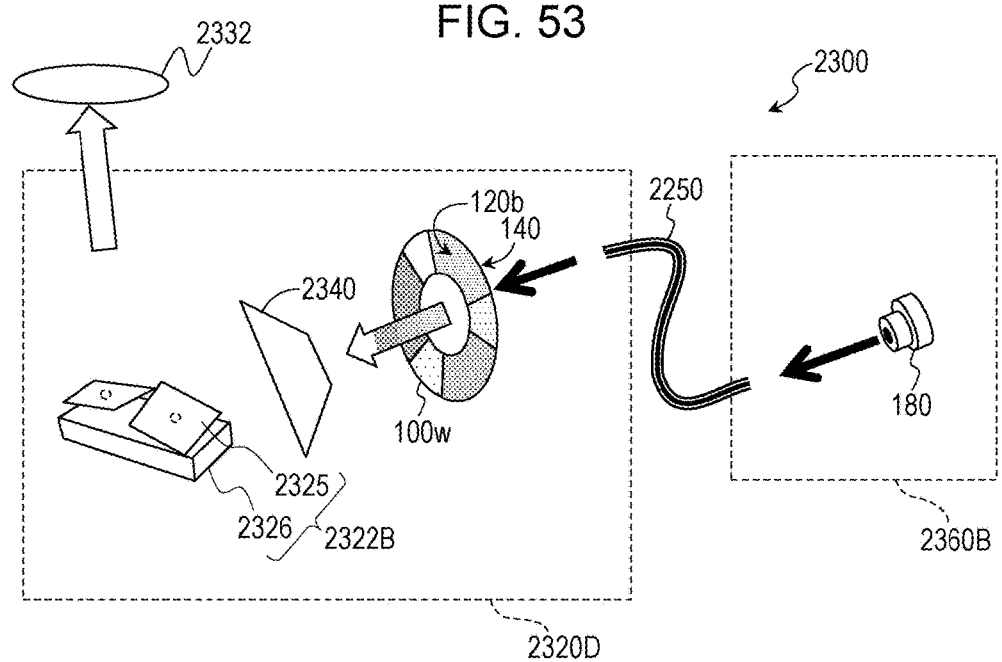
FIG. 53 is a schematic view of still another optical system of the projector.

FIGS. 52 and 53 illustrate still another optical system of the projector 2300. As illustrated in FIGS. 52 and 53, the light modulator 2322 may be the DMD 2322B illustrated in FIG. 51.

In the structure illustrated in FIG. 52, the projector 2300 includes the light source unit 2360A, an image-forming unit 2320C including the DMD 2322B, and the optical fiber 2250, which optically couples the light source unit 2360A with the image-forming unit 2320C. The light source unit 2360A and the image-forming unit 2320C are disposed in the main body unit 2350 and the lighting unit 2310, respectively (see FIG. 42).

Light generated in the light source unit 2360A is transmitted to the image-forming unit 2320C via the optical fiber 2250. Light emitted from the optical fiber 2250 is directly or indirectly incident on the DMD 2322B. In this example, a lens system 2340 is disposed between the optical fiber 2250 and the DMD 2322B. The lens system 2340 expands light emitted from the optical fiber 2250. The DMD 2322B is uniformly irradiated with a light beam expanded by the lens system 2340.

As described above, the DMD 2322B includes many minute mirrors 2325 arranged on the substrate 2326. Each of the mirrors 2325 supported by the substrate 2326 can be tilted at a desired angle with an actuator (not shown). The inclination of each of the mirrors 2325 can be changed by approximately 10 degrees according to the digital input signal sent from the driver 2324 (see FIG. 44). Each of the mirrors 2325 reflects incident light toward the focusing lens 2332 or a light absorber in the lighting unit 2310 depending on its inclination. As described above, the wavelength of light incident on the DMD 2322B through the optical fiber 2250 can be changed by rotating the light-emitting device 100w. Thus, a desired color image can be displayed on a screen by independently changing the inclination of each of the mirrors 2325 in synchronism with the rotation of the light-emitting device 100w (for example, at a frequency of thousands per second).

As described above, the light modulator 2322 can be a DMD, and the light-emitting device 100w can be optically coupled to the DMD via the optical fiber 2250. This embodiment of the present disclosure can achieve high coupling efficiency between the light-emitting device 100w and the optical fiber 2250 and can provide an optical system with low optical loss. Thus, bright images can be displayed. Furthermore, since the excitation light source 180 can be disposed in the main body unit 2350, this embodiment has the same advantages as the structure illustrated in FIGS. 43 and 46.

As in the structure illustrated in FIG. 46, the light-emitting device 100w may be disposed in the lighting unit 2310. In FIG. 53, the light-emitting device 100w is disposed in the lighting unit 2310. In the structure illustrated in FIG. 53, the image-forming unit 2320D in the lighting unit 2310 includes the DMD 2322B and the light-emitting device 100w. Even in this structure, the excitation light source 180 is disposed in the main body unit 2350, and the structure has the same advantages as the structure illustrated in FIGS. 43 and 46.

In addition to these embodiments, the technique of the present disclosure can be variously modified. For example, the light modulator 2322 may be based on the liquid crystal on silicon (LCOS) technology. The light modulator 2322 reflects or transmits incident light to form images. In the embodiments described above, the wavelength of light incident on the light modulator 2322 is changed by selecting the region(s) in the light-emitting device 100w that excitation light enters. However, without being limiting to these embodiments, a light-emitting device may be independently disposed for each of the wavelength ranges (for example, red, green, and blue) used to form color images.

12. Light-Emitting Apparatus Including Support for Photoluminescent Layer

Still another modified example of a light-emitting apparatus according to the present disclosure will be described below.

Figure 54A:
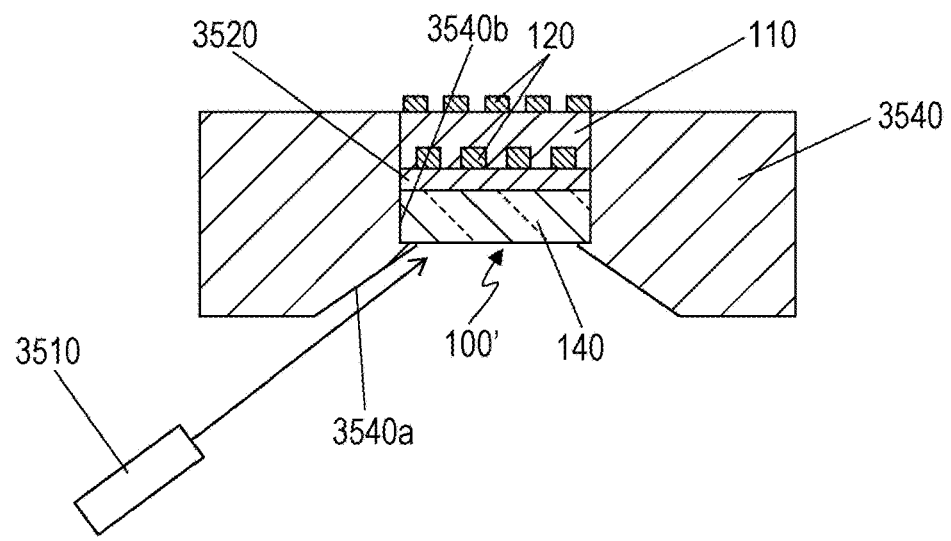
FIG. 54A is a schematic cross-sectional view of a light-emitting apparatus including a light-emitting device and a support for supporting the light-emitting device.
Figure 54B:
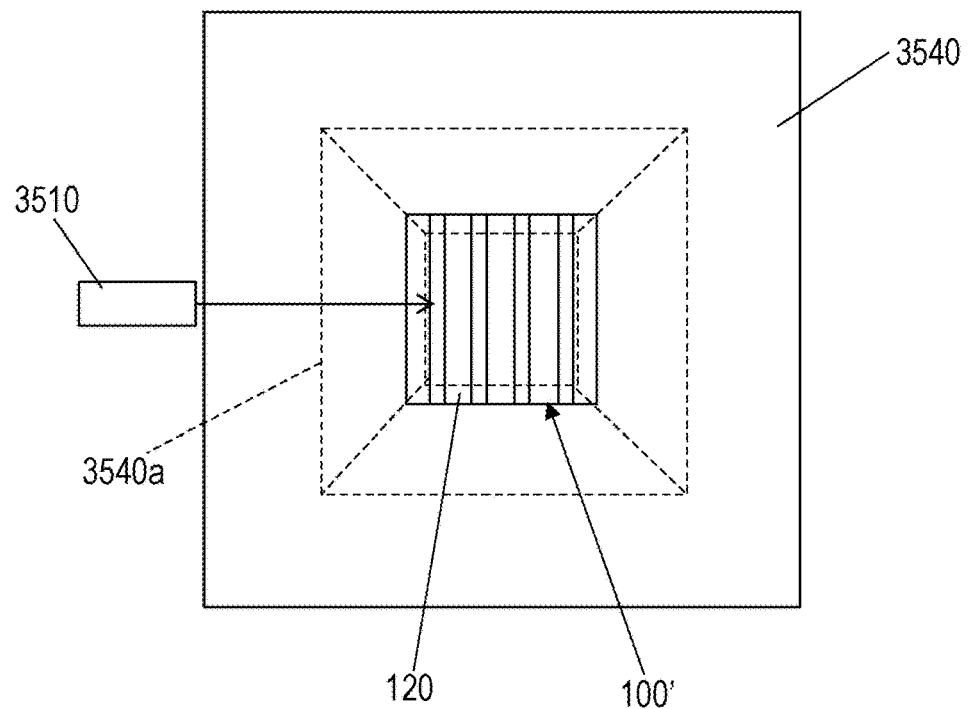
FIG. 54B is a plan view of the light-emitting apparatus illustrated in FIG. 54A, viewed from above.

FIG. 54A is a schematic cross-sectional view of a light-emitting apparatus including a light-emitting device 100' and a support 3540 for supporting the light-emitting device 100'. FIG. 54B is a plan view of the light-emitting apparatus, as viewed from above in FIG. 54A. Although the light-emitting device 100' has a very large surface structure 120 in these figures, the surface structure 120 can practically have many fine projections or recesses. This is also true in the other figures in the present disclosure. In the light-emitting apparatus illustrated in FIGS. 54A and 54B, the support 3540 surrounds and supports the light-emitting device 100'.

The support 3540 is in contact with the side of the light-emitting device 100' and fixes the light-emitting device 100'. Advantageously, the support 3540 protects the light-emitting device 100' and makes it easy to hold the light-emitting apparatus. The support 3540 can be composed of a material having a higher thermal conductivity than the photoluminescent layer 110. This allows the support 3540 to function as a heat bath or heat sink for dissipating heat generated in the photoluminescent layer 110.

Without a heat bath for dissipating heat, the photoluminescent layer 110 may be heated in high power operation and have low luminous efficiency. The support 3540 having high thermal conductivity in contact with the photoluminescent layer 110 can promote heat dissipation and suppress the decrease in luminous efficiency. The support 3540 can be composed of a material having a relatively high thermal conductivity, such as aluminum, brass, or copper. Another material may also be used. In the case that the support 3540 is provided in order to protect the light-emitting device 100' from impacts, the support 3540 may be composed of a material having a lower thermal conductivity than the photoluminescent layer 110.

The light-emitting device 100' can have the structure of any of the light-emitting devices according to the present disclosure described above. For example, in FIG. 54A, the light-emitting device 100' includes a light-transmissive layer 3520 and the photoluminescent layer 110 on the substrate 140. A surface structure (typically a periodic structure) 120 is disposed between the light-transmissive layer 3520 and photoluminescent layer and between the photoluminescent layer 110 and the air layer. This structure is particularly effective when the substrate 140 is composed of an inexpensive transparent material, such as soda-lime glass or borosilicate glass. However, the substrate 140 composed of such an inexpensive glass may be damaged in a process of sintering a photoluminescent material in the production of the light-emitting device 100'. In order to avoid this, it is effective to form the light-transmissive layer 3520 formed of a heat-resistant material (for example, $SiO_2$, $Al_2O_3$, MgO, SiN, $Ta_2O_3$, or $TiO_2$) and having the surface structure 120 on the low-cost substrate 140. The light-transmissive layer 3520 can block sintering heat when the photoluminescent layer 110 is heated with a laser beam for a short time and thereby protect the substrate 140 from damage. The structure of the light-emitting device 100' is not limited to the structure illustrated in FIG. 54A and can be variously modified as described later.

Figure 54C:
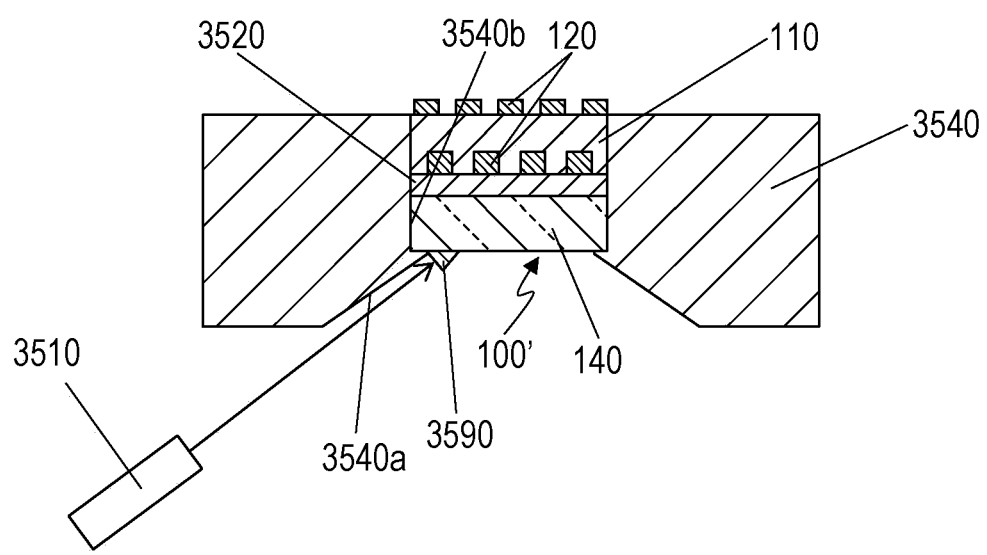
FIG. 54C is a schematic view of a light-emitting apparatus including a light introducing structure for efficiently guiding excitation light into a photoluminescent layer.

In FIG. 54A, the light-emitting apparatus further includes an excitation light source 3510. The excitation light source 3510 obliquely irradiates the bottom of the light-emitting device 100' (the interface between the substrate 140 and the air) with excitation light. The incident angle of excitation light is more than 0 degrees. Preferably, a light introducing structure is provided such that excitation light is totally reflected in the photoluminescent layer 110. As illustrated in FIG. 54C, the light introducing structure may be a triangular prism disposed on the substrate 140 facing the excitation light source 3510. The light introducing structure 3590 (a triangular prism in this example) may be another structure, such as a hemisphere, pyramid, diffraction grating, or blazed diffraction grating. Such a structure can reduce reflection from the surface of the substrate 140 and allows excitation light to efficiently enter the photoluminescent layer 110. Such a structure is described in detail as a light guide structure in Japanese Patent Application No. 2015-031515 filed by the same applicant. Japanese Patent Application No. 2015-031515 is incorporated herein by reference in its entirety. The position and orientation of the excitation light source 3510 are adjusted so as to satisfy the incident angle. Consequently, excitation light enters the photoluminescent layer 110 at an angle with respect to the direction normal to the photoluminescent layer 110 and propagates through the photoluminescent layer 110. This improves luminous efficiency compared with excitation light perpendicularly incident on the photoluminescent layer 110.

The surface structure 120 emits intense light having a particular wavelength in a particular direction. Thus, the surface structure 120 also most strongly emits excitation light in a particular direction. The excitation light source can be disposed such that excitation light enters the light-emitting device 100' at the same angle as its output angle θ$_{out}$. This allows excitation light to efficiently enter the photoluminescent layer 110 and improves luminous efficiency.

The support 3540 illustrated in FIGS. 54A to 54C can be wide open for the excitation light source 3510 such that excitation light can obliquely enter the light-emitting device 100'. The opening has a side surface 3540a inclined with respect to the direction normal to the photoluminescent layer 110. The opening widens gradually from a portion 3540b in contact with the light-emitting device 100' (referred to as a "supporting portion") toward the excitation light source 3510. In other words, the opening has a tapered side surface. Excitation light can obliquely enter the light-emitting device 100' along the side surface 3540a of the opening. Although the opening in FIGS. 54A to 54C is a truncated pyramid having a square bottom, the opening may have any shape, provided that the opening does not interfere with the optical path of excitation light. For example, the opening may have a step instead of the tapered side surface 3540a.

As in the embodiments described above, the light-emitting apparatus illustrated in FIGS. 54A to 54C has the surface structure 120 for limiting the directional angle of light having a particular wavelength. This can improve the directionality of light having a particular wavelength. The light-emitting device 100' is fixed to the support 3540 such that a portion of the light-emitting device 100' on which excitation light is incident (the bottom of the substrate 140) is exposed. Thus, excitation light can enter the light-emitting device 100' at a desired angle while the light-emitting device 100' is protected. If the support 3540 is composed of a material having a higher thermal conductivity than the photoluminescent layer 110, the light-emitting apparatus can have good heat dissipation characteristics and is less likely to have low luminous efficiency.

Figure 55A:
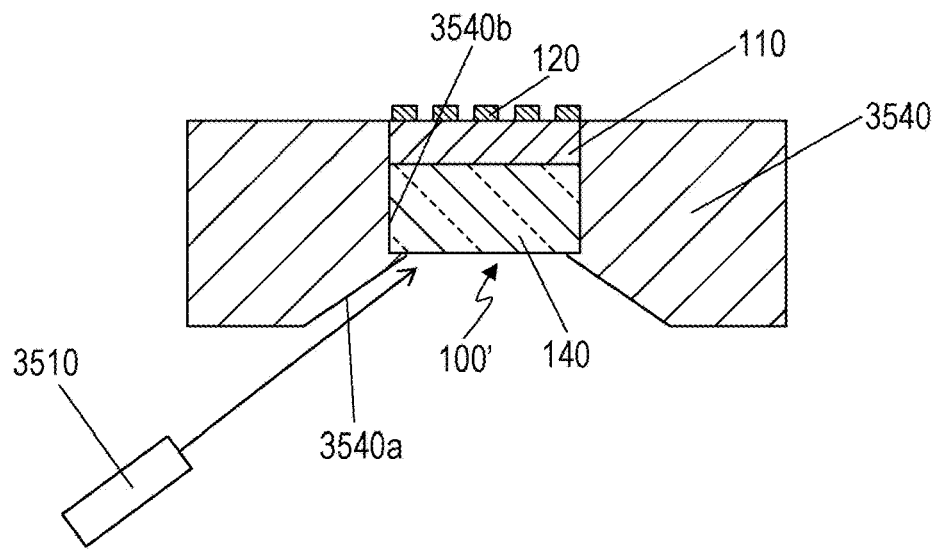
FIG. 55A is a schematic cross-sectional view of another light-emitting apparatus including a light-emitting device and a support for supporting the light-emitting device.
Figure 55B:
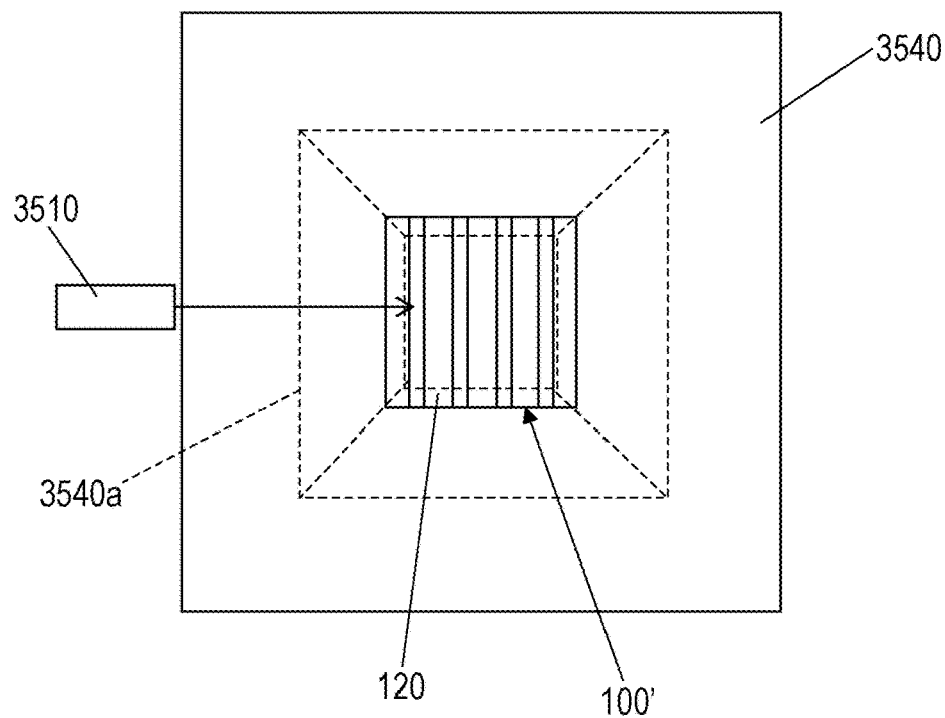
FIG. 55B is a plan view of the light-emitting apparatus illustrated in FIG. 55A, viewed from above.

FIGS. 55A and 55B illustrate another example of the light-emitting device 100' having a different structure. In this light-emitting device 100', the light-transmissive layer 3520 and the surface structure 120 on the surface thereof are eliminated from the structure illustrated in FIGS. 54A and 54B. More specifically, the light-emitting device 100' includes the substrate 140, the photoluminescent layer 110 disposed on the substrate 140, and the surface structure 120 on the surface of the photoluminescent layer 110. The components other than the light-emitting device 100' are the same as in FIGS. 54A and 54B. In FIGS. 55A and 55B, the surface structure 120 is only disposed on top of the photoluminescent layer 110, and therefore the production process can be simplified. This structure is particularly effective when the substrate 140 is composed of heat-resistant quartz glass. Because of its high heat resistance, quartz glass is less likely to be damaged by sintering of the photoluminescent material. Thus, the photoluminescent layer 110 can be directly formed on the substrate 140, and the surface structure 120 can be formed on the photoluminescent layer 110.

Figure 56A:
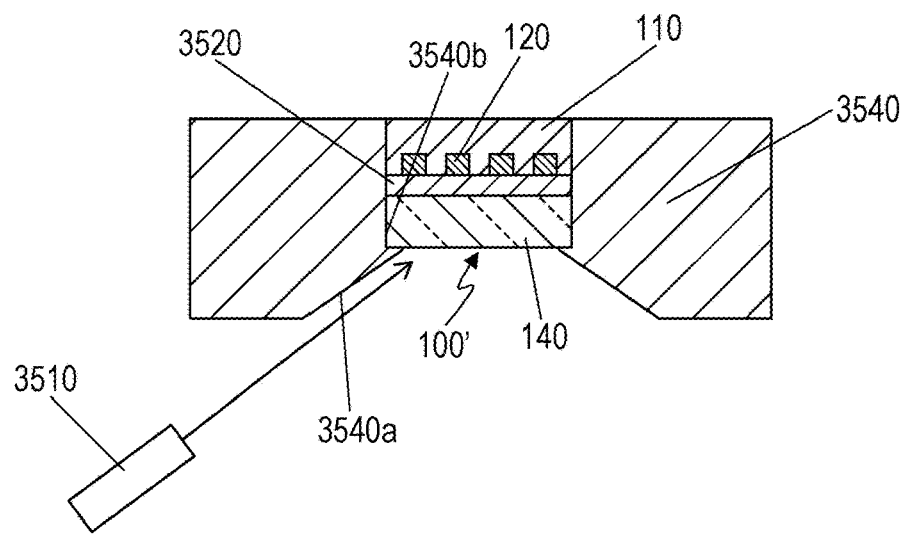
FIG. 56A is a schematic cross-sectional view of still another light-emitting apparatus including a light-emitting device and a support for supporting the light-emitting device.
Figure 56B:
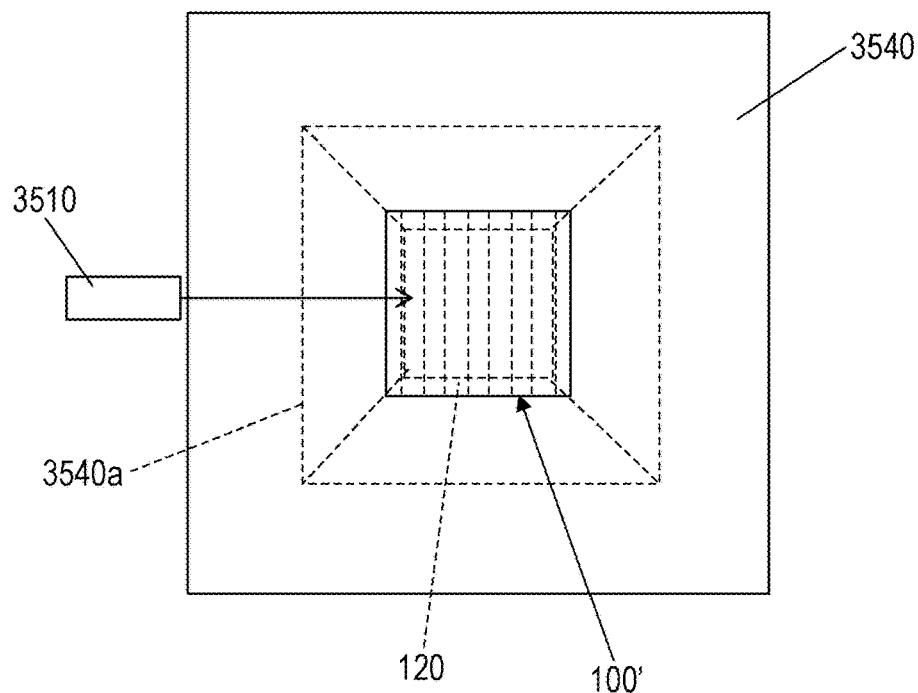
FIG. 56B is a plan view of the light-emitting apparatus illustrated in FIG. 56A, viewed from above.

FIGS. 56A and 56B illustrate still another example of the light-emitting device 100' having a different structure. In this light-emitting device 100', the surface structure 120 on the photoluminescent layer 110 is eliminated from the structure illustrated in FIGS. 54A and 54B. More specifically, the light-emitting device 100' includes the substrate 140, the light-transmissive layer 3520 disposed on the substrate 140, the surface structure 120 on the surface of the light-transmissive layer 3520, and the photoluminescent layer 110 disposed on the light-transmissive layer 3520. The surface structure 120 is disposed only at the interface between the photoluminescent layer 110 and the light-transmissive layer 3520. This structure can also simplify the production process.

Figure 57A:
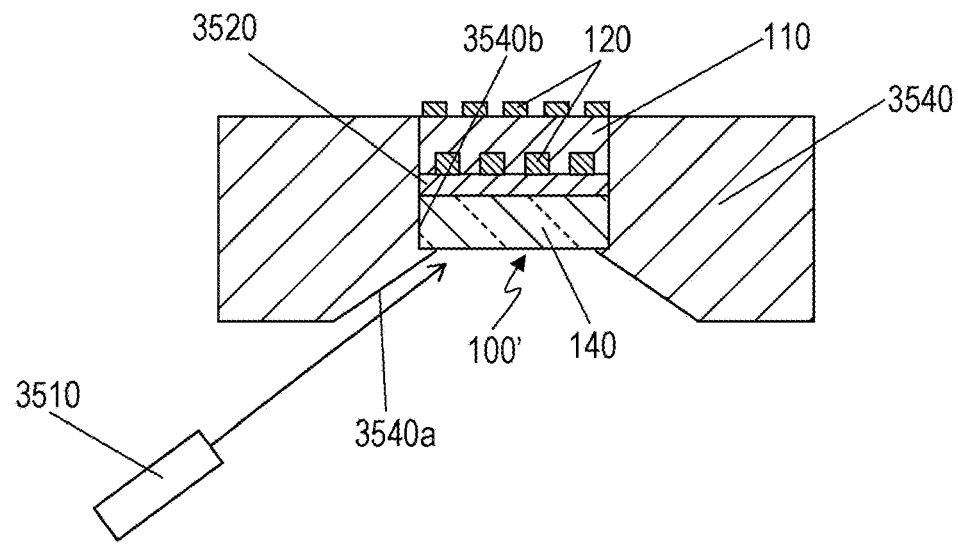
FIG. 57A is a schematic cross-sectional view of still another light-emitting apparatus including a light-emitting device and a support for supporting the light-emitting device.
Figure 57B:
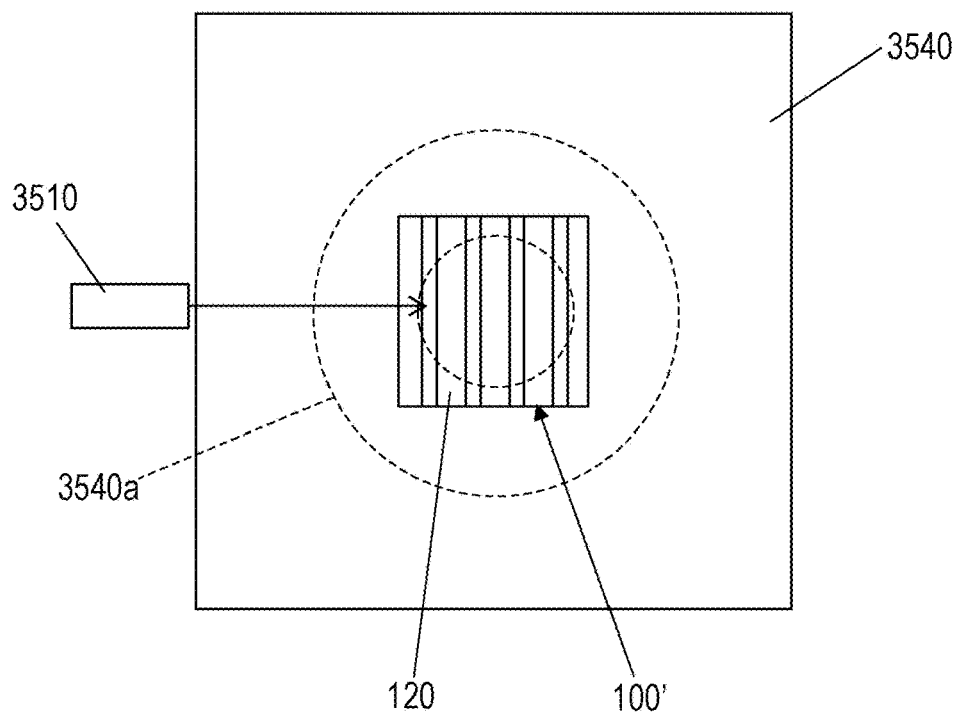
FIG. 57B is a plan view of the light-emitting apparatus illustrated in FIG. 57A, viewed from above.

In FIGS. 57A and 57B, the support 3540 has a structure different from the structure illustrated in FIGS. 54A and 54B. As illustrated in FIG. 57B, the shape of the outer and inner peripheries of the side surface 3540a of the support 3540 is circular rather than tetragonal, as viewed in the direction perpendicular to the photoluminescent layer. In other words, the opening is truncated conical rather than truncated pyramidal. Except for this, the structure is the same as the structure illustrated in FIGS. 54A and 54B. This structure also has the same advantages as the structure illustrated in FIGS. 54A and 54B.

Figure 58A:
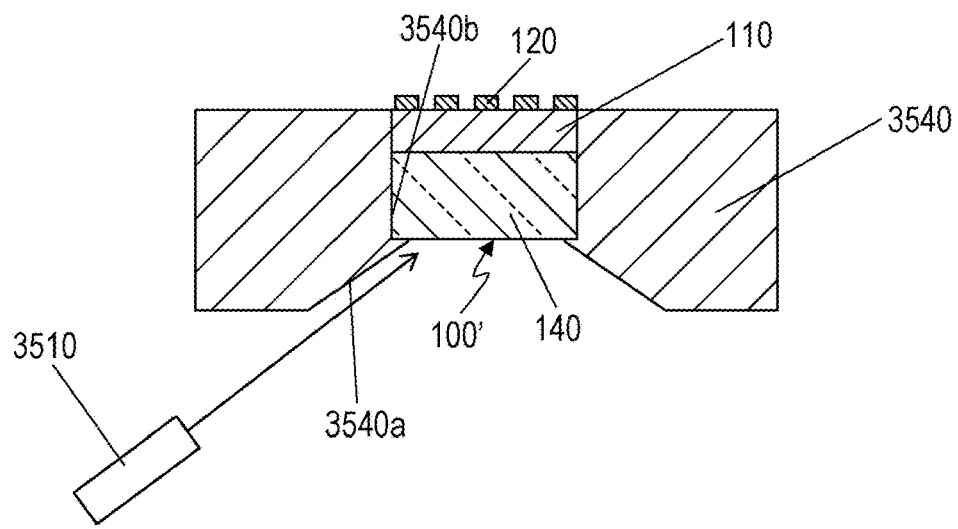
FIG. 58A is a schematic cross-sectional view of still another light-emitting apparatus including a light-emitting device and a support for supporting the light-emitting device.
Figure 58B:
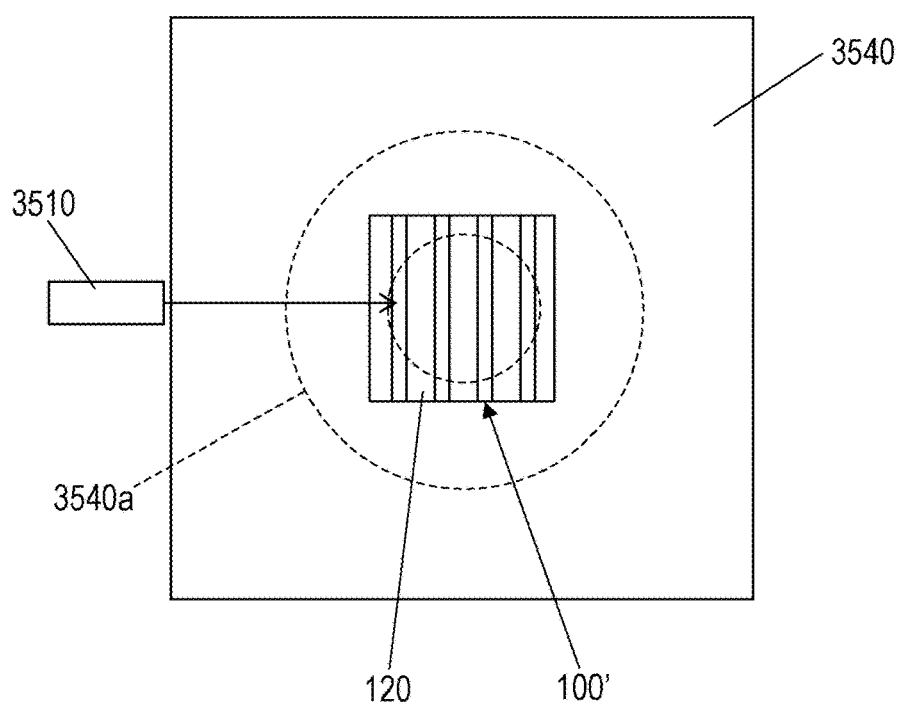
FIG. 58B is a plan view of the light-emitting apparatus illustrated in FIG. 58A, viewed from above.

In FIGS. 58A and 58B, the support 3540 of the light-emitting apparatus illustrated in FIGS. 55A and 55B is substituted by the support illustrated in FIGS. 57A and 57B. Having a difference only in the shape of the side surface of the opening in the support, this structure has the same advantages as the structure illustrated in FIGS. 55A and 55B.

Figure 59A:
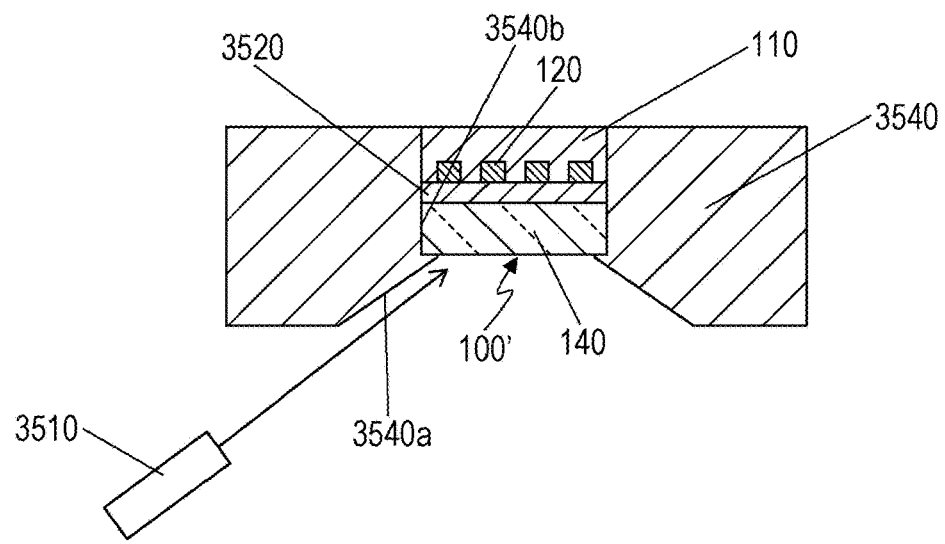
FIG. 59A is a schematic cross-sectional view of still another light-emitting apparatus including a light-emitting device and a support for supporting the light-emitting device.
Figure 59B:
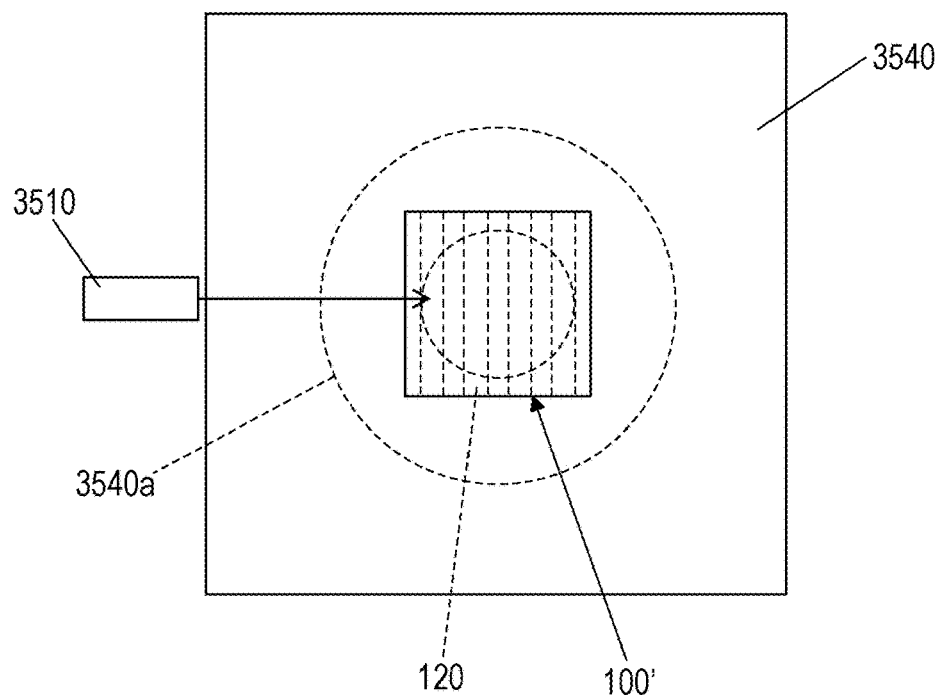
FIG. 59B is a plan view of the light-emitting apparatus illustrated in FIG. 59A, viewed from above.

In FIGS. 59A and 59B, the support 3540 of the light-emitting apparatus illustrated in FIGS. 56A and 56B is substituted by the support illustrated in FIGS. 57A and 57B. Having a difference only in the shape of the side surface of the opening in the support, this structure has the same advantages as the structure illustrated in FIGS. 56A and 56B.

Figure 60A:
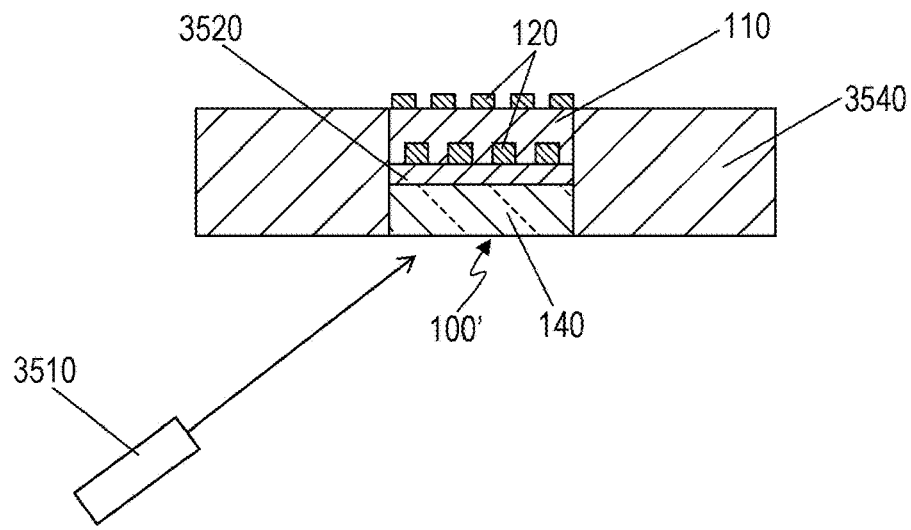
FIG. 60A is a schematic cross-sectional view of still another light-emitting apparatus including a light-emitting device and a support for supporting the light-emitting device.
Figure 60B:
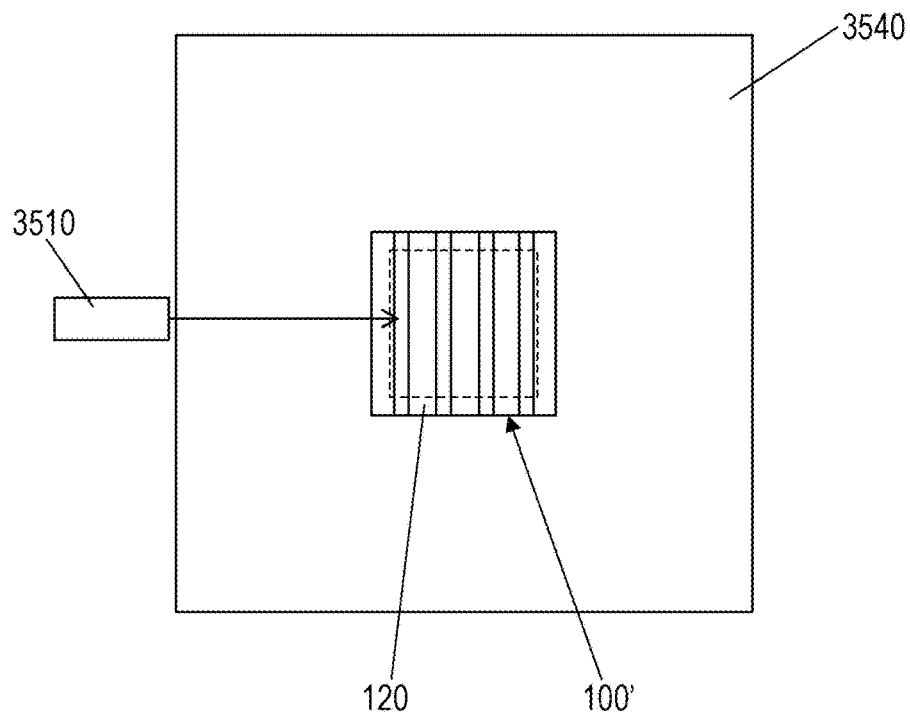
FIG. 60B is a plan view of the light-emitting apparatus illustrated in FIG. 60A, viewed from above.

FIGS. 60A and 60B illustrate a light-emitting apparatus in which the support 3540 is disposed only on the side surface of the light-emitting device 100'. In this example, the periphery of the support 3540 does not protrude toward the excitation light source 3510; that is, the support 3540 does not have an opening facing the excitation light source 3510. Except for this, the structure is the same as the structure illustrated in FIGS. 54A and 54B. This example can provide a directional-light-emitting apparatus having a simple structure and high impact resistance or good heat dissipation characteristics.

Figure 61A:
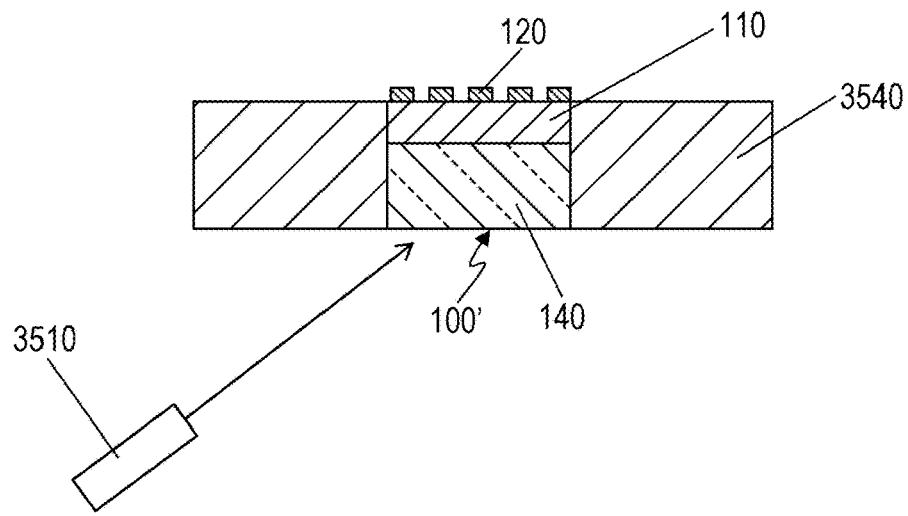
FIG. 61A is a schematic cross-sectional view of still another light-emitting apparatus including a light-emitting device and a support for supporting the light-emitting device.
Figure 61B:
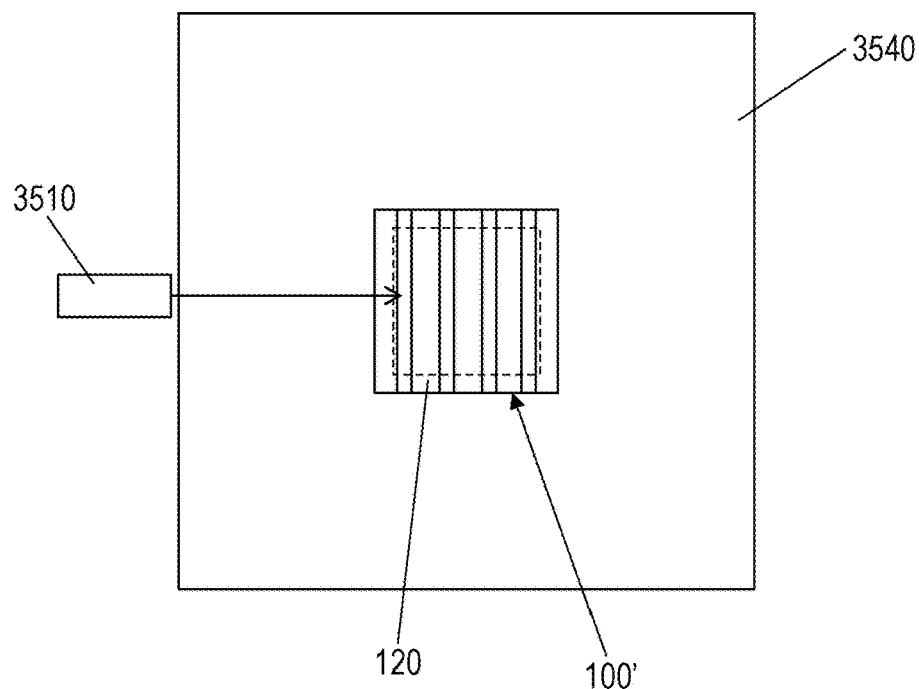
FIG. 61B is a plan view of the light-emitting apparatus illustrated in FIG. 61A, viewed from above.

In a light-emitting apparatus illustrated in FIGS. 61A and 61B, the light-emitting device 100' in the structure illustrated in FIGS. 60A and 60B is substituted by the light-emitting device illustrated in FIGS. 55A and 55B. This example can also provide a directional-light-emitting apparatus having a simple structure and good heat dissipation characteristics.

Figure 62A:
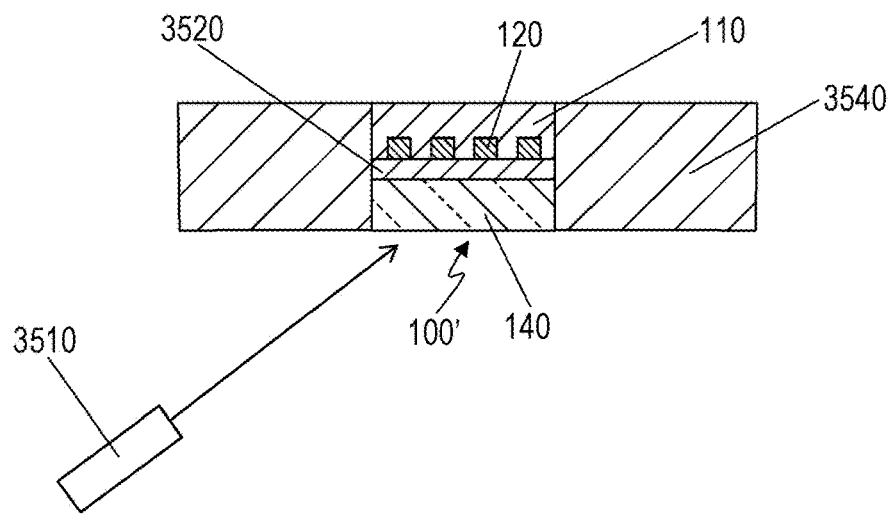
FIG. 62A is a schematic cross-sectional view of still another light-emitting apparatus including a light-emitting device and a support for supporting the light-emitting device.
Figure 62B:
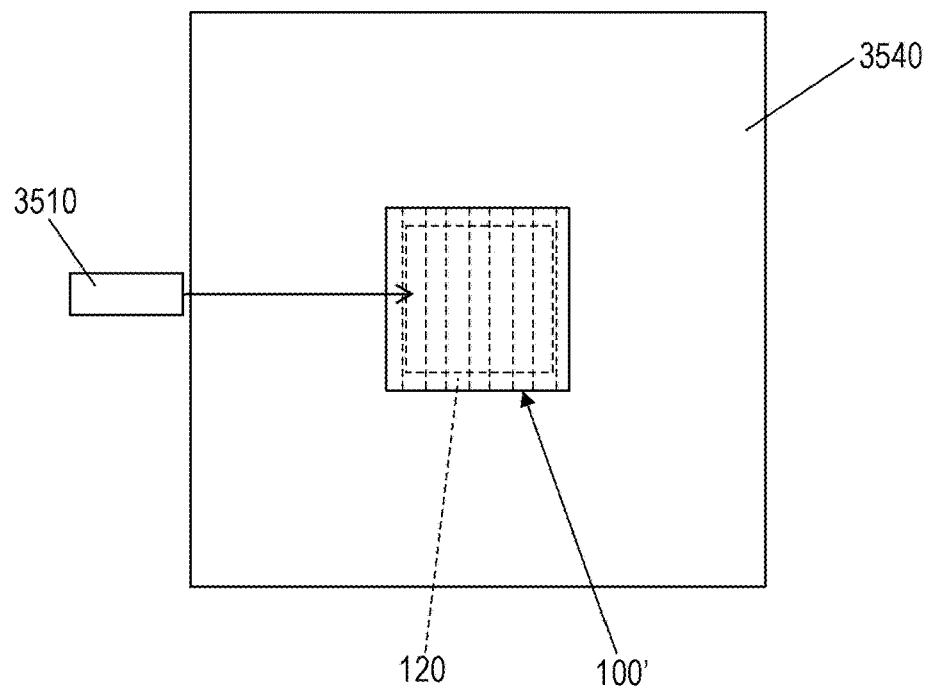
FIG. 62B is a plan view of the light-emitting apparatus illustrated in FIG. 62A, viewed from above.

In a light-emitting apparatus illustrated in FIGS. 62A and 62B, the light-emitting device 100' in the structure illustrated in FIGS. 60A and 60B is substituted by the light-emitting device illustrated in FIGS. 56A and 56B. This example can also provide a directional-light-emitting apparatus having a simple structure and good heat dissipation characteristics.

Figure 63A:
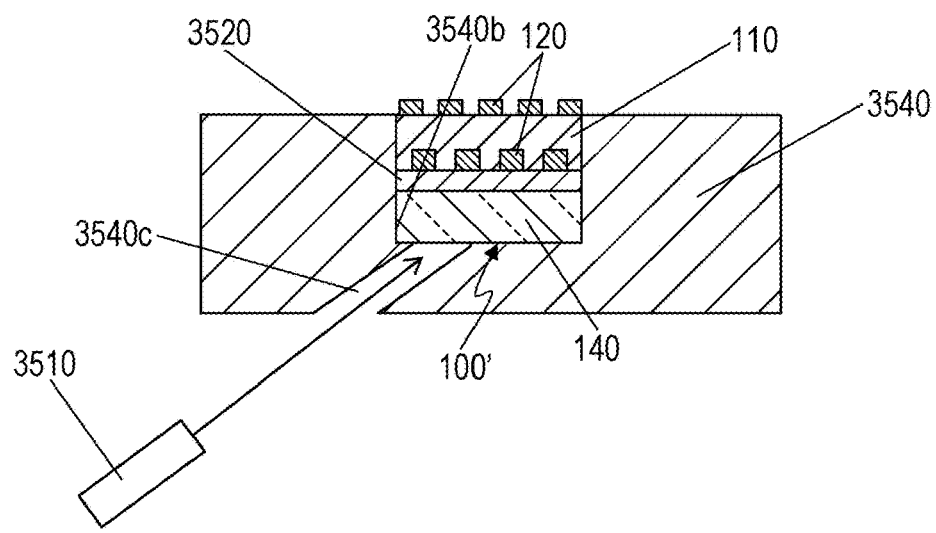
FIG. 63A is a schematic cross-sectional view of still another light-emitting apparatus including a light-emitting device and a support for supporting the light-emitting device.
Figure 63B:
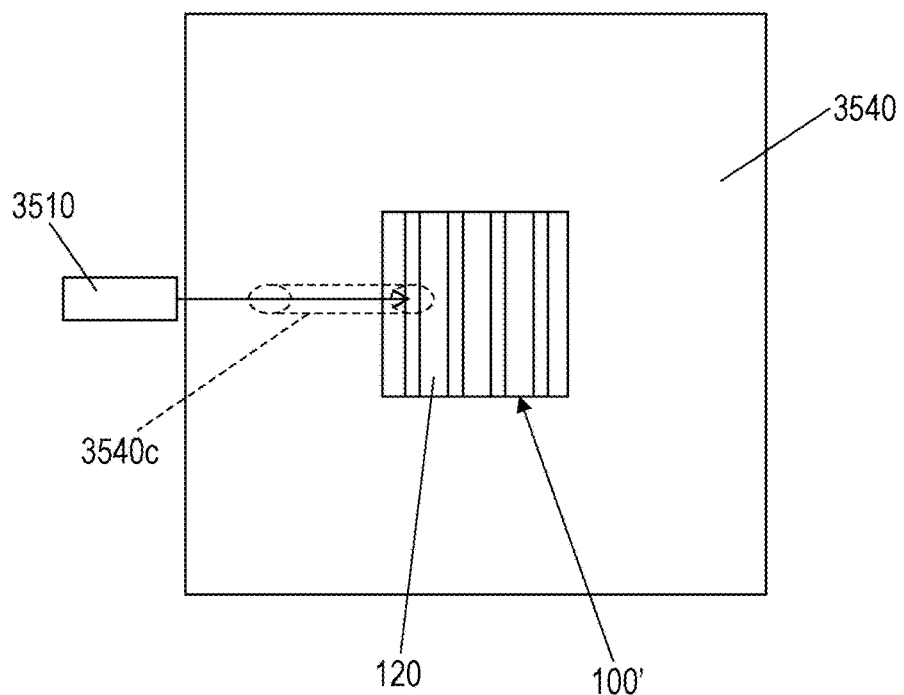
FIG. 63B is a plan view of the light-emitting apparatus illustrated in FIG. 63A, viewed from above.

In FIGS. 63A and 63B, the structure of the support 3540 of the light-emitting apparatus illustrated in FIGS. 54A and 54B is substituted by still another structure. The support 3540 has an opening 3540c extending along the optical path of excitation light from a supporting portion 3540b disposed in contact with the light-emitting device 100'. The opening 3540c functions as a light guide path for directing excitation light to the light-emitting device 100'. Excitation light emitted from the excitation light source 3510 travels through the opening 3540c and obliquely enters the bottom of the light-emitting device 100'. This structure can also provide a directional-light-emitting apparatus having high impact resistance or good heat dissipation characteristics.

Figure 64A:
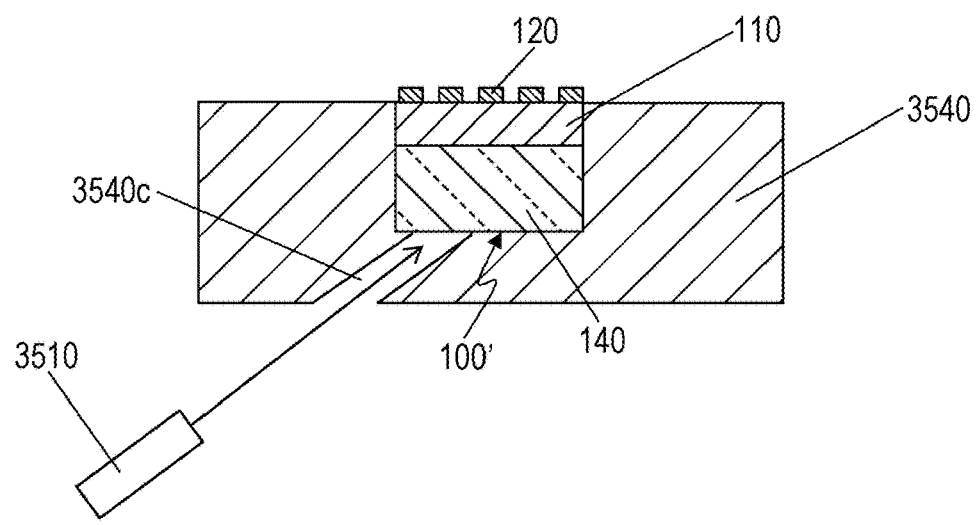
FIG. 64A is a schematic cross-sectional view of still another light-emitting apparatus including a light-emitting device and a support for supporting the light-emitting device.
Figure 64B:
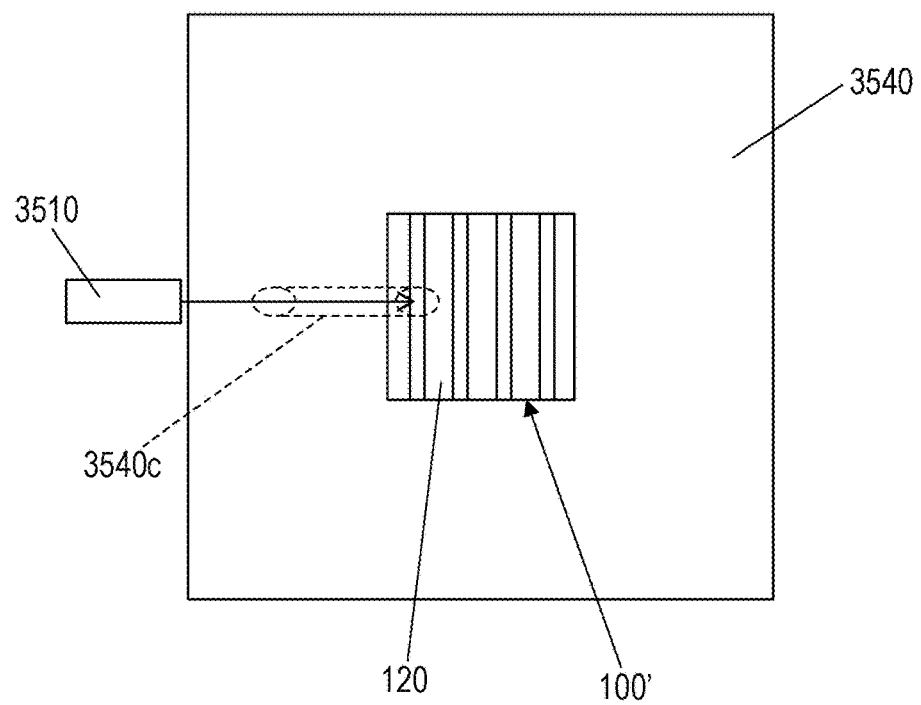
FIG. 64B is a plan view of the light-emitting apparatus illustrated in FIG. 64A, viewed from above.
Figure 65A:
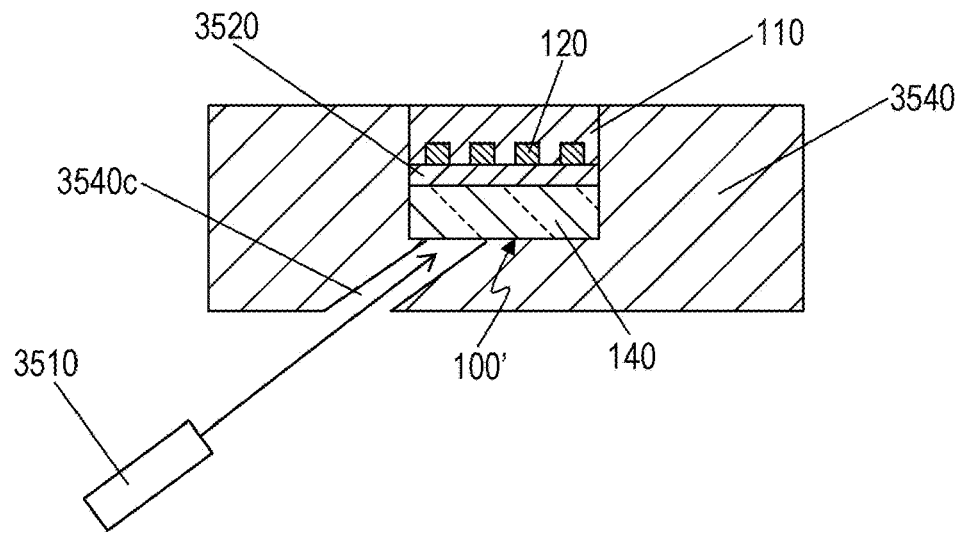
FIG. 65A is a schematic cross-sectional view of still another light-emitting apparatus including a light-emitting device and a support for supporting the light-emitting device.
Figure 65B:
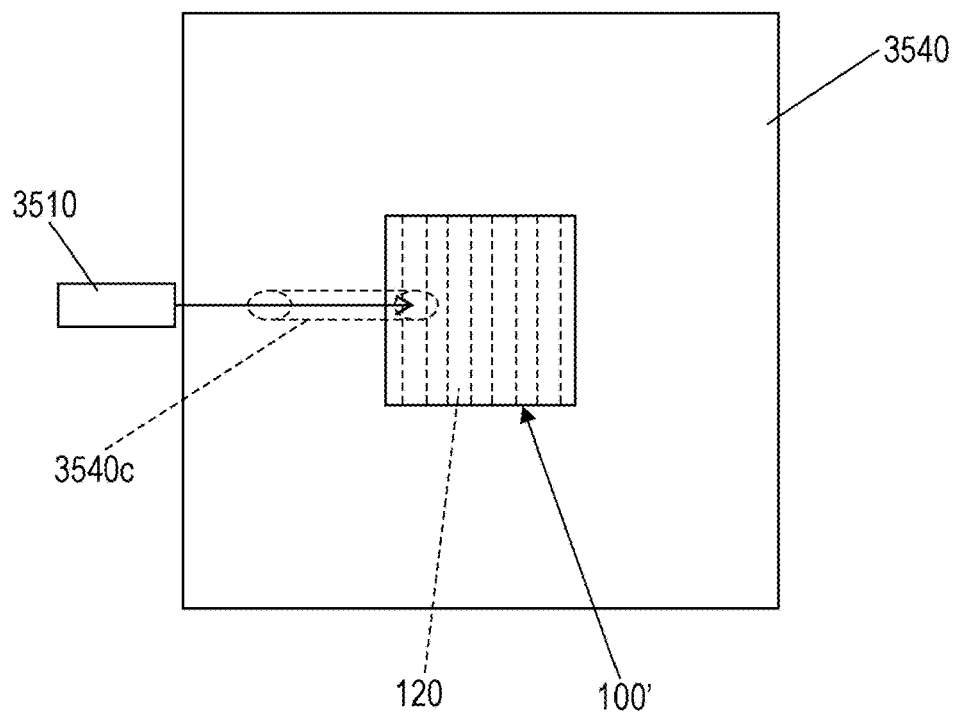
FIG. 65B is a plan view of the light-emitting apparatus illustrated in FIG. 65A, viewed from above.

In a light-emitting apparatus illustrated in FIGS. 64A and 64B, the light-emitting device 100' in the structure illustrated in FIGS. 63A and 63B is substituted by the light-emitting device illustrated in FIGS. 55A and 55B. In a light-emitting apparatus illustrated in FIGS. 65A and 65B, the light-emitting device 100' in the structure illustrated in FIGS. 63A and 63B is substituted by the light-emitting device illustrated in FIGS. 56A and 56B. Having a difference only in the structure of the light-emitting device 100', these examples have the same advantages as the example illustrated in FIGS. 63A and 63B.

Figure 66A:
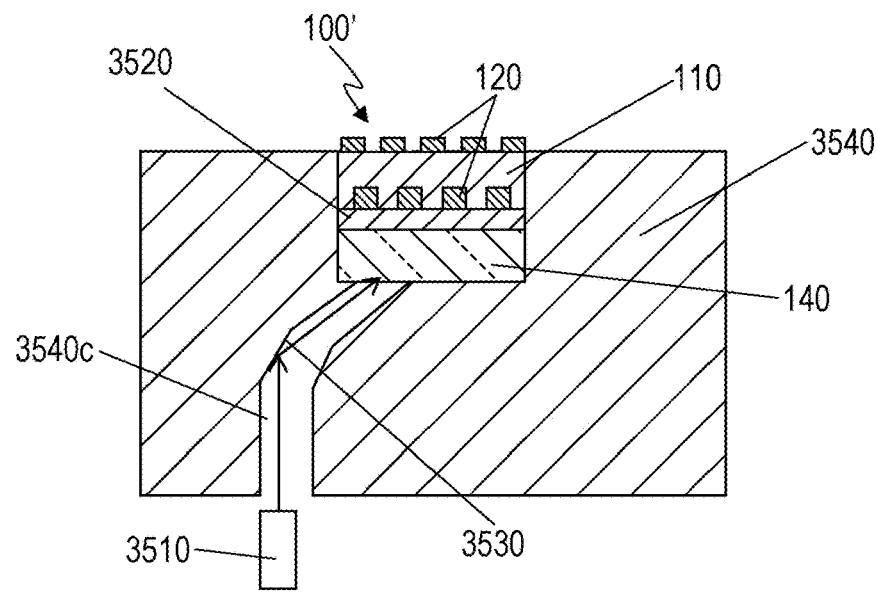
FIG. 66A is a schematic cross-sectional view of still another light-emitting apparatus including a light-emitting device and a support for supporting the light-emitting device.
Figure 66B:
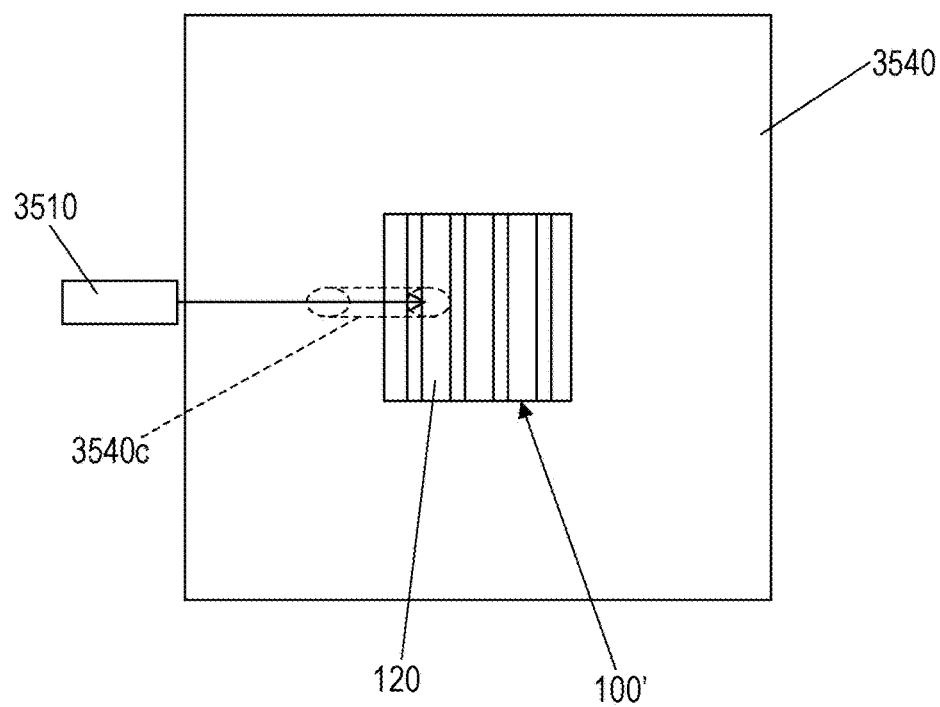
FIG. 66B is a plan view of the light-emitting apparatus illustrated in FIG. 66A, viewed from above.

A structure illustrated in FIGS. 66A and 66B includes a reflecting mirror (reflector) 3530 in a light guide path. The reflector reflects excitation light. The light-emitting device 100' can have the structure illustrated in FIGS. 54A and 54B. In this example, the opening 3540c (light guide path) in the support 3540 has a bend at which a reflector 3530 is disposed. The reflector 3530 has a high reflectance in a wavelength range of excitation light. The reflector 3530 is not limited to a general mirror and may be a dichroic mirror. Excitation light reflected from the reflector 3530 enters the bottom of the light-emitting device 100'. The reflector 3530 in the light guide path relaxes location constraints on the excitation light source 3510. This structure can provide a small light-emitting apparatus.

Figure 67A:
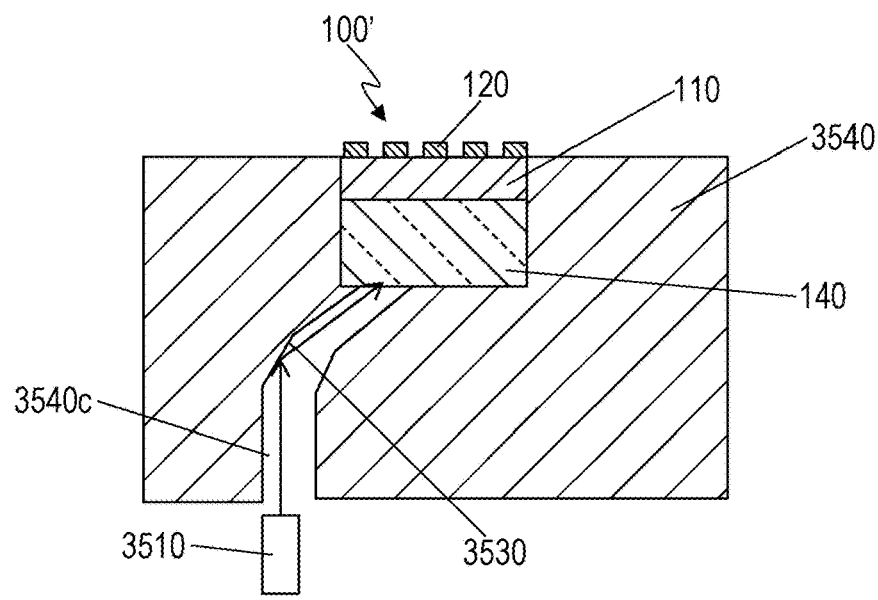
FIG. 67A is a schematic cross-sectional view of still another light-emitting apparatus including a light-emitting device and a support for supporting the light-emitting device.
Figure 67B:
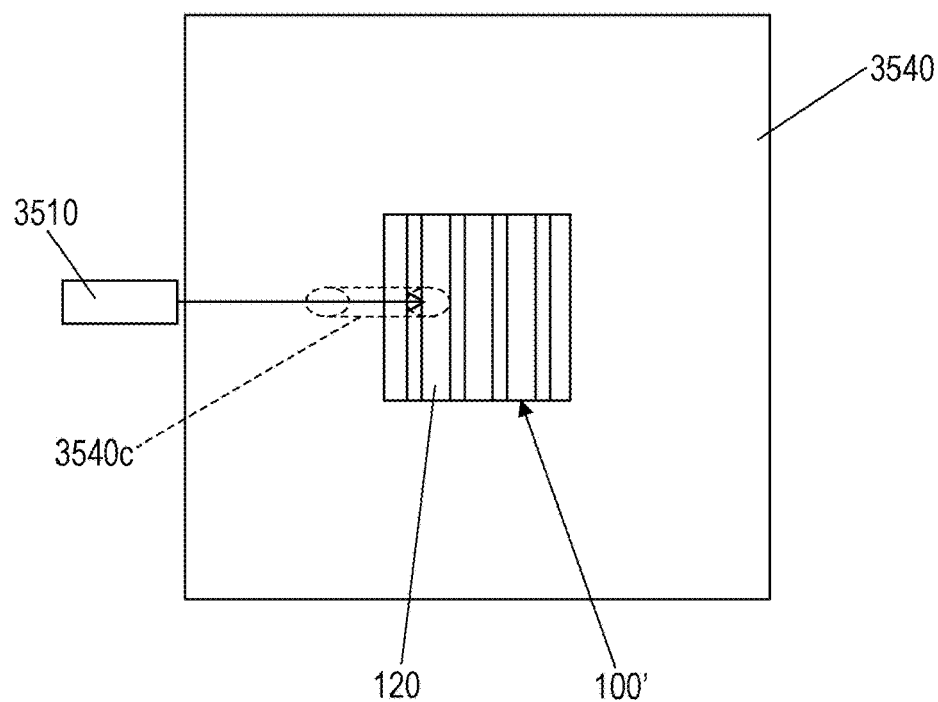
FIG. 67B is a plan view of the light-emitting apparatus illustrated in FIG. 67A, viewed from above.
Figure 68A:
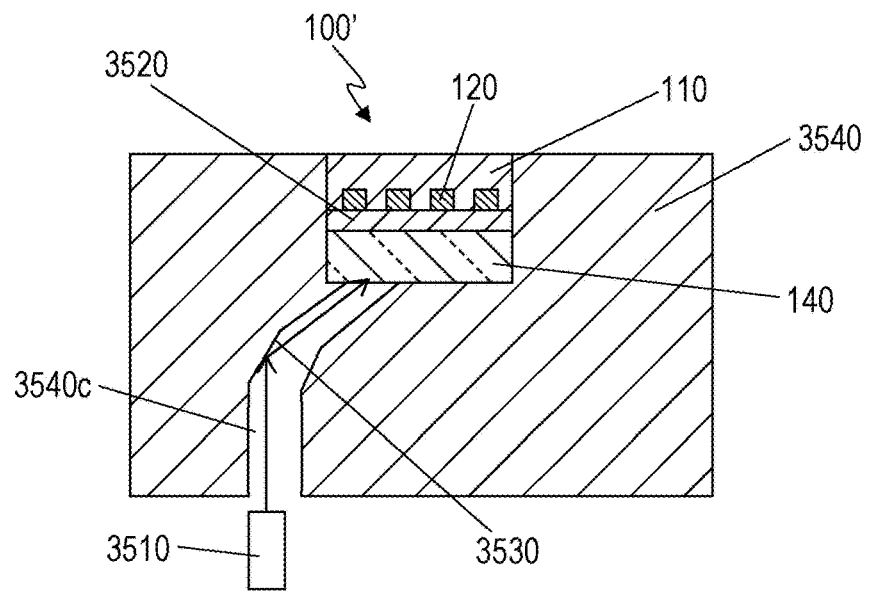
FIG. 68A is a schematic cross-sectional view of still another light-emitting apparatus including a light-emitting device and a support for supporting the light-emitting device.
Figure 68B:
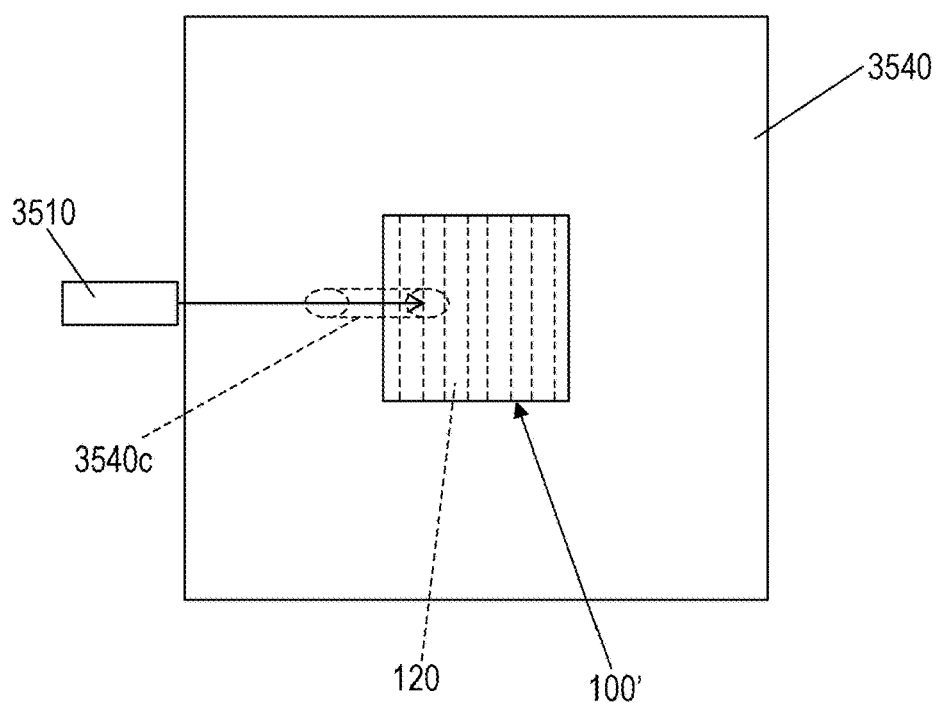
FIG. 68B is a plan view of the light-emitting apparatus illustrated in FIG. 68A, viewed from above.
Figure 69A:
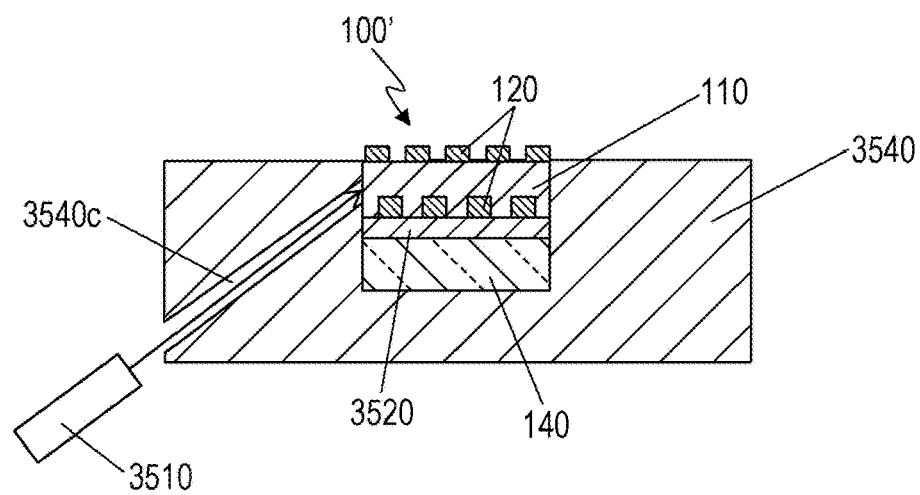
FIG. 69A is a schematic cross-sectional view of still another light-emitting apparatus including a light-emitting device and a support for supporting the light-emitting device.
Figure 69B:
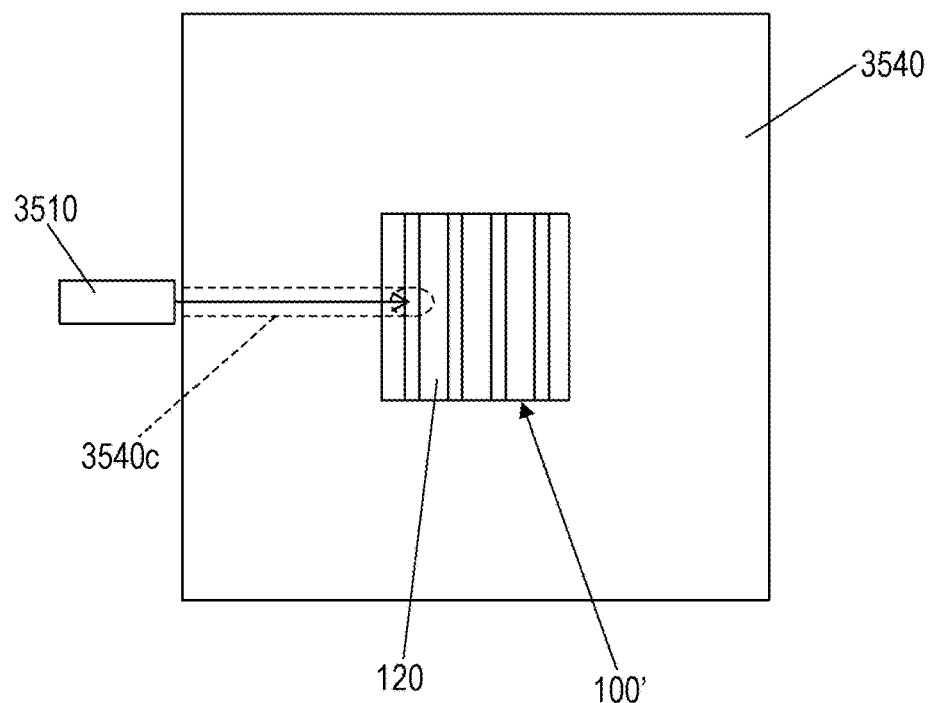
FIG. 69B is a plan view of the light-emitting apparatus illustrated in FIG. 69A, viewed from above.
Figure 70A:
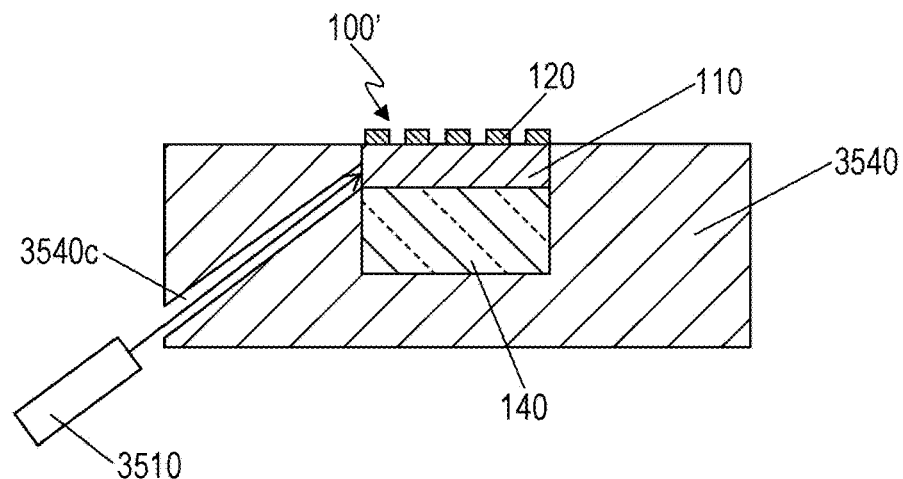
FIG. 70A is a schematic cross-sectional view of still another light-emitting apparatus including a light-emitting device and a support for supporting the light-emitting device.
Figure 70B:
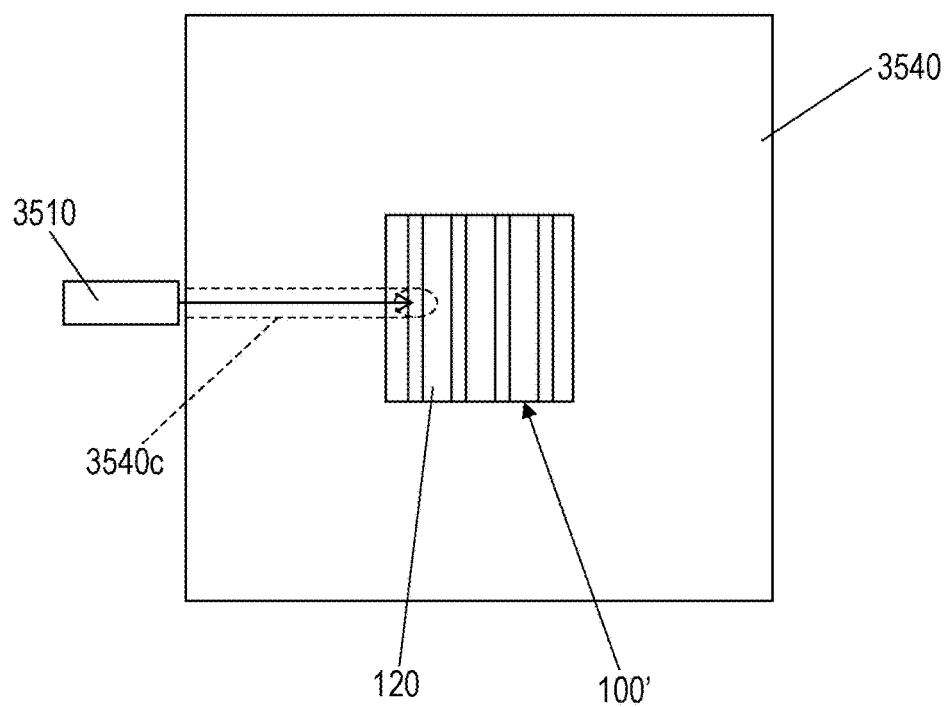
FIG. 70B is a plan view of the light-emitting apparatus illustrated in FIG. 70A, viewed from above.
Figure 71A:
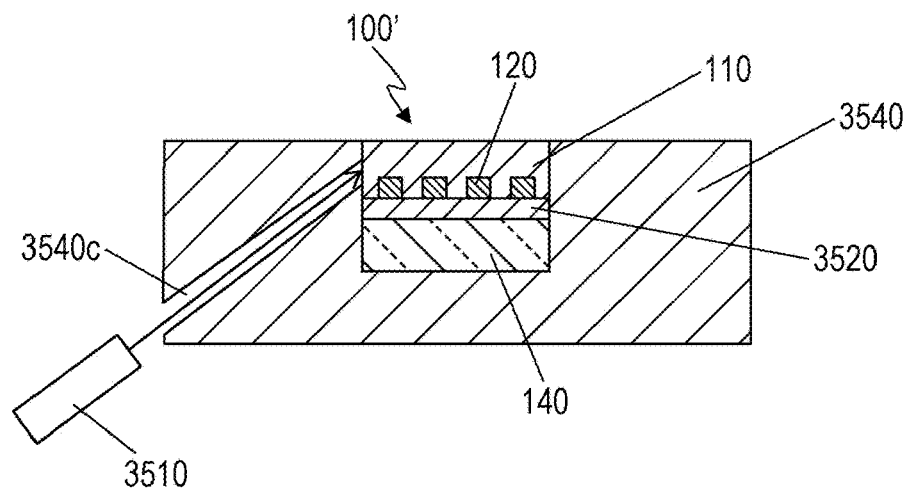
FIG. 71A is a schematic cross-sectional view of still another light-emitting apparatus including a light-emitting device and a support for supporting the light-emitting device.
Figure 71B:
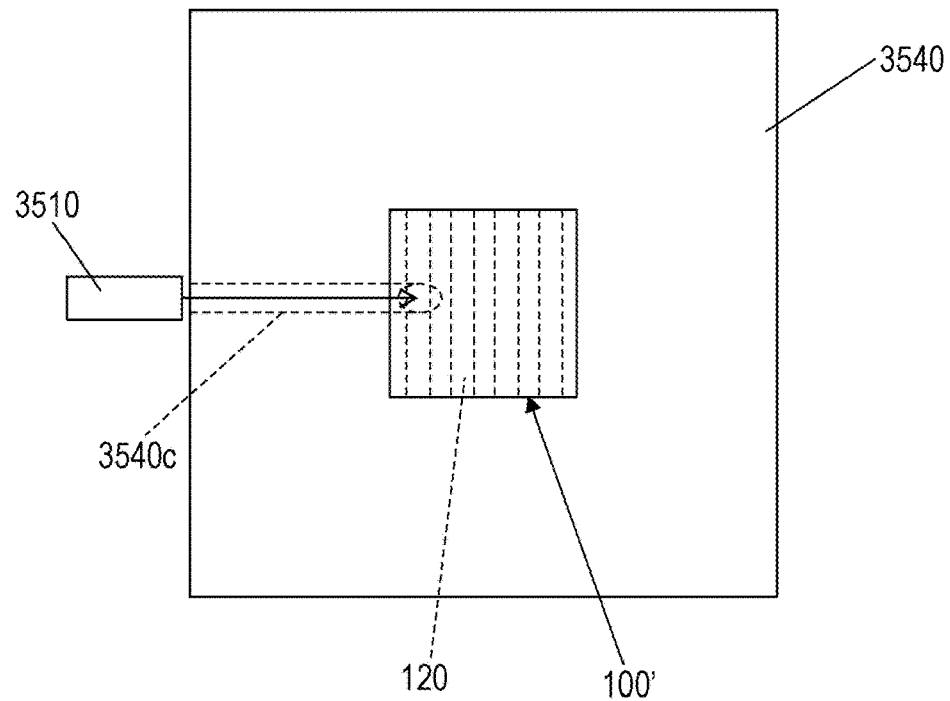
FIG. 71B is a plan view of the light-emitting apparatus illustrated in FIG. 71A, viewed from above.
Figure 72A:
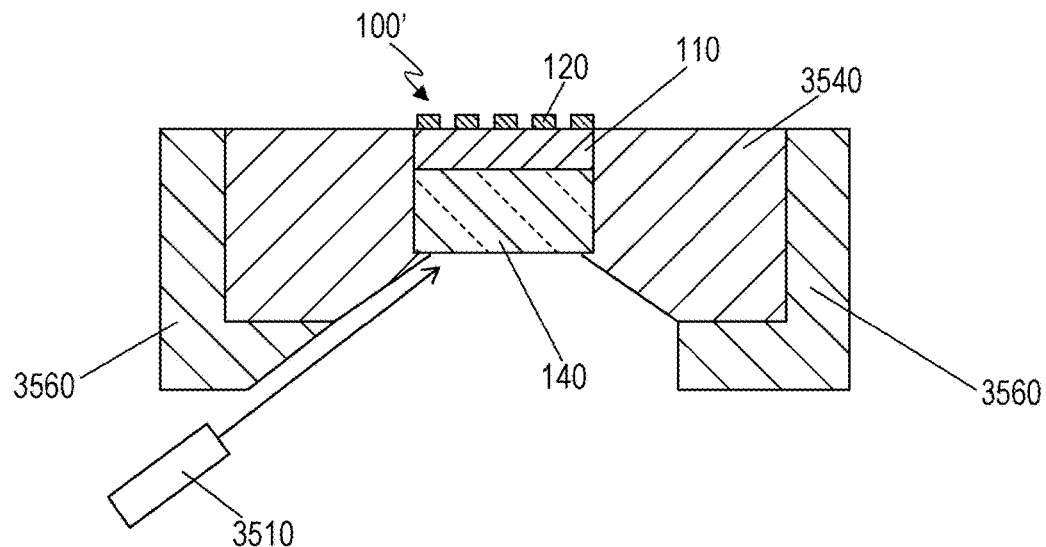
FIG. 72A is a schematic cross-sectional view of still another light-emitting apparatus including a light-emitting device and a support for supporting the light-emitting device.
Figure 72B:
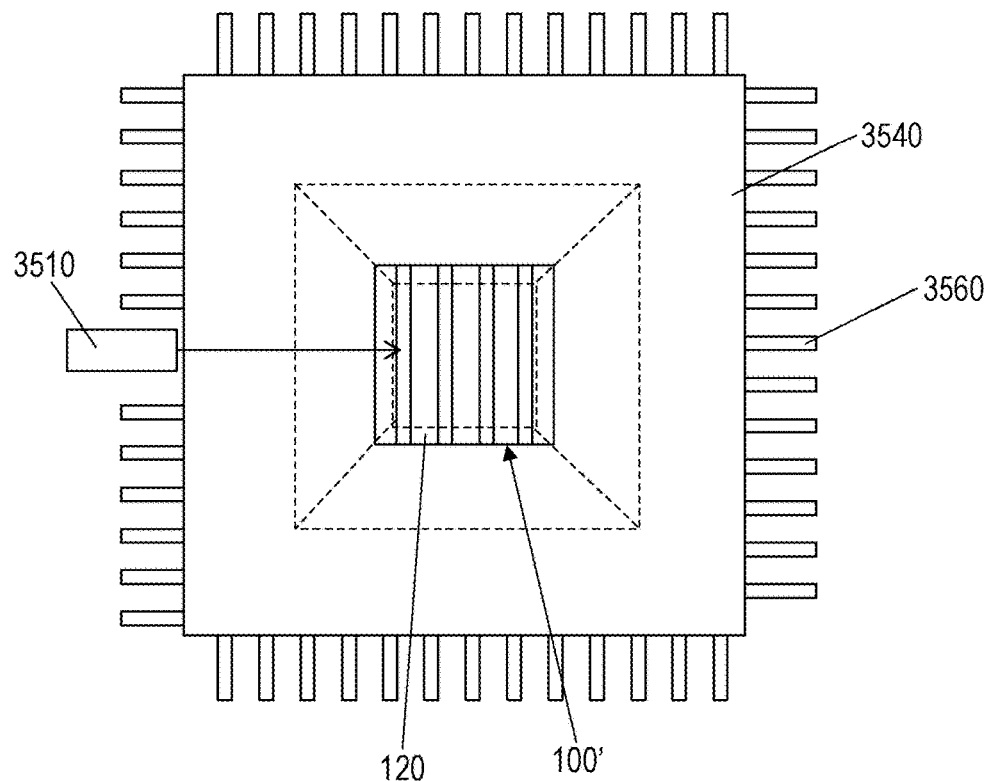
FIG. 72B is a plan view of the light-emitting apparatus illustrated in FIG. 72A, viewed from above.
Figure 73A:
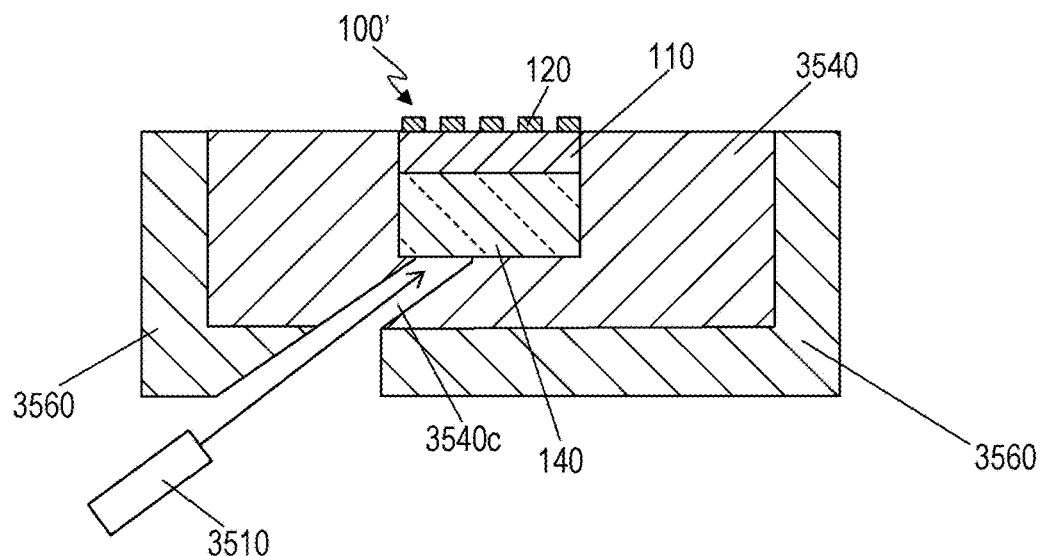
FIG. 73A is a schematic cross-sectional view of still another light-emitting apparatus including a light-emitting device and a support for supporting the light-emitting device.
Figure 73B:
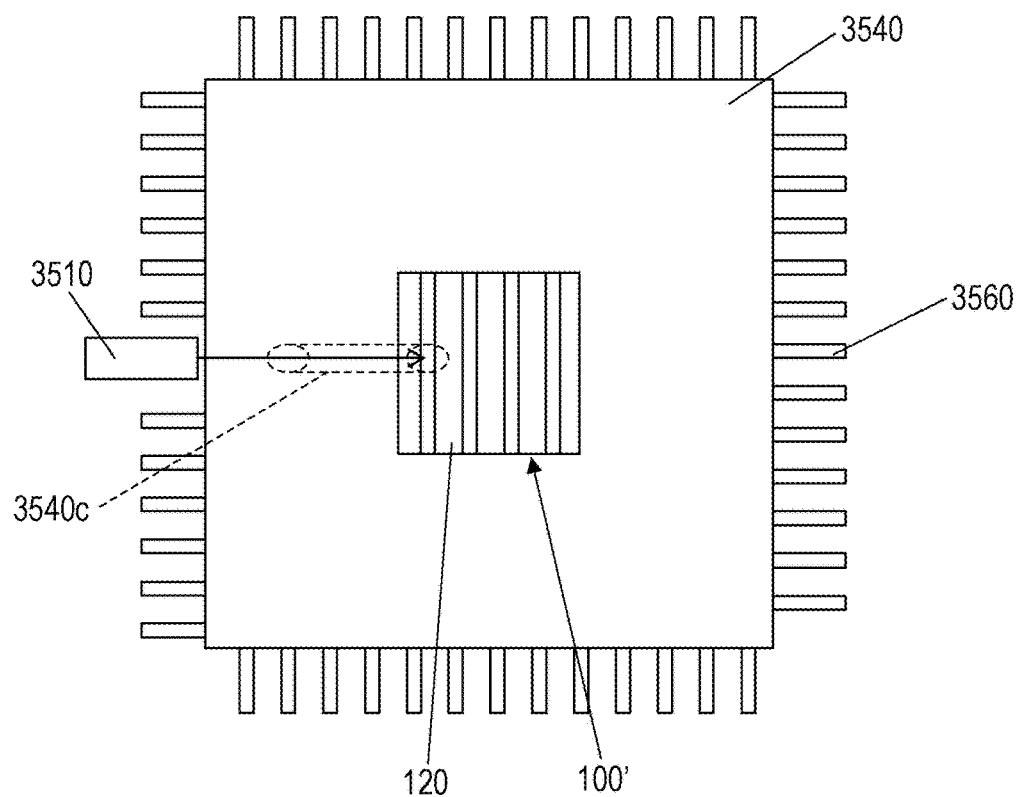
FIG. 73B is a plan view of the light-emitting apparatus illustrated in FIG. 73A, viewed from above.
Figure 74A:
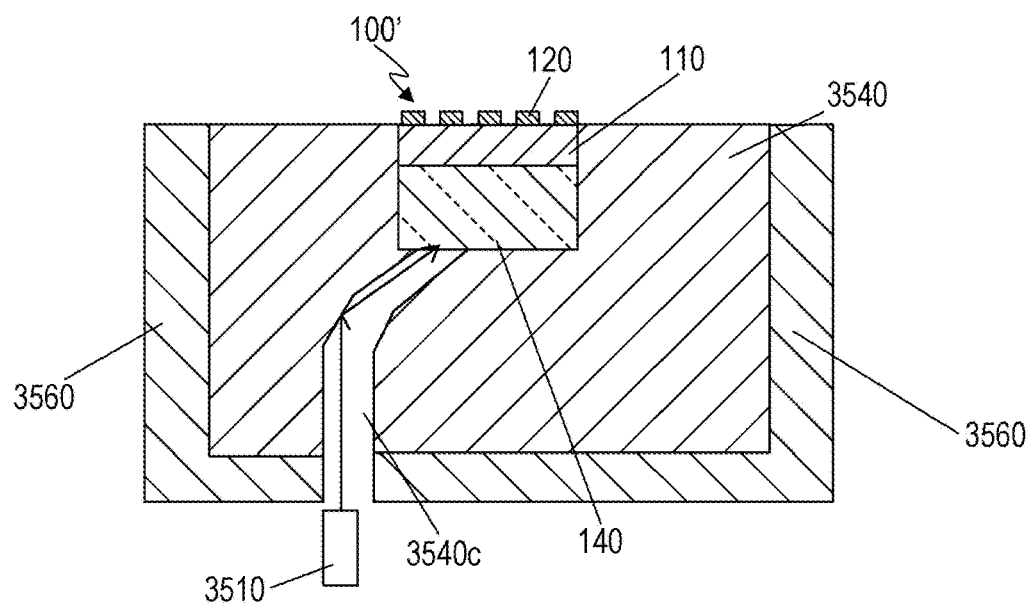
FIG. 74A is a schematic cross-sectional view of still another light-emitting apparatus including a light-emitting device and a support for supporting the light-emitting device.
Figure 74B:
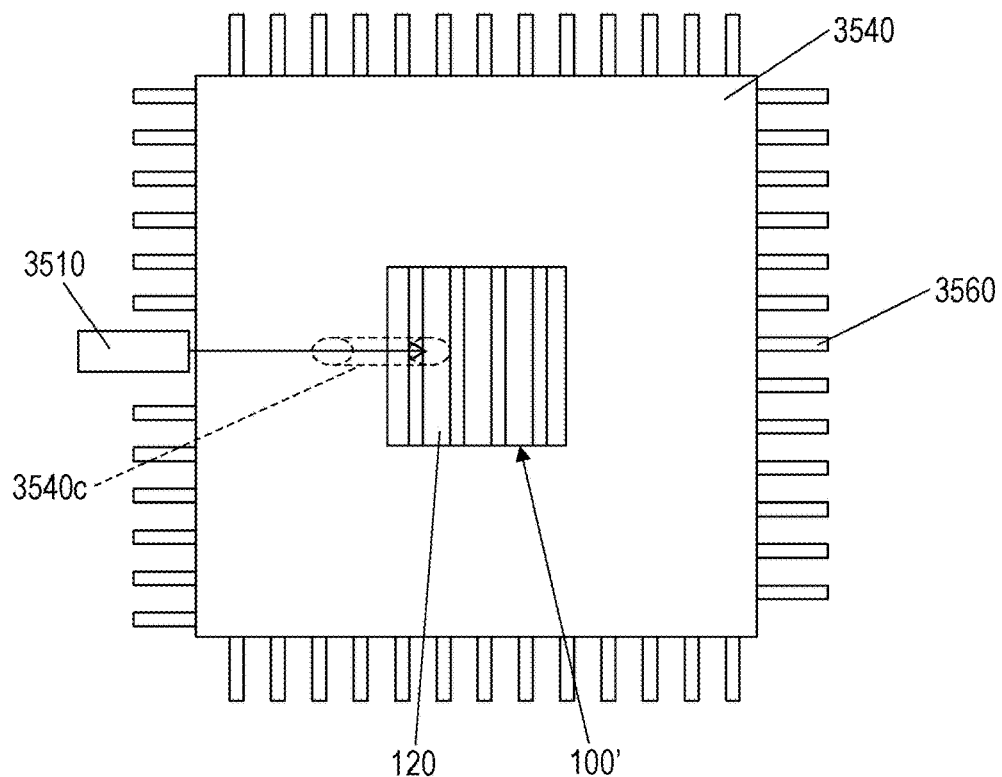
FIG. 74B is a plan view of the light-emitting apparatus illustrated in FIG. 74A, viewed from above.
Figure 75A:
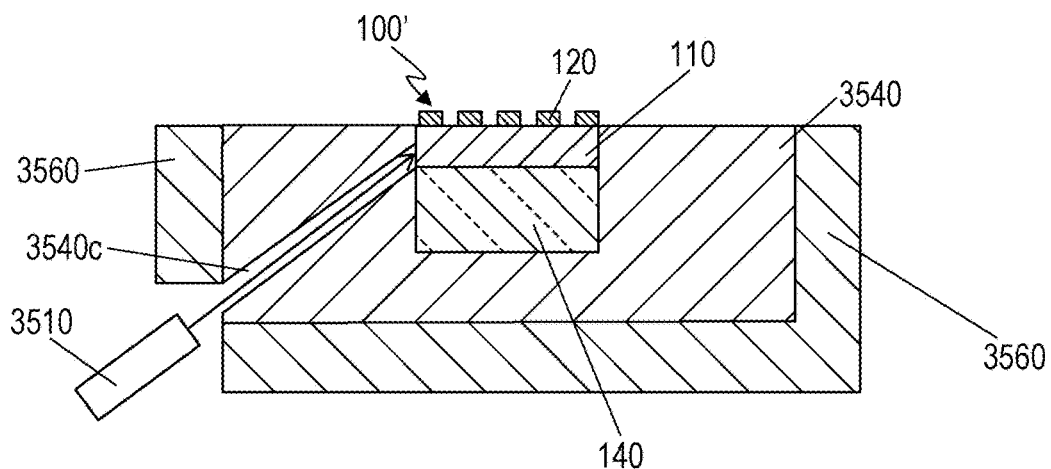
FIG. 75A is a schematic cross-sectional view of still another light-emitting apparatus including a light-emitting device and a support for supporting the light-emitting device.
Figure 75B:
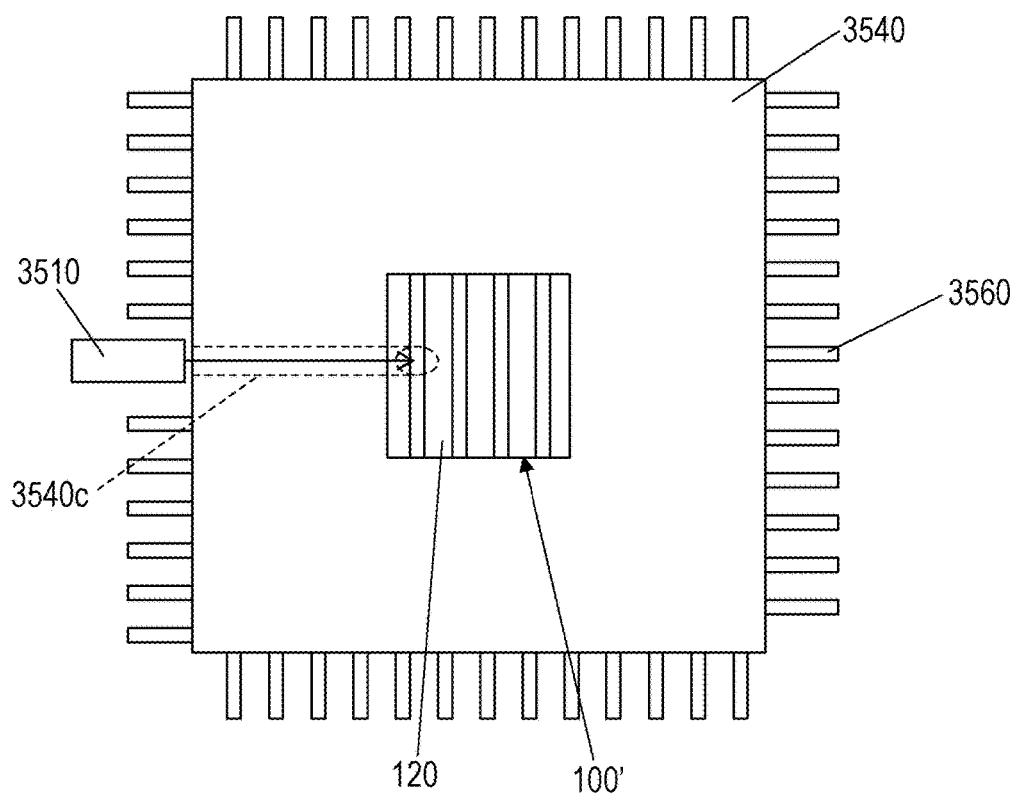
FIG. 75B is a plan view of the light-emitting apparatus illustrated in FIG. 75A, viewed from above.

In FIGS. 67A and 67B, the light-emitting device 100' in the light-emitting apparatus illustrated in FIGS. 66A and 66B is substituted by the light-emitting device illustrated in FIGS. 55A and 55B. In FIGS. 68A and 68B, the light-emitting device 100' in the light-emitting apparatus illustrated in FIGS. 66A and 66B is substituted by the light-emitting device illustrated in FIGS. 56A and 56B. Having a difference only in the structure of the light-emitting device 100', these examples have the same advantages as the example illustrated in FIGS. 66A and 66B.

In structures illustrated in FIGS. 69A to 71B, excitation light enters a side surface of the photoluminescent layer 110. An example illustrated in FIGS. 69A and 69B includes the light-emitting device 100' illustrated in FIGS. 54A and 54B. An example illustrated in FIGS. 70A and 70B includes the light-emitting device 100' illustrated in FIGS. 55A and 55B. An example illustrated in FIGS. 71A and 71B includes the light-emitting device 100' illustrated in FIGS. 56A and 56B. In the examples illustrated in FIGS. 69A to 71B, the support 3540 has an opening (light guide path) 3540c extending from a side surface (not a main surface) of the photoluminescent layer 110 toward the excitation light source 3510. Excitation light travels through the opening 3540c and obliquely enters the side surface of the photoluminescent layer 110. Thus, excitation light directly enters the photoluminescent layer 110. These structures can provide a directional-light-emitting apparatus particularly miniaturized in the vertical direction (in the direction perpendicular to the photoluminescent layer).

FIGS. 72A to 75B illustrate a light-emitting apparatus that includes radiating fins 3560 in addition to the support 3540. In a structure illustrated in FIGS. 72A and 72B, the radiating fins 3560 are added to the light-emitting apparatus illustrated in FIGS. 55A and 55B. In a structure illustrated in FIGS. 73A and 73B, the radiating fins 3560 are added to the light-emitting apparatus illustrated in FIGS. 64A and 64B. In a structure illustrated in FIGS. 74A and 74B, the radiating fins 3560 are added to the light-emitting apparatus illustrated in FIGS. 67A and 67B. In a structure illustrated in FIGS. 75A and 75B, the radiating fins 3560 are added to the light-emitting apparatus illustrated in FIGS. 70A and 70B. Although the light-emitting device 100' in these examples is the light-emitting device illustrated in FIGS. 55A and 55B, the light-emitting device 100' may have any of the structures described above.

In the examples illustrated in FIGS. 72A to 75B, the radiating fins 3560 are attached at regular intervals to the periphery of the support 3540 surrounding the light-emitting device 100'. The support 3540 and the radiating fins 3560 are composed of a material having a higher thermal conductivity than the photoluminescent layer 110 (for example, aluminum, brass, or copper). The radiating fins 3560 and the support 3540 may be composed of the same material or different materials. Heat generated in the photoluminescent layer 110 is dissipated by the radiating fins 3560 via the support 3540. This can further improve the heat dissipation characteristics of the directional-light-emitting apparatus. The shape and position of the radiating fins 3560 are not limited to those illustrated in the figures. The radiating fins 3560 may have any structure that can efficiently dissipate heat.

Figure 76A:
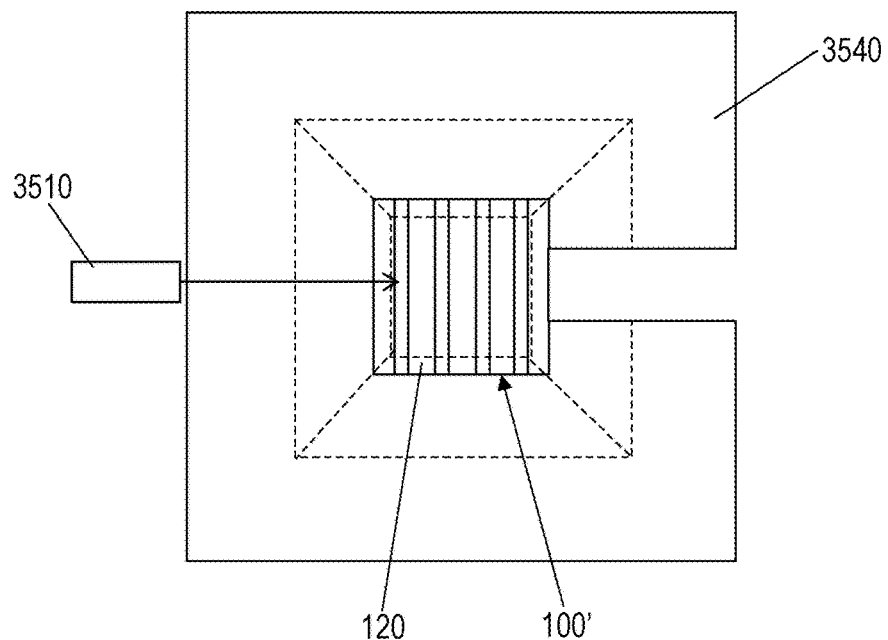
FIG. 76A is a schematic plan view of still another light-emitting apparatus including a light-emitting device and a support for supporting the light-emitting device.
Figure 76B:
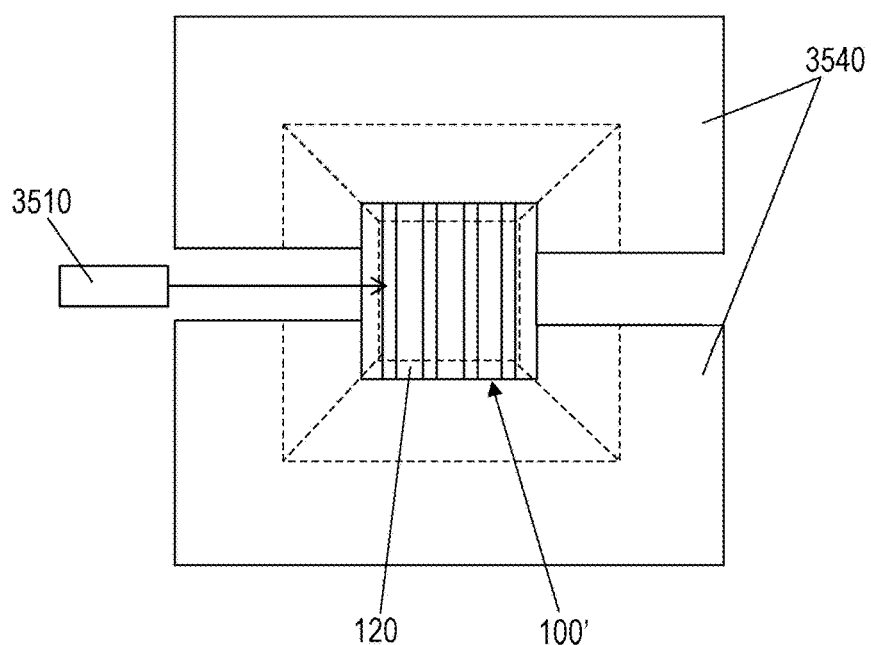
FIG. 76B is a schematic plan view of still another light-emitting apparatus including a light-emitting device and a support for supporting the light-emitting device.

Although the support 3540 is a single continuous structure and entirely surrounds the light-emitting device 100' in the examples described above, the support 3540 is not limited to such a structure. For example, as illustrated in FIG. 76A, the support 3540 is interrupted around the light-emitting device 100', and the photoluminescent layer 110 is partly exposed. As illustrated in FIG. 76B, the support 3540 is divided into two portions, which hold the light-emitting device 100' therebetween. Like these, the support 3540 is not necessarily a single continuous structure. The support 3540 may have any structure that fixes the light-emitting device 100' and is partly open so as not to interfere with the optical path of excitation light and so as to expose a portion of the light-emitting device 100' that excitation light enters. For example, the support 3540 may be in contact with only a portion of the photoluminescent layer 110.

13. Light Source Unit Including Reflector

Figure 77:
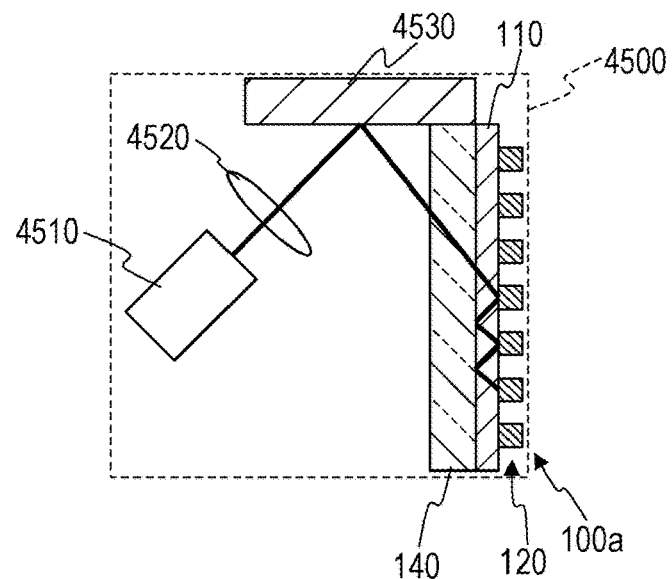
FIG. 77 is a schematic view of the structure of a light-emitting apparatus including a reflector.

FIG. 77 is a schematic view of the structure of a light source unit (light-emitting apparatus) including a reflector (reflective member). A light source unit 4500 illustrated in FIG. 77 includes an excitation light source 4510, a light-emitting device 100a, a reflector 4530, and a collimating lens 4520. The light-emitting device 100a has the structure of the light-emitting device 100a illustrated in FIG. 1C. A light-emitting device having one of the other structures described above may be used instead of the light-emitting device 100a. Although the light-emitting device 100a has a very large surface structure 120 in FIG. 77, the surface structure 120 can practically have many fine projections or recesses.

The reflector 4530 is a reflective member having a high reflectance in a wavelength range of excitation light. For example, the reflector 4530 may be a general mirror composed of an alloy of metals or a dichroic mirror formed of a dielectric multilayer film. The reflector 4530 is disposed on the optical path of excitation light emitted from the excitation light source 4510 and reflects and directs excitation light to the light-emitting device 100a. The position and orientation of the excitation light source 4510 and the reflector 4530 are adjusted such that excitation light is totally reflected in the photoluminescent layer 110.

The collimating lens 4520 is disposed between the excitation light source 4510 and the reflector 4530. When the excitation light source 4510 is a laser diode, excitation light is generally emitted as a wide light beam. The wide light beam is converted into parallel light by the collimating lens 4520 and enters the reflector 4530. Although the collimating lens 4520 in FIG. 77 is a single lens, the collimating lens 4520 may be a combination of lenses. The shape of the collimating lens 4520 may also be appropriately designed for the required performance.

The light-emitting device 100a includes the photoluminescent layer 110 for emitting light having a wavelength $\lambda_a$ in air upon receiving excitation light, the substrate 140 (typically a transparent substrate), and the surface structure 120 (typically a periodic structure) formed on the photoluminescent layer 110. The surface structure 120 may be one of the surface structures described above. The directional angle of light having a wavelength $\lambda_a$ emitted from the photoluminescent layer 110 is limited to, for example, less than 15 degrees by the surface structure 120. This provides a narrow-angle light distribution.

In the light source unit 4500 illustrated in FIG. 77, excitation light is reflected from the reflector 4530 and then enters the photoluminescent layer 110. The optical path of excitation light is bent before excitation light enters the photoluminescent layer 110. This can improve the degree of freedom in the positional relationship between the excitation light source 4510 and the light-emitting device 100a. Thus, the light source unit 4500 can be miniaturized.

Figure 78:
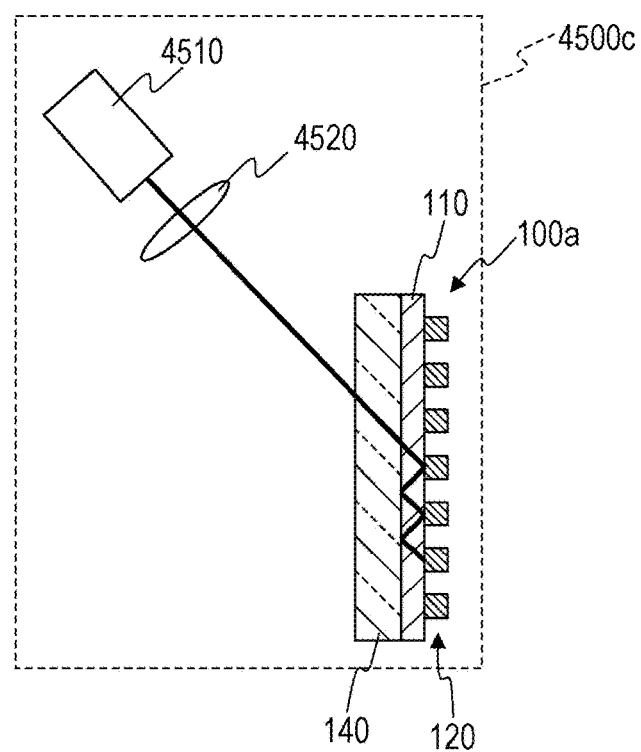
FIG. 78 is a schematic view of the structure of a light-emitting apparatus including no reflector.

FIG. 78 illustrates a light source unit without the reflector 4530, for comparison purposes. In the light source unit 4500c illustrated in FIG. 78, the excitation light source 4510 is disposed away from the light-emitting device 100a such that excitation light can obliquely enter the light-emitting device 100a. Consequently, the light source unit 4500c is larger than the light source unit 4500 illustrated in FIG. 77 in the direction parallel to the layers of the light-emitting device 100a.

Figure 79:
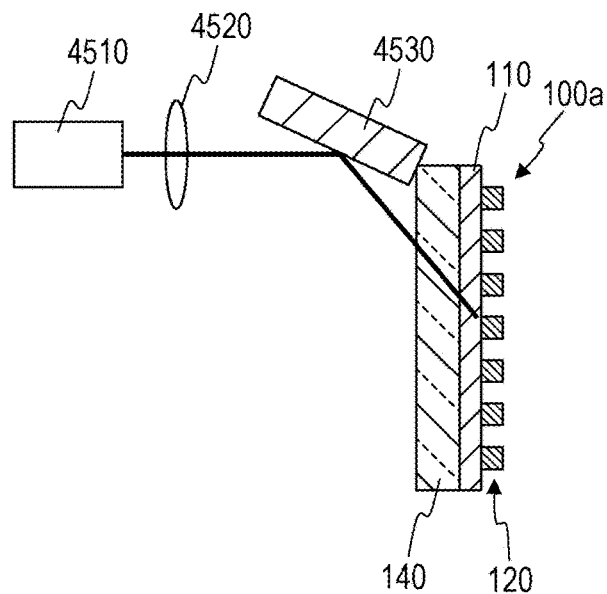
FIG. 79 is a schematic view of the structure of another light-emitting apparatus including a reflector.

FIG. 79 illustrates another structure. In this example, the position and orientation of the excitation light source 4510 and the orientation of the reflector 4530 are different from those illustrated in FIG. 77. The excitation light source 4510 emits excitation light in a direction almost perpendicular to a main surface of the photoluminescent layer 110. The excitation light is reflected from the reflector 4530 and obliquely enters the photoluminescent layer 110. This structure can also miniaturize the apparatus in the same manner as in FIG. 77.

Figure 80:
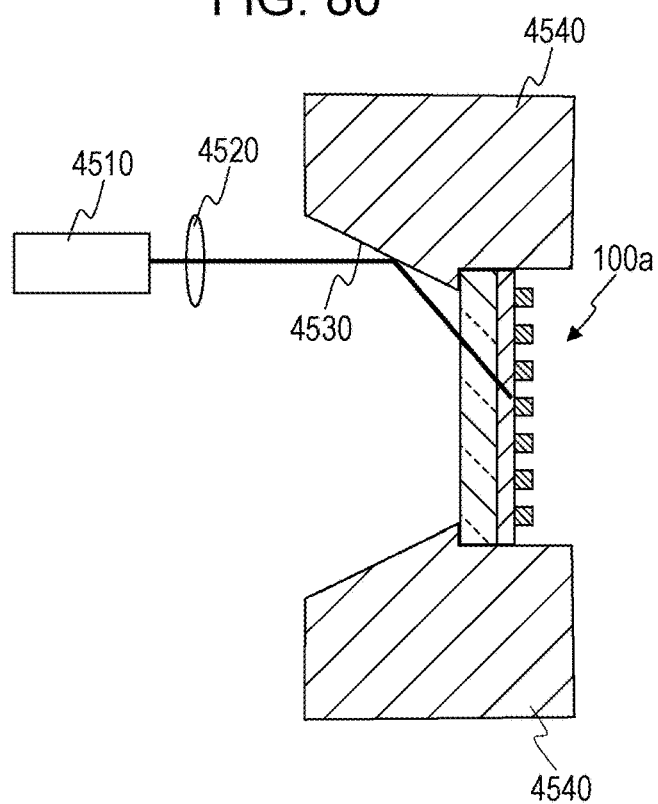
FIG. 80 is a schematic view of a light-emitting apparatus including a support.

FIG. 80 illustrates still another structure. In this example, the light-emitting apparatus includes a member (referred to as a support) 4540 for supporting the light-emitting device 100a. The support 4540 surrounds and supports the light-emitting device 100a. Although the support 4540 in FIG. 80 appears to be separated into two portions, the support 4540 is practically a single continuous structure. Advantageously, the support 4540 protects the light-emitting device 100a and makes it easy to hold the light-emitting apparatus.

A portion of the support 4540 is a reflector 4530 formed of a material that reflects excitation light. The reflector 4530 reflects and directs excitation light to the photoluminescent layer 110. Thus, this structure has the same function as the structure illustrated in FIG. 79. In this example, the support 4540 and the reflector 4530 are integrated and thereby improve impact resistance. If the support 4540 is composed of a material having high thermal conductivity, the support 4540 can function as a heat sink for efficiently dissipating heat generated in the light-emitting device 100a.

Figure 81:
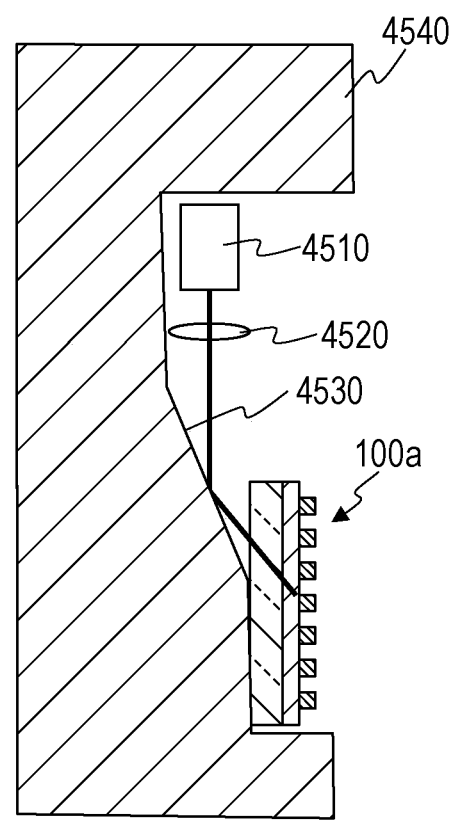
FIG. 81 is a schematic view of another light-emitting apparatus including a support.

FIG. 81 illustrates a modified example of FIG. 80. In a light-emitting apparatus according to this example, the support 4540 has a structure different from the structure illustrated in FIG. 80. The support 4540 houses and protects the excitation light source 4510 and the collimating lens 4520 as well as the light-emitting device 100a. A slope near a portion that holds the light-emitting device 100a functions as the reflector 4530. The excitation light source 4510, the collimating lens 4520, the reflector 4530, and the light-emitting device 100a are supported while having a predetermined positional relationship. This structure can prevent the optical path of excitation light from being changed by impacts. Thus, the structure can further improve impact resistance.

Figure 82:
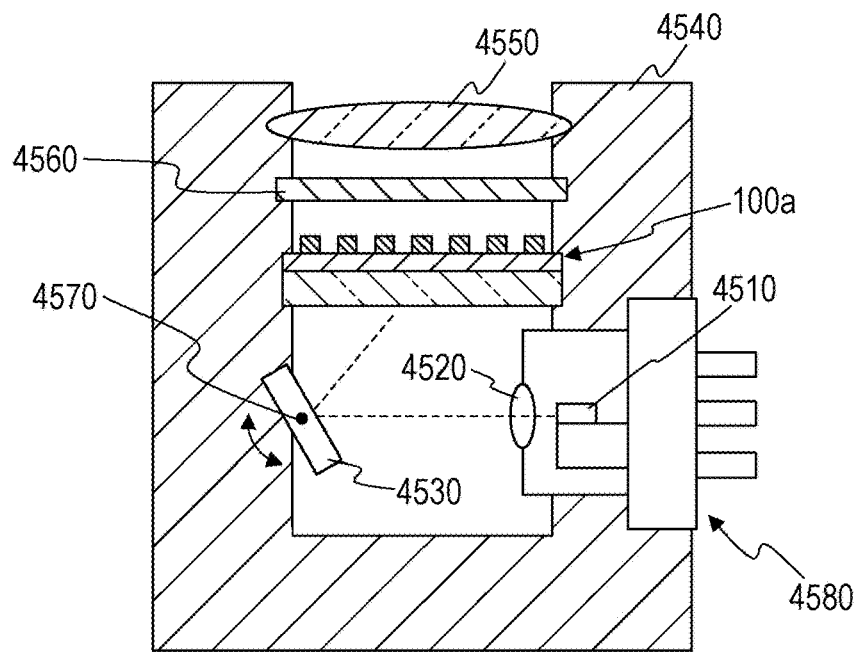
FIG. 82 is a schematic view of still another light-emitting apparatus including a support.

FIG. 82 illustrates another modified example. A light-emitting apparatus according to this example includes the light-emitting device 100a, a laser module 4580, a safety filter 4560, a lens 4550, a reflector 4530, and a support 4540 for supporting these components. The laser module 4580 includes an excitation light source 4510 including a laser diode and a collimating lens 4520. Excitation light emitted from the excitation light source 4510 passes through the collimating lens 4520, is reflected from the reflector 4530, and enters the light-emitting device 100a at an optimum angle.

When a laser diode is used as the excitation light source 4510, part of excitation light not converted by the light-emitting device 100a passes through the light-emitting device 100a. The laser beam passing through the light-emitting device 100a is coherent and may cause damage to the human body, particularly to the eye. In order to prevent the leakage of the laser beam, the safety filter 4560 removes light having a wavelength of excitation light emitted from the excitation light source 4510. The lens 4550 converges light passing through the safety filter 4560, for example, into an optical fiber.

The reflector 4530 includes a rotating shaft 4570 that functions as an angle control mechanism. The reflector 4530 can be manually rotated about the rotating shaft 4570. In this structure, the incident angle of excitation light on the light-emitting device 100a can be freely adjusted. For example, the incident angle of excitation light can be manually adjusted before product delivery. The angle control mechanism may also be an automatic angle control mechanism including a combination of a motor and a control circuit for driving the motor. Instead of the reflector 4530 having an angle control mechanism, the excitation light source 4510 may have an angle control mechanism. Such an angle control mechanism may be a mechanism for rotating the excitation light source 4510 about a rotating shaft.

In the example illustrated in FIG. 82, the support 4540 holds the lens 4550, the safety filter 4560, the light-emitting device 100a, the reflector 4530, and the laser module 4580. This prevents the positional relationship between these components from being changed by impacts and provides a light-emitting apparatus with operational stability.

The reflector 4530 can bend the optical path of excitation light emitted from the excitation light source 4510 and thereby allows excitation light to enter the photoluminescent layer 110. This can improve the degree of freedom in the positional relationship between the excitation light source 4510 and the light-emitting device 100a and miniaturize the apparatus.

Figure 83:
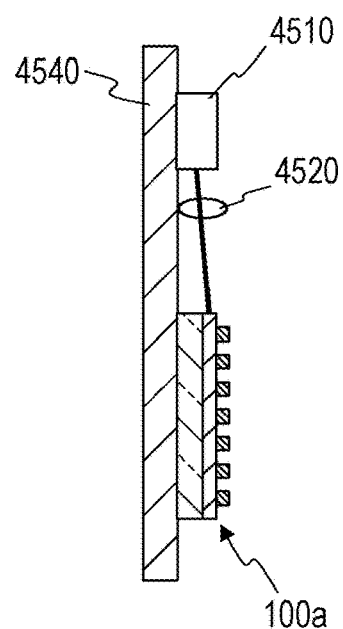
FIG. 83 is a schematic view of a light-emitting apparatus including an excitation light source and a light-emitting device supported by a support.

FIG. 83 illustrates another modified example of a light-emitting apparatus including the support 4540. The light-emitting apparatus includes the excitation light source 4510, the collimating lens 4520, the light-emitting device 100a, and a support 4540 for supporting these components. This example includes no reflector. Excitation light emitted from the excitation light source 4510 passes through the collimating lens 4520 and enters the photoluminescent layer of the light-emitting device 100a at a desired angle. The excitation light source 4510, the collimating lens 4520, and the light-emitting device 100a are integrated with the support 4540 and thereby improve impact resistance.

The miniaturization effects of a light source unit including the reflector 4530 will be described in the following specific example.

Figure 84A:
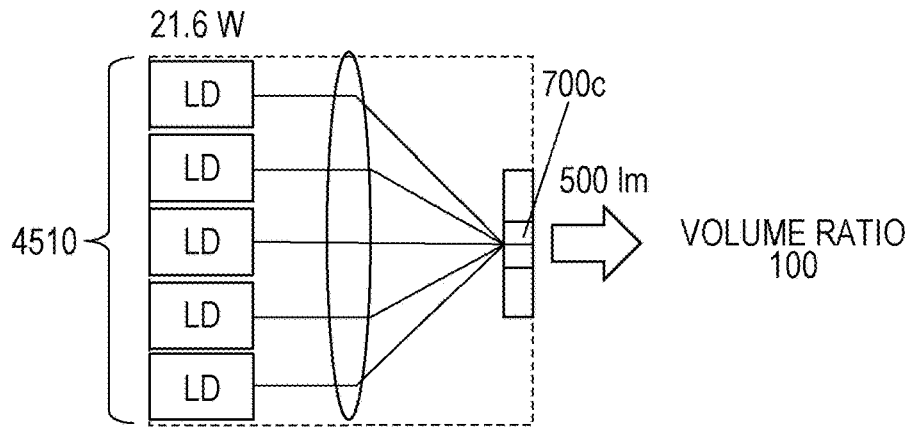
FIG. 84A is a schematic view indicating the size of a lighting apparatus including a known light-emitting device.
Figure 84B:
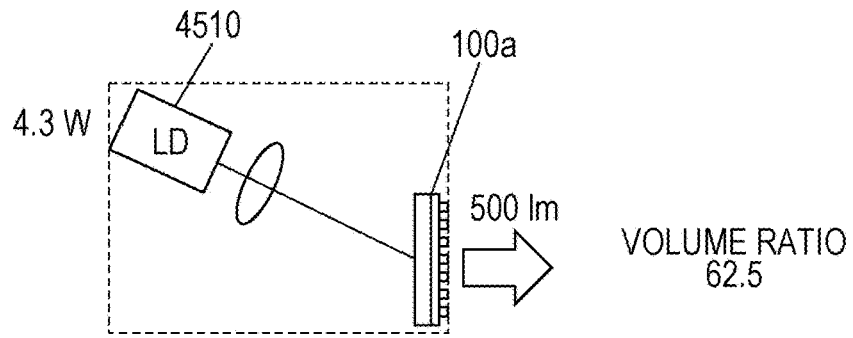
FIG. 84B is a schematic view indicating the size of a lighting apparatus including a light-emitting device according to an embodiment of the present disclosure.
Figure 84C:
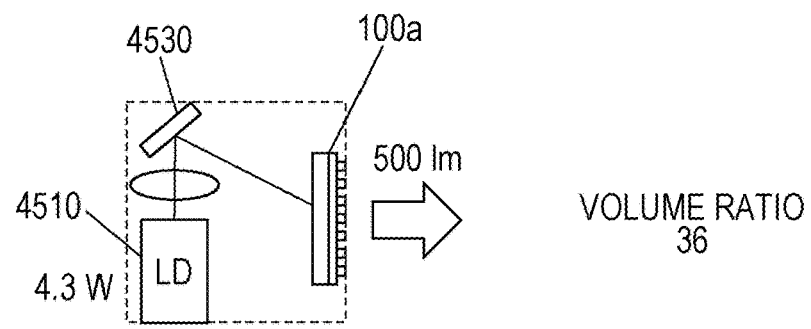
FIG. 84C is a schematic view indicating the size of a lighting apparatus including a light-emitting device according to an embodiment of the present disclosure and a reflector.

FIGS. 84A to 84C illustrate the effects of the reflector 4530. FIG. 84A illustrates a light source unit that includes a known light-emitting device 700c not having high directionality. FIG. 84B illustrates a light source unit that includes a light-emitting device according to an embodiment of the present disclosure and no reflector. FIG. 84C illustrates a light source unit that includes a light-emitting device according to an embodiment of the present disclosure and a reflector.

In these structures, a laser diode (LD) is used as the excitation light source 4510. Each of the light source units can be used as a component of lighting apparatuses. For example, a lighting apparatus suitable for an 8-mat (tatami) (approximately 13 m$^2$) room should emit a light beam of approximately 5000 lumen (lm). If each LD has a light output of approximately 4.3 W, and a light beam emitted from each light source unit in the front direction is 500 lm, then approximately 10 light-emitting modules need to be integrated. Thus, it is necessary to miniaturize each light-emitting module.

The light source unit illustrated in FIG. 84A includes a known light-emitting device 700c having low directionality. Thus, many excitation light sources 4510 are needed to emit a light beam of 500 lm in the front direction. This increases the size of each light source unit and the size of a lighting apparatus in which many light source units are integrated.

The light source unit illustrated in FIG. 84B includes the light-emitting device 100a having high directionality according to an embodiment of the present disclosure. Thus, for example, one excitation light source 4510 can emit a light beam of 500 lm in the front direction. This can reduce the size of each light source unit and the size of a lighting apparatus. If the light source unit illustrated in FIG. 84A has a volume of 100, the volume of the light source unit illustrated in FIG. 84B can be decreased to 62.5, for example.

In the light source unit illustrated in FIG. 84C, a light beam of excitation light is bent by the reflector 4530 toward the light-emitting device 100a. This can further reduce the size of each light source unit. Consequently, a lighting apparatus can have a much smaller size. If the light source unit illustrated in FIG. 84A has a volume of 100, the volume of the light source unit illustrated in FIG. 84C can be decreased to 36, for example.

14. Light-Emitting Apparatus Including Additional Light Source

The following embodiment relates to a light-emitting apparatus for emitting light having a desired color (spectrum) by synthesizing light beams emitted from light sources. The light-emitting apparatus includes one of the light-emitting devices according to the embodiments described above (hereinafter also referred to as a "directional-light-emitting device" or "directional light source") and another light source (hereinafter also referred to as an "additional light source"). The additional light source emits light having a different spectrum from light emitted from the directional light source. Light emitted from the directional light source and light emitted from the additional light source are synthesized inside or outside the directional light source. The synthesized light may enter an optical fiber cable (hereinafter referred to simply as an "optical fiber"). Such a light-emitting apparatus may be used for "optical fiber illumination".

The term "synthesis" of light, as used herein, refers to a mixed state of light beams having different spectra. Each light beam after synthesis does not necessarily have the same propagation direction and spread angle. First light emitted from the directional light source and second light emitted from the additional light source are synthesized inside or outside the directional light source. In the case that the second light passes through the directional light source, the first light and the second light are synthesized in the directional light source. The first light and the second light may be synthesized by an optical system or light guide outside the directional light source.

The spectrum of light emitted from the directional light source may lack a wavelength component of the spectrum of light required for actual use. The additional light source can compensate for the lacked wavelength component. The spectrum and intensity of light emitted from each light source can be changed to adjust the color and brightness of illumination light.

Figure 85:
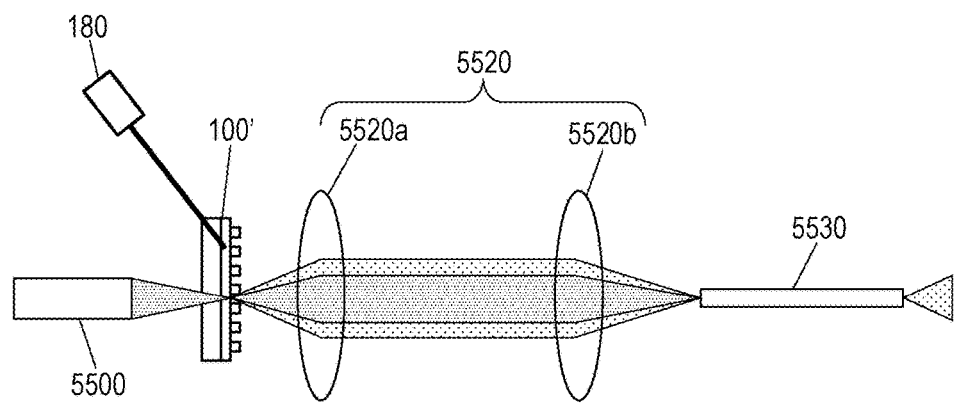
FIG. 85 is a schematic view of a light-emitting apparatus for synthesizing light beams emitted from light sources.

FIG. 85 schematically illustrates such a light-emitting apparatus. This light-emitting apparatus includes the light-emitting device 100', an excitation light source 180, an additional light source 5500, an optical system 5520, and an optical fiber 5530. The optical system 5520 includes a collimating lens 5520a and a converging lens 5520b. Although the light-emitting device 100' in the figure has the structure of the light-emitting device 100a illustrated in FIG. 1C, the light-emitting device 100' may have another structure, such as the structure illustrated in FIG. 1A.

The additional light source 5500 may be a light source including a laser diode or another directional-light-emitting device. The additional light source 5500 emits light having a different spectrum from light emitted from the light-emitting device 100'. Light emitted from the additional light source 5500 contains a spectrum component that is insufficient in light emitted from the light-emitting device 100'. For example, when white light is desired, and the light-emitting device 100' emits light in a yellow (red and green) wavelength range, the additional light source 5500 can be configured to emit light in a blue wavelength range. Light emitted from the additional light source 5500 is negligibly absorbed or scattered, except when the light enters the photoluminescent layer at a particular angle at which the light is resonantly-coupled to a guided mode. Thus, when light emitted from the additional light source 5500 almost perpendicularly enters the photoluminescent layer in the light-emitting device 100' as illustrated in FIG. 85, most of the light passes through the light-emitting device 100'.

The excitation light source 180 is separated from the additional light source 5500 and excites a photoluminescent material in the light-emitting device 100', thereby inducing light emission. For example, excitation light emitted from the excitation light source 180 enters the photoluminescent layer in the light-emitting device 100' at an angle with respect to the direction normal to the photoluminescent layer.

First light produced by excitation light entering the light-emitting device 100' and second light emitted from the additional light source 5500 and entering the light-emitting device 100' are synthesized in the light-emitting device 100'. More specifically, the second light converges to a point in the photoluminescent layer in the light-emitting device 100' and is synthesized with first light at the moment when the first light is produced at the point. Synthesized first and second light in a mixed state propagates outside the light-emitting device 100'. The synthesized light is converted into parallel light by the collimating lens 5520a and converges through the converging lens 5520b. The converging light enters the optical fiber 5530. In the optical system 5520 including the lenses 5520a and 5520b, the first light and second light are synthesized (gathered) and enter the optical fiber 5530. The light in the optical fiber 5530 is emitted from the other end. Thus, light having a desired color can be emitted at a position distant from the light source unit including the light-emitting device 100' and the additional light source 5500. Although the optical fiber 5530 in FIG. 85 is relatively short, the optical fiber 5530 may be several to hundreds of meters in some applications.

Figure 86:
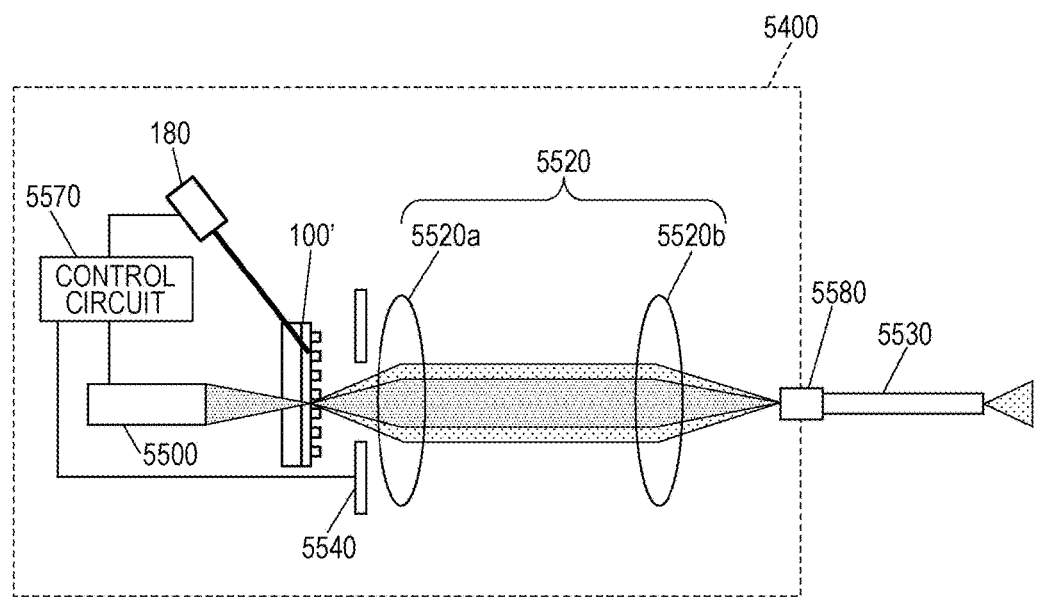
FIG. 86 is a detailed view of a light-emitting apparatus for synthesizing light beams emitted from light sources.

FIG. 86 is a detailed view of a light-emitting apparatus. In addition to the light-emitting device 100', the additional light source 5500, the excitation light source 180, and the optical system 5520, a light-emitting apparatus 5400 further includes a control circuit 5570 for controlling the excitation light source 180 and the additional light source 5500 and a connector 5580 for connecting the optical fiber 5530. In this example, the optical fiber 5530 is disposed outside the light-emitting apparatus 5400.

The control circuit 5570 may be an integrated circuit including a processor, such as a microcontroller, coupled to the excitation light source 180 and the additional light source 5500. For example, the control circuit 5570 instructs the excitation light source 180 and the additional light source 5500 to change the intensity of output light according to the input from a user. This adjusts the intensity ratio of first light emitted from the light-emitting device 100' to second light emitted from the additional light source 5500. Consequently, the intensity and color of synthesized light can be changed. Alternatively, the intensity ratio of the first light to the second light may be adjusted by changing the size of an aperture 5540 disposed between the optical system 5520 and the light-emitting device 100'.

The excitation light source 180 may be a laser beam source, and excitation light emitted from the excitation light source 180 enters the light-emitting device 100' at an angle at which the excitation light is totally reflected in the photoluminescent layer in the light-emitting device 100'. Thus, light emission can occur efficiently in the light-emitting device 100'.

The connector 5580 is a terminal for connecting the optical fiber 5530 and is disposed on a housing of the light-emitting apparatus 5400. The optical fiber 5530 can be inserted into and removed from the connector 5580. Thus, in the case that the optical fiber 5530 is a long cable laid in a building, when the light-emitting apparatus 5400 has broken down, or when the light-emitting apparatus 5400 is to be replaced with a light-emitting apparatus having different light-emitting properties, the light-emitting apparatus 5400 can be easily replaced.

As described above, the light-emitting apparatus illustrated in FIGS. 85 and 86 includes the directional light source as a first light source and the additional light source as a second light source. The first light source includes a photoluminescent layer for emitting first light containing light having a wavelength $\lambda_a$ in air, a light-transmissive layer located on or near the photoluminescent layer, and a surface structure formed on a surface of at least one of the photoluminescent layer and the light-transmissive layer. The surface structure has projections or recesses or both and limits the directional angle of light having a wavelength $\lambda_a$ in air emitted from the photoluminescent layer. For example, the center-to-center distance $D_{int}$ between two adjacent projections or recesses in the surface structure and the refractive index $n_{wav-a}$ of the photoluminescent layer for light having a wavelength $\lambda_a$ in air satisfy $\lambda_a/n_{wav-a} < D_{int} < \lambda_a$. Alternatively, the surface structure has at least one periodic structure, and the refractive index $n_{wav-a}$ of the photoluminescent layer for light having a wavelength $\lambda_a$ in air and the period $p_a$ of at least one periodic structure satisfy $\lambda_a/n_{wav-a} < p_a < \lambda_a$. Consequently, light having a wavelength $\lambda_a$ in air emitted from the first light source has the maximum intensity in a first direction predetermined by the projections or recesses or both. The second light source emits second light containing light having a wavelength $\lambda_b$ (different from $\lambda_a$) in air. The first light emitted from the first light source and the second light emitted from the second light source are synthesized. The synthesized light may enter one end of an optical fiber and exits from the other end.

Such a structure can compensate for a deficiency in the spectrum of the first light source, which is a directional light source, with the second light source, thereby producing light having a desired spectrum. The spectrum of the final light can be adjusted by changing the intensity ratio of the first light source to the second light source. Thus, the color and brightness of the resulting optical fiber illumination can be changed. The optical fiber may be replaced with a light diffuser plate disposed at a position at which the first light and the second light are synthesized. Light diffused by the light diffuser plate can be utilized as illumination. Likewise, in the embodiments described below, the optical fiber 5530 may be replaced with a light diffuser plate.

Figure 87:
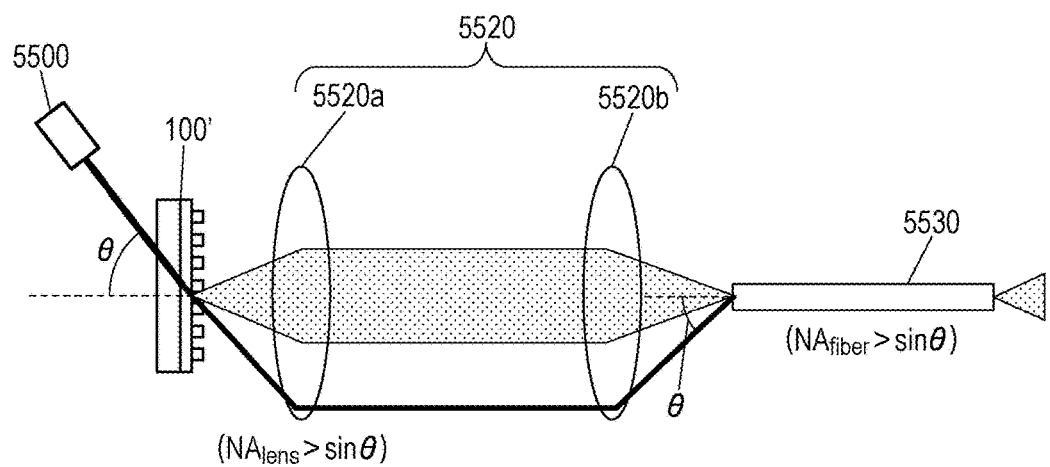
FIG. 87 is a schematic view of a light-emitting apparatus in which an additional light source also emits excitation light.

FIG. 87 is a schematic view of a light-emitting apparatus in which the additional light source 5500 also emits excitation light. In this example, second light emitted from the additional light source 5500 contains a light component that functions as excitation light. Part of the second light passes through the light-emitting device 100' and is synthesized with first light emitted from the light-emitting device 100' in the optical system 5520. The additional light source 5500 is disposed such that excitation light enters the light-emitting device 100' at a particular incident angle θ.

When a photoluminescent material is resonantly excited, excitation light incident at a particular angle θ can efficiently excite the photoluminescent material. In general, since the wavelength of excitation light is shorter than the wavelength of light having a narrow-angle light distribution emitted from the light-emitting device 100', the light having a narrow-angle light distribution is emitted at an angle smaller than the angle θ. Thus, the lens 5520a used in this embodiment has a numerical aperture ($NA_{lens}$) of sin θ or more in order to introduce light at an angle in the range of 0 (front) to θ degrees. The lens 5520a allows both light having a narrow-angle light distribution and excitation light to be introduced into the optical system 5520.

When the lens 5520b has the same structure as the lens 5520a, most (ideally all) of light in the optical system 5520 can be transmitted to an optical fiber 5530 having a numerical aperture ($NA_{fiber}$) of sin θ or more. When the lens 5520b has a different structure from the lens 5520a, the optical fiber 5530 should have a $NA_{fiber}$ of more than sin θ, wherein θ' (different from θ) denotes the incident angle of a light beam converged into the optical fiber 5530 by the lens 5520b.

In the embodiment illustrated in FIG. 87, the additional light source 5500 functions as an excitation light source, and therefore the number of light sources can be decreased. This can decrease the cost and size of the apparatus.

Figure 88:
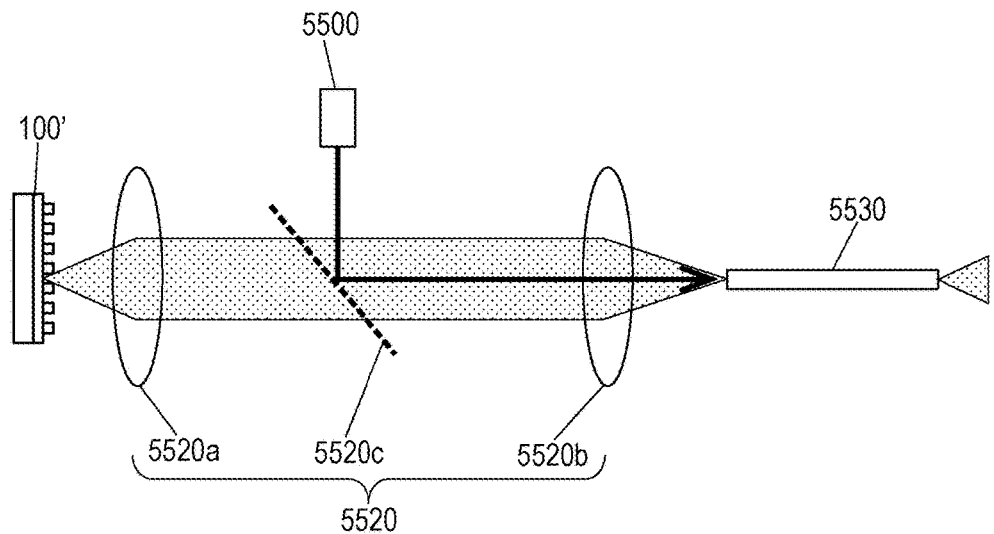
FIG. 88 is a schematic view of another light-emitting apparatus for synthesizing light beams emitted from light sources.

FIG. 88 illustrates still another structure of the light-emitting apparatus. This light-emitting apparatus is different from the example described above in the structure of the optical system 5520 and the position of the additional light source 5500. The optical system 5520 in this example includes a dichroic mirror 5520*c* between the lens 5520*a* and the lens 5520*b*. The additional light source 5500 is disposed in front (on the right side in the figure) of the light-emitting device 100' rather than at the back (on the left side in the figure) of the light-emitting device 100'. Second light emitted from the additional light source 5500 enters the dichroic mirror 5520*c*. The excitation light source for emitting excitation light to the light-emitting device 100' is omitted in FIG. 88. Likewise, the excitation light source may be omitted in the subsequent figures.

The dichroic mirror 5520*c* is designed to give high transmittance of light in the wavelength range of first light emitted from the light-emitting device 100' and have high reflectance in the wavelength range of second light emitted from the additional light source 5500. Second light emitted from the additional light source 5500 crosses first light emitted from the light-emitting device 100' (at right angles in FIG. 88). The first light and the second light crosses at the dichroic mirror 5520*c*. The angle of the dichroic mirror 5520*c* is adjusted such that transmitted first light and reflected second light propagate in the same direction. The first light and the second light are synthesized by the dichroic mirror 5520*c*, converged by the lens 5520*b*, and enter the optical fiber 5530. As in the other embodiments described above, this structure can produce light having a desired spectrum.

Figure 89:
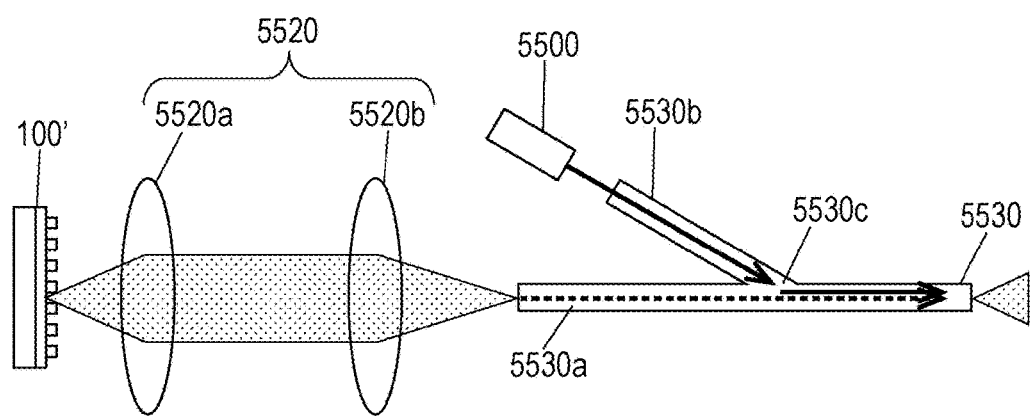
FIG. 89 is a schematic view of still another light-emitting apparatus for synthesizing light beams emitted from light sources.

FIG. 89 illustrates still another structure of the light-emitting apparatus. The light-emitting apparatus is different from the other embodiments described above in that first light and second light are synthesized in the optical fiber 5530 rather than by the optical system 5520. The optical fiber 5530 in the light-emitting apparatus branches off in two directions. One branch 5530*a* is hereinafter referred to as a first optical fiber, and the other branch 5530*b* is hereinafter referred to as a second optical fiber. The first optical fiber 5530*a* and the second optical fiber 5530*b* are joined together at a junction 5530*c*. First light emitted from the light-emitting device 100' enters the first optical fiber 5530*a* through the optical system 5520. Second light emitted from the additional light source 5500 enters the second optical fiber 5530*b*. The first light and the second light are synthesized at the junction 5530*c* of the optical fiber.

Also in such a structure, desired light can be emitted from the optical fiber 5530. An optical branching and coupling unit may be disposed at the junction 5530*c* of the optical fiber 5530 illustrated in FIG. 89. A plurality of optical fibers can be connected to the unit to form a similar structure.

Figure 90:
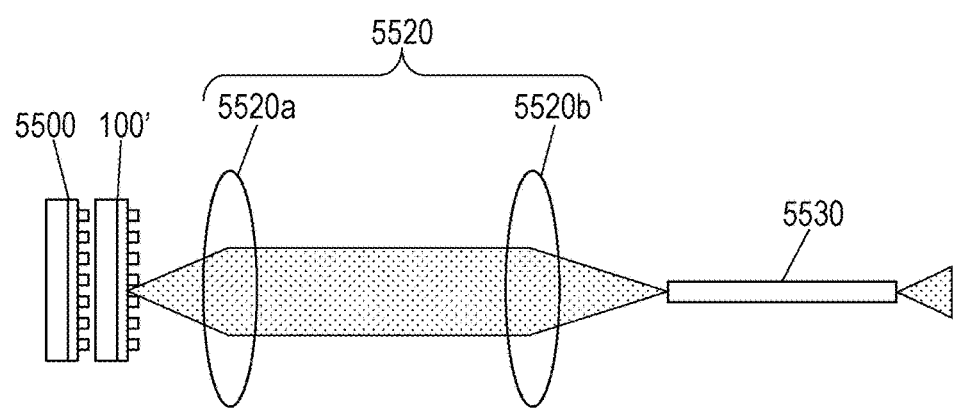

FIG. 90 illustrates still another modified example of the light-emitting apparatus. In this example, the additional light source 5500 is a directional-light-emitting device similar to the light-emitting device 100'. Like the light-emitting device 100', the additional light source 5500 includes a photoluminescent layer, a light-transmissive layer, and a surface structure. The surface structure of the light-emitting device 100' limits the directional angle of light having a wavelength $\lambda_a$, whereas the additional light source 5500 limits the directional angle of light having a wavelength $\lambda_b$ (different from $\lambda_a$). The light-emitting device 100' and the additional light source 5500 may be a single multilayer structure. Also in this example, first light emitted from the light-emitting device 100' and second light emitted from the additional light source 5500 are synthesized in the optical system 5520 and enter the optical fiber 5530.

Figure 91:
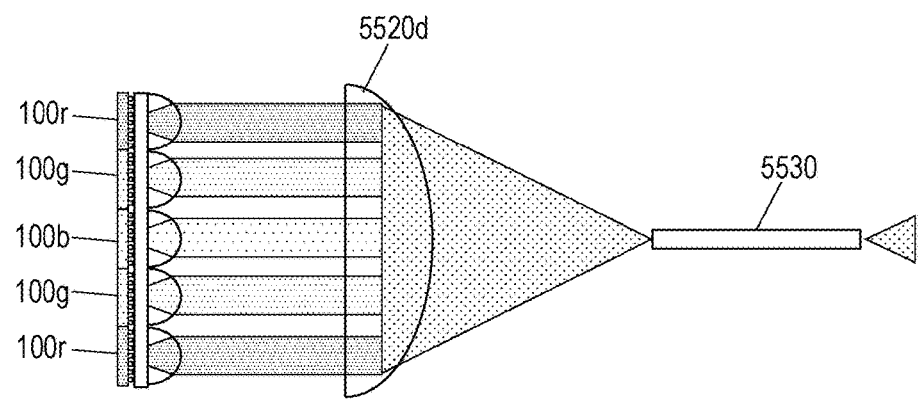

FIG. 91 illustrates a portion of a light-emitting apparatus including tiled directional-light-emitting devices. The light-emitting apparatus includes one- or two-dimensionally arranged light-emitting devices (first light sources) 100*r* for emitting light in a red wavelength range, light-emitting devices (second light sources) 100*g* for emitting light in a green wavelength range, and light-emitting devices (third light sources) 100*b* for emitting light in a blue wavelength range. Although FIG. 91 illustrates five light-emitting devices, practically, more light-emitting devices may be arranged. Light beams emitted from the light-emitting devices 100*r*, 100*g*, and 100*b* are converged by the lens 5520*d* into the optical fiber 5530. Thus, white light can be emitted from the optical fiber 5530. Although three light sources of red, green, and blue are used in this example, light emitted from first, second, and third light sources may have any color (spectrum). Like this example, three types of directional light sources can be combined to adjust the color of output light having greater flexibility. Although three types of light sources are used in this example, four or more light sources may be combined. Second and third light sources are not limited to directional-light-emitting devices and may be another light source, such as a laser beam source.

Figure 92:
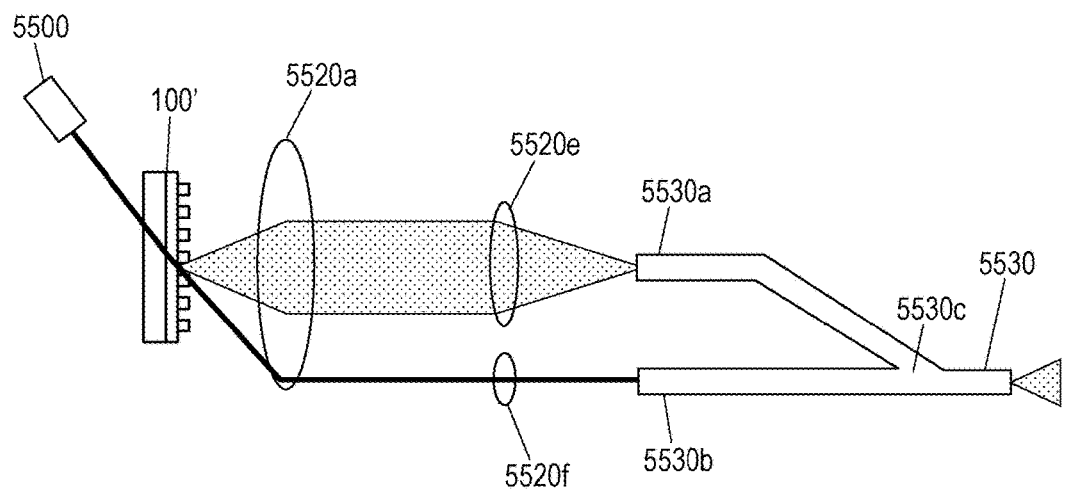

FIG. 92 illustrates still another example of the light-emitting apparatus. The additional light source 5500 in this light-emitting apparatus also functions as an excitation light source. First light and second light are synthesized in the optical fiber 5530. First light emitted from the light-emitting device 100' is converged by the lens 5520*a* and a lens 5520*e* into a first optical fiber 5530*a* of a branched optical fiber 5530. Second light emitted from the additional light source 5500 passes through the light-emitting device 100' and is converged by the lens 5520*a* and a lens 5520*f* into a second optical fiber 5530*b* of the branched optical fiber 5530. Thus, the first light and the second light are synthesized at the junction 5530*c* and are emitted from the optical fiber 5530.

Figure 93:
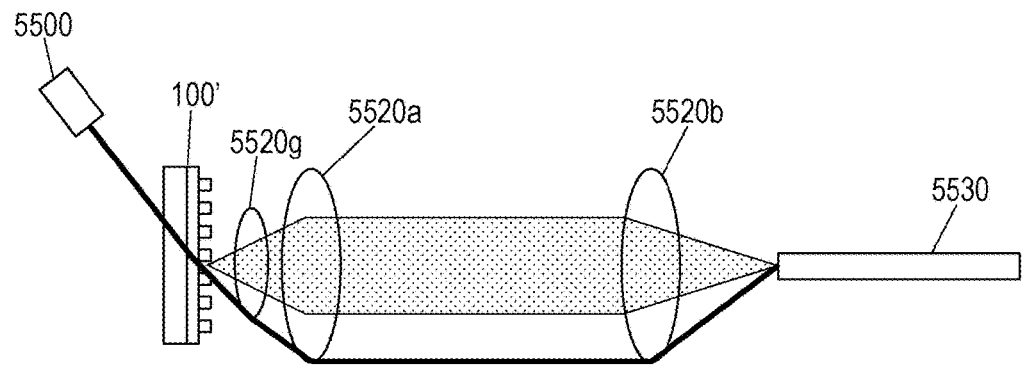
Figure 94:
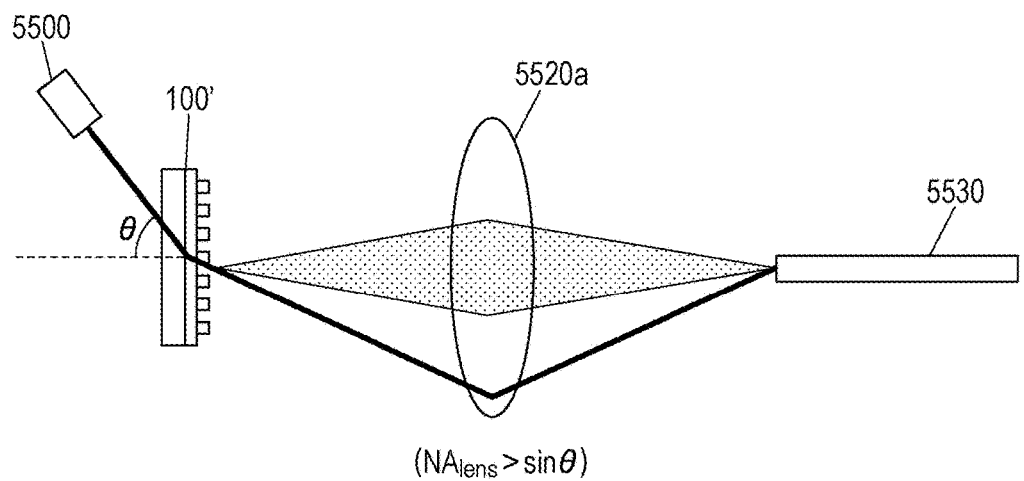

FIG. 93 illustrates still another example of the light-emitting apparatus. This example is similar to but is different in the number of lenses from the structure illustrated in FIG. 87. Another lens 5520*g* is disposed between the lens 5520*a* and the light-emitting device 100'. The lens 5520*g* is close to the light-emitting device 100'. Thus, even when second light emitted from the additional light source 5500 has a large incident angle, the second light passing through the light-emitting device 100' can enter the lens 5520*g*. The lens 5520*a* compensates for an insufficient bending of the optical path of the second light bent by the lens 5520*g*. Consequently, the optical axis of the first light emitted from the light-emitting device 100' becomes almost parallel to the optical axis of the second light emitted from the additional light source 5500. The first light and the second light are converged by the lens 5520*b* into the optical fiber 5530. Although three lenses are used in this example, the number of lenses is not particularly limited. The shape, size, and position of each lens are also not limited to those in the figure and may be appropriately designed. For example, as illustrated in FIG. 94, the number of lenses in the optical system may be one (the lens 5520*a*). In this example, because of a small number of lenses, the light-emitting apparatus can be produced at low cost.

Figure 95:
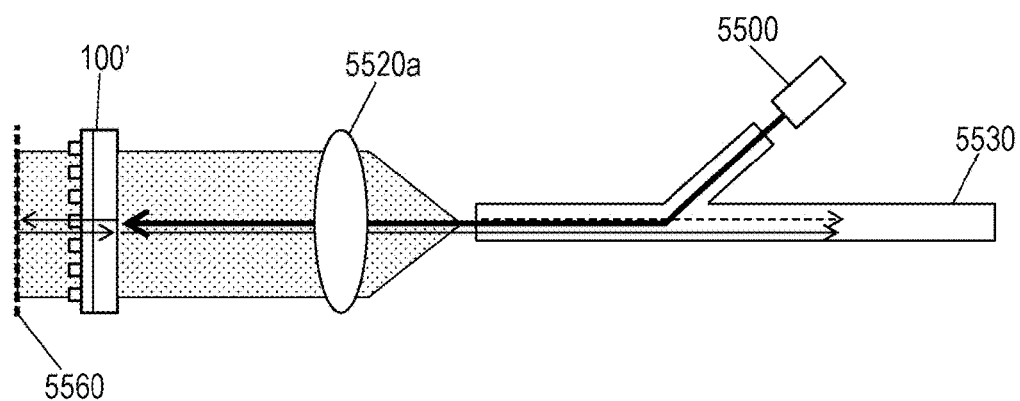

FIG. 95 illustrates still another structure of the light-emitting apparatus. The light-emitting apparatus includes the light-emitting device 100', the lens 5520*a* disposed on one side of the light-emitting device 100', a mirror (reflector) 5560 disposed on the other side, a branched optical fiber 5530, and the additional light source 5500. Excitation light emitted from the additional light source 5500 enters one branch of the optical fiber 5530. The excitation light passes through the lens 5520a and enters the light-emitting device 100'. Part of the excitation light incident on the light-emitting device 100' is absorbed into the photoluminescent layer and is converted into first light. The other part of the excitation light passes through the light-emitting device 100', is reflected from the mirror 5560, and again passes through the light-emitting device 100'. The first light emitted from the light-emitting device 100' and the excitation light (second light) passing through the light-emitting device 100' are converged by the lens 5520a into the optical fiber 5530. The first light and the second light are synthesized and emitted from the optical fiber 5530. Excitation light reflected from the mirror 5560 can be used in this manner.

Thus, a light-emitting apparatus including additional light source can be variously modified. In any of the modified examples, first light emitted from the first light source, which is a directional light source, and second light emitted from the second light source can be synthesized to produce light having a desired spectrum.

Figure 96:
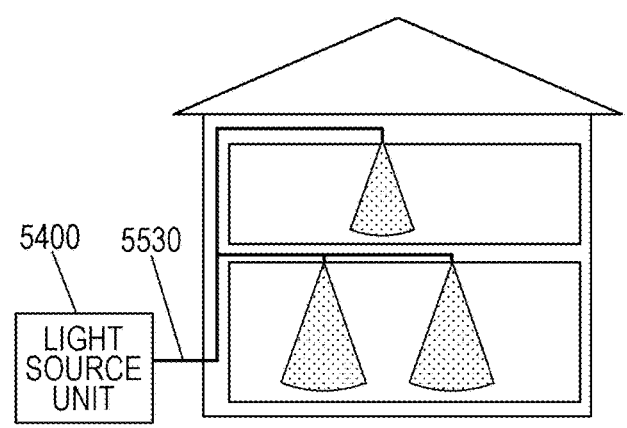

FIG. 96 illustrates a household fiber lighting system as an application example. The fiber lighting system includes a light-emitting apparatus (hereinafter also referred to as a light source unit) 5400 and optical fibers 5530. The light source unit 5400 is placed at a predetermined location around the house. Each of the optical fibers 5530 is laid from the light source unit 5400 to a place in a room where a lighting fixture is to be installed. Although the optical fibers 5530 appear as a single optical fiber in FIG. 96, they are actually a plurality of optical fibers. The structure of the light source unit 5400 is not limited to the structure illustrated in FIG. 86. The light source unit 5400 illustrated in FIG. 96 has the same structure as any of the light-emitting apparatuses illustrated in FIGS. 85 to 95. Light beams emitted from light sources including at least one directional light source are synthesized and enter the optical fibers 5530. Thus, desired light can be transmitted to a place where a lighting fixture is to be installed and can be utilized as illumination light. The color and brightness of illumination light can be adjusted to the situation by changing the outputs of the light sources. Such a fiber lighting system can be utilized not only in houses but also in various facilities, such as office buildings, underground cities, and stadiums.

The function of easily adjusting the spectrum can be applied to beautifying light color illumination and color-enhancing light color illumination techniques, for example. These techniques beautify an object to be illuminated by controlling the spectrum of the light source (the intensity distribution as a function of light wavelength). For example, the skin can be beautified by reducing light having a wavelength in the range of approximately 570 to 580 nm responsible for darkening of the skin. Such beautifying light color illumination can be achieved by synthesizing light in a blue to green wavelength range of 570 nm or less and light in a red wavelength range of 580 nm or more using a light-emitting apparatus according to the present disclosure.

For example, foods having a red color can look fresher when a component with a wavelength of approximately 580 nm is decreased, and a red component on the long wavelength side is strengthened. This can make lean meat, red flesh of fish, and red fruit and vegetables look fresher. Such color-enhancing light color illumination can be achieved by synthesizing light in a blue to green wavelength range of 570 nm or less and light in a red wavelength range of 590 nm or more with a light-emitting apparatus according to the present disclosure. Such wavelength control can also be utilized to make scenery, such as red flowers and autumn leaves, look more vivid.

A light-emitting apparatus that can adjust the spectrum of output light as described above can be utilized to determine the degree of freshness of foods. In many foods, the spectrum of reflected light changes with a decrease in the degree of freshness. For example, a decrease in the degree of freshness of beef results in a decrease in the amount of component in a wavelength range of approximately 600 to 700 nm. Thus, the degree of freshness of a food can be easily determined by irradiating the food with only light in a wavelength range in which the reflectance of the light depends greatly on the degree of freshness and by measuring the intensity of reflected light. In some foods, the reflectance changes greatly in different wavelength ranges. Even in such a case, a light-emitting apparatus for synthesizing light beams having different spectra emitted from light sources can be used to produce light beams in desired wavelength ranges.

15. Light-Emitting Apparatus for Synthesizing Light Beams Emitted in Different Directions A light-emitting apparatus for synthesizing light beams in different wavelength ranges emitted from one light-emitting device will be described below. As described above, a light-emitting device according to the present disclosure emits intense light having a particular wavelength in a particular direction and emits intense light having another wavelength in another direction. Utilizing the characteristics, light beams in different wavelength ranges emitted in different directions can be synthesized by an optical system or light guide. Light beams in different wavelength ranges can be synthesized to compensate for an insufficient spectrum component of one light beam with another light beam, thereby making the light beams more similar to light having a desired spectrum. Synthesized light can be introduced into an optical fiber, for example. Such a light-emitting apparatus can be used for optical fiber illumination, for example.

FIG. 97 is a schematic view of a light-emitting apparatus for synthesizing light beams in different wavelength ranges emitted in different directions from a light-emitting device. The light-emitting apparatus includes the light-emitting device 100', an optical system 6520, and an optical fiber 6530. The optical system 6520 includes a collimating lens 6520a and a converging lens 6520b. Although the light-emitting device 100' in FIG. 97 has the same structure as the light-emitting device 100 illustrated in FIG. 1A, a light-emitting device having another structure, such as the structure illustrated in FIG. 1C, may also be used. In FIG. 97, each component is simplified and does not necessarily have its actual structure. The same is true for other figures. Although not shown in FIG. 97, an excitation light source that emits excitation light to the light-emitting device 100' may be provided.

The photoluminescent layer contains a photoluminescent material having a broad emission spectrum. Light having a wavelength $\lambda_a$ emitted from the photoluminescent material has directionality in a particular direction, and light having a wavelength $\lambda_b$ emitted from the photoluminescent material has directionality in another direction. A light beam containing first light having a wavelength $\lambda_a$ and a light beam containing second light having a wavelength $\lambda_b$ are synthesized (gathered) by the optical system 6520 and enter the optical fiber 6530. The light in the optical fiber 6530 is emitted from the other end. Thus, optical fiber illumination for emitting light having a desired spectrum at a position distant from the light source unit including the light-emitting device 100' can be provided. Although the optical fiber 6530 in FIG. 97 is relatively short, the optical fiber 6530 may be several to hundreds of meters in some applications.

Figure 98:
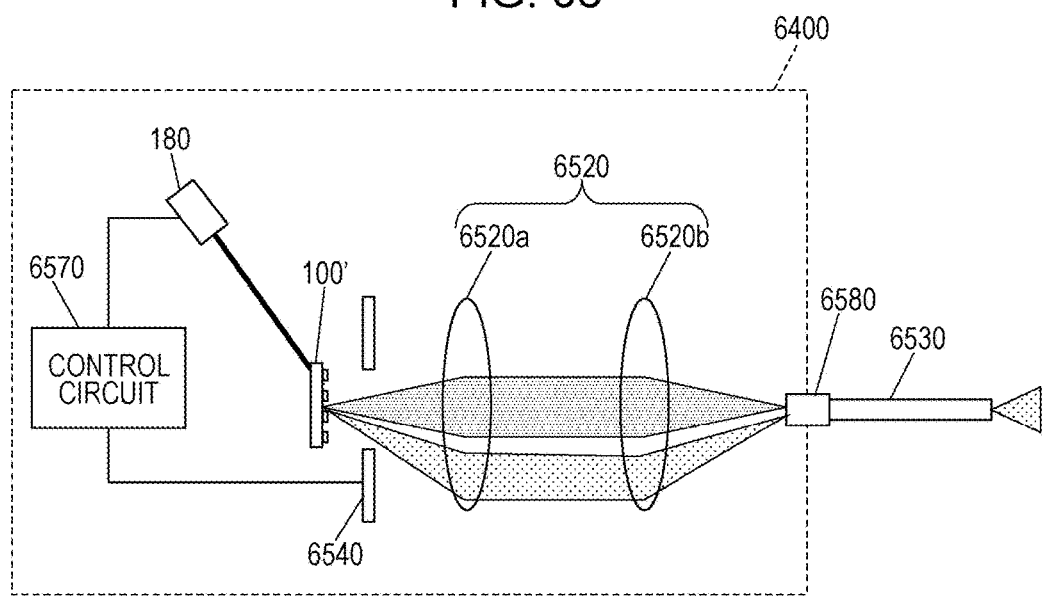

FIG. 98 illustrates a detailed structure of a light-emitting apparatus. In addition to the light-emitting device 100' and the optical system 6520, a light-emitting apparatus 6400 further includes an excitation light source 180, a control circuit 6570 for controlling the excitation light source 180, and a connector 6580 for connecting the optical fiber 6530. In this example, the optical fiber 6530 is disposed outside the light-emitting apparatus 6400.

The control circuit 6570 may be an integrated circuit including a processor, such as a microcontroller, coupled to the excitation light source 180. For example, the control circuit 6570 instructs the excitation light source 180 to change the intensity of output light according to the input from a user. This can change the intensity of first light and second light emitted from the light-emitting device 100'. In addition to such control, the intensity ratio of the first light to the second light may be adjusted by changing the size of an aperture 6540 disposed between the optical system 6520 and the light-emitting device 100'. This can adjust the spectrum of synthesized light.

The excitation light source 180 may be a laser beam source, and excitation light emitted from the excitation light source 180 enters the light-emitting device 100' at an angle at which the excitation light is totally reflected in the photoluminescent layer in the light-emitting device 100'. Thus, light emission can occur efficiently in the light-emitting device 100'.

The connector 6580 is a terminal for connecting the optical fiber 6530 and is disposed on a housing of the light-emitting apparatus 6400. The optical fiber 6530 can be inserted into and removed from the connector 6580. Thus, in the case that the optical fiber 6530 is a long cable laid in a building, when the light-emitting apparatus 6400 has broken down, or when the light-emitting apparatus 6400 is replaced with a light-emitting apparatus having different light-emitting properties, the light-emitting apparatus 6400 can be easily replaced.

As described above, the light-emitting apparatus illustrated in FIGS. 97 and 98 includes a photoluminescent layer for emitting light containing first light having a wavelength $\lambda_a$ in air and second light having a wavelength $\lambda_b$ in air, a light-transmissive layer located on or near the photoluminescent layer, a surface structure formed on a surface of at least one of the photoluminescent layer and the light-transmissive layer, and an optical system for synthesizing the first light and the second light. The surface structure has projections and recesses and limits the directional angle of the first light. For example, the center-to-center distance $D_{int}$ between two adjacent projections or recesses in the surface structure and the refractive index $n_{wav-a}$ of the photoluminescent layer for first light having a wavelength $\lambda_a$ in air satisfy $\lambda_a/n_{wav-a}<D_{int}<\lambda_a$. Alternatively, the surface structure has at least one periodic structure, and the refractive index $n_{wav-a}$ of the photoluminescent layer for light having a wavelength $\lambda_a$ in air and the period $p_a$ of at least one periodic structure satisfy $\lambda_a/n_{wav-a}<p_a<\lambda_a$. Consequently, the first light has the maximum intensity in a first direction predetermined by the projections or recesses or both, and the second light has the maximum intensity in a second direction different from the first direction. The optical system synthesizes the light beam containing the first light emitted in the first direction and the light beam containing the second light emitted in the second direction. The synthesized light may enter one end of an optical fiber and exits from the other end.

Such a structure can compensate for an insufficient spectrum component of the first light emitted in one direction with the second light. As described above, the intensity ratio of the first light to the second light can be controlled by adjusting the size of the aperture 6540. Thus, the color and brightness of the resulting optical fiber illumination can be changed. In the present embodiment, the apparatus can be advantageously miniaturized compared with the case in which light beams from light sources are synthesized. A small light-emitting apparatus can be provided that can control the spectrum by synthesizing light beams of two or more wavelengths or colors emitted from one light-emitting device. The optical fiber may be replaced with a light diffuser plate disposed at a position at which the first light and the second light are synthesized. Light diffused by the light diffuser plate can be utilized as illumination. Likewise, in the embodiments described below, the optical fiber 6530 may be replaced with a light diffuser plate.

Figure 99:
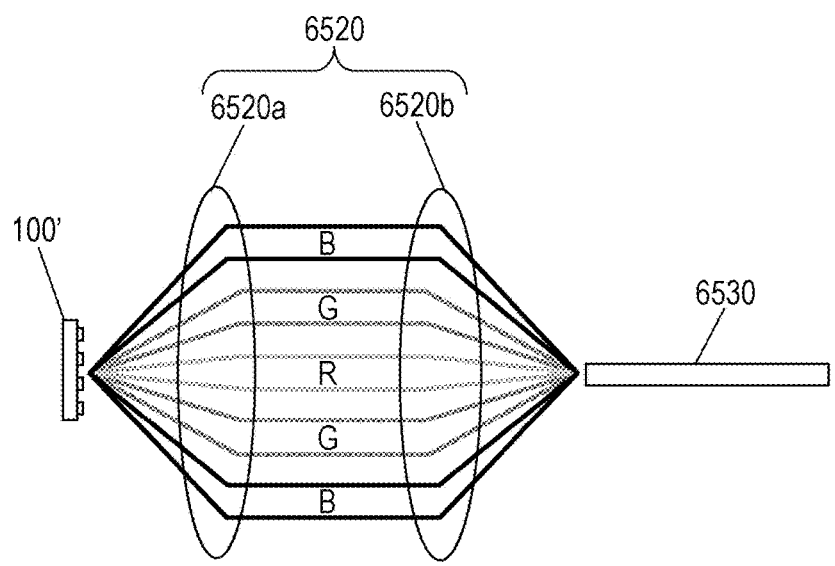

FIG. 99 illustrates a light-emitting apparatus for producing white light by synthesizing light beams of three particular wavelengths. In this example, the light-emitting device 100' emits light beams in three wavelength ranges of red (R), green (G), and blue (B) in different directions. These three color light beams are synthesized by the optical system 6520 and enter the optical fiber 6530. Thus, white light can be emitted from the optical fiber 6530. Although red, green, and blue light beams are used to produce white light in this example, light beams of any color may be combined.

FIG. 100 illustrates first light in a first direction and second light in a second direction emitted from the light-emitting device 100' into different optical fibers 6530a and 6530b. A light-emitting apparatus in this example includes a first optical system including lenses 6520a and 6520b and a second optical system including lenses 6520c and 6520d. First light emitted from the first optical system enters the first optical fiber 6530a, and second light emitted from the second optical system enters the second optical fiber 6530b. The first optical fiber 6530a and the second optical fiber 6530b are coupled to an optical fiber 6530d via a synthesizer 6640. The first light and the second light are synthesized by the synthesizer 6640 at the junction of the two optical fibers 6530a and 6530b. This structure also has the advantages as described above.

FIG. 101 illustrates another light-emitting apparatus including coupled optical fibers. The light-emitting apparatus includes the light-emitting device 100', a lens 6520a, a lens array 6610, optical modulators 6582, optical fibers 6530, and a synthesizer 6640. In the light-emitting apparatus, red (R), green (G), and blue (B) light beams emitted in different directions from the light-emitting device 100' are converted into parallel light by the lens 6520a, are converged by the lens array 6610, and enter the optical fibers 6530 through the optical modulators 6582. Each of the optical modulators 6582 receives red, green, or blue light and outputs the light to the corresponding optical fiber 6530. The optical modulators 6582 can weaken or block unnecessary light for the optical fibers 6530. Light beams propagating through the optical fibers 6530 are synthesized by the synthesizer 6640 and are emitted from one optical fiber.

Such a structure can produce light having any spectrum. The structure can individually output light beams of three primary colors of red, green, and blue and can be utilized not only for illumination but also for display equipment, such as displays and projectors.

FIG. 102 illustrates a structure including tiled light-emitting devices 100r, 100g, and 100b instead of the light-emitting device 100' illustrated in FIG. 101. The light-emitting devices 100*r*, 100*g*, and 100*b* are directional-light-emitting devices that emit light in red, green, and blue wavelength ranges, respectively, at a narrow angle. The light-emitting devices 100*r*, 100*g*, and 100*b* are one- or two-dimensionally arranged. Although FIG. 102 illustrates five light-emitting devices, practically, more light-emitting devices may be arranged. Light beams emitted from the light-emitting devices 100*r*, 100*g*, and 100*b* are converged by the lens 6520*a* and enter the optical fibers 6530 through the lens array 6610 and the optical modulators 6582. This structure also has the same advantages as the structure illustrated in FIG. 101.

Although red, green, and blue light beams are combined in FIGS. 101 and 102, any colors may be combined. The number of colors to be combined is not limited to three and may be two or four or more.

FIG. 103 illustrates a structure in which part of light emitted from the excitation light source 180 is utilized in the structure illustrated in FIG. 97. In this example, third light (for example, blue light) containing excitation light emitted from the excitation light source 180 enters the light-emitting device 100' at an angle (incident angle θ) with respect to the direction normal to the photoluminescent layer. Part of the third light is used for light emission, and another part of the third light passes through the light-emitting device 100'. In addition to first light and second light emitted from the light-emitting device 100', the third light passing through the light-emitting device 100' is transmitted to the optical fiber 6530 via the optical system 6520. When a desired spectrum cannot be produced from light emitted from the light-emitting device 100' alone, this structure can compensate for the insufficient spectrum component(s).

As described above, when a photoluminescent material is resonantly excited, excitation light incident at a particular angle θ can efficiently excite the photoluminescent material. In general, since the wavelength of excitation light is shorter than the wavelength of light having a narrow-angle light distribution emitted from the light-emitting device 100', the light having a narrow-angle light distribution is emitted at an angle smaller than the angle θ. As described above with reference to FIG. 87, the lens 6520*a* having a numerical aperture ($NA_{lens}$) of sin θ or more can be used to introduce light at an angle in the range of 0 (front) to θ degrees and to introduce both light having a narrow-angle light distribution and excitation light into the optical system 6520.

When the lens 6520*b* has the same structure as the lens 6520*a*, most (ideally all) of light in the optical system 6520 can be transmitted to an optical fiber 6530 having a numerical aperture ($NA_{fiber}$) of sin θ or more. When the lens 6520*b* has a different structure from the lens 6520*a*, the optical fiber 6530 should have a $NA_{fiber}$ of more than sin θ', wherein θ' (different from θ) denotes the incident angle of a light beam converged into the optical fiber 6530 by the lens 6520*b*.

FIG. 104 illustrates a structure in which the position of the excitation light source 180 illustrated in FIG. 103 was changed. In this example, third light containing excitation light emitted from the excitation light source 180 perpendicularly enters the light-emitting device 100'. Because most of the third light passes through the light-emitting device 100', the components of the third light can be strengthened. However, the luminous efficiency of the photoluminescent layer decreases, and therefore another excitation light source may be provided. When another excitation light source is provided, the excitation light source 180 may be replaced with a light source that emits light in a different wavelength range from excitation light.

FIG. 105 illustrates a light-emitting apparatus in which part of light emitted from the excitation light source 180 is utilized in the structure illustrated in FIG. 100. In the light-emitting apparatus, part of third light emitted from the excitation light source 180 and passing through the photoluminescent layer enters a third optical fiber 6530*c* through a third optical system (lens) 6520*e*. The first to third optical fibers 6530*a*, 6530*b*, and 6530*c* are joined together at a junction. The synthesizer 6640 at the junction synthesizes first and second light emitted from the light-emitting device 100' and third light passing through the light-emitting device 100'. This structure can also produce light having a desired spectrum from light emitted from the excitation light source 180.

Thus, a light-emitting apparatus configured to synthesize light beams in different wavelength ranges emitted in different directions from a light-emitting device can be variously modified. In any of the modified examples, first light and second light emitted from a light-emitting device are synthesized to produce light having a desired spectrum.

FIG. 106 illustrates a household fiber lighting system as an application example. The fiber lighting system includes a light-emitting apparatus (hereinafter also referred to as a light source unit) 6400 and optical fibers 6530. The light source unit 6400 is placed at a predetermined location around the house. Each of the optical fibers 6530 is laid from the light source unit 6400 to a place in a room where a lighting fixture is to be installed. Although the optical fibers 6530 appear as a single optical fiber in FIG. 105, they are actually a plurality of optical fibers. The structure of the light source unit 6400 is not limited to the structure illustrated in FIG. 98. The light source unit 6400 illustrated in FIG. 106 has the same structure as any of the light-emitting apparatuses illustrated in FIGS. 97 to 105. Light beams in different wavelength ranges are synthesized and enter the optical fibers 6530. Thus, as in the application example illustrated in FIG. 96, desired light can be sent to a place where a lighting fixture is to be installed and can be used as illumination light. The color and brightness of illumination light can be adjusted to the situation by changing the synthesis ratio of light beams in different wavelength ranges.

In the embodiments illustrated in FIGS. 97 to 106, the spectrum can be easily adjusted. Thus, these embodiments can be applied to beautifying light color illumination and color-enhancing light color illumination techniques, as in the embodiments illustrated in FIGS. 85 to 96. For example, color-enhancing light color illumination can make foods, such as meat and vegetables, look more delicious, can make scenery, such as red flowers and autumn leaves, look more vivid, or can be utilized to determine the degree of freshness of foods.

As described above, the spectrum of light has been controlled with an optical filter by removing a component or components in an unnecessary wavelength range from light emitted from a light source. This decreases light-use efficiency. In contrast, a light-emitting apparatus according to the present disclosure can emit enhanced light having a particular wavelength and does not need an optical filter. Thus, a light-emitting apparatus according to the present disclosure can have higher light-use efficiency than known light-emitting apparatuses.

Light-emitting devices and light-emitting apparatuses according to the present disclosure can be applied to various optical devices, such as lighting fixtures, displays, and projectors.

What is claimed is:

1. A light-emitting apparatus comprising:
an excitation light source that emits first light;
a light-emitting device on an optical path of the first light, the light-emitting device emitting second light having a wavelength $\lambda_a$ in air; and
a first converging lens on an optical path of the second light, wherein:
the light-emitting device comprises:
a photoluminescent layer that emits the second light by being excited by the first light; and
a light-transmissive layer on the photoluminescent layer,
at least one of the photoluminescent layer and the light-transmissive layer has a surface structure comprising projections or recesses arranged perpendicular to a thickness direction of the photo luminescent layer,
the surface structure is entirely made of a light-transmissive dielectric material,
at least one of the photoluminescent layer and the light-transmissive layer has a light emitting surface perpendicular to the thickness direction, the second light emitted from the light emitting surface,
the surface structure limits the directional angle of the second light emitted from the light emitting surface,
the photoluminescent layer comprises a dielectric layer, and
the light-transmissive dielectric material is continuously formed from the dielectric layer by a same material as the dielectric layer so that the surface structure is formed as a part of the photoluminescent layer.

2. The light-emitting apparatus according to claim 1, wherein the surface structure limits the directional angle of the second light emitted from the light emitting surface to less than 15 degrees.

3. The light-emitting apparatus according to claim 1, wherein the surface structure satisfies the following relationship:

$$\lambda_a/n_{wav-a} < D_{int} < \lambda_a$$

where $D_{int}$ is a center-to-center distance between adjacent two of the projections or the recesses, and $n_{wav-a}$ is a refractive index of the photoluminescent layer for the second light.

4. The light-emitting apparatus according to claim 1, wherein the surface structure has at least one periodic structure that satisfies the following relationship:

$$\lambda_a/n_{wav-a} < p_a < \lambda_a$$

where $p_a$ is a period of the at least one periodic structure.

5. The light-emitting apparatus according to claim 1, further comprising a collimating lens between the light-emitting device and the first converging lens.

6. The light-emitting apparatus according to claim 1, further comprising a joint for an optical fiber, at an incident position of light passing through the first converging lens.

7. The light-emitting apparatus according to claim 1, further comprising a second converging lens between the excitation light source and the light-emitting device.

8. The light-emitting apparatus according to claim 7, further comprising a collimating lens between the excitation light source and the second converging lens.

9. The light-emitting apparatus according to claim 1, further comprising a collimating lens between the excitation light source and the light-emitting device.

10. The light-emitting apparatus according to claim 1, wherein the photoluminescent layer is in contact with the light-transmissive layer.

11. The light-emitting apparatus according to claim 1, wherein a thickness of the photoluminescent layer, the refractive index of the photoluminescent layer, and the center-to-center distance between adjacent two of the projections or the recesses are set to limit the directional angle of the second light emitted from the light emitting surface.

12. The light-emitting apparatus according to claim 1, wherein the light-transmissive dielectric material is one of magnesium fluoride ($MgF_2$), lithium fluoride (LiF), calcium fluoride ($CaF_2$), resins, magnesium oxide (MgO), indium tin oxide (ITO), silicon nitride (SiN), tantalum pentoxide ($Ta_2O_5$), zirconia ($ZrO_2$), zinc selenide (ZnSe), and zinc sulfide (ZnS).

* * * * *